United States Patent
Collins

(10) Patent No.: US 6,444,084 B1
(45) Date of Patent: Sep. 3, 2002

(54) LOW DENSITY HIGH FREQUENCY PROCESS FOR A PARALLEL-PLATE ELECTRODE PLASMA REACTOR HAVING AN INDUCTIVE ANTENNA

(75) Inventor: Kenneth Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/480,007

(22) Filed: Jan. 10, 2000

Related U.S. Application Data

(60) Division of application No. 09/023,365, filed on Feb. 13, 1998, now Pat. No. 6,036,878, which is a continuation-in-part of application No. 08/740,124, filed on Oct. 24, 1996, now Pat. No. 6,054,013, which is a continuation-in-part of application No. 08/597,577, filed on Feb. 2, 1996, now Pat. No. 6,077,384, which is a continuation-in-part of application No. 08/648,254, filed on May 13, 1996, now Pat. No. 6,165,311.

(51) Int. Cl.$^7$ .................................................. H05H 1/00
(52) U.S. Cl. ........................ 156/345; 118/723 I; 216/68
(58) Field of Search ........................ 118/723 I; 156/345; 216/68

(56) References Cited

U.S. PATENT DOCUMENTS

| | | | |
|---|---|---|---|
| 4,123,316 A | 10/1978 | Tsuchimoto | |
| 4,261,762 A | 4/1981 | King | |
| 4,350,578 A | 9/1982 | Frieser et al. | |
| 4,371,412 A | 2/1983 | Nishizawa | |
| 4,427,516 A | 1/1984 | Levinstein et al. | |
| 4,427,762 A | 1/1984 | Takahashi et al. | |
| 4,430,547 A | 2/1984 | Yoneda et al. | |
| 4,457,359 A | 7/1984 | Holden | |
| 4,512,391 A | 4/1985 | Harra | |
| 4,565,601 A | 1/1986 | Kakehi et al. | |

(List continued on next page.)

FOREIGN PATENT DOCUMENTS

| | | |
|---|---|---|
| DE | 39 42964 A1 | 6/1991 |
| EP | 0 403 418 A2 | 12/1990 |
| EP | 0 413 282 A2 | 2/1991 |

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1977.

Matsuo, Seitaro, "Selective Etching of SiO2 Relative to Si by Plasma Reactive Sputter Etching," *J. Vac. Sc. Technology*, vol. 17, No. 2, Mar.–Apr. 1980.

(List continued on next page.)

*Primary Examiner*—Thi Dang
(74) *Attorney, Agent, or Firm*—Michaelson and Wallace; Joseph Bach

(57) ABSTRACT

The present invention is embodied in a method of operating an inductively coupled plasma reactor for processing a semiconductor wafer, the reactor including a vacuum chamber for containing the wafer, a process gas source, a semiconductor window electrode facing an interior portion of the chamber, an inductive power radiator on an exterior side of the semiconductor window electrode, the inductive field having a skin depth generally decreasing with the frequency of the RF inductive field and with the density of the plasma in the chamber and generally increasing with the pressure inside the vacuum chamber, the inductive coupling of the RF field tending to approach extinguishment as the skin depth approaches the spacing between the wafer and the window electrode, a method for maintaining an intermediate plasma density inside the chamber without extinguishing the inductive coupling of the RF field, the method including operating the reactor at a selected flow rate of the process gas, a selected chamber pressure and a selected plasma source power level corresponding to the reduced plasma density, and maintaining the frequency of the RF field at least at a level sufficient to limit the skin depth to a depth less than the electrode-to-wafer spacing, whereby to maintain the inductive coupling of the RF field.

23 Claims, 74 Drawing Sheets

U.S. PATENT DOCUMENTS

| | | |
|---|---|---|
| 4,579,080 A | 4/1986 | Martin et al. |
| 4,711,698 A | 12/1987 | Douglas |
| 4,755,345 A | 7/1988 | Baity, Jr. et al. |
| 4,756,810 A | 7/1988 | Lamont, Jr. et al. |
| 4,786,352 A | 11/1988 | Benzing |
| 4,786,359 A | 11/1988 | Stark et al. |
| 4,793,897 A | 12/1988 | Dunfield et al. |
| 4,807,016 A | 2/1989 | Douglas |
| 4,810,935 A | 3/1989 | Boswell |
| 4,842,683 A | 6/1989 | Cheng et al. |
| 4,870,245 A | 9/1989 | Price et al. |
| 4,918,031 A | 4/1990 | Flamm et al. |
| 4,948,458 A | 8/1990 | Ogle |
| 4,948,750 A | 8/1990 | Kausche et al. |
| 4,990,229 A | 2/1991 | Campbell et al. |
| 5,000,113 A | 3/1991 | Wang et al. |
| 5,006,220 A | 4/1991 | Hijikata et al. |
| 5,015,330 A | 5/1991 | Okumura et al. |
| 5,074,456 A | 12/1991 | Degner et al. |
| 5,085,727 A | 2/1992 | Steger |
| 5,169,487 A | 12/1992 | Langley et al. |
| 5,173,412 A | 12/1992 | Kiener et al. |
| 5,187,454 A | 2/1993 | Collins et al. |
| 5,203,956 A | 4/1993 | Hansen |
| 5,241,245 A | 8/1993 | Barnes et al. |
| 5,249,251 A | 9/1993 | Egalon et al. |
| 5,258,824 A | 11/1993 | Carlson et al. |
| 5,276,693 A | 1/1994 | Long et al. |
| 5,277,751 A | 1/1994 | Ogle |
| 5,326,404 A | 7/1994 | Sato |
| 5,346,578 A | 9/1994 | Benzing et al. |
| 5,349,313 A | 9/1994 | Collins et al. |
| 5,392,018 A | 2/1995 | Collins et al. |
| 5,399,237 A | 3/1995 | Keswick et al. |
| 5,401,350 A | 3/1995 | Patrick et al. |
| 5,414,246 A | 5/1995 | Shapona |
| 5,421,891 A | 6/1995 | Campbell et al. |
| 5,423,945 A | 6/1995 | Marks et al. |
| 5,468,341 A | 11/1995 | Samukawa |
| 5,477,975 A | 12/1995 | Rice et al. |
| 5,514,246 A | 5/1996 | Blalock |
| 5,529,657 A | 6/1996 | Ishii |
| 5,556,501 A | 9/1996 | Collins et al. |
| 5,607,542 A | 3/1997 | Wu et al. |
| 5,685,942 A * | 11/1997 | Ishii .......................... 156/345 |

FOREIGN PATENT DOCUMENTS

| | | |
|---|---|---|
| EP | 0 520 519 A1 | 12/1992 |
| EP | 0 552 490 A1 | 7/1993 |
| EP | 0 552 491 A1 | 7/1993 |
| EP | 0 596 551 A1 | 5/1994 |
| EP | 0 601 468 A1 | 6/1994 |
| EP | 0 641 013 A2 | 3/1995 |
| EP | 0 651 434 A2 | 5/1995 |
| EP | 0 680 072 A2 | 11/1995 |
| EP | 0 702 391 A2 | 3/1996 |
| EP | 0 710 055 A1 | 5/1996 |
| EP | 0 727 807 A1 | 8/1996 |
| EP | 0 727 923 A1 | 8/1996 |
| EP | 0 742 577 A2 | 11/1996 |
| EP | 0 756 309 A1 | 1/1997 |
| EP | 0 807 952 A2 | 11/1997 |
| GB | 231197 | 8/1925 |
| JP | 55-154582 | 12/1980 |
| JP | 57-155732 | 9/1982 |
| JP | 61-147531 | 12/1984 |
| JP | 61-91377 | 5/1986 |
| JP | 61-142744 | 6/1986 |
| JP | 62-254428 | 11/1987 |
| JP | 63-9120 | 1/1988 |
| WO | WO 91/10341 | 7/1991 |
| WO | WO 92/20833 | 11/1992 |

OTHER PUBLICATIONS

Lee, Ho–Jun, Yang, Dong–II and Whang, Ki–Woong, "The effects of magnetic fields on a planar inductively coupled argon plasma," *Plasma Sources Sci. Technol.*, 5(1996), pp. 383–388.

WO  WO 97/08734  3/1997

Sugai, H. and Nakamura, K., "Diagnostics and Control of radicals in an inductively coupled etching reactor," *J. Vac. Sci. Technol.*, A 13(3), May/Jun. 1995, pp. 887–893.

Horiike, Yashuiro, Kazuhiro, Shindo, Haruo and Kukasawa, Takayuki, "High rate and highly selective $SiO_2$ etching employing inductively coupled plasma and discussion on reaction kinetics," *J. Vac. Sci. Technol.*, A 13(3), May/Jun. 1995, pp. 801–809.

Lieberman, M.A. and Ashida, S., "Global models of pulse–power–modulated high–density, low pressure discharges," *Plasma Sources Sci. Technol.*, 5(1996), pp. 145–158.

Samukawa, Seiji and Ohtake, Hiroto, "Pulse–time Modulated Plasma Etching for Precise ULSI Patterning," Abstract No. 162, *Microelectronics Research Laboratories*, NEC Corporation, Japan, May 1996, pp. 217–218.

Shibano, Teruo, Fujiwara, Nobuo, Hirayama, Makoto, Nagata, Hitoshi and Demizo, Kiyoshi, "Etching yields of $SiO_2$ by low energy CF+x and Fx ions," *Appl. Phys. Lett.*, vol. 63, No. 17, Oct. 25, 1993.

Tynan, G.R., Bailey, A.D. III, Campbell, G.A., Charatan, R., de Chambrier, A., Gibson, G., "Characterization of an Azimuthally Symmetric helicon Wave High Density Plasma Source," *Trikon Technologies, Inc.*, Japan, Jul. 1997.

European Patent Office Communication Pursuant to Article 96(2) and Rule 51(2) EPC for Application No. 94307307.2–2208, mailed Jan., 1996.

Patent Abstracts of Japan, Publication No. 57045927 A, Mar. 16, 1982 (Fujitsu Ltd).

Patent Abstracts of Japan, Publication No. 06196446 A, Jul. 15, 1994 (NEC Corp).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst:KK).

Patent Abstracts of Japan, Publication No. 62052714 A, Mar. 7, 1987 (Olympus Optical Co. Ltd; Toagosei Chem Ind Co Ltd).

* cited by examiner

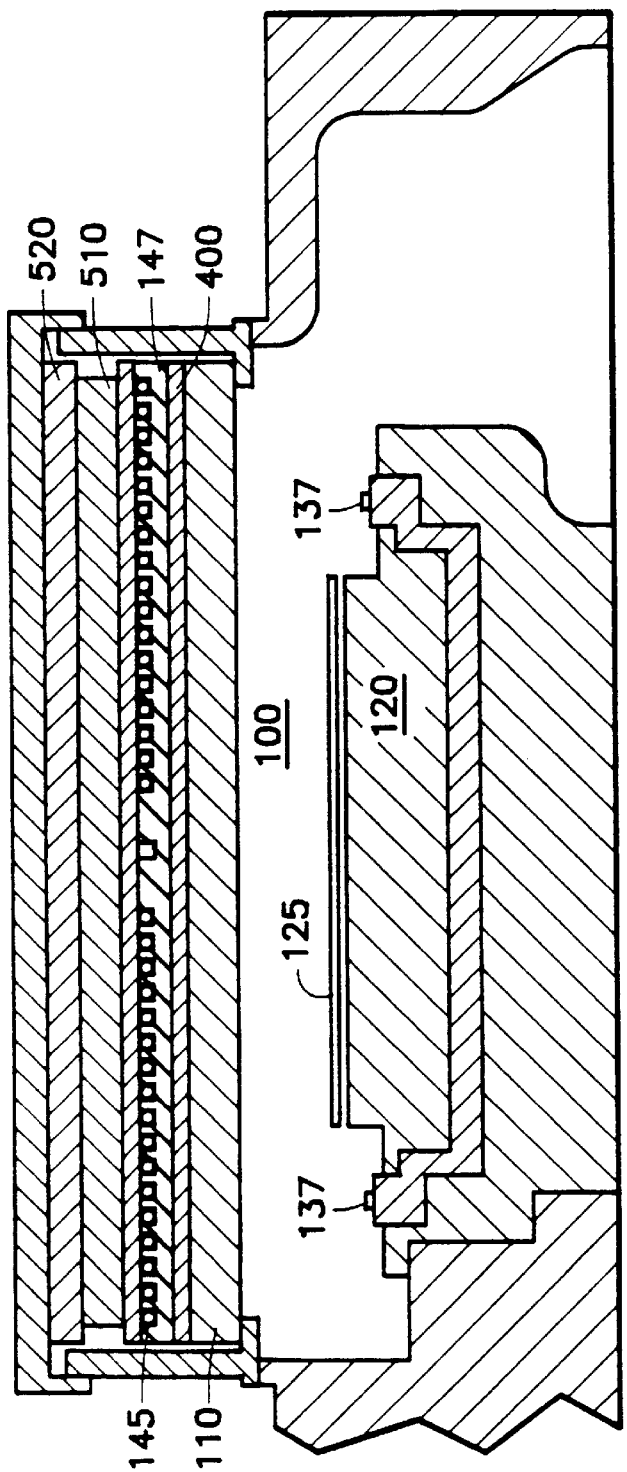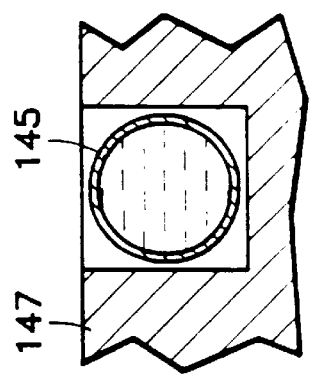
FIG. 39A
FIG. 39B

LOW DENSITY HIGH FREQUENCY PROCESS FOR A PARALLEL-PLATE ELECTRODE PLASMA REACTOR HAVING AN INDUCTIVE ANTENNA

CROSS REFERENCE TO RELATED APPLICATIONS

This application is a divisional of U.S. application Ser. No. 09/023,365, filed Feb. 13, 1998, now U.S. Pat. No. 6,036,878 which is a continuation-in-part of the following co-pending applications:

U.S. Ser. No. 08/740,124 filed Oct. 24, 1996, now U.S. Pat. No. 6,054,013 by Kenneth S. Collins et al. and entitled "PARALLEL PLATE ELECTRODE PLASMA REACTOR HAVING AN INDUCTIVE ANTENNA AND ADJUSTABLE RADIAL DISTRIBUTION OF PLASMA ION DENSITY" which is a continuation in part of:

U.S. Ser. No. 08/597,577 filed Feb. 2, 1996, now U.S. Pat. No. 6,077,384, by Kenneth S. Collins et al. entitled "PARALLEL PLATE ELECTRODE PLASMA REACTOR HAVING AN INDUCTIVE ANTENNA COUPLING POWER THROUGH A PARALLEL PLATE ELECTRODE";

U.S. Ser. No. 08/648,254 filed May 13, 1996 now U.S. Pat. No. 6,165,311 by Kenneth S. Collins et al. entitled "INDUCTIVELY COUPLED RF PLASMA REACTOR HAVING AN OVERHEAD SOLENOIDAL ANTENNA".

BACKGROUND OF THE INVENTION

1. Technical Field

The invention relates to a plasma reactor having parallel plates for interposition therebetween of a workpiece to be processed, such as a semiconductor wafer, and an inductive coil antenna coupling RF power through one of the parallel plates into the interior of the reactor.

2. Background Art (1) Background Relating to the Reactor Apparatus

Inductively coupled plasma reactors for processing microelectronic semiconductor wafers, such as the type of reactor disclosed in U.S. Pat. No. 4,948,458 to Ogle, enjoy important advantages over parallel-plate capacitively coupled plasma reactors. For example, inductively coupled plasma reactors achieve higher plasma ion densities (e.g., on the order of $10^{11}$ ions/cm$^3$). Moreover, plasma ion density and plasma ion energy can be independently controlled in an inductively coupled plasma reactor by applying bias power to the workpiece or wafer. In contrast, capacitively coupled reactors typically provide relatively lower plasma ion densities (e.g., on the order of only $10^{10}$ ions/cm$^3$) and generally cannot provide independent control of ion density and ion energy. The superior ion-to-neutral density ratio provided by an inductively coupled plasma etch reactor used to etch silicon dioxide, for example, provides superior performance at small etch geometries (e.g., below 0.5 micron feature size) including better etch anisotropy, etch profile and etch selectivity. In contrast, parallel plate capacitively coupled plasma reactors typically stop etching at feature sizes on the order of about 0.25 microns, or at least exhibit inferior etch selectivity and etch profile due to an inferior ion-to-neutral density ratio.

One type of inductively coupled plasma reactor, such as one disclosed in U.S. Pat. No. 4,948,458, has a planar coil overlying the chamber ceiling and facing the semiconductor wafer being processed, which provides a relatively uniform RF induction field over the surface of the wafer. For this purpose, the ceiling, which seals the reactor chamber so that it can be evacuated, must be fairly transmissive to the RF induction field from the coil and is therefore a dielectric, such as quartz. It should be noted here that such a ceiling could be made from dielectric materials other than quartz, such as aluminum oxide. However other materials such as aluminum oxide tend produce greater contamination than quartz due to sputtering.

An advantage of capacitively coupled plasma reactors is that the chamber volume can be greatly reduced by reducing the space between the parallel plate electrodes, thereby better confining or concentrating the plasma over the workpiece, while the reactor can be operated at relatively high chamber pressure (e.g., 200 mTorr). In contrast, inductively coupled plasma reactors require a larger volume due to the large skin depth of the RF induction field, and must be operated at a lower chamber pressure (e.g., 10 mTorr) to avoid loss of plasma ions due to recombination. In commercial embodiments of the inductively coupled reactor of U.S. Pat. No. 4,948,458 referred to above, the requirement of a large chamber volume is met by a fairly large area side wall. Typically the ceiling must be a non-conductive material in order to permit inductive coupling from the overhead coil antenna into the chamber interior, and is therefore not available to provide an RF ground or RF return plane. Therefore, the chamber side walls must provide the RF ground or RF return and must therefore be formed of a conductive material such as aluminum, for example. However, the side wall is a poor ground plane, as it has many discontinuities, such as a slit valve for wafer ingress and egress, gas distribution ports or apparatus and so forth. Such discontinuities give rise to non-uniform current distribution, which distort plasma ion distribution relative to the wafer surface. The resulting sideways current flow toward the side wall contributes to non-uniform plasma ion distribution relative to the wafer surface.

One approach for combining capacitive and inductive coupling is to provide a side coil wound around the side wall of a parallel plate plasma reactor, as disclosed in European Patent Document Publication No. 0 520 519 A1 by Collins et al. For this purpose, the cylindrical chamber side wall must be a nonconductor such as quartz in order to admit the RF induction field of the side coil into the chamber. This type of plasma reactor may tend to exhibit, under certain circumstances, processing non-uniformity across the wafer surface. For example, the etch rate is much greater at the wafer periphery and much slower at the wafer center, thereby constricting the process window. The disposition of the induction coil antenna along the side wall of the reactor chamber, the relatively short (e.g., 2 cm) skin depth (or depth within which most of the RF power is absorbed) toward the chamber center, and the introduction of the etch precursor gas into the reactor chamber from the side, tends to provide more of the etchant ions and radicals near the chamber side wall or around the wafer periphery. The phrase "etchant ions and radicals" as employed in this specification refers to the various chemical species that perform the etch reaction, including fluorocarbon ions and radicals as well as fluorohydrocarbon ions and radicals. The population of free fluorine ions and radicals is preferably minimized by well-known techniques if a selective etch process is desired. Energetic electrons generated by the plasma source power interact with the process precursor gas and thereby produce the required etchant ions and radicals and, furthermore, produce molecular or atomic carbon necessary for polymerization employed in sophisticated etch processes. The etch process near the wafer center is dependent upon such energetic electrons traveling from the vicinity of the chamber side wall and reaching the wafer center before recombining along the way by collisions with neutral species or ions, so that the etch process is less uniform across the wafer surface. These problems are better understood in light of the role polymerization plays in the etch process.

Polymerization employing fluoro-carbon ($C_xF_x$) or fluoro-hydrocarbon chemistry is employed in a typical silicon dioxide etch process, for example, to enhance etch anisotropy or profile and etch selectivity, as described in Bariya et al., "A Surface Kinetic Model for Plasma Polymerization with Application to Plasma Etching," *Journal of the Electrochemical Society*, Volume 137, No. 8 (August 1990), pp. 2575–2581 at page 1. An etch precursor gas such as a fluoro-carbon like $C_2F_6$ or a fluoro-hydrocarbon introduced into the reactor chamber dissociates by inelastic collisions with energetic electrons in the plasma into etchant ions and radicals as well as carbon. As noted above, such etchant ions and radicals include fluoro-carbon or fluoro-hydrocarbon ions and radicals, for example, and free fluorine ions and radicals. The free fluorine ions and radicals are preferably minimized through scavenging, for example, if the etch process is to be selective with respect to a non-oxygen containing material such as polysilicon. The carbon and at least some of the fluoro-carbon or fluoro-hydrocarbon ions and radicals are polymer-forming. Also present in the plasma are excited neutrals or undissociated species and etch by-products. The polymer-forming radicals and carbon enhance etch profile as follows: By forming only on the side-walls of etch features (formation on the horizontal surfaces being prevented by the energetic downward ion flux from the plasma), polymers can block lateral etching and thereby produce anisotropic (narrow and deep) profiles. The polymer-forming ions and radicals also enhance silicon oxide etch selectivity because polymer generally does not form on the silicon oxide under favorable conditions but does form on silicon or other materials which are not to be etched but which may underlie a silicon oxide layer being etched. Thus, as soon as an overlying silicon oxide layer has completely etched through to expose an underlying polysilicon layer, the polymer-forming ions and radicals in the plasma that contact the exposed polysilicon layer immediately begin to form a polymer layer, inhibiting further etching.

Such polymerization during the etch process requires a careful balance of etchant and polymer, the etchant concentration typically being at a depletion level to avoid inhibition of appropriate polymer formation. As a result, a significant proportion of etchant ions and radicals formed near the wafer periphery are consumed before reaching the wafer center, further depleting the etch ion concentration over the wafer center. This leads to a lower etch rate or etch stopping near the wafer center.

One reason that there are more ions at the wafer periphery is that the location of the inductive coil at the side wall causes hotter ion-producing electrons to be generated in the vicinity of the side wall, such electrons cooling off and/or being consumed by recombination before reaching the center so that less production of etchant ions and radicals occurs over the wafer center. Moreover, introduction of the etchant precursor gas from the side and coupling of plasma source power from the side tends to produce a less uniform etchant ion/radical distribution favoring the side. Many of the ions and radicals formed near side (over the wafer periphery) are consumed by etching the quartz side wall and are not available to etch the wafer center, while etchant ion/radical-forming energetic electrons generated near the side are lost to collisions with other species before reaching the wafer center, thus reducing the etchant ion concentration at the wafer center. (It should be noted that the etching of the quartz side wall eventually increases the cost of operating the reactor.) The relative lack of etchant ions near the wafer center permits faster formation of polymer at the wafer center, and in some cases the polymer formation can inhibit the etch process, particularly at feature sizes less than 0.5 microns. Such etch stopping may occur either at larger etch features, at shallower etch depths or at shorter etch times.

The converse of the foregoing is that the relative plentitude of etchant ions and radicals near the wafer periphery can, under selected processing conditions, so impede polymerization as to impair etch selectivity, possibly leading to punchthrough of the underlying layer near the wafer periphery, in addition to causing a much higher etch rate at the wafer periphery. A related problem is that the hotter electrons near the chamber side wall/wafer periphery providing more energetic plasma ions in that vicinity, coupled with the oxygen released by the etching of the quartz side wall mentioned above, erode the edges of the photoresist mask near the wafer periphery. Such erosion may lead to faceting, in which the corners defined by the photoresist mask are etched, giving rise to an undesirable tapered etch profile.

From the foregoing, it is clear that there is a trade-off between avoiding punchthrough and faceting at the wafer edge and avoiding etch stopping at the wafer center, leading to a relatively narrow window of processing parameters within which a successful etch process may be realized across the entire wafer surface. To avoid the overetching the wafer periphery, the concentration of etchant ions and radicals in the plasma relative to other particles (e.g., polymer-forming ions or radicals and carbon) may be decreased, which risks etch-stopping at the wafer center. Conversely, to avoid etch-stopping at the wafer center, the concentration of etchant ions in the plasma may be increased, which risks punch through or faceting near the wafer periphery. Thus, the process window for successfully etching the entire wafer is relatively narrow.

In the parallel plate plasma reactor, the concentration of free fluorine in the plasma can be controlled by introducing a scavenging article, such as silicon, near or at the top of the reactor chamber. Silicon atoms physically etched (sputtered), chemically etched or reactive ion etched from the scavenging article combine with the fluorine ions and radicals, thereby reducing fluorine ion and radical concentration in the plasma. By controlling the rate at which silicon atoms are physically or chemically etched from the scavenging article, the amount of free fluorine ions and radicals in the plasma may be regulated (e.g., reduced) as desired to meet the narrow processing window mentioned above. The physical or chemical etch rates can be controlled by controlling the temperature of the scavenging article and/or by controlling the rate of ion-bombardment on the scavenging article. The surface of the scavenging article may be activated (to release silicon atoms into the plasma) either by RF power or by heating. By holding the scavenging article's temperature below the temperature at which polymerization occurs, the polymers accumulate on the scavenging article surface and block any release therefrom of silicon atoms. By raising the scavenging article's temperature above the condensation temperature, the surface is free from polymers, thus permitting the release of silicon atoms into the plasma. Further increasing the temperature increases the rate at which silicon atoms are released from the scavenging surface into the plasma. As for activating the scavenging article by RF power, the rate of ion bombardment of the scavenging article is affected by the RF potential or bias applied (directly or indirectly) to the top parallel plate electrode adjacent the scavenging article. Reducing the free fluorine concentration in this manner has the effect of not only decreasing etch rate but also enriching the carbon content of the polymer, thus increasing the effect of the polymer on the etch process to guard against punch through at the wafer periphery, but increasing the risk of etch stopping at the wafer center. Conversely, increasing the free fluorine concentration not only increases the etch rate but also depletes the carbon content of the polymer, thus decreasing the effect of polymerization on the etch process, thus decreasing the risk of etch stopping at the wafer center but weakening the protection against punch through at the wafer periphery.

The narrow processing window is also met by regulating the polymer-forming ion and radical concentration in the plasma. This is accomplished by regulating the rate at which such polymer-forming radicals and ions are lost from the plasma by polymerization onto the chamber ceiling or sidewalls (or a scavenging article) or the rate at which polymer deposits are sputtered from the ceiling or sidewalls (or scavenging article). The polymerization rate at the ceiling is affected by regulating the ceiling temperature above or below the polymerization temperature. The rate at which such polymer deposits on the ceiling are etched and released into the plasma is affected by the following factors: the RF power applied (directly or indirectly) to the ceiling electrode, temperature, chamber pressure, gas flow rate, inductive source power and other parameters.

Thus, in order to meet the narrow processing window, in general the relative concentrations of free fluorine and polymer-forming ions and radicals in the plasma may be controlled by regulating the temperature of the chamber ceiling or side walls or a scavenging article (if any) and/or by regulating the RF power applied to the to overhead/ceiling parallel plate electrode.

Thus, it is seen that the parallel-plate plasma reactor with the induction coil wound around its cylindrical-side wall has the advantage of providing its ceiling electrode as a uniform ground plane over the entire wafer surface, but confines plasma ion production to the vicinity of the chamber side wall, so that plasma processing is weaker at the wafer center and stronger at the wafer periphery. The overhead planar coil plasma reactor has the advantage of a more uniform RF induction field relative to the wafer surface, so that ion production is not confined to the wafer periphery, but suffers from the lack of any uniform ground plane over the wafer, so that plasma ion current flow to the side walls distorts the plasma.

In a typical plasma processing chamber used for selective etching of thin films on a semiconductor wafer, a combination of etch and deposition processes are employed simultaneously. Polymer forms on surfaces that are either sufficiently cold (below the temperature threshold of polymerization) or on which ion bombardment is below a threshold energy (the threshold ion energy sufficient to offset the polymer deposition rate on that surface). The temperature threshold and the threshold ion energy depend upon the material of the surface. Deposition can occur on the wafer as well as the process chamber surfaces. Control of the deposition on the wafer as well as the process chamber surfaces is critical to controlling the selective etch process. Polymer deposition on interior surfaces of reactor chamber walls is required in cases where the material of the chamber walls is incompatible with the process being carried out on the wafer. One example of this is where the chamber walls are aluminum and the process being carried out is plasma etching of silicon dioxide. Deposition of polymer on the chamber wall surfaces prevents introduction of aluminum into the process by preventing plasma ion sputtering of the chamber walls.

Conventional techniques for controlling polymer deposition required the user to choose between the following two options:

(1) Keeping the process chamber surfaces below the threshold temperature or keeping the ion energy below the threshold ion energy in order to cause polymer deposition on the surfaces;

(2) Keeping process chamber surfaces above the threshold temperature or keeping the ion energy above the threshold ion energy in order to prevent polymer deposition on the surfaces.

The problem with option (1) is that the polymer accumulated on the surface must be removed periodically, either by manual (wet) cleaning, by plasma (dry) cleaning, or by replacing the contaminated parts. Otherwise, flaking of the polymer will occur, leading to contamination of the chamber. Cleaning the reactor chamber requires the reactor operation be interrupted during the entire cleaning process, which represents a significant loss of productivity and increases the cost of operating the reactor. Problems associated with the plasma cleaning process include not only loss of productivity but also loss of consumable materials in the chamber and contamination.

The problem with option (2) is that etching of chamber surfaces occurs because the surfaces are exposed. Typically, these surfaces are either aluminum or quartz. For aluminum surfaces, etching creates contaminant by-products that can destroy the integrity of the plasma processing of the wafer, as mentioned hereinabove. For quartz surfaces, the etching can occur at such a high rate that the quartz parts must be replaced periodically at a significant cost in parts and lost production time. Moreover, some transition to colder surfaces—in other regions of the chamber such as the pumping annulus—must be provided.

(2) Background Relating to the Present Invention

The etch process becomes more difficult to carry out as new device geometries are introduced requiring greater versatility of the etch process. The apparatus described in this specification has successfully performed at relatively high plasma ion densities on the order of $10^{11}$ ions/cm$^3$ and greater. However, some semiconductor structures need to be etched at lesser plasma densities, e.g., on the order of $5 \cdot 10^{10}$ ions/cm$^3$. The following are some examples of such structures.

(1) Self-Aligned Contact (SAC): A self-aligned contact in a multi-level conductor structure is one in which a portion of the opening to be etched is near a lower-level bit line or conductor adjacent the bottom of the opening, for example. Normally, the contact opening location must be carefully controlled during photolithographic definition to avoid exposing the bit line to the metal deposited into the etched opening. However, depending upon the dimensions involved, the photolithographic definition process may not be a sufficiently reliable guarantee of accurate placement of the contact opening to avoid exposing the lower-level bit line. In order to ensure the insulation of the lower-level bit line from the metal deposited inside the contact opening even in the presence of significant placement errors in the photolithographic definition step, a silicon nitride film is formed around the lower level bit line before formation of the overlying layers through which the contact opening is to be etched. The challenge is to avoid etching through the silicon nitride cover layer without etch-stopping above the desired depth of the contact opening. This challenge is particularly difficult for two reasons: (a) First, if the contact opening partially overlies the lower-level bit line, it is constricted by the lower-level bit line, thereby increasing the likelihood of etch-stopping. (b) Second, the silicon nitride insulating film covering the lower-level bit line tends to have an outer corner facing the contact opening, which is highly susceptible to sputtering, thereby increasing the likelihood of damaging or etching through the silicon nitride insulating film.

(2) Self-Aligned Local Interconnect (SALI): In a self-aligned local interconnect structure, contact openings are etched at the same time large-area openings are etched, whose width may be an order of magnitude or more greater than the width of a typical contact opening. It is very difficult to maintain adequate etch selectivity in the large-area openings without etch-stopping in the contact (narrow) openings.

(3) Dual Damascene: A narrow contact opening is formed at the bottom of a large-area trench, both the trench and the contact being etched in the same etch step. In this structure, it is especially difficult to avoid exceeding the critical opening dimensions of the overhead trench without etch-stopping in the underlying contact opening, for the following reasons:

(a) the disparity in opening sizes between the trench and contact;
   (b) the use of special low-dielectric constant material instead of or as an additive within the silicon oxide insulating layers renders these layers less susceptible to attack by the enchant, and therefore reduces etch selectivity;
   (c) the underlying stop layer (e.g., polysilicon or silicon) contains oxide additives which renders this layer more susceptible to attack by the enchant, and therefore reduces etch selectivity.

As already mentioned, carrying out these latter applications using the reactor described in this specification has been difficult for the reasons outlined immediately above. It is believed that other types of inductively coupled plasma reactors can experience similar difficulties.

One approach to such handling problems has been to simply decrease the plasma source power from its typical level corresponding to a plasma density of over $3\cdot10^{11}$ ions/cm$^3$ to reduce the plasma density. However, the problem with this approach is that, as the plasma source power is reduced, the skin depth of the inductive field in the plasma expands until, at or below $3\cdot10^{11}$ ions/cm$^3$, the skin depth reaches the lower limit (i.e., the level of the wafer or workpiece), at which point inductive coupling ceases and the plasma abruptly switches over to a purely capacitively coupled mode and a much lower plasma ion density of about $1\cdot10^{10}$ ions/cm$^3$. In the capacitively coupled mode it is not possible to achieve a higher plasma density, so that it would appear that it is not possible to operate the above-described reactor (or other inductively coupled reactors) at an intermediate plasma density (e.g., $5\cdot10^{10}$ ions/cm$^3$, which would be more desireable. In addition, in the capacitively coupled mode there is no independent control of plasma ion density and plasma ion energy at the wafer surface, resulting in inadequate plasma density and excessive ion energy. Such excessive ion energy increases the risk of punching through the silicon nitride insulating layer exposed during contact etching, for example. The inadequate plasma ion density reduces process throughput or productivity. Thus, one problem is how to obtain an intermediate plasma ion density while maintaining inductive coupling of the RF source power.

SUMMARY OF THE INVENTION

The present invention is embodied in a method of operating an inductively coupled plasma reactor for processing a semiconductor wafer, the reactor including a vacuum chamber for containing the wafer, a process gas source, a semiconductor window electrode facing an interior portion of the chamber, an inductive power radiator on an exterior side of the semiconductor window electrode, the inductive field having a skin depth generally decreasing with the frequency of the RF inductive field and with the density of the plasma in the chamber and generally increasing with the pressure inside the vacuum chamber, the inductive coupling of the RF field tending to approach extinguishment as the skin depth approaches the spacing between the wafer and the window electrode, a method for maintaining an intermediate plasma density inside the chamber without extinguishing the inductive coupling of the RF field, the method including operating the reactor at a selected flow rate of the process gas, a selected chamber pressure and a selected plasma source power level corresponding to the reduced plasma density, and maintaining the frequency of the RF field at a level sufficient to reduce the skin depth to a depth less than the electrode-to-wafer spacing, whereby to maintain the inductive coupling of the RF field.

The electrode-to-wafer spacing is typically on the order of about 7 cm. The high plasma density is typically between about $1\cdot10^{11}$ electrons/cm$^3$ to $10\cdot10^{11}$ electrons/cm$^3$ and the intermediate plasma density is between about $1\cdot10^{10}$ electrons/cm$^3$ to $10\cdot10^{10}$ electrons/cm$^3$. Typically the frequencies in the invention exceed by a factor of between 4 and 100 the typical frequency of operation of inductively coupled plasma reactors. The typical (low) frequency of operation is on the order of about 2 MHz; while, in contrast, the frequency employed in the present invention is on the order of about 13 MHz. Alternatively, the source power frequency employed in the present invention may be within a range between about 13 and 100 MHz. The chamber pressure typically lies in a range between on the order of about 2 mTorr and 100 mTorr or, alternatively between on the order of about 2 mTorr and 200 mTorr. The chamber pressure may lie in a range of between about 25 to 100 mTorr. Alternatively, the chamber pressure is in a range of between about 40 and 100 mTorr. As a second alternative, the chamber pressure is in a range of between about 2 and 25 mTorr. As a third alternative, the chamber pressure is in a range of between about 2 and 40 mTorr. The intermediate plasma density is within about one order of magnitude of a high plasma density. The electrode-to-wafer spacing is typically a fraction of the diameter of the wafer.

In accordance with an additional feature of the invention, the method further includes an RF bias power generator for applying plasma bias power to the wafer, the method further including maintaining the frequency of the RF bias power generator at least at a level sufficient to limit ion energies near the wafer below a desired threshold, such as, for example, about 2 KeV peak ion energy. For example, the RF bias power frequency is maintained above 10 MHz to achieve keep ion energy at the wafer surface below a threshold of about 2 KeV.

BRIEF DESCRIPTION OF THE DRAWINGS

FIGS. 35A through 35E illustrate one embodiment of a center gas feed silicon ceiling, of which FIG. 35A is a bottom perspective view of the gas feed top, FIG. 35B is a bottom perspective view of an annular seal therefor, FIG. 35C is a cross-sectional view of the seal of FIG. 35B, FIG. 35D is a top perspective view of the silicon ceiling showing the gas feed holes and FIG. 35E is a partial cross-sectional view of the silicon ceiling of FIG. 35D.

FIG. 39A is a detailed cross-sectional side view of a preferred implementation of the invention.

FIG. 39B is an axial cross-sectional view of the conductor employed in the overhead inductive antenna.

DETAILED DESCRIPTION OF THE PREFERRED EMBODIMENTS

Figure 1:
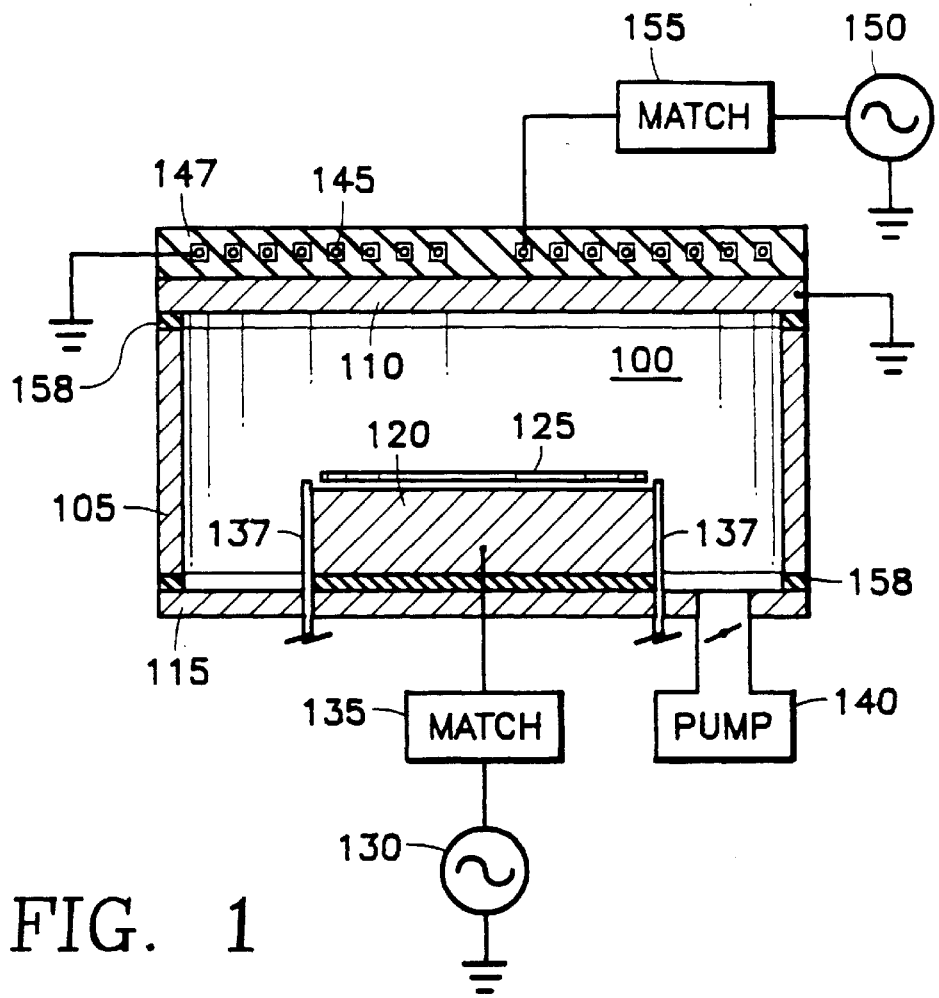
FIG. 1 illustrates a first embodiment of the plasma reactor invention having a planar coil antenna overlying a planar silicon ceiling.

Reactor in Which the Process of the Invention is Carried Out:

Referring to FIG. 1, a plasma reactor includes a sealed cylindrical chamber 100 enclosed by a cylindrical side wall 105, a disk-shaped ceiling 110 and a base 115. A wafer pedestal 120 supports a semiconductor wafer or workpiece 125 to be processed by the reactor. The wafer pedestal 120 may be an electrostatic chuck assembly, as disclosed in co-pending U.S. patent application Ser. No. 08/507,726 filed Jul. 26, 1995 by Kenneth S. Collins et al. entitled "PLASMA SOURCE WITH AN ELECTRONICALLY VARIABLE DENSITY PROFILE" and assigned to the assignee of the present application, the disclosure of which is incorporated herein by reference. A bias RF power generator 130 applies a bias potential to the wafer pedestal 120 through an impedance match circuit 135 of the type well-known in the art. Impedance match circuits are disclosed, for example, in U.S. Pat. No. 5,392,018 to Collins et al. and U.S. Pat. No. 5,187,454 to Collins et al. Gas inlets 137 adjacent the pedestal 120 admit a processing gas such as an etchant precursor gas such as a $C_xF_x$ gas. A vacuum pump 140 evacuates the chamber 100 to a desired pressure. An overhead inductive coil antenna 145 held over the ceiling 110 in an insulating antenna holder 147 is connected to a plasma source RF power generator 150 through another conventional impedance match circuit 155 and inductively couples RF power into the chamber through the ceiling 110.

In order to provide a uniform ground return for the bias RF power over the entire surface of the wafer 125 and in order to minimize current flow toward the side wall 105, the ceiling 110 is grounded. However, this feature requires the ceiling 110 to perform two functions: (a) act as a conductor that can be grounded and (b) act as a non-conductor so that the RF induction field from the overhead coil antenna 145 can pass therethrough. In order to fulfill its dual-function role, the ceiling 110 is a semiconductor such as silicon. The silicon ceiling 110 may be insulated from conductive member of the chamber by insulators 158. The silicon ceiling 110, as a semiconductor, has sufficient conductive properties to act as an electrode or ground plane. In order to vertically confine the plasma closer to the wafer 125 and bring the uniform overhead ground plane into closer proximity to the wafer 125 (i.e., closer than the side wall 105) to minimize sideways plasma current flow to the side wall 105, the silicon ceiling 110 preferably is placed within a distance of the wafer 125 less than the wafer diameter and as close as only a fraction of the wafer diameter (e.g, within a few centimeters for a 20 cm diameter wafer). This distance can be as great as 20 cm and as little as 1 cm although a preferable range is 2–10 cm.

The ceiling 110 is a semiconductor window of a semiconductor material which is preferably silicon. However, other well-known semiconductor materials may be employed, such as silicon carbide, germanium, III-V compound semiconductors such as gallium arsenide or indium phosphide and II-III-V compound semiconductors such as mercury cadmium telluride. The requisite dopant impurity level at room temperature given a desired resistivity value of the silicon window electrode may be obtained from the graph of FIG. 4.14 of Grove, *Physics of Semiconductors*, page 113. The temperature of the silicon window 110 must be maintained within a range above which it does not act like a dielectric and below which it does not act like a conductor. The requisite temperature range may be obtained from the graph of FIG. 4.8 of Grove, *Physics of Semiconductors* illustrating the electron concentration in n-type silicon as a function of temperature. This graph shows that below about 100° K, the silicon begins to act like a dielectric while above about 600° K the silicon begins to act like a conductor. It is therefore preferable to maintain the temperature of the silicon ceiling 110 in a range where the carrier electron concentration is fairly constant with respect to temperature, which is within the range between 100° K and 600° K.

The advantages of the plasma reactor of FIG. 1 include the even distribution across the entire wafer surface of the plasma source power generated by the overhead coil antenna 145 in comparison with the conventional type of reactor having a coil wound around the side wall. Thus, plasma ion generation is not confined to the vicinity of the side wall but is uniformly distributed over the wafer surface. Plasma ion uniformity is enhanced because the grounded ceiling electrode 110 reduces or eliminates plasma current flow to the side wall 105, in contrast to the sideways current flow in the plasma reactor having an overhead coil antenna over a dielectric ceiling as disclosed in U.S. Pat. No. 4,948,458 referred to above. Also, the close vertical proximity between wafer and ceiling reduces the distance between the wafer and the region in which plasma ions are generated, thereby reducing recombination losses and permitting the chamber pressure to be increased (e.g., to be in the range of 50–200 mTorr, for example). Such an increase in chamber pressure can be desirable for enhancing certain processing performance parameters, such as etch selectivity. The uniformity of plasma ion generation in the embodiment of FIG. 1 (achieved by the overhead coil antenna 145) coupled with the reduction in current flow to the chamber side wall (achieved with the grounded silicon ceiling 110 in close proximity to the wafer 125) reduces or eliminates differences in processing (e.g., etching) at the wafer center and processing at the wafer periphery, thereby widening the processing window. Specifically, the tendency to overetch or punch through at the wafer periphery is reduced while at the same time the tendency to etch stop at small feature sizes at the wafer center is also reduced. Also, the tendency near the wafer periphery to facet the photoresist mask edges and to generally etch the photoresist giving rise to poor etch profile is reduced or eliminated. Thus, the plasma reactor of FIG. 1 can provide at very small feature sizes aggressive etch performance across the entire wafer surface with superior etch profile and superior etch selectivity with little or no microloading. Moreover, since there is little or no participation of the side wall 105, consumption of reactor components and the associated operating cost is significantly reduced. Accordingly, the invention provides a revolutionary advance in the art.

There are, however, a number of potential problems which preferably should be resolved to optimize the reactor of FIG. 1. First, there is the problem of whether the silicon ceiling 110 will block the RF induction field of the overhead coil antenna 145 from ever reaching the chamber 100. For example, the impedance of the silicon ceiling 110 to the RF induction field may be too great to permit transmission therethrough. This may be affected by the dopant impurity concentration in the silicon ceiling 110 or by the temperature of the silicon ceiling 110. Alternatively, the RF induction field skin depth through the silicon ceiling 110 may not exceed the ceiling thickness, thus preventing transmission therethrough. Also, the RF induction field skin depth through the plasma in the chamber 100 may be greater than the chamber height (i.e., the wafer-top electrode gap), so that the RF induction power may not be efficiently coupled to the plasma. Another problem is that the close proximity of the ceiling 110 to the wafer 125 may be insufficient to separate the plasma sheath near the ceiling 110 from the plasma sheath near the underlying wafer 125, thereby shorting out the plasma from top to bottom. Also, insertion of the silicon material of the ceiling 110 into the RF return path of the bias RF power generator 130 may occasion significant RF bias power losses. Finally, there may not exist a suitable or practical range of resistivity values for the semiconductor window within which an RF-inductive field can be coupled without undue loss or attenuation. These problems are solved or otherwise disposed of in the analyses that follows immediately below.

The Induction Field's Skin Depth Through the Plasma is Sufficiently Short so that Power is Efficiently Absorbed in the Plasma:

The skin depth of the RF induction field from the overhead coil antenna 145 is less than the ceiling-to-wafer height (e.g., on the order of the wafer diameter or less), so that the power from the coil antenna 145 is inductively coupled to the plasma efficiently. This may be shown for two cases, namely a collisional skin depth in which the plasma source RF angular frequency is much less than the plasma momentum transfer elastic collision frequency, and a collisionless skin depth in which the plasma source RF angular frequency is much greater than the plasma momentum transfer elastic collision frequency.

The collisional skin depth $\delta_c$ of the RF induction field through the plasma is computed as follows:

$$\delta_c = (2\tau_m/\omega)^{1/2} c [(e^2 n_e)/(\epsilon_0 m_e)]^{-1/2}, \qquad (1)$$

where:

$\tau_m = 1.4 \cdot 10^7$ sec$^{-1}$ is the electron-to-neutral momentum transfer collision frequency for an Argon plasma at a temperature of 300° K and a chamber pressure of 5 mTorr, $\omega = 12.57 \cdot 106$ radians/sec is the angular frequency of the induction field RF power source applied to the coil antenna, $c = 3 \cdot 10^8$ meters/sec is the speed of light,
$e = 1.6022 \cdot 10^{-19}$ coulomb is the electron charge,
$n_e = 5 \cdot 10^{17}$ meters$^{-3}$ is the applicable electron density,
$\epsilon_0 = 8.85 \cdot 10^{-12}$ farads/meter is the electrical permittivity of free space, and
$m_e = 9.1095 \cdot 10^{-31}$ kg is the electron mass.

Substituting the foregoing values into Equation 1 yields:

$$\delta_c = 1.1 \text{ cm} \quad (2)$$

as the collisional skin depth.

The collisionless skin depth $\delta_p$ of the RF induction field through the plasma is computed as follows:

$$\delta_p = c[(e^2 n_e)/(\epsilon_0 m_e)]^{-\frac{1}{2}} \quad (3)$$

Substituting the foregoing values into Equation 3 yields:

$$\delta_p = 0.8 \text{ cm} \quad (4)$$

as the collisionless skin depth. Thus, in either case the skin depth of the RF induction field is significantly less than the wafer-to-ceiling height, so that the RF source power is efficiently absorbed by the plasma.

The Induction Field's Skin Depth Through the Silicon Ceiling is Greater Than the Ceiling Thickness, So That It Can Extend Through the Ceiling The RF induction field of the coil antenna 145 has a skin depth in silicon that far exceeds the one-inch (2.54 cm) thickness of the silicon ceiling. Therefore, the RF induction field is sufficiently deep to penetrate the silicon ceiling 110, provided the resistive losses are sufficiently small. This may be closely estimated by computing the skin depth $\delta$ of a uniform plane wave incident on an infinite planar silicon slab:

$$\delta = [\pi f \sigma \mu]^{-\frac{1}{2}},$$

where:
$f = 2$ MHz is the frequency of the RF power source 130 connected to the coil antenna 145,
$\mu = 4\pi \cdot 10^{-7}$ Henries/meter is the magnetic permeability of the silicon slab, and
$\sigma = 3.33 \, \Omega^{-1}$ meters$^{-1}$ is the conductance of the 30 $\Omega$-cm resistivity silicon slab.

Substituting the foregoing values into the-equation for $\delta$ yields:

$$\delta = 0.195 \text{ m},$$

so that the skin depth is about eight times the thickness of the silicon ceiling 110 and therefore the RF induction field has a penetration depth well into the chamber 10, provided the silicon ceiling 110 does not pose a high impedance to the RF induction field.

Figure 2:
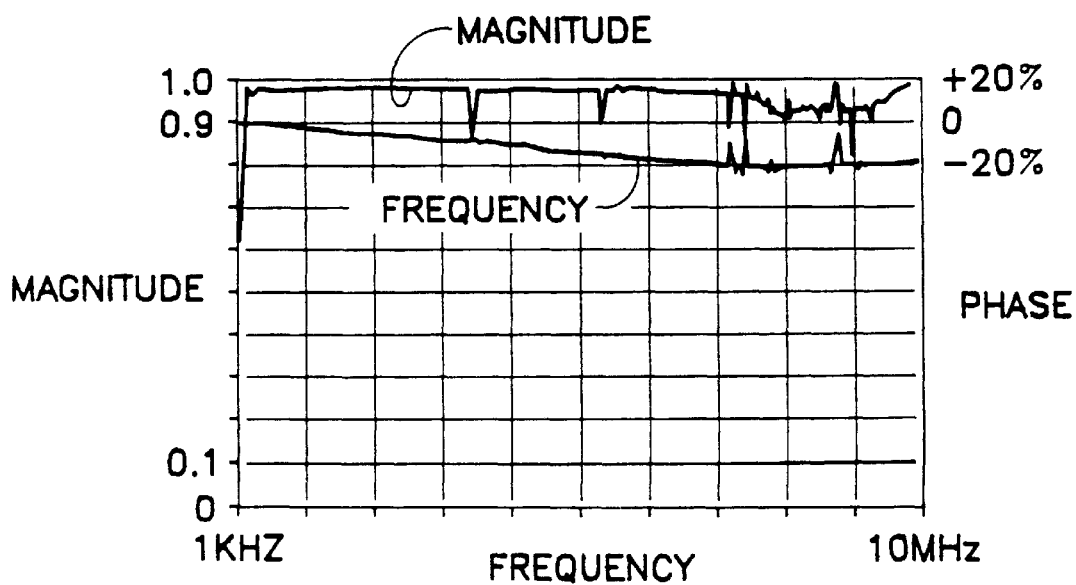
FIG. 2 is a graph illustrating the normalized forward voltage transmission coefficient from a transmitting RF coil to a receiving RF coil with a planar silicon window of FIG. 1 in between the transmitting and receiving RF coils.

The Silicon Ceiling Poses a Low Impedance to the RF Induction Field:

Transmission of an RF induction field through an embodiment of the silicon ceiling 110 consisting of a disc-shaped silicon slab of 30 $\Omega$-cm resistivity at room temperature measuring 13.5 inches in diameter and 1 inch in thickness was tested at room temperature by placing induction coils on opposite sides of the slab, connected the coil on one side of the slab to a variable frequency RF source and connecting the coil on the other side to a multichannel analyzer and then sweeping the frequency of the RF source from 1 kHz to 10 MHz. The resulting output of the multichannel analyzer is illustrated in FIG. 2. For the curve labelled "magnitude", the vertical axis is the ratio of the magnitudes of the received and transmitted signals and extends from a value of unity at the top of the scale and falls in 0.1 unitless increments, while the horizontal axis is frequency and extends from 1 kHz on the left to 10 MHz on the right. For the curve labelled "phase", the vertical axis is the difference between the phase angles of the received and transmitted signals and extends from a value of 20° at the top of the scale and falls in 20° increments. The graph of FIG. 2 clearly indicates that there virtually is no loss of RF power through the silicon slab out to 2 MHz and that there is relatively little loss above 2 MHz.

Figure 3:
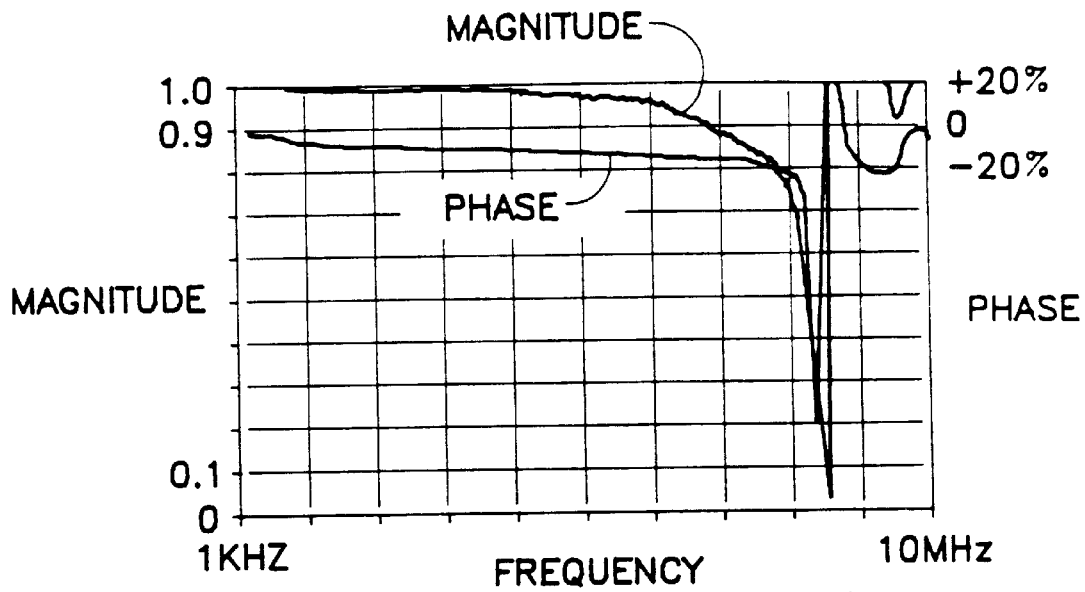
FIG. 3 is a graph illustrating the normalized forward voltage transmission coefficient from a transmitting RF coil to a receiving RF coil with a cylindrical version of the silicon window in between the transmitting and receiving RF coils.

While FIG. 2 illustrates the results obtained with a discoid silicon slab, FIG. 3 illustrates results obtained at room temperature with a cylindrical silicon slab having a 12.3 inch outside diameter, a 1 cm wall thickness. A 5-turn transmission coil was wound around the outside of the cylindrical slab for transmitting RF power into the interior volume surrounded by the cylindrical silicon slab. Measurements were taken at the center of the interior volume from an 8-turn receiver coil having a 2.3 inch outside diameter and a 3 inch length. For the curve labelled "magnitude", the vertical axis is the ratio of the magnitudes of the received and transmitted signals and extends from a value of unity at the top of the scale and falls in 0.1 unitless increments, while the horizontal axis is frequency and extends from 1 kHz on the left to 10 MHz on the right. For the curve labelled "phase", the vertical axis is the difference between the phase angles of the received and transmitted signals and extends from a value of 0° at the top of the scale and falls in 20° increments. The graph of FIG. 2 clearly indicates that there virtually is no loss of RF power through the silicon slab out to 2 MHz and that there is relatively little loss above 2 MHz. Thus, the silicon ceiling 110 is nearly transparent to the RF induction field.

The Silicon Ceiling Poses a Low Impedance to the RF Induction Field Over A Wide Temperature Range The tests described above with reference to FIGS. 2 and 3 were repeated at silicon temperatures of 200° and 250° and similar results were obtained, demonstrating that the temperature of the silicon ceiling 110 may be varied over a wide range to adjust the polymerization and fluorine scavenging processes as desired. However, at temperatures well above 300° C. the silicon ceiling 110 becomes intrinsic and therefore cuts off the RF induction field of the overhead coil antenna 145 from reaching the chamber 100. It is preferable to employ a high resistivity silicon (e.g., 30 $\Omega$-cm at room temperature) in the ceiling 110. Otherwise, using, for example, 0.01 $\Omega$-cm resistivity silicon in the ceiling 110 would require reducing the frequency of the RF induction field to the kHz range or below in order to couple through the silicon ceiling. Another option is to reduce the ceiling thickness.

The Silicon Ceiling Adds Virtually No Losses in the Return Path of the Bias RF Power Source That the RF power loss occasioned by insertion of the silicon ceiling 110 in the RF return path for the bias power generator 130 is low may be seen by computing the resistance of a silicon slab to a current flux normal to the slab's flat surface assuming a skin depth much greater than the slab thickness and assuming the presence of a perfect conductor ground plane on the back of the silicon slab. This resistance is shown to be far less than the measured driving point RF impedance at the wafer pedestal 120, so that the insertion of the silicon ceiling causes only a fractional increase in the overall bias RF power loss.

The resistance $R_{slab}$ of the silicon slab to a current flux normal to the surface is computed as follows:

$$R_{slab} = \Gamma t (d/2)^{-2}/\pi,$$

where:
- t=0.0254 m is the slab thickness,
- d=0.318 m is the slab effective diameter exposed to the current flux, and
- $\Gamma$=0.30 $\Omega$-m is the resistivity of the 30 $\Omega$-cm resistivity silicon at room temperature.

Substituting the foregoing values into the equation for $R_{slab}$ yields for the slab resistance:

$$R_{slab} = 0.096 \Omega.$$

The driving point impedance Z at the wafer pedestal 120 has been measured in typical parallel electrode plasma reactor of the type illustrated in FIG. 1 (with a 2.0 MHz plasma power source RF induction field from a coil antenna and an applied RF bias on the pedestal of 1.8 MHz) as 38.7$\Omega$ at an angle of 50.1°. The real part of this driving point impedance is:

$$Re(Z) = 38.7\Omega \cos(50.1° (180/\pi)) \approx 24\Omega.$$

The fractional increase in RF power loss occasioned by the insertion of the silicon ceiling is:

$$R_{slab}/Re(z) = 0.096/24 = 0.004,$$

which is a very small fraction. Thus, the insertion of a silicon slab into the RF return path of the RF bias power generator 130 adds only a negligible amount of resistance.

The Plasma DC Sheath Thickness is Sufficiently Short to Avoid Shorting Between the Ceiling and the Wafer There is a sheath at the edge of the plasma across which the ion density falls from the plasma ion density value to zero. If the sheath at the wafer surface meets the sheath at the chamber ceiling, there is no plasma in the chamber. The high voltage plasma DC sheath thickness, s, is computed as follows:

$$s = (2 1/2_{/3})[(\epsilon_0 \cdot T_e)/(e \cdot n_e)]^{1/2} (2 \cdot V_0/T_e)^{3/4},$$

where:
- $\epsilon_0 = 8.85 \cdot 10^{-14}$ farads/cm is the electrical permittivity of free space,
- $T_e = 5$ eV is the mean electron temperature assuming a Maxwellian distribution,
- $e = 1.6022 \cdot 10^{-19}$ coulombs is the electron charge,
- $n_e = 5 \cdot 10^{11}$ cm$^{-3}$ is the average electron density in the bulk plasma adjacent the sheath, and
- $V_0 = 300$ Volts is the DC voltage across the plasma sheath.

Substituting the foregoing values into the equation for s yields:

$$s = 0.04 \text{ cm},$$

so that the plasma sheath thickness is only a small fraction of the wafer-to-ceiling distance and therefore there is no risk of the top and bottom sheaths intersecting.

There is a Wide Range of Resistivity Values for a Semiconductor Window Electrode Through Which RF Power May Be Coupled With Low Attenuation Losses:

In order to ascertain a range of resistivity values of a semiconductor window through which an inductive RF field is to be coupled or transmitted with low attenuation losses, a thickness of the window must be selected, the frequency of the RF inductive field must be selected and a minimum ratio r of RF skin depth to window thickness must be specified. In a first example, the window thickness is T=0.0254 meter, the RF frequency f is $2 \cdot 10^6$ s$^{-1}$ and the minimum ratio of RF skin depth to window thickness is r=5. For this first example, the minimum resistivity for the semiconductor window is calculated assuming:
- $\mu = 4\pi \cdot 10^{-7}$ Henries/meter is the magnetic permeability of the semiconductor window,
- $S = r \cdot T$ is the skin depth of the RF induction field in the semiconductor window. The minimum resistivity $\Gamma_{min}$ is then computed by the following equation:

$$\Gamma_{min} = S^2 \cdot \pi \cdot f \cdot \mu$$

Substituting the values given above into this equation, the minimum resistivity for this first example is:

$$\Gamma_{min} = 12.735 \; \Omega\text{-cm}.$$

Next, the maximum resistivity must be computed for this first example. For purposes of the following analysis, it will be assumed that there is a ground plane transmissive to the RF induction field behind the semiconductor window. The real part of the RF bias plasma load impedance must be defined, the acceptable loss L must be defined and the effective plasma interaction diameter d of the semiconductor window must be defined. In this first example, the real part R of the RF bias plasma impedance is:
- R=25$\Omega$,
- the acceptable loss (normalized at 100%=1) is L=0.01,
- the effective plasma interaction diameter of the semiconductor window is d=0.318, from which the effective plasma interaction area A is computed as A=$\pi$ (d/2)$^2$.

The maximum resistivity $\Gamma_{max}$ is given by the following equation:

$$\Gamma_{max} = L \cdot R \cdot A \cdot T.$$

Substituting the foregoing values into this equation yields:

$$\Gamma_{max} = 78.172 \; \Omega\text{-cm}.$$

Therefore, in this first example, the resistivity of the semiconductor may lie anywhere within the range between 12.735 $\Omega$-cm and 78.172 $\Omega$-cm.

In a second example, the semiconductor window thickness is reduced by a factor of ten so that T=0.00254 meters. In this case, $\Gamma_{min}$ is reduced to 0.127 $\Omega$-cm, while $\Gamma_{max}$ increases to 781.719 $\Omega$-cm.

In a third example, the parameters of the second example are repeated except that the frequency of the RF induction field is reduced to 100 kHz (f=$0.1 \cdot 10^6$ s$^{-1}$). In this case, $\Gamma_{min}$ is reduced to 0.006 $\Omega$-cm, while $\Gamma_{max}$ is unchanged (from the second example) at 781.719 $\Omega$-cm.

In a fourth example, the parameters of the first example are adopted except that the frequency of the RF induction field is increased to 10 MHz (f=$10 \cdot 10^6$ s$^{-1}$). In this case, $\Gamma_{min}$ is increased to 63.675 $\Omega$-cm, while $\Gamma_{max}$ is decreased to 78.172 $\Omega$-cm, thus narrowing the range somewhat relative to the other examples.

Thus, the useful range of resistivity values is broad. If the semiconductor window is a 2.54 cm-thick silicon slab and the RF frequency of the induction field is 2 MHz, then the preferred resistivity is 30 $\Omega$-cm.

Figure 4:
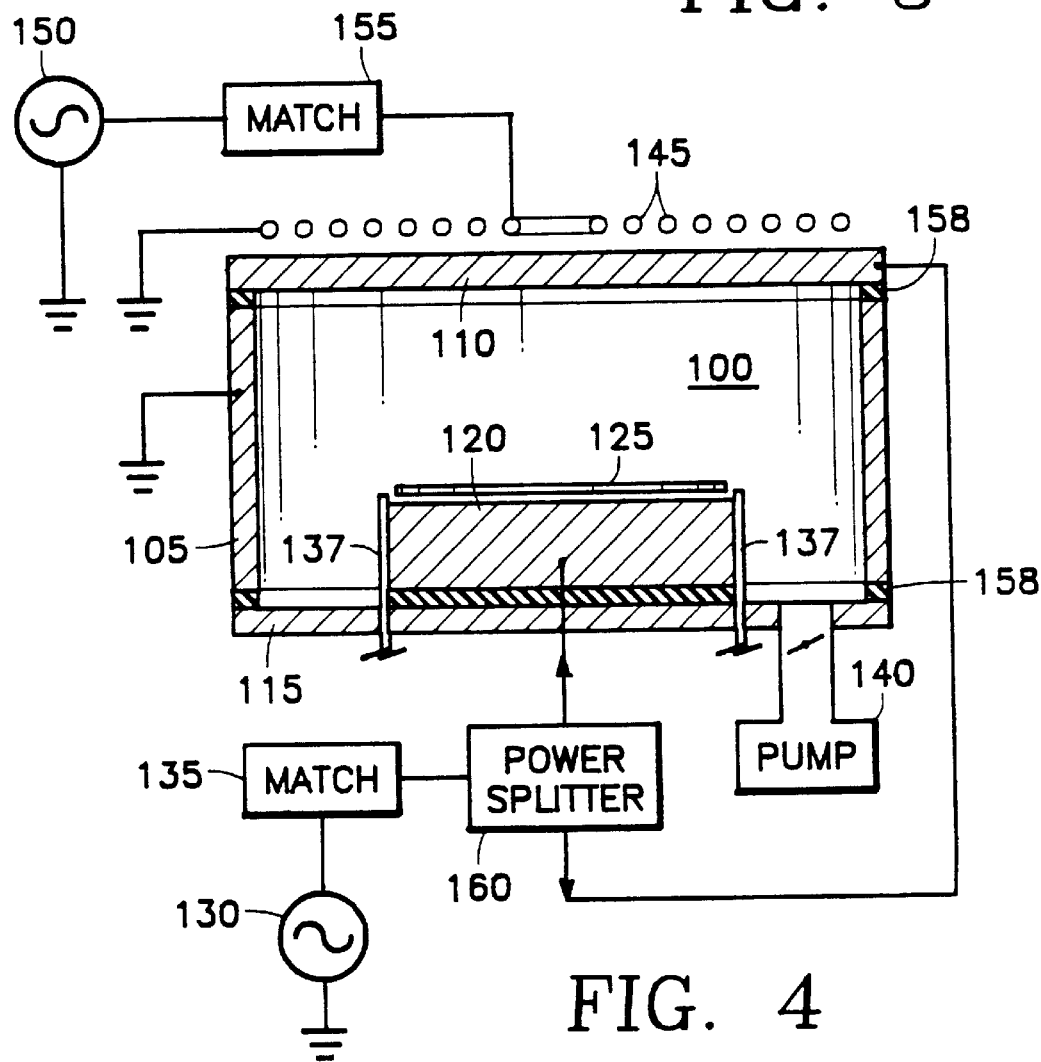
FIG. 4 illustrates an embodiment of the invention employing power splitting between the silicon ceiling and the wafer pedestal.
Figure 5:
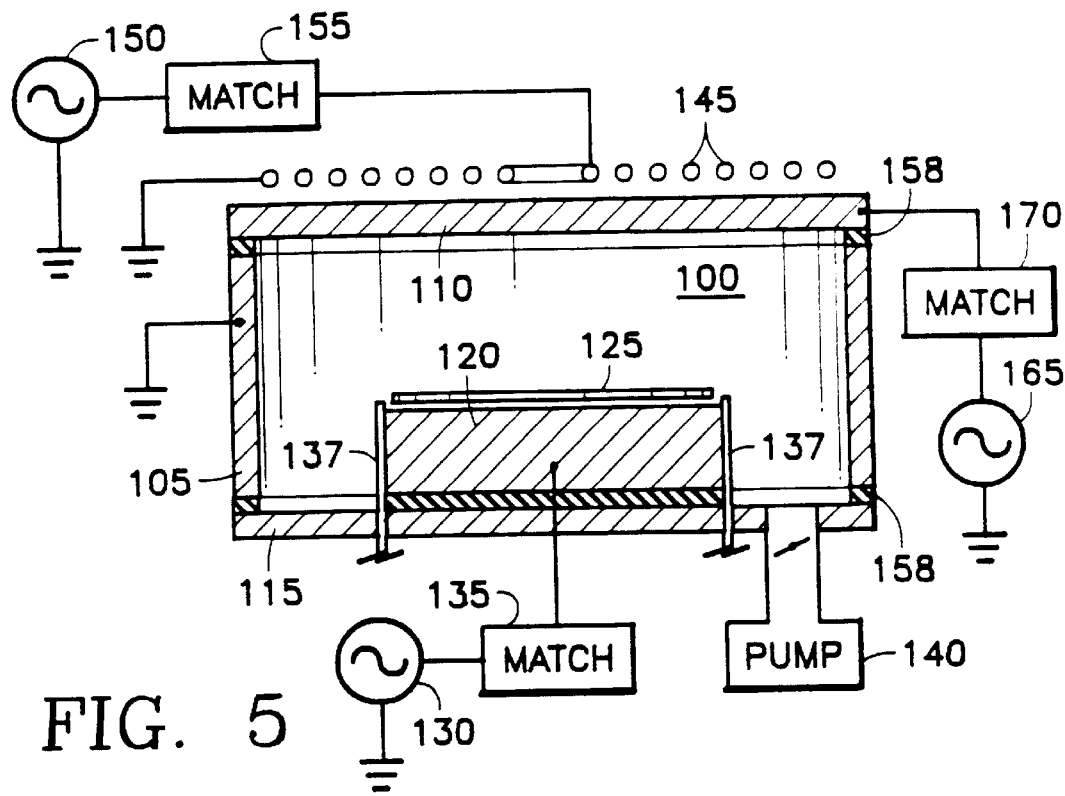
FIG. 5 illustrates an embodiment of the invention employing separate RF power sources to drive the wafer pedestal, the overhead induction coil and the silicon ceiling.
Figure 6:
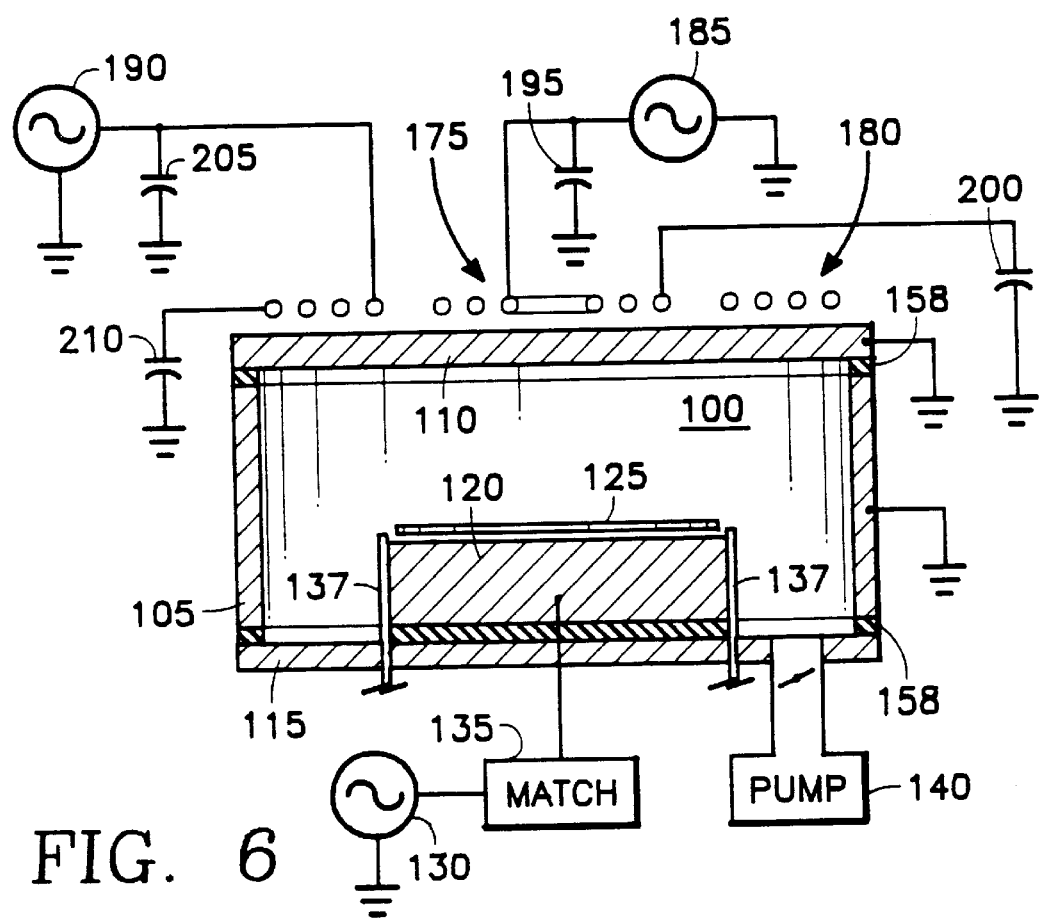
FIG. 6 illustrates an embodiment of the invention in which the overhead inductive antenna is divided into separately powered concentric inner and outer windings.

Other Embodiments of the Reactor:

While the silicon ceiling 110 is grounded in the preferred embodiment of FIG. 1, in the embodiment FIG. 4 power from the RF generator 130 is split by a power splitter 160 between the pedestal 120 and the silicon ceiling 110. In order to provide a ground return path, the side wall 105 may be a grounded conductor. In FIG. 5, the silicon ceiling 110 is driven independently from the wafer pedestal 120 by a separate RF power generator 165 through a conventional impedance match circuit 170. While the embodiment of FIG. 1 employs a single coil as the inductor antenna 145, in the embodiment of FIG. 6 the inductor antenna 145 is comprised of plural (in this case, two) independently driven coils, namely an inner coil 175 overlying the wafer center and an outer coil 180 overlying the wafer periphery. In the implementation of FIG. 6, the inner and outer coils 175, 180 are planar concentric coils driven by separate plasma source power generators 185, 190. The advantage is that plasma variations along the radius of the chamber 100 can be compensated by selecting different power levels from the two RF generators 185, 190. In a prototype of the embodiment of FIG. 6, the inner and outer coils consisted of nine turns each. A fixed impedance match was realized using parallel and series capacitors 195, 200 connected to the input and return ends, respectively, of the inner coil 175 and parallel and series capacitors 205, 210 connected to the input and return ends, respectively, of the outer coil 180. In a working example, the plasma source RF power generator 155 produced 2600 Watts at 2.0 MHz, the bias RF power generator 130 produced 1600 Watts at 1.8 MHz, $C_2F_6$ gas was pumped into the chamber 100 at a rate of 30 sccm with 100 cc of Argon, the chamber pressure was maintained at 6.5 mTorr and the temperature of the silicon ceiling 110 was maintained at 200° C. Under these conditions, the parallel and series capacitors 195, 200 of the inner coil 175 had capacitances of 8.19699 nanoFarads and 2.12631 nanoFarads, respectively, while the parallel and series capacitors 205, 210 of the outer coil 180 had capacitances of 4.45572 nanoFarads and 1.09085 nanoFarads, respectively. By shorting one of the inner and outer coils 175, 180, the input impedance of the other could be measured. Indeed, with the foregoing capacitances being selected, the complex impedance of the inner coil 175 was measured as 51Ω at a complex plane angle of −12° and the complex impedance of the outer coil 180 was measured as 51.8Ω at a complex plane angle of −8.6°. Thus, their impedance nearly matched the standard 50Ω output of the RF generators 185 and 190.

Figure 7:
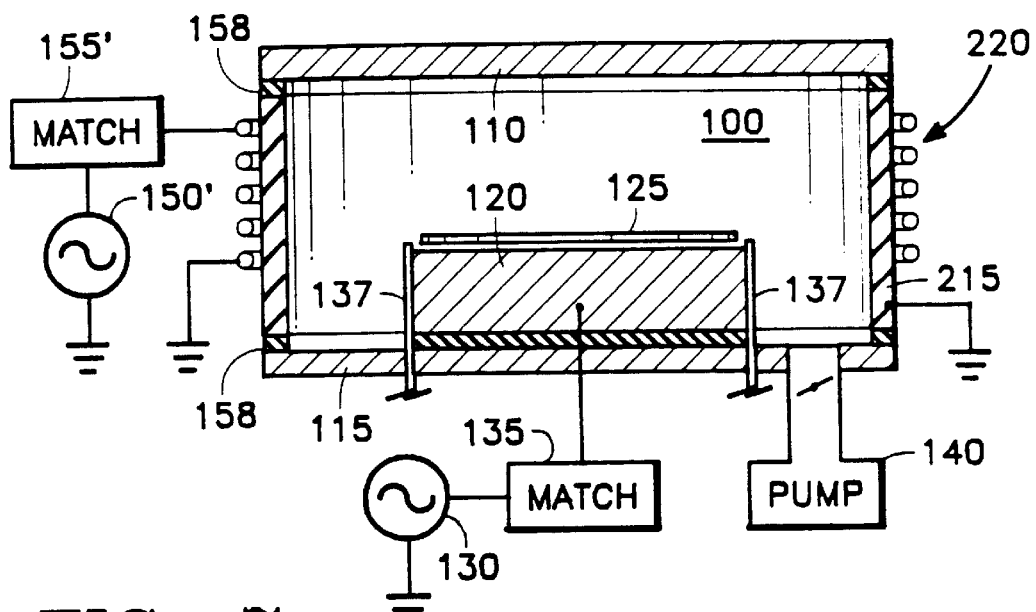
FIG. 7 illustrates an embodiment employing a side inductive antenna wound around a cylindrical silicon side wall.
Figure 8:
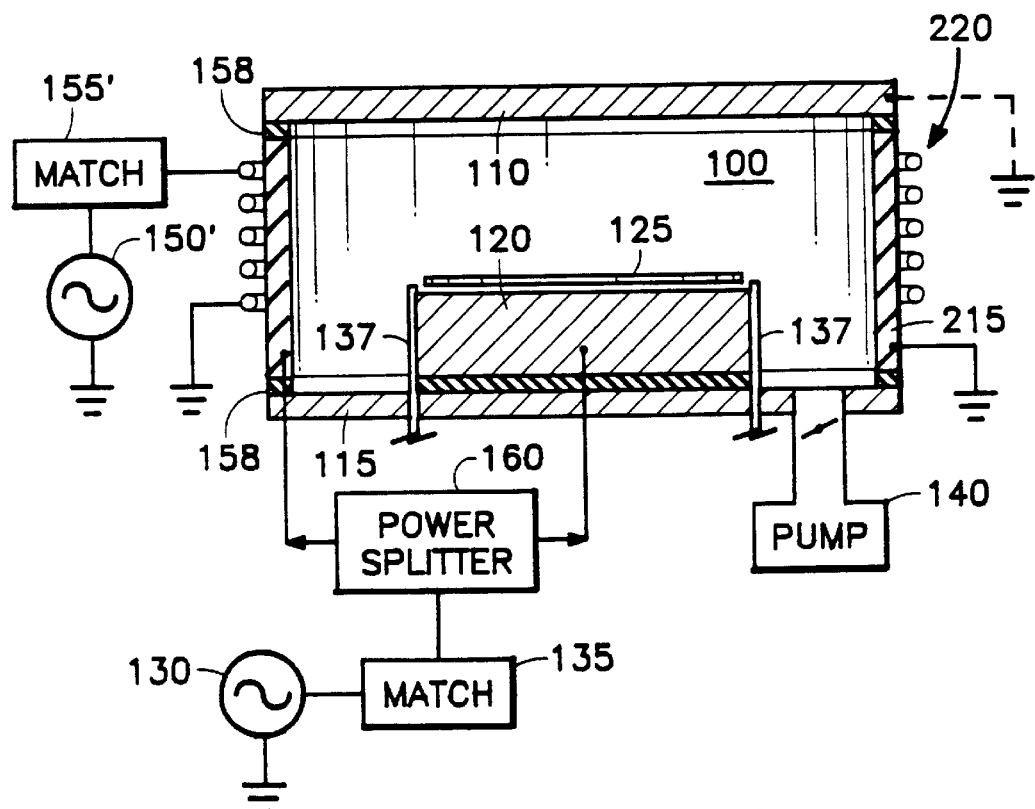
FIG. 8 illustrates an embodiment corresponding to that of FIG. 7 in which power from a single RF power source is split between the silicon side wall and the wafer pedestal.
Figure 9:
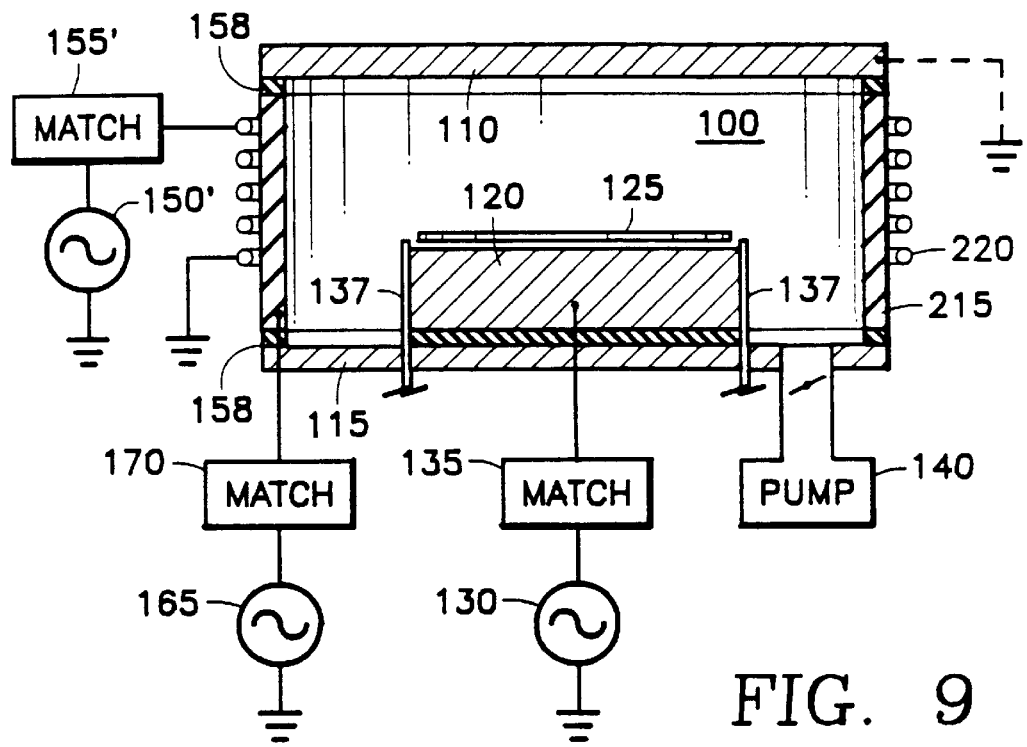
FIG. 9 illustrates and embodiment employing separate RF generators driving the silicon side wall, the wafer pedestal and the inductive side antenna.
Figure 10:
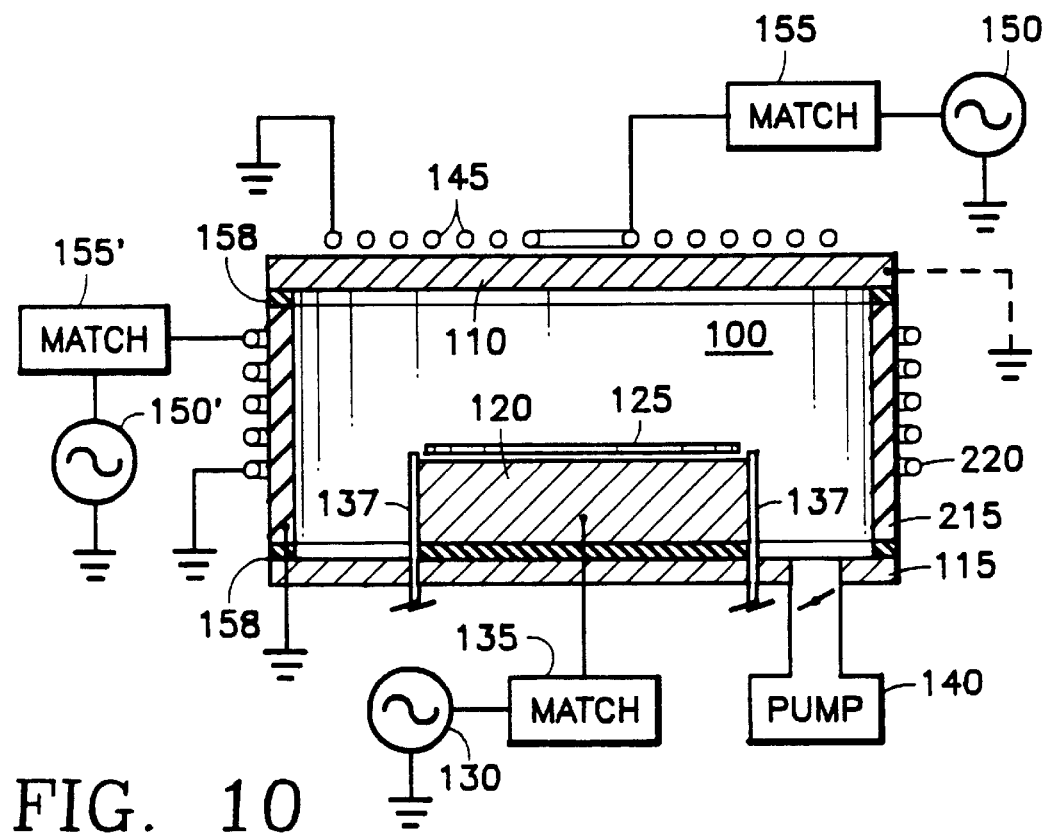
FIG. 10 illustrates and embodiment combining the silicon ceiling and overhead inductive antenna with the silicon side wall and the inductive side coil wound thereabout.
Figure 11:
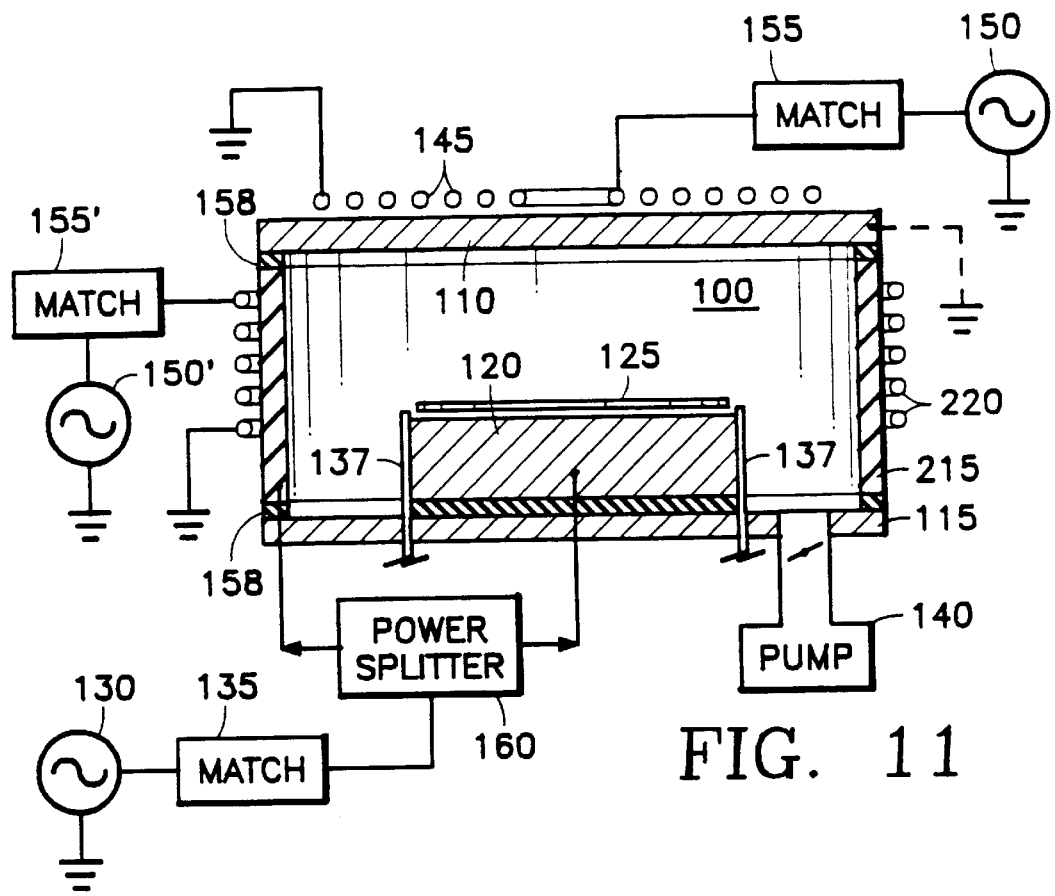
FIG. 11 illustrates an embodiment corresponding to that of FIG. 10 employing power splitting between the silicon side wall and the wafer pedestal.
Figure 12:
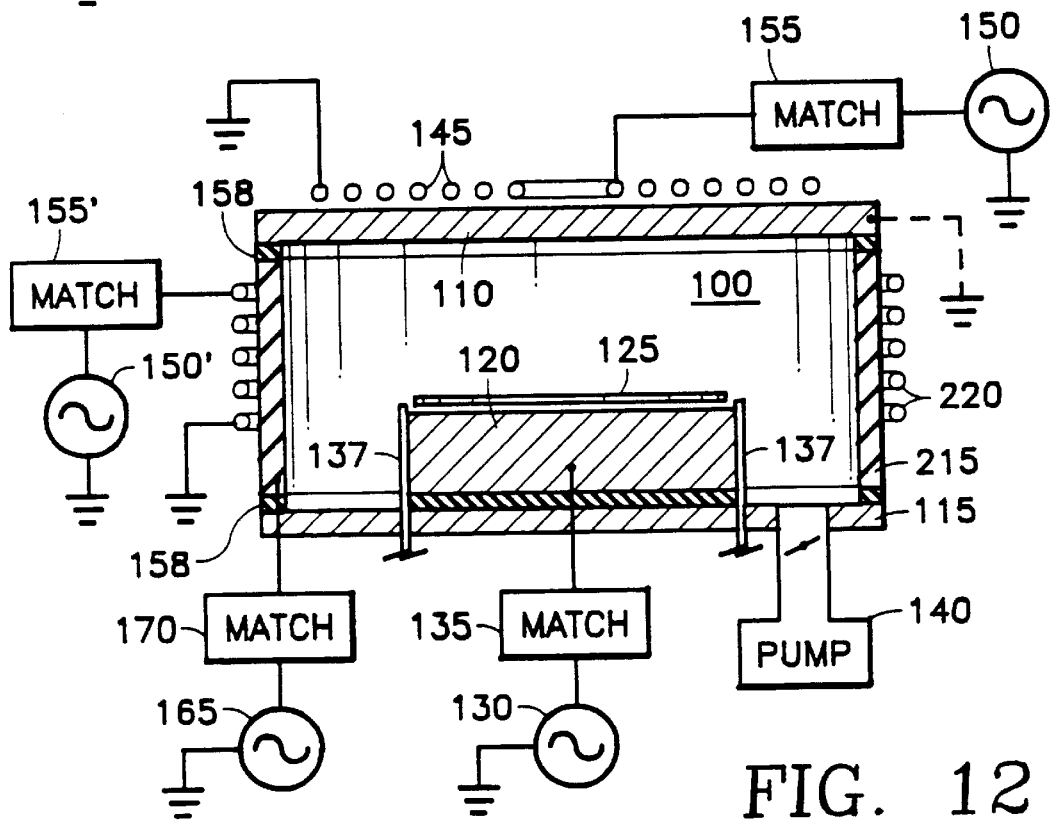
FIG. 12 illustrates an embodiment in which the silicon ceiling, the silicon side wall, the overhead inductive antenna and the side inductive antenna are separately driven with RF power.

In the embodiment of FIG. 7, the side wall 105 is replaced by a silicon side wall 215 and inductive coupling is provided by a coil inductor 220 wound around the exterior of the silicon side wall 215 and connected to the plasma source power generator 150' through the impedance match circuit 155'. In FIG. 7, the silicon side wall 215 is grounded. As in the embodiment of FIG. 4, FIG. 8 illustrates that the power splitter 160 may spilt RF power from the bias generator 130 between the pedestal 120 and the silicon side wall 215. As in the embodiment of FIG. 5, FIG. 9 shows how the silicon side wall 215 may be independently powered by the separated RF generator 165 through the match circuit 170. FIG. 10 shows how the silicon ceiling 110 and overhead coil antenna 145 of FIG. 1 may be combined with the silicon side wall 215 and side coil antenna 220 of FIG. 7. FIG. 11 illustrates how the power splitter 160 of FIG. 8 may be employed in the embodiment of FIG. 10 to split power from the bias generator 130 between the side wall 215 and the pedestal 120. FIG. 12 illustrates the combination of the embodiment of FIG. 9 with the overhead coil antenna 145 and silicon ceiling 110 of FIG. 1.

Figure 14:
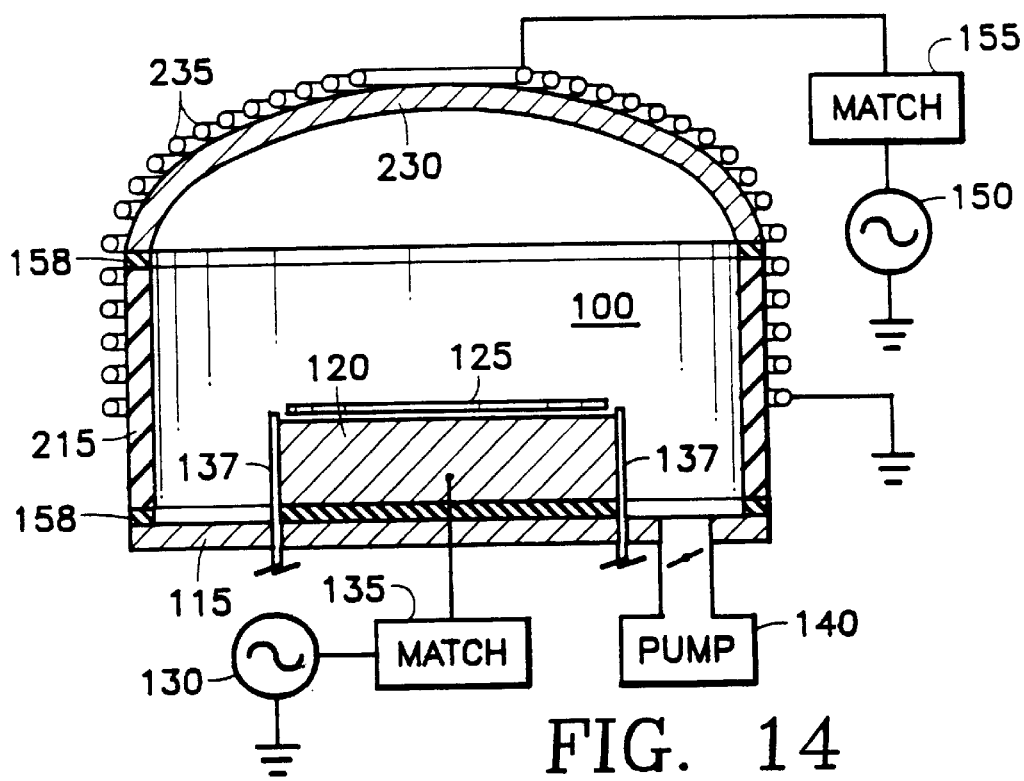
FIG. 14 illustrates an embodiment having a dome-shaped silicon ceiling and an overlying inductive antenna having a dome-shaped portion overlying the ceiling and continuing into a cylindrical portion wrapped around the cylindrical side wall.
Figure 15:
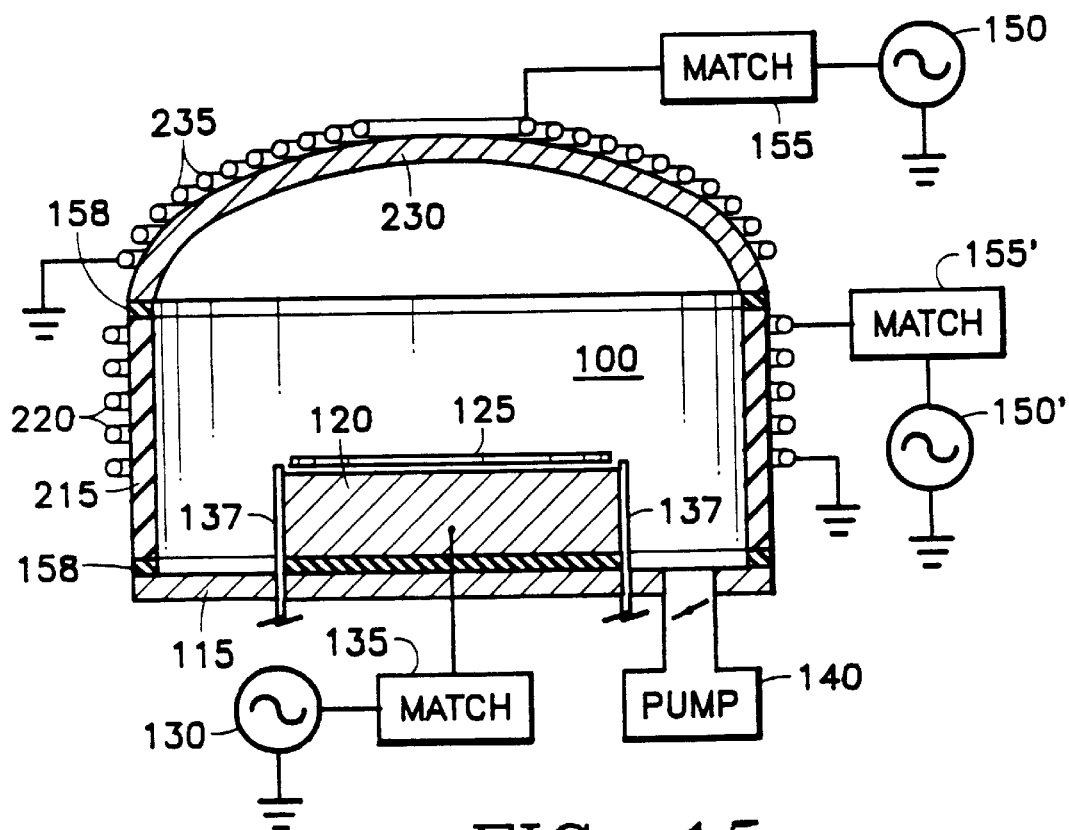
FIG. 15 illustrates and embodiment corresponding to that of FIG. 14 but in which the dome-shaped and cylindrical portions of the inductive antenna are isolated from one another and separately driven with RF power.

FIGS. 13A, 13B, 13C and 13D illustrate modifications of the embodiments of FIGS. 1, 4, 5 and 6, respectively, in which the planar silicon ceiling 110 and planar inductive coil antenna 145 have been replaced by a dome-shaped silicon ceiling 230 and a dome-shaped coil antenna 235, respectively. In one implementation, the dome-shaped coil antenna 235 is wound in a helix. FIG. 14 illustrates an embodiment in which the dome-shaped coil antenna 235 extends from near the top of the dome-shaped ceiling 230 and past the bottom of the dome-shaped ceiling 230 to wind around the side wall 105. In this case, at least that portion of the side wall 105 surrounded by the bottom portion of the coil antenna 235 would have to be a non-conductor such as quartz or a semiconductor such as silicon. FIG. 15 illustrates an embodiment corresponding to that of FIG. 10 in which the flat silicon ceiling 110 and the flat coil antenna 145 are replaced by the dome-shaped silicon ceiling 230 and the dome-shaped coil antenna 235 of FIG. 13A.

Figure 16:
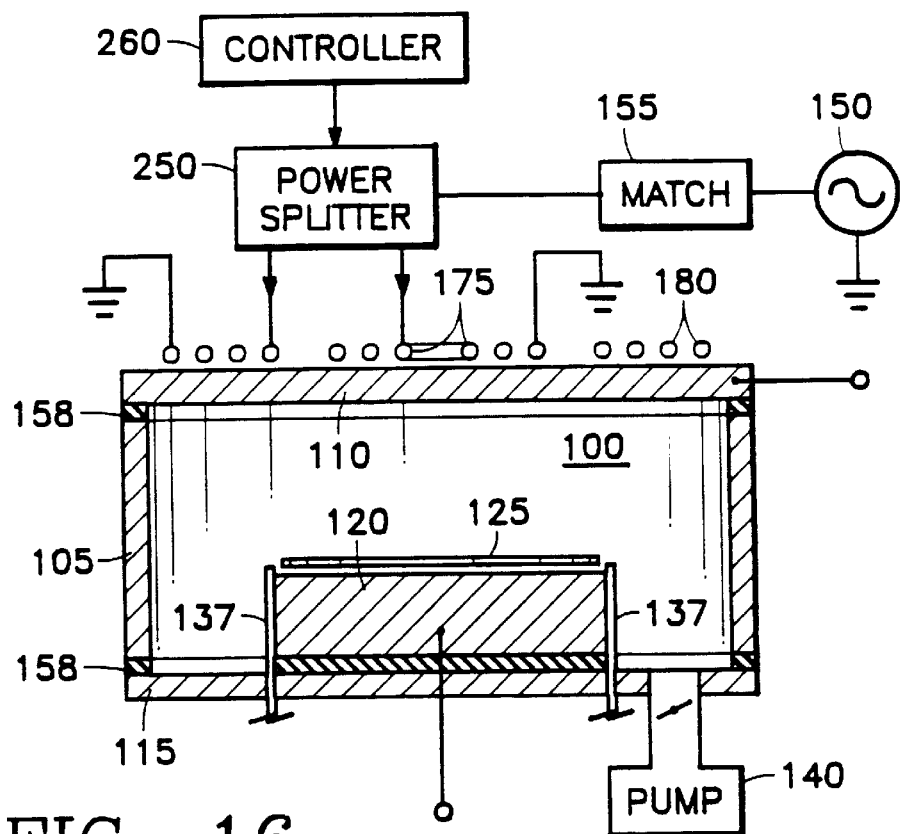
FIG. 16 illustrates an embodiment corresponding to that of FIG. 6 in which power from a common RF generator is split between the inner and outer inductive antennas.
Figure 18:
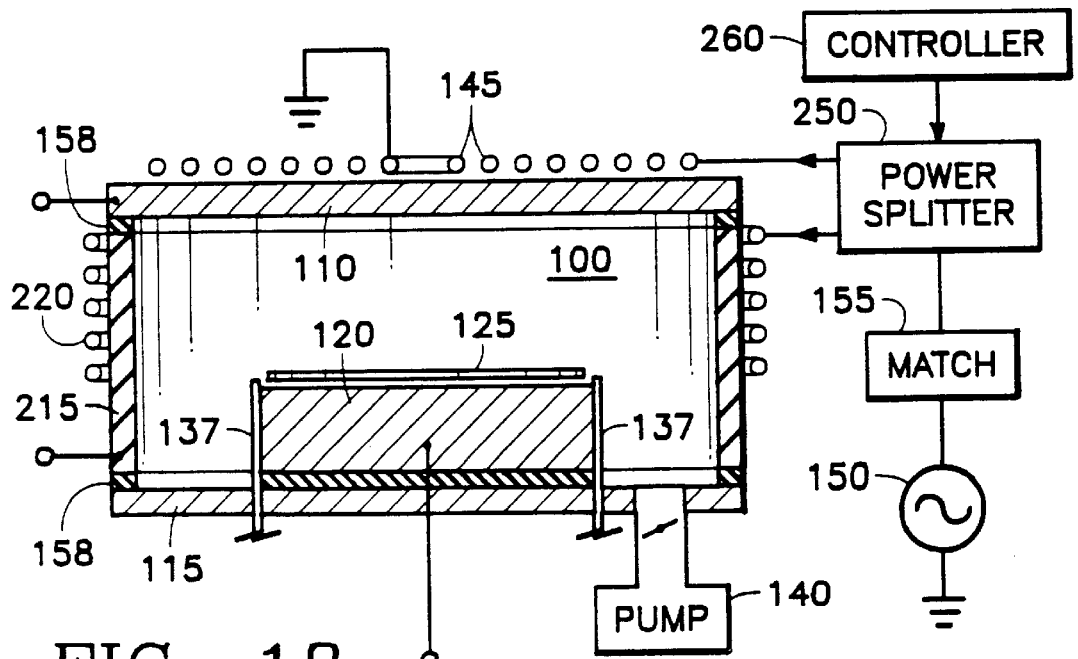
FIG. 18 illustrates an embodiment corresponding to that of FIG. 10 in which power from a common RF generator is split between the overhead inductive antenna and the side inductive antenna.
Figure 17A:
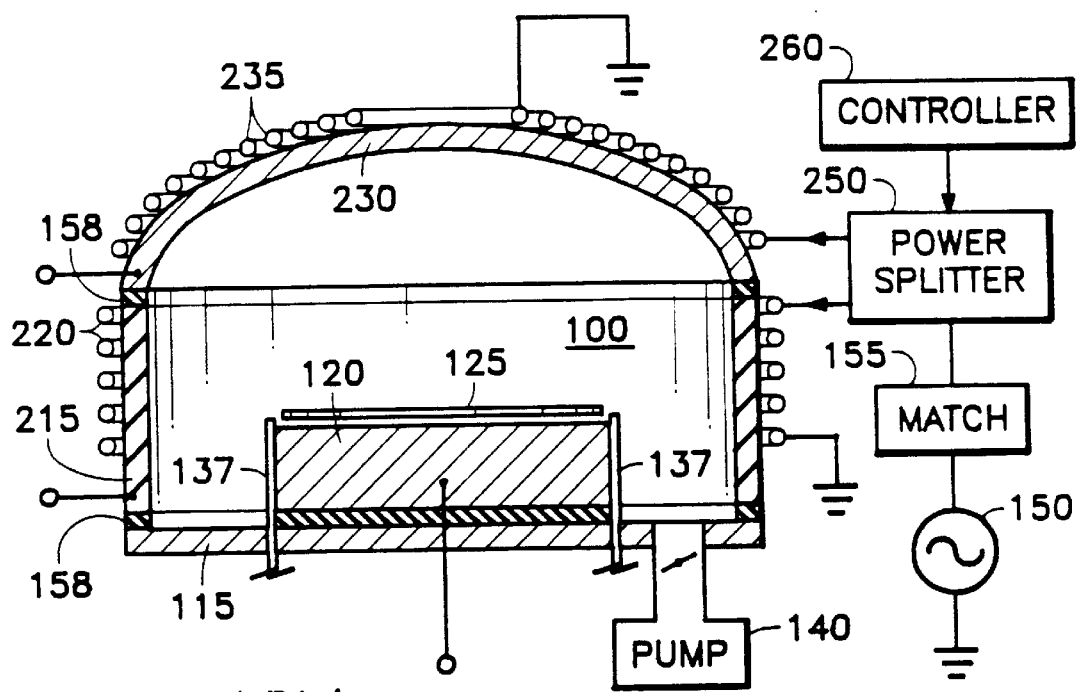
FIG. 17A illustrates an embodiment corresponding to that of FIG. 15 in which power from a common RF generator is split between the dome-shaped and cylindrical inductive antenna portions.
Figure 17B:
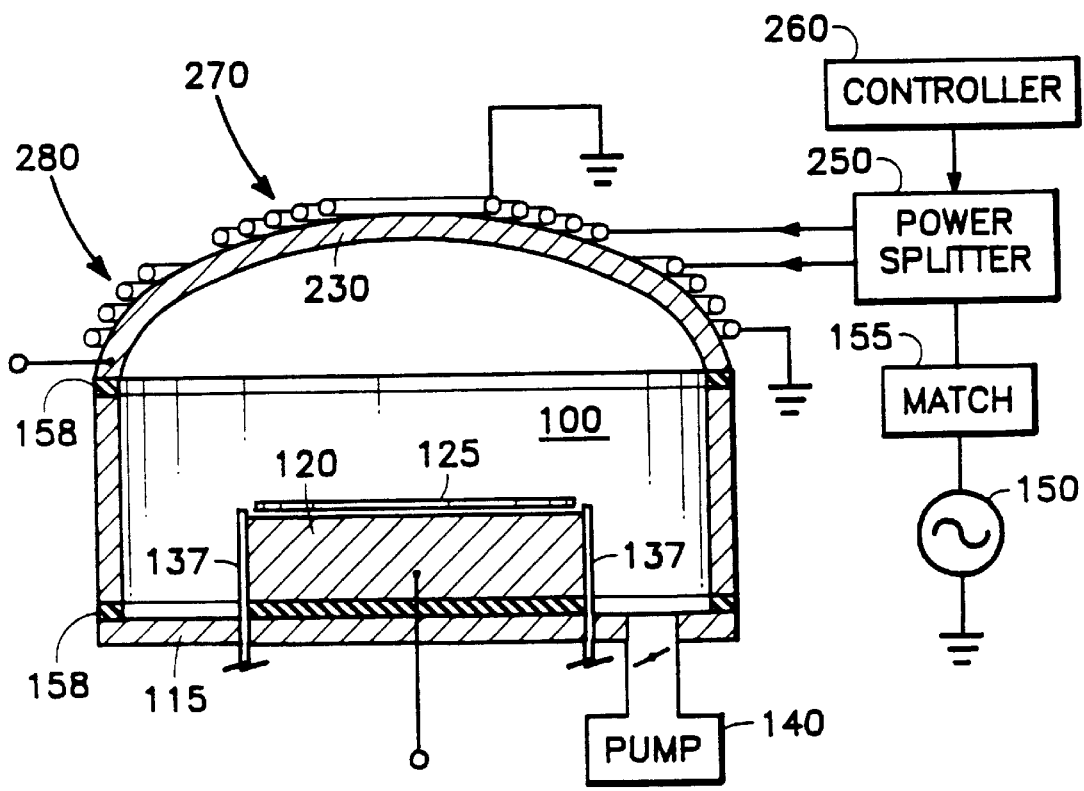
FIG. 17B illustrates an embodiment having separate inner and outer dome-shaped inductive antennas between which power from a common RF generator is split.

FIG. 16 illustrates how a power splitter 250 can be employed to split power from the plasma source RF power generator 150 between the inner and outer coil antennas 175, 180 overlying the silicon ceiling 110 of FIG. 6. An RF power splitter is disclosed in U.S. Pat. No. 5,349,313 to Collins et al. As disclosed in the co-pending Collins et al. patent application incorporated by reference above, a controller 260 can vary the power ratio between the inner and outer coil antennas 175, 180 to compensate for any difference between the plasma ion densities over the wafer center and the plasma ion density over the wafer periphery. FIG. 17A illustrates an embodiment corresponding to that of FIG. 15 in which the power splitter 250 splits RF power from the plasma source power generator 150 between the side coil 220 and the dome-shaped overhead coil 235. FIG. 17B illustrates an embodiment with the dome-shaped silicon ceiling 230 having an inner (upper) dome-shaped coil 270 and an outer (lower) dome-shaped coil 280. The power splitter 250 splits RF power from the plasma source power generator 150 between the inner and outer dome-shaped coils 270, 280. The silicon ceiling 230 and the wafer pedestal 120 of FIG. 17B may be connected in accordance with any one of the embodiments of FIGS. 13A, 13B or 13C. FIG. 18 shows how the power splitter 250 can split power from the plasma source RF power generator 150 between the overhead coil antenna 145 and the side coil antenna 220 of FIG. 10.

Figure 19:
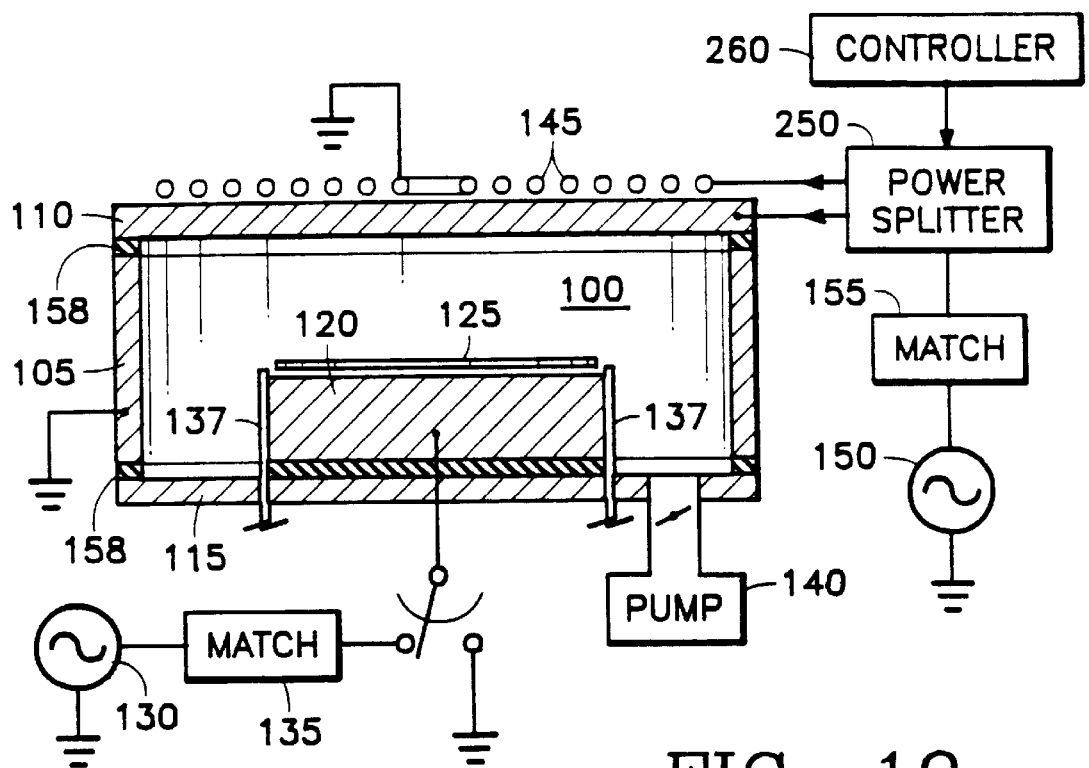
FIG. 19 illustrates an embodiment corresponding to that of FIG. 1 in which power from a common RF generator is split between the overhead inductive antenna and the silicon ceiling.
Figure 20:
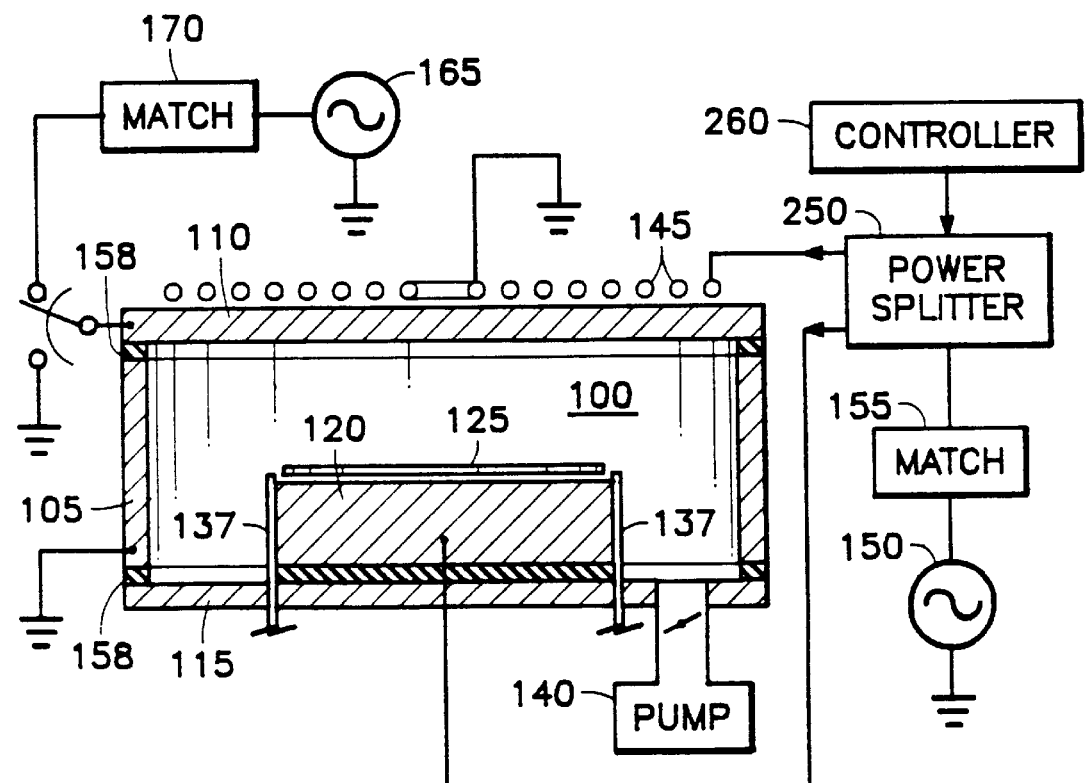
FIG. 20 illustrates an embodiment corresponding to that of FIG. 1 in which power from a common RF generator is split between the overhead inductive antenna and the wafer pedestal.
Figure 21:
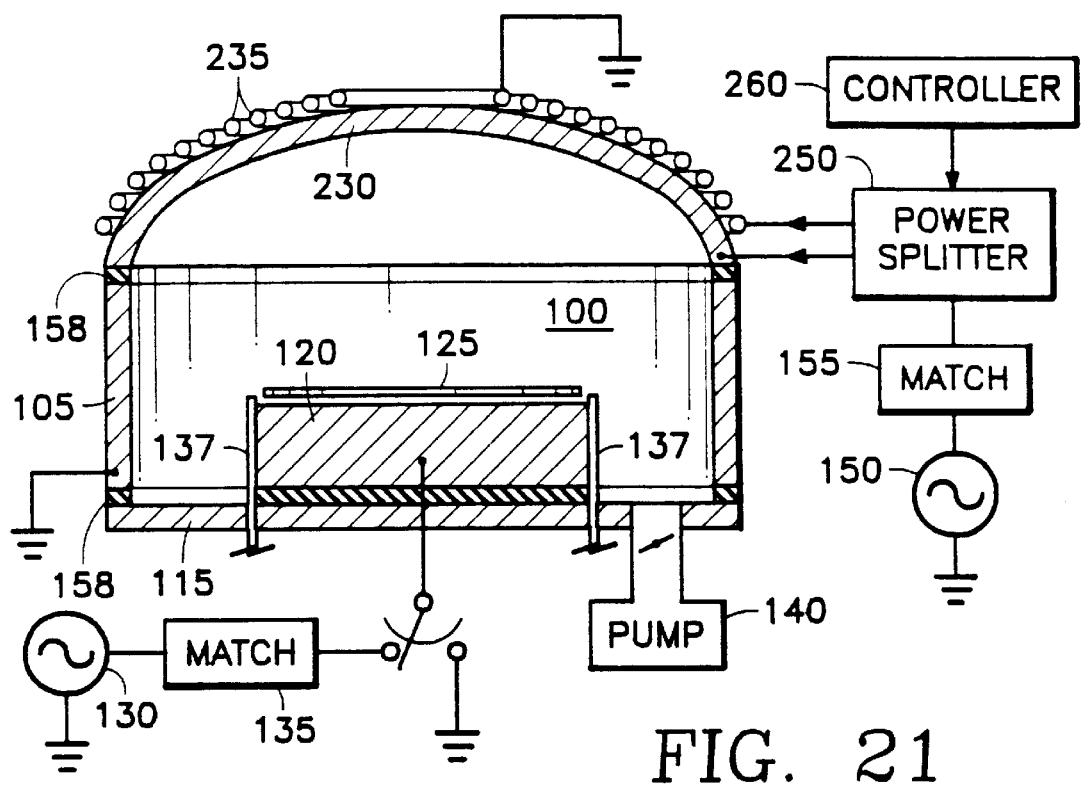
FIG. 21 illustrates an embodiment corresponding to that of FIG. 13A having a dome-shaped ceiling in which power from a common RF generator is split between the overhead inductive antenna and the dome-shaped silicon ceiling.
Figure 22:
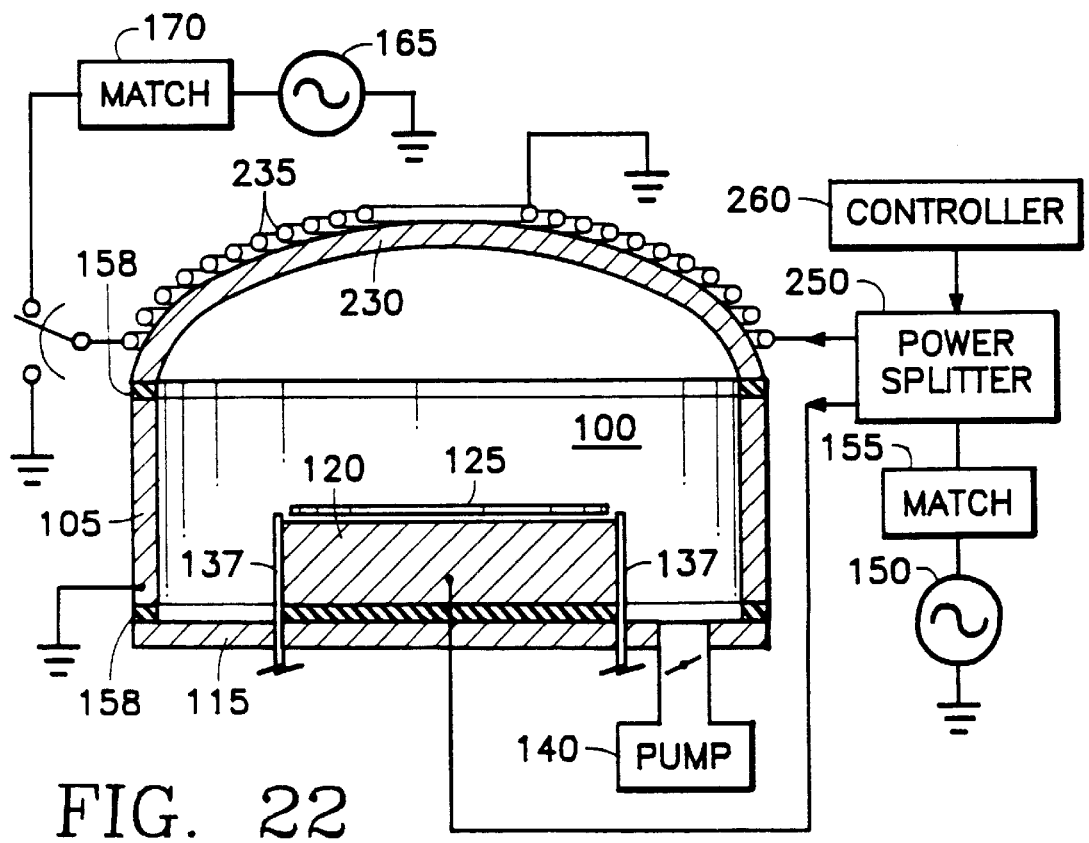
FIG. 22 illustrates an embodiment corresponding to that of FIG. 13A having a dome-shaped ceiling in which power from a common RF generator is split between the overhead inductive antenna and the wafer pedestal.

FIG. 19 illustrates how the power splitter 250 can split power from the plasma source RF generator 150 between the overhead coil antenna 145 and the silicon ceiling 110. In the embodiment of FIG. 19, the wafer pedestal 120 can either be grounded are connected to the bias RF power generator 130 through the impedance match circuit 135. FIG. 20 illustrates how the power splitter 250 can split power from the RF generator 150 between the overhead coil antenna 145 and the wafer pedestal 120. In the embodiment of FIG. 20, the silicon ceiling 110 can either be grounded or can be connected to the separate RF power generator 165 through the match circuit 170. FIG. 21 is an embodiment corresponding to that of FIG. 19 but employing the dome-shaped silicon ceiling 230 and the dome-shaped coil antenna 235 in lieu of the flat silicon ceiling 110 and the planar coil antenna 145 of FIG. 19. FIG. 22 is an embodiment corresponding to that of FIG. 20 but employing the dome-shaped silicon ceiling 230 and the dome-shaped coil antenna 235 in lieu of the flat silicon ceiling 110 and the planar coil antenna 145 of FIG. 20.

Figure 23:
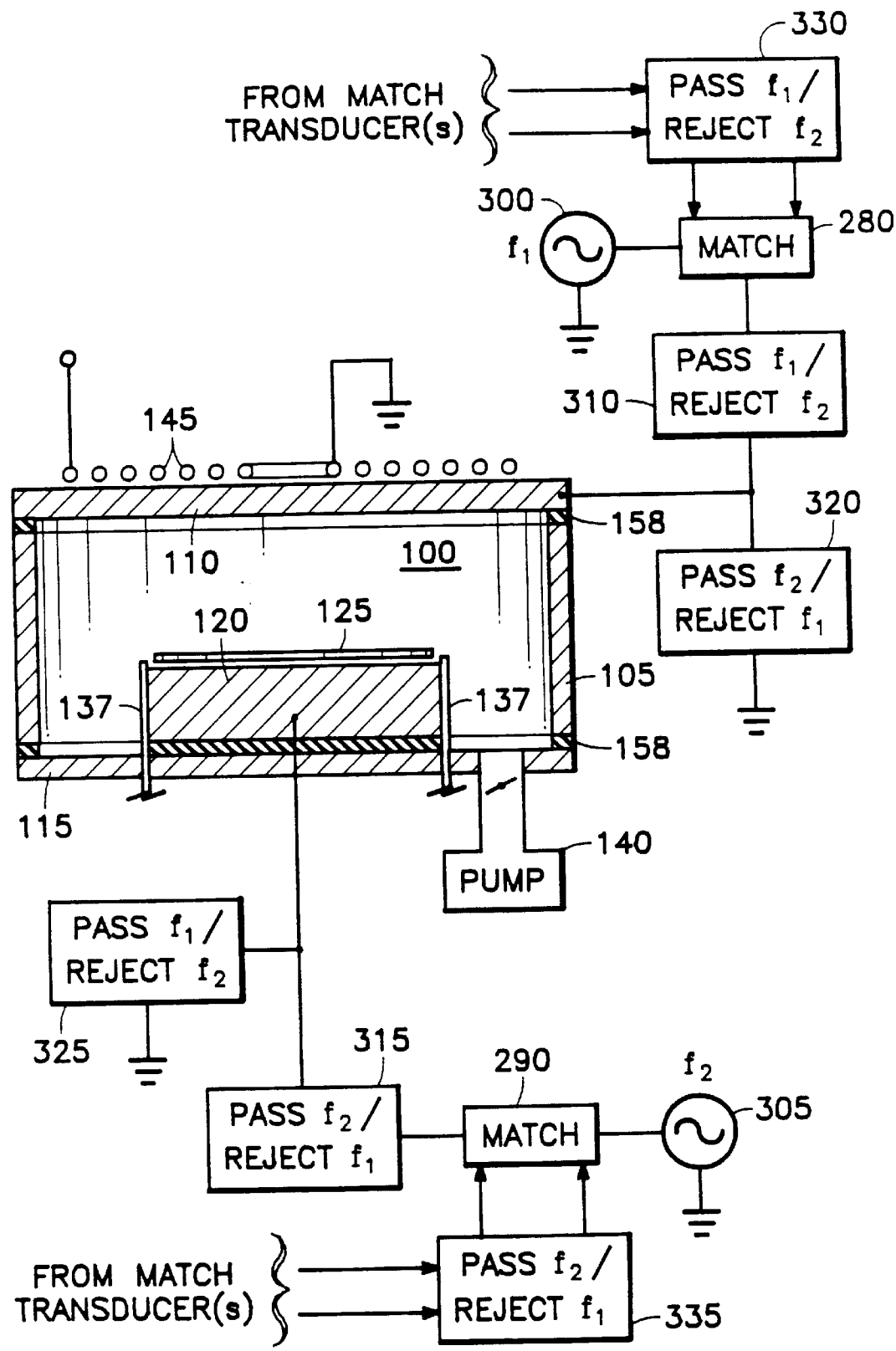
FIG. 23 illustrates an embodiment in which the wafer pedestal and the silicon ceiling are separately driven with RF power and each serves as the counter electrode for the other.

FIG. 23 illustrates an embodiment in which the silicon ceiling 110 and the wafer pedestal 120 are each the RF ground return for the other. The ceiling and pedestal 110, 120 are driven through respective impedance match circuits 280, 290 by respective independent RF power generators 300, 305 of respective RF frequencies $f_1$ and $f_2$ through respective RF isolation filters 310, 315 and are each connected to ground through respective ground RF filters 320, 325. The isolation filters 310, 315 prevent the RF energy from either one of the RF power generators 300, 305 from reaching the other. The ground RF filters 320, 325 permit each one of the ceiling and pedestal 110, 120 to return to ground the RF power radiated across the chamber 100 by the other. At the same time, the ground RF filters 320, 325 prevent the RF power applied to either one of the ceiling and pedestal 110, 120 from being shorted directly to ground. Specifically, the isolation filter 310 connected between the silicon ceiling 110 and the RF power generator 300 of frequency $f_1$ passes RF power at the frequency $f_1$ and blocks RF power at the frequency $f_2$. The isolation filter 315 connected between the wafer pedestal 120 and the RF power generator 305 of frequency $f_2$ passes RF power at the frequency $f_2$ and blocks RF power at the frequency $f_1$. The ground filter 320 connected between the silicon ceiling 110 and ground passes RF power at the frequency $f_2$ and blocks RF power at the frequency $f_1$. The ground filter 325 connected between the wafer pedestal 120 and ground passes RF power at the frequency $f_1$ and blocks RF power at the frequency $f_2$.

The impedance match circuits 280, 290 are of the conventional type discussed previously herein and employ voltage and current sensors or impedance match transducers (not shown) in the conventional manner to measure actual input impedance. In order to prevent the RF power from either one of the two RF generators 300, 305 from interfering with the operation of the impedance match circuit of the other, respective match isolation filters 330, 335 are connected between the impedance match transducers and the transducer inputs to the impedance match circuits 280, 290, respectively. The match isolation filter 330 at the input to the $f_1$ match circuit 280 passes RF power at the frequency $f_1$ and blocks RF power at the frequency $f_2$. The match isolation filter 335 at the input to the $f_2$ match circuit 290 passes RF power at the frequency $f_2$ and blocks RF power at the frequency $f_1$.

The various RF filters 310, 315, 320, 325, 330, 335 may be constructed of passive reactive components (capacitors and inductors) using techniques well-known in the art. If the two frequencies $f_1$, $f_2$ are widely separated (e.g., by an octave), then the various RF filters 310, 315, 320, 325, 330, 335 can be suitable high-pass and low-pass filters with the suitably selected cut-off frequencies. Otherwise, if the two frequencies $f_1$, $f_2$ are not sufficiently separated, then the various RF filters 310, 315, 320, 325, 330, 335 should be bandpass or band reject filters centered at the appropriate frequencies.

Figure 13A:
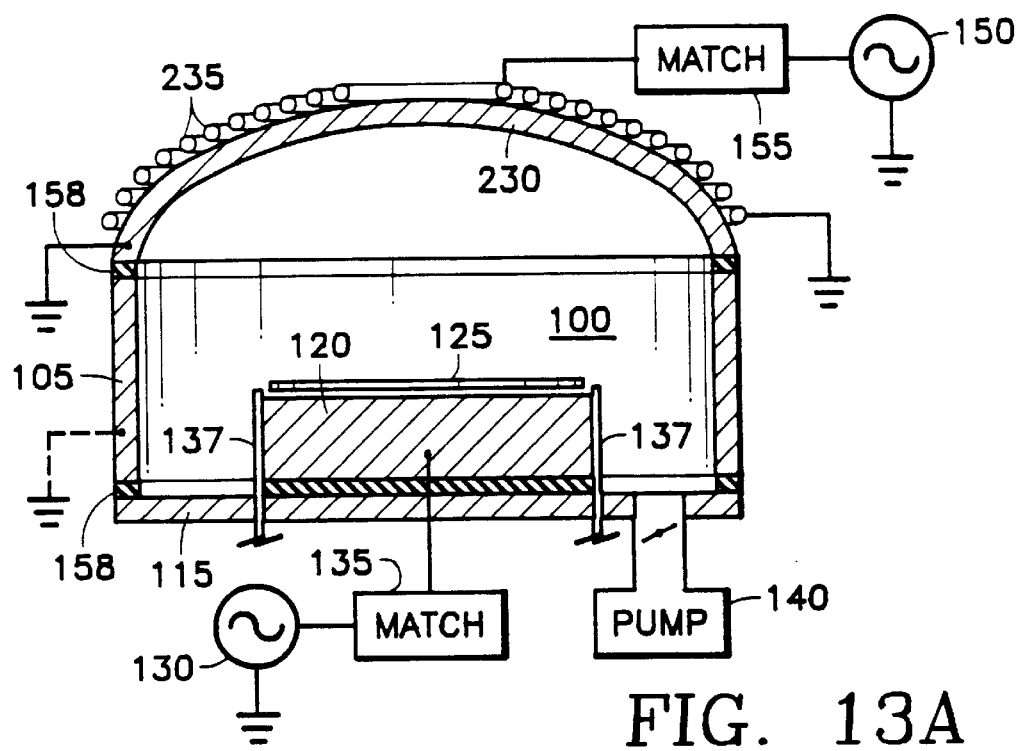
FIG. 13A illustrates an embodiment corresponding to that of FIG. 1 employing a dome-shaped silicon ceiling.
Figure 13B:
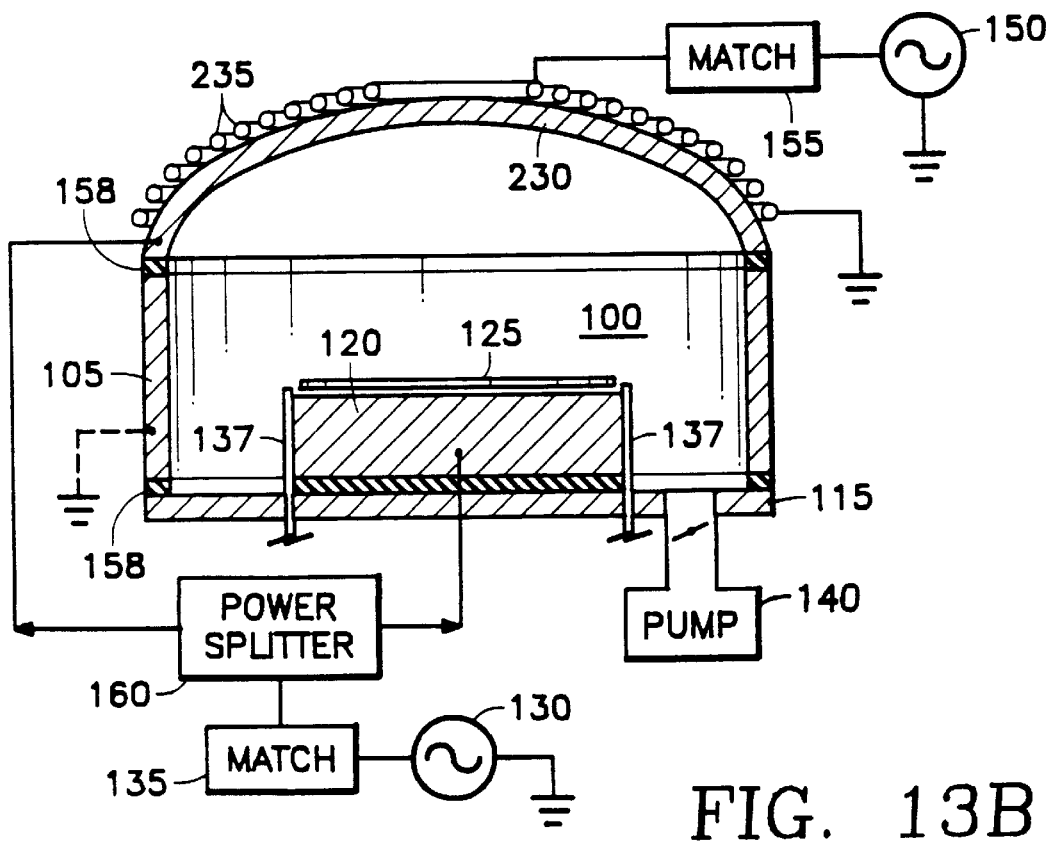
FIG. 13B illustrates an embodiment corresponding to that of FIG. 4 employing a dome-shaped silicon ceiling.
Figure 13C:
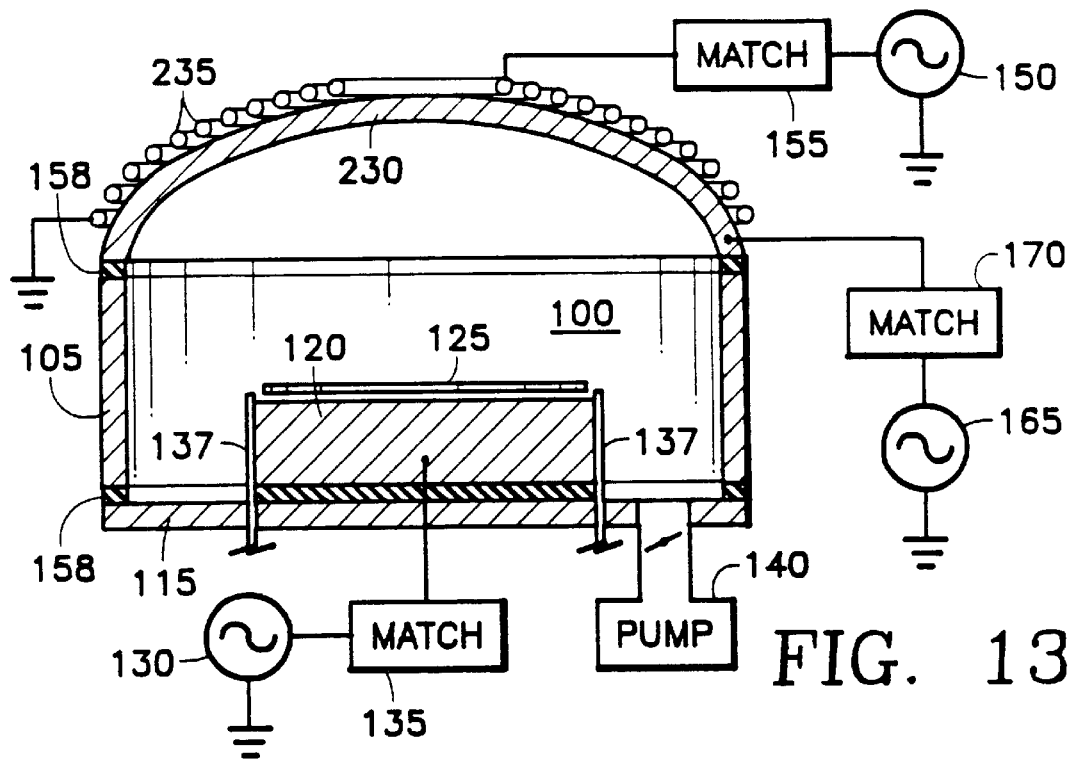
FIG. 13C illustrates an embodiment corresponding to that of FIG. 5 employing a dome-shaped silicon ceiling.
Figure 13D:
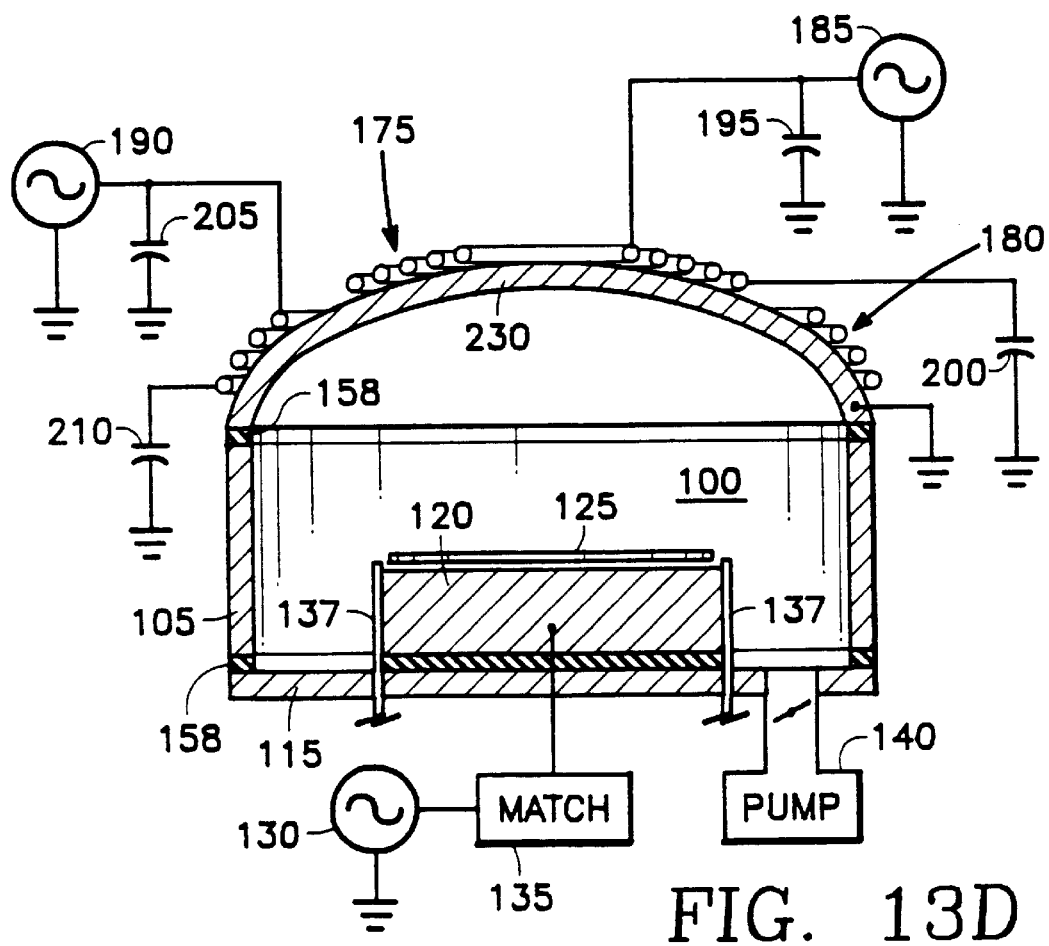
FIG. 13D illustrates an embodiment corresponding to that of FIG. 6 employing a dome-shaped silicon ceiling.
Figure 24:
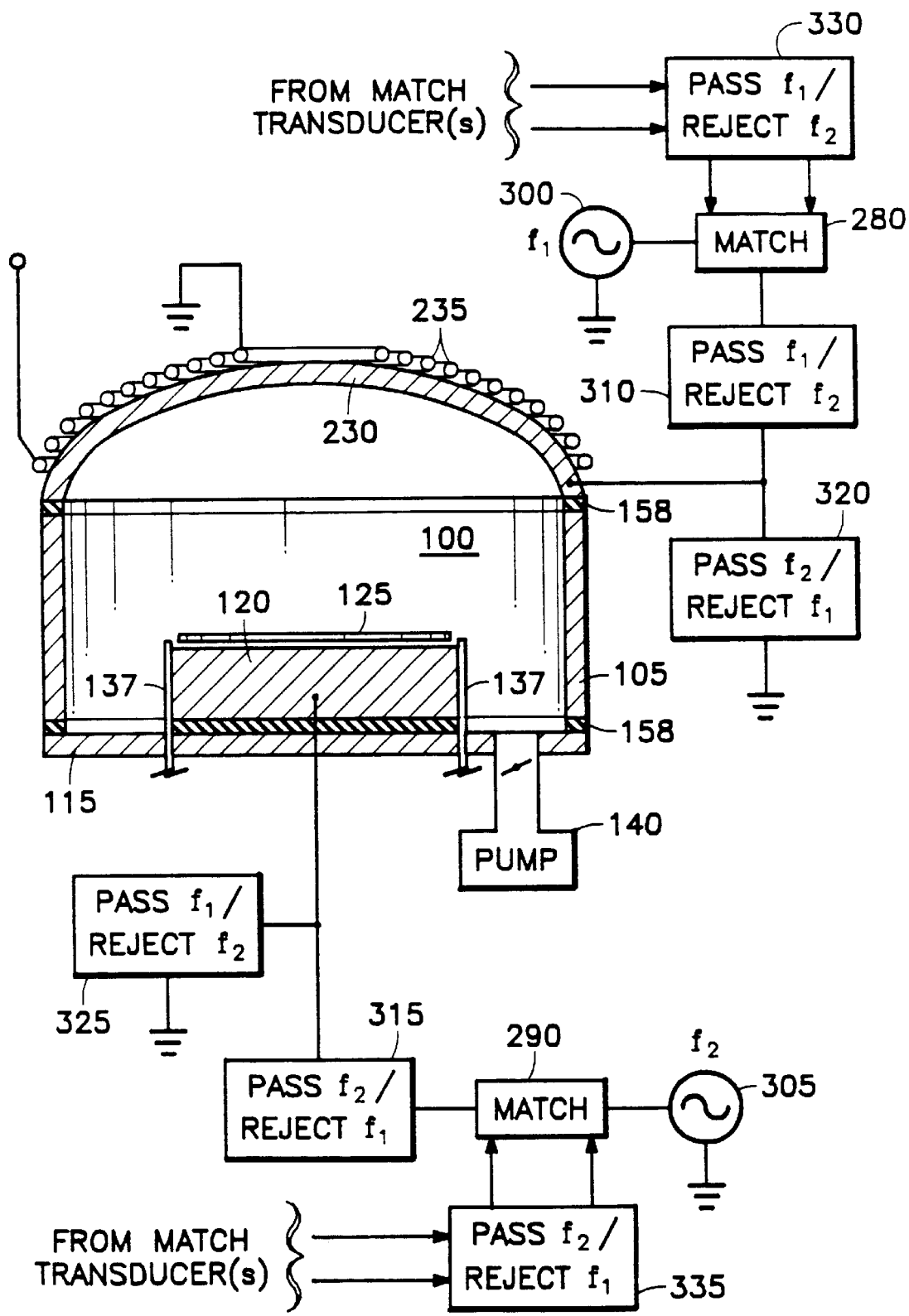
FIG. 24 illustrates and embodiment corresponding to that of FIG. 23 in which the silicon ceiling is dome-shaped.

FIG. 24 illustrates an embodiment corresponding to that of FIG. 23 but employing the dome-shaped silicon ceiling 230 and dome-shaped coil antenna 235 of FIG. 13A in lieu of the flat silicon ceiling 110 and planar coil antenna 145 of FIG. 23.

Figure 25A:
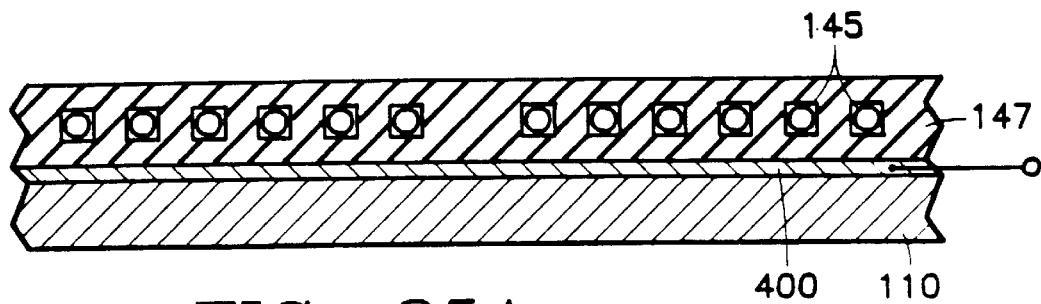
FIG. 25A is a side view of an embodiment of the silicon ceiling including a conductive back plane.

FIG. 25A illustrates the use of a conductive backplane 400 on the upper side or back surface of the silicon ceiling 110. The electrical potential (e.g., ground or, alternatively, the output of an RF generator) to be applied to the silicon ceiling 110 is applied directly to the conductive backplane 400 for uniform distribution across the back surface of the ceiling 110. The backplane 400 may be of any highly conductive material such as aluminum or copper, for example.

Figure 25B:
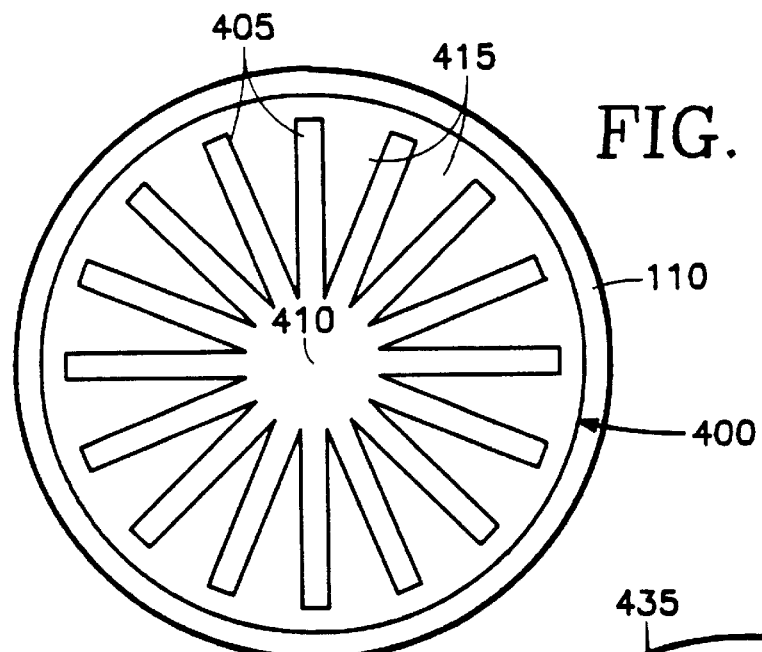
FIG. 25B is a top view of one embodiment of the conductive back plane.
Figure 25C:
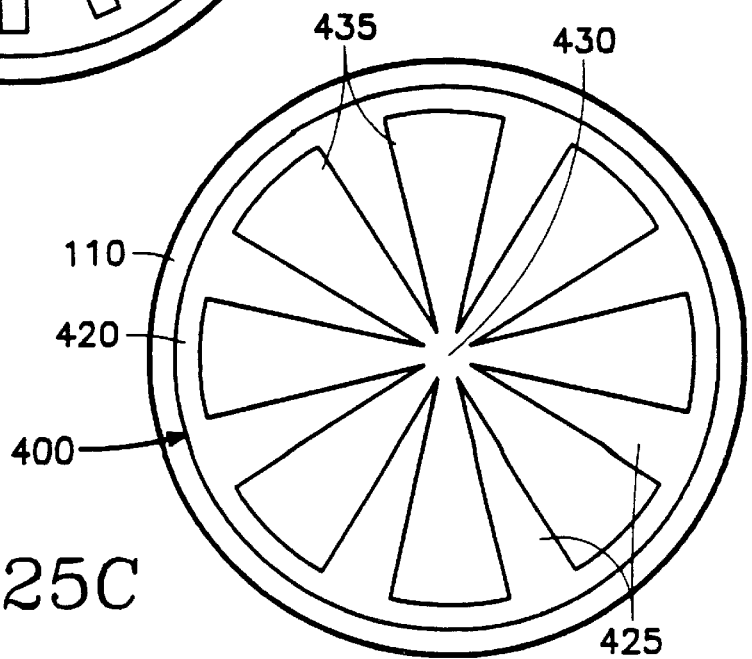
FIG. 25C is a top view of another embodiment of the conductive back plane.

Moreover, the backplane 400 must have sufficient openings or apertures to prevent the formation of eddy currents by the inductive RF field of the overhead coil antenna 145 which would block transmission of the RF inductive field through the backplane 400. For example, the top view of FIG. 25B illustrates that the conductive backplane 400 may be in the shape of a star, with plural conductive arms 405 extending radially from a conductive center 410. Preferably, the spaces or apertures 415 between the conductive arms 405 are of a characteristic width on the order of the thickness of the silicon ceiling 110. This feature provides uniform current distribution and vertical current flow through the silicon ceiling 110. The center connected arms of the embodiment of FIG. 25B may be preferable in the case of silicon laminated on ceramic for ease of fabrication. FIG. 25C illustrates an alternative embodiment of the conductive backplane 400 which consists of an outer conductive annulus 420 with plural conductive arms 425 extending from the conductive annulus 420 radially inwardly toward an imaginary center point 430. The apertures 435 between the conductive arms 425 are of a characteristic width on the order of the thickness of the silicon ceiling 110, as shown in FIG. 25C. Preferably, electrical contact is made along the entire annulus 420. Preferably, the outer conductive annulus 420 is beyond the effective radial range of the RF inductive field.

Figure 26:
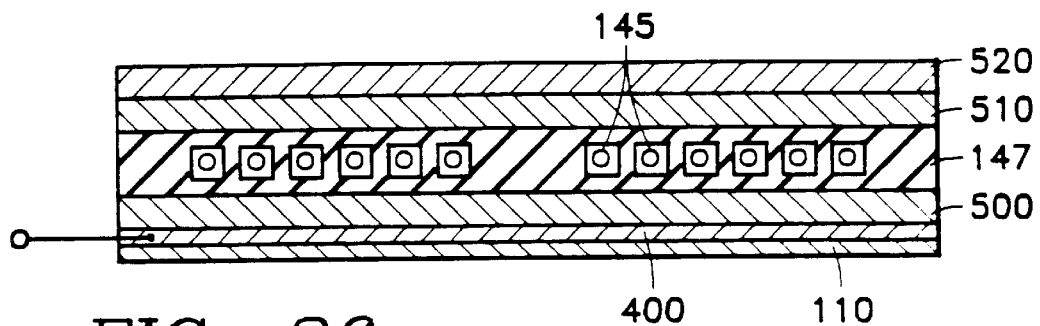
FIG. 26 is a side view of an embodiment of the silicon ceiling which is bonded to a supportive substrate.
Figure 27:
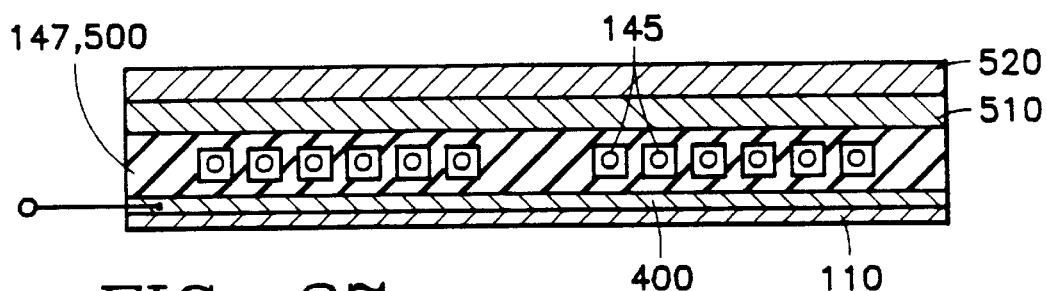
FIG. 27 is a side view of an embodiment corresponding to that of FIG. 26 in which the supportive substrate is an insulative holder of the overhead inductive antenna.

Preferably, the silicon ceiling is about 1 inch (2.54 cm) thick for a 13 inch (32 cm) diameter ceiling to provide structural integrity and an anti-implosion safety factor in excess of 10. However, to significantly reduce the thickness of the silicon ceiling (e.g., to a fraction of an inch), FIG. 26 illustrates how the silicon ceiling 110 and its backplane 400 may be bonded to a strong support substrate 500 such as a ceramic disk. The overhead inductive coil antenna holder 147 is placed over the substrate 500. In order to control the temperature of the silicon ceiling 110, a heater layer 510 is placed on top of the antenna holder 147 and a cooling plate 520 is placed on top of the heater layer 510. FIG. 27 illustrates how the role of the substrate 500 and the role of the antenna holder 147 may be merged into a single member by employing a strong material such as a ceramic in the antenna holder 147 and bonding the silicon ceiling 110 with its conductive backplane 400 directly to the antenna holder 147.

Figure 28:
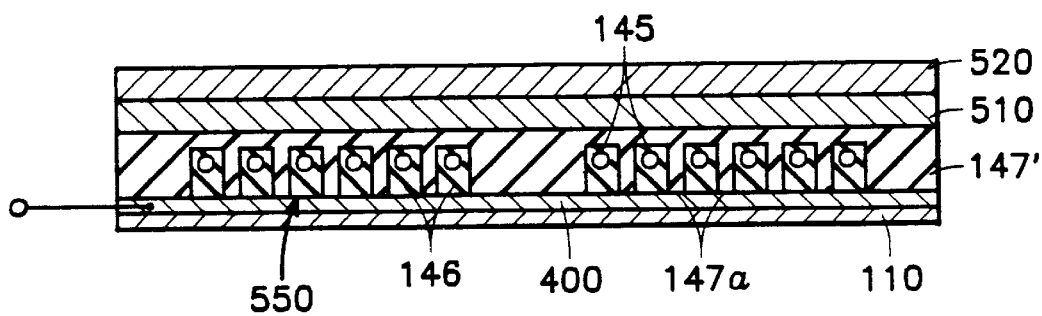
FIG. 28 is a side view of an embodiment of the invention in which the antenna holder is conductive.
Figure 29:
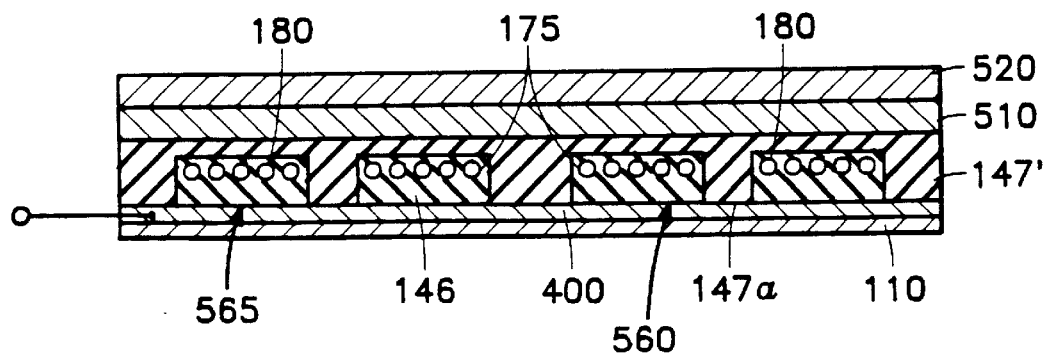
FIG. 29 is a side view of an embodiment corresponding to that of FIG. 28 in which the conductive antenna holder has a pair of annular apertures containing the inner and outer overhead inductive antennas.

FIG. 28 illustrates an embodiment of the invention employing an alternative antenna holder 147' consisting of a conductor such as aluminum or copper, for example. In this embodiment, an insulating material 146 is provided between the windings of the inductive coil antenna 145 and the conductive antenna holder 147'. In order to prevent the conductive antenna holder 147' from blocking the RF inductive field of the coil antenna 145, each turn of the antenna 145 nests within a groove-shaped aperture 550 in the antenna holder 147', each aperture 550 opening to the bottom surface 147a of the conductive antenna holder 147'. The conductive antenna holder 147' of FIG. 28 may also serve as the conductive backplane for the silicon ceiling 110 as well as the strong supportive substrate for the ceiling 110, in which case the silicon ceiling 110 is bonded directly to the conductive antenna holder 147' of FIG. 28. However, a preferable option is to interpose the star-shaped conductive backplane 400 between the silicon ceiling 110 and the conductive backplane 147' of FIG. 28. FIG. 29 illustrates another embodiment of the conductive antenna holder 147' having a pair of wide concentric annular apertures 560, 565 in which respective ones of the inner and outer coil antennas 175, 180 of FIGS. 6 or 16 nest. The annular apertures 560, 565 open at the bottom surface 147a of the antenna holder so that there is no blockage of the RF induction field. In this embodiment, as FIG. 28, the conductive antenna holder can also serve as the conductive backplane for the silicon antenna (in lieu of the star-shaped conductive backplane 400) and as the strong supportive substrate for the silicon ceiling 110 (in lieu of the supportive substrate 500) and therefore may bonded directly to the silicon ceiling 110. Preferably, however, the star-shaped conductive backplane is interposed between the conductive antenna holder 147' and the silicon ceiling 110 and is bonded with the silicon ceiling 110 to the antenna holder 147'.

Figure 30A:
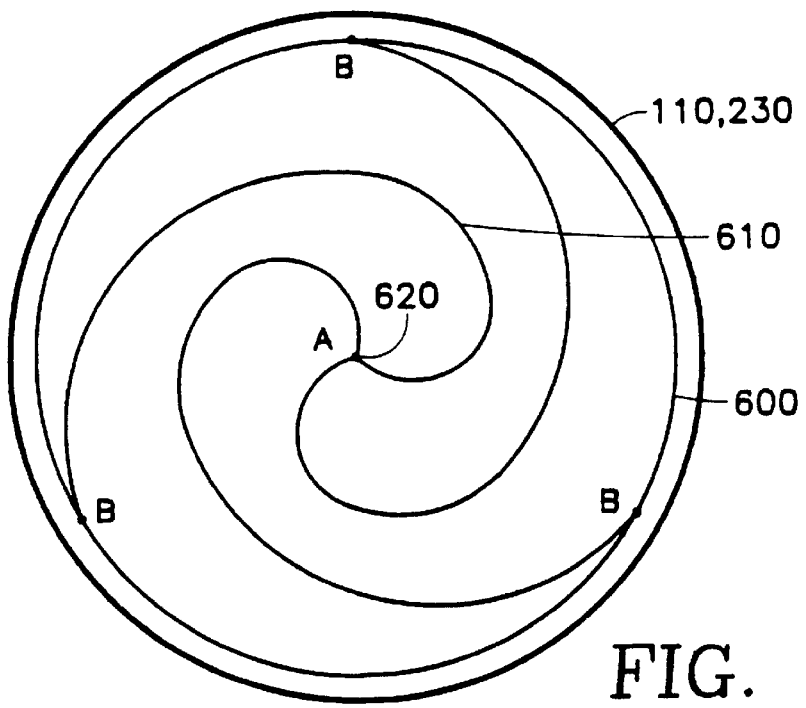
FIG. 30A is a top view of a non-concentric embodiment of the overhead inductive antenna.
Figure 30B:
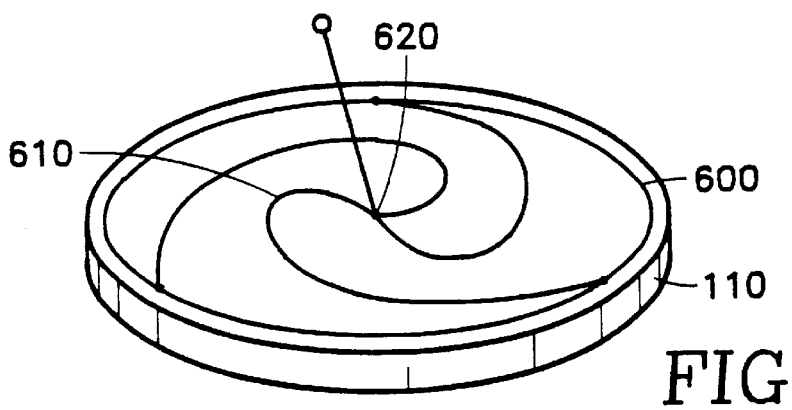
FIGS. 30B and 30C are side views of alternative implementations of the inductive antenna of FIG. 30A having planar and dome-shaped shapes, respectively.
Figure 30C:
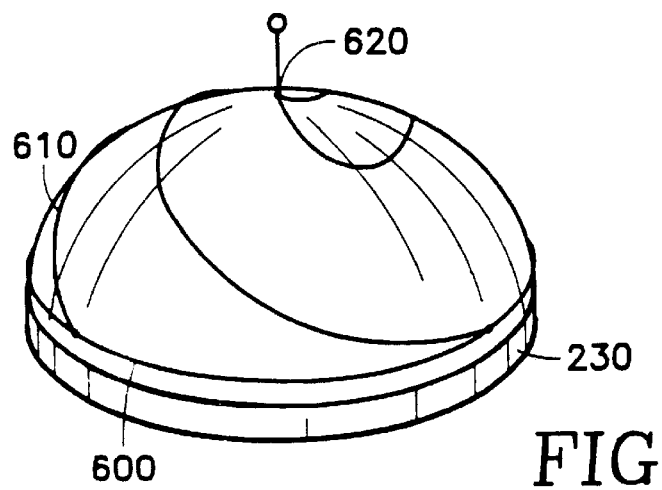

The overhead coil antenna 145 has been described above as consisting of a single concentric spiral winding or of inner and outer concentric spiral windings 175, 180. FIGS. 30A, 30B and 30C illustrate an alternative design of the overhead coil antenna 145 having non-concentric windings. Specifically, in FIG. 30A there is an outer circular conductor 600 which is of very low inductance and low resistance so as to be at least nearly equipotential along its entire circumference. Plural spiral conductors 610 radiate inwardly in involute paths from the outer conductor 600 to a center point 620 joining all of the spiral conductors 610. Plasma source RF power (from the RF generator 150) is applied between the outer conductor 600 and the center point 620. As illustrated in FIG. 30B, the involute spiral conductors 610 lie in a plane, while FIG. 30C illustrates an alternative embodiment for use with the dome-shaped ceiling 230 in which the involute spiral conductors 610 form a dome. A dome shape, such as the dome shapes employed in the various embodiments disclosed in this specification may be non-linear or hemispherical or conical or a rotation of some arcuate curve such as a conical section or the combination of two different radii (as disclosed earlier in this specification).

Figure 31A:
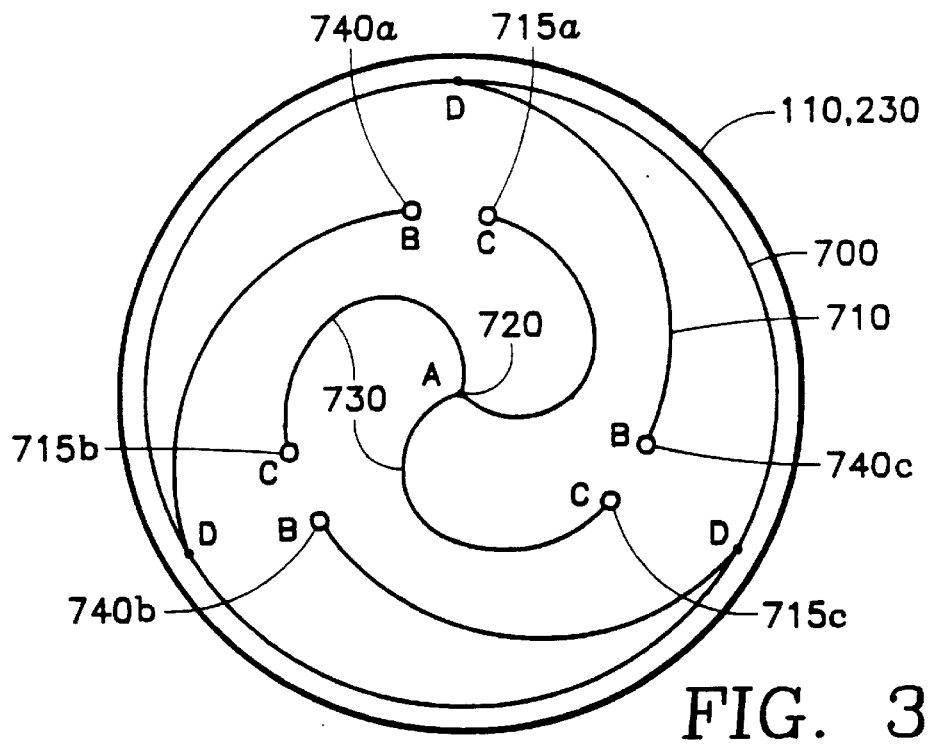
FIG. 31A is a top view of another non-concentric embodiment of the overhead inductive antenna.
Figure 31B:
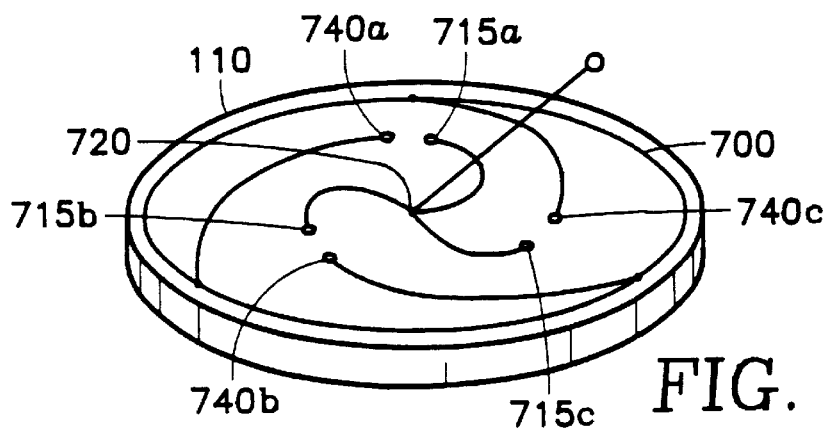
FIGS. 31B and 31C are side views of alternative implementations of the inductive antenna of FIG. 31A having planar and dome shapes, respectively.
Figure 31C:
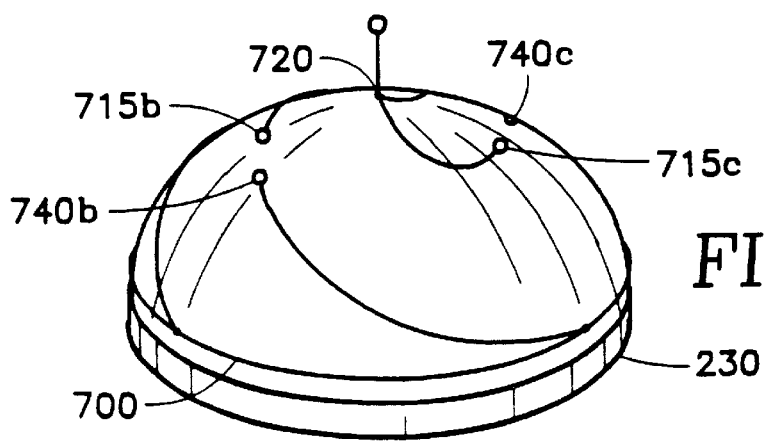

FIGS. 31A, 31B and 31C illustrate another non-concentric embodiment of the overhead coil antenna. FIG. 31B corresponds to the planar case while FIG. 31C corresponds to the dome-shaped case. An outer circular conductor 700 has plural arcuate conductive arms 710 radiating inwardly therefrom terminating at ends 715A, 715B, 715C. A center point 720 has plural arcuate conductive arms 730 radiating outwardly therefrom and terminating at ends 740A, 740B, 740C. As employed in the embodiment of FIG. 16, RF power from one output of the power splitter 250 of FIG. 16 is applied between the outer circular conductor 700 and the ends 715, while RF power from the other output of the power splitter 250 is applied between the center point 720 and the ends 740.

Figure 32:
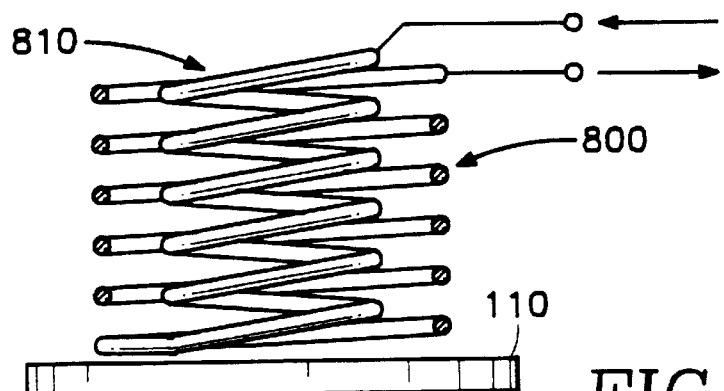
FIG. 32 is a cross-sectional side view of a dual cylindrical helix embodiment of the overhead inductive antenna.
Figure 33:
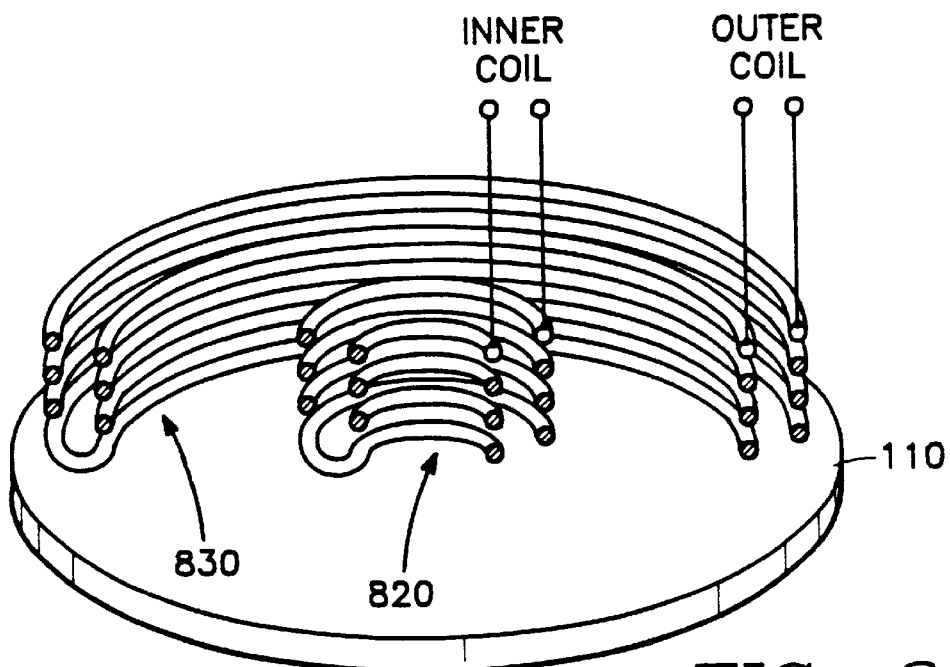
FIG. 33 is a cross-sectional side view of a pair of concentric cylindrical helix inductive antennas of the type illustrated in FIG. 32 for the inner and outer antennas of FIG. 16.

The conductor of the inductive antenna may follow any suitable three-dimensional path. For example, FIG. 32 illustrates a non-planar or 3-dimensional embodiment of the coil antenna 145 consisting of dual concentric cylindrical helical windings, namely an outer cylindrical helix 800 and an inner cylindrical helix 810 all formed with the same conductor. FIG. 33 illustrates how a pair of dual concentric cylindrical helical windings of the type illustrated in FIG. 32, namely an inner dual concentric cylindrical helical winding 820 and an outer dual concentric cylindrical helical winding 830 can be employed as the inner and outer windings of the overhead inductive antenna in the embodiment of FIG. 16, in lieu of the inner and outer planar windings 175, 180 of FIG. 16.

Figure 34:
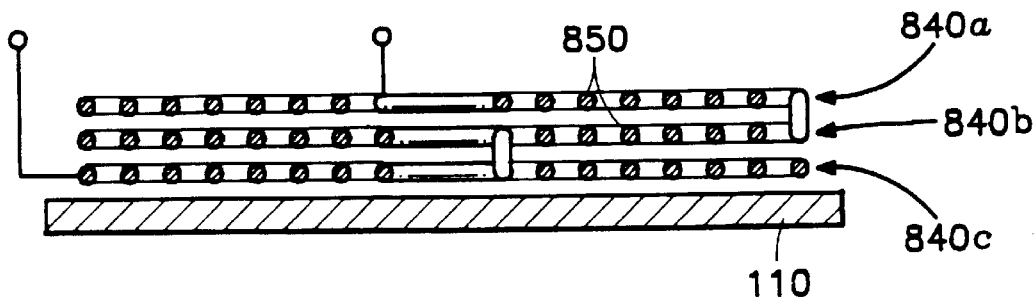
FIG. 34 is a cross-sectional side view of an embodiment of the overhead inductive antenna consisting a layers of inductive antennas.

FIG. 34 illustrates another non-planar embodiment of the inductive antenna 145 of FIG. 1 consisting of stacked layers 840a, 840b, 840c of spiral windings 850.

As mentioned previously herein, one factor that can give rise to plasma etch processing differences between the wafer center and the wafer periphery non-uniform etch precursor gas distribution. Such non-uniformity in gas distribution arises from the introduction of the gas from the side of wafer pedestal through the gas inlets 137, so that there is relatively more etchant precursor gas near the wafer periphery and relatively less etchant precursor gas near the wafer center. This problem is addressed in the embodiment of the silicon ceiling 110 of FIGS. 35A, 35B, 35C, 35D and 35E, which includes a center gas feed system built into the silicon ceiling 110 for introducing the etch precursor gas directly over the wafer in a symmetrical manner relative to the wafer center.

Figure 35A:
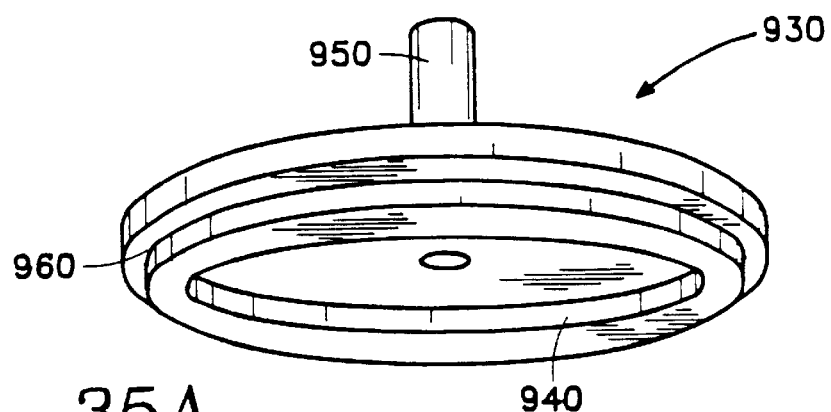
Figure 35B:
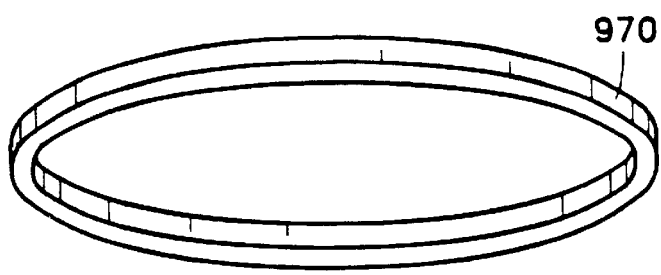
Figure 35D:
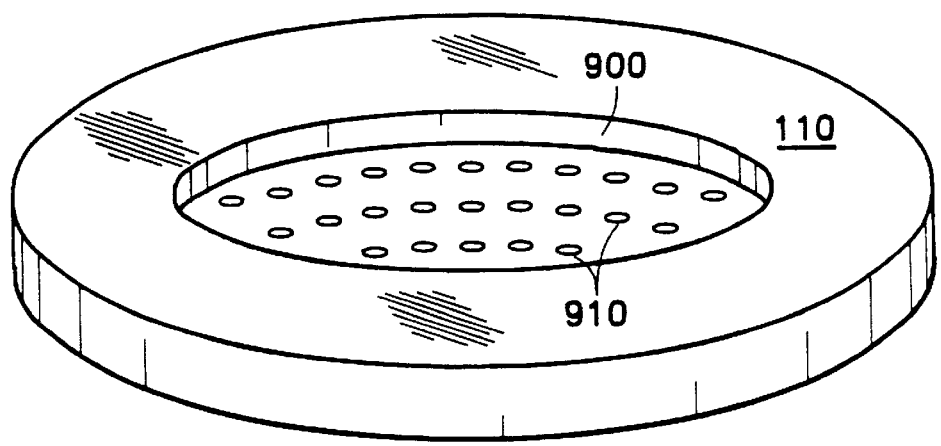
Figure 35C:
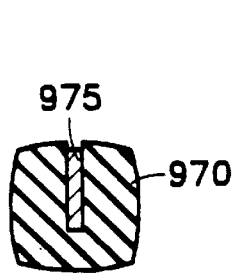
Figure 35E:
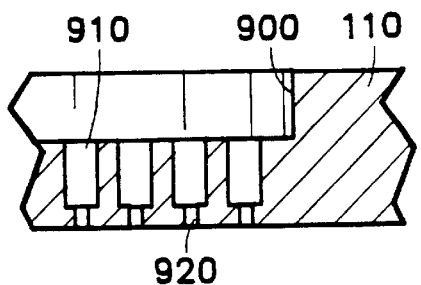

Referring to FIG. 35D, the 1-inch thick silicon ceiling 110 has an approximately 0.33-inch deep 3.5-inch diameter counterbored opening 900 in its top surface. Preferably, as shown in FIG. 35E, about twenty-two symmetrically placed 0.20-inch diameter holes 910 are drilled down from the top surface of the counterbore opening 900 through about 80% of the thickness of the ceiling 110. Small 0.030-inch diameter holes 920 concentric with the larger holes 910 are laser-drilled from the bottom surface of the silicon ceiling 110. As shown in FIGS. 35A and 35B, a disk-shaped gas feed top 930 fits snugly within the counterbore opening 900 in the top surface of the silicon ceiling 110. The bottom surface of the gas feed top 930 has an approximately 0.01-inch deep 3.3-inch diameter counterbore opening 940 therein which forms a gas distribution manifold. A center gas feed pipe 950 passes through the center of the gas feed top 930 and opens into the counterbore opening 940. The bottom peripheral corner of the gas feed top has a step 960 cut out therein, the step 960 being 0.143-inch deep and extending 0.075-inch radially inwardly. The step 960 creates a circumferential pocket into which an annular teflon seal 970 having dimensions matching those of the step 960 snugly fits. Preferably, the teflon seal 970 has a U-shaped cross-section, as illustrated in FIG. 35C. An annular steel wire stiffener 975 within the teflon seal 970 provides stiffness for the seal 970.

The center gas feed silicon ceiling of FIGS. 35A–E can be employed as the silicon ceiling 110 in the embodiment of FIG. 16 in combination with the independently adjustable inner and outer inductive coil antennas 175, 180 controlled through the power splitter 250 by the electrical controller 260. The advantage is that the reactor's center-to-edge etch uniformity is enhanced by the uniform etchant precursor gas distribution across the wafer surface achieved with the center gas feed silicon ceiling 110 of FIGS. 35A–E, and any residual center-to-edge etch non-uniformity can be precisely compensated by judiciously adjusting, using the controller 260, the relative proportion of power levels applied to the inner and outer coil antennas 175, 180 in the manner disclosed in the co-pending application of Collins et al. referred to above. As a result, the wafer center-to-edge etch uniformity is optimized to a degree not attainable in the prior art without sacrificing etch profile, etch selectivity and etch rate at very small feature sizes.

Figure 36A:
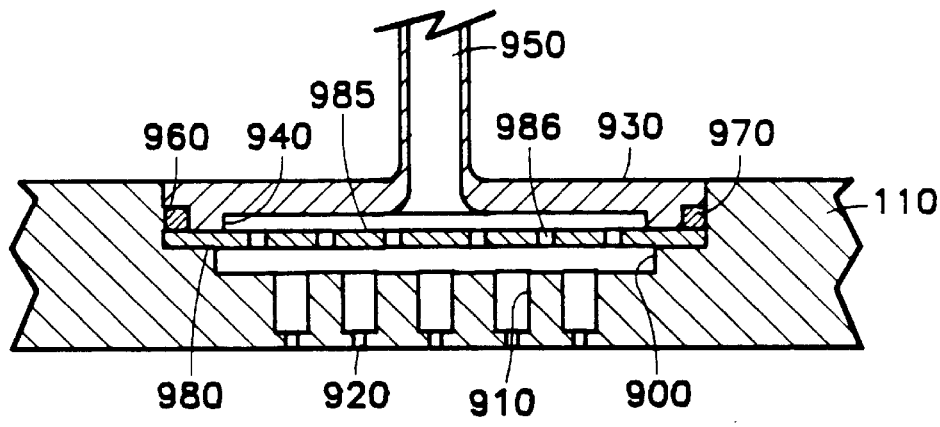
FIG. 36A is a cross-sectional view of another embodiment of the center gas feed silicon ceiling having a pair of gas plenums separated by a silicon wafer baffle.

FIG. 36A illustrates another preferred embodiment of the center gas feed silicon ceiling which better protects the gas feed top from the plasma. In this embodiment, a shoulder 980 is provided along the circumferential edge of the counterbore opening 900 in the silicon ceiling 110. A silicon wafer 985 rests on the shoulder 980 and separates into two separate chambers the counterbore opening 900 in the top of the silicon ceiling 110 and the counterbore opening 940 in the bottom of the gas feed top 930. The silicon wafer 985 has plural gas feed holes 986 drilled therethrough which are all laterally displaced from the gas feed holes 910 in the silicon ceiling 110. The interposition of the silicon wafer 985 in this manner eliminates any direct-line path to the gas feed top 930 for plasma ions diffusing upwardly from the chamber through the holes 920. This feature better protects the top 930 from attack by the plasma. The top 930 is either a material such as a semiconductor or a dielectric which does not appreciably attenuate the RF inductive field, or, if its diameter is less than the diameter of the center null of the inductive antenna, may be a conductor such as stainless steel.

Figure 36B:
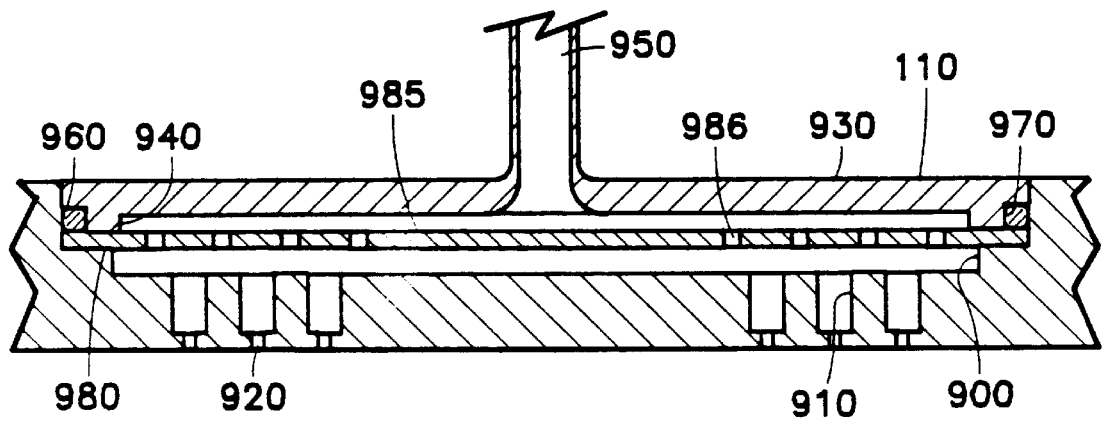
FIG. 36B illustrates an alternative embodiment corresponding to FIG. 36A.

In the embodiments of FIGS. 35A–E and 36A, the gas feed holes 910, 920 are grouped about the center of the ceiling 110. However, in either embodiment the holes 910, 920 may be distributed from the center out to the periphery, if desired, or may be grouped about the periphery instead of the center. This is illustrated in FIG. 36B, in which the gas feed holes 910, 920 are distributed about the periphery of the ceiling 110.

Figure 37A:
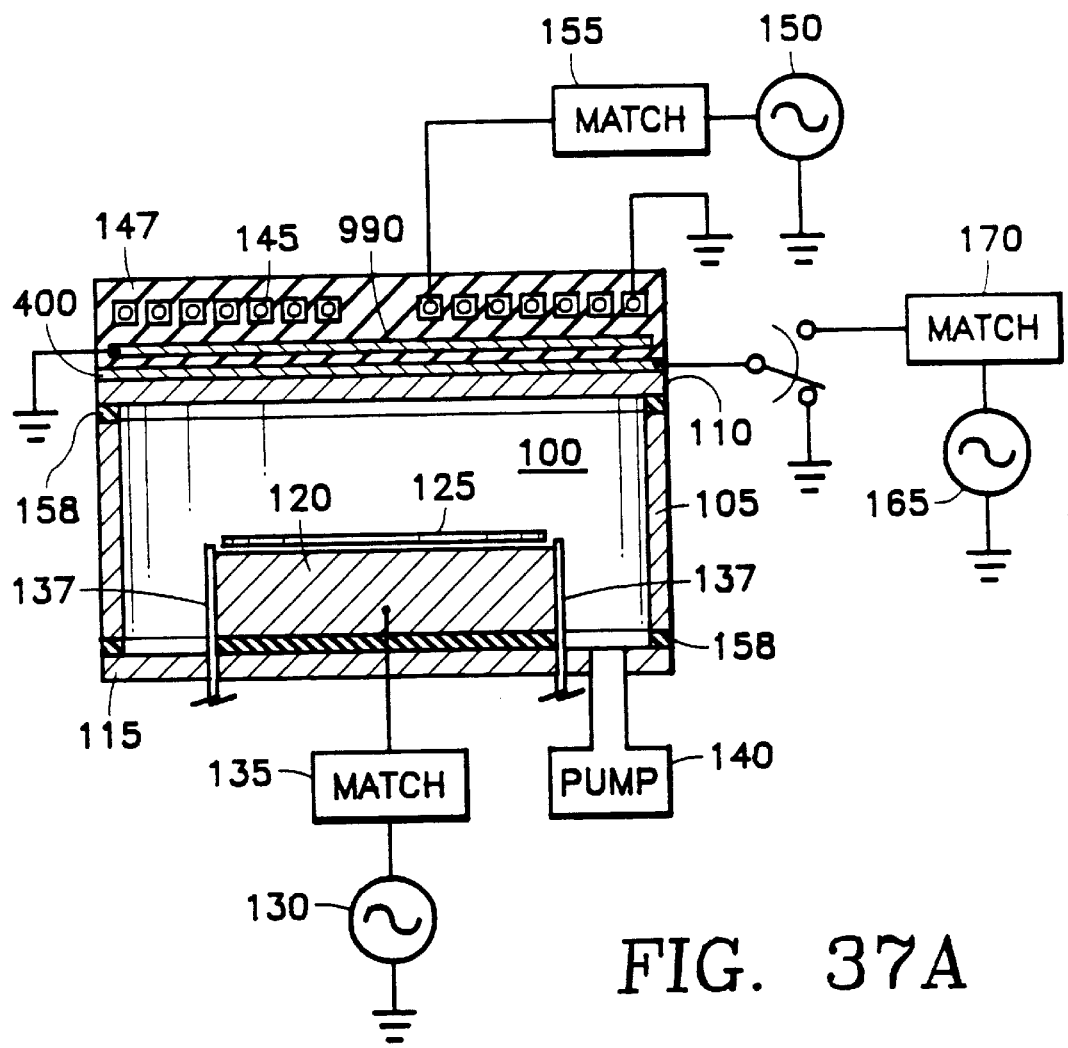
FIG. 37A illustrates how a Faraday shield may be included in the embodiment of FIG. 1.
Figure 37B:
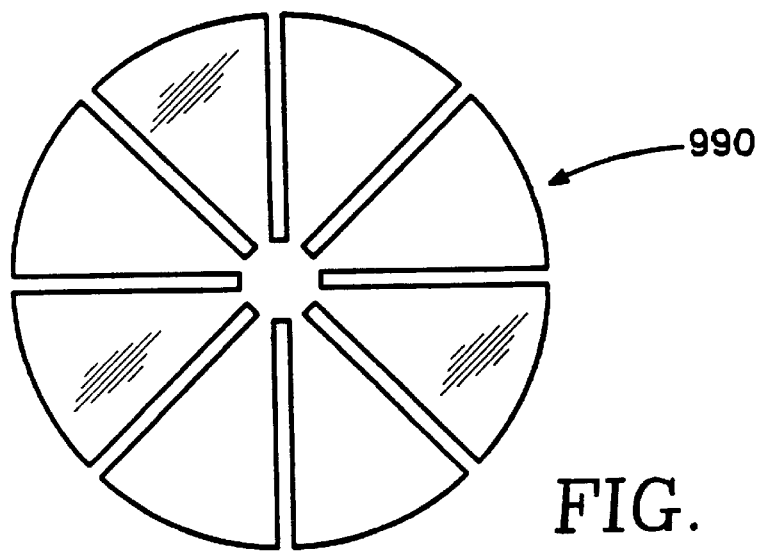
FIG. 37B is a top view of the Faraday shield of FIG. 37A.
Figure 38A:
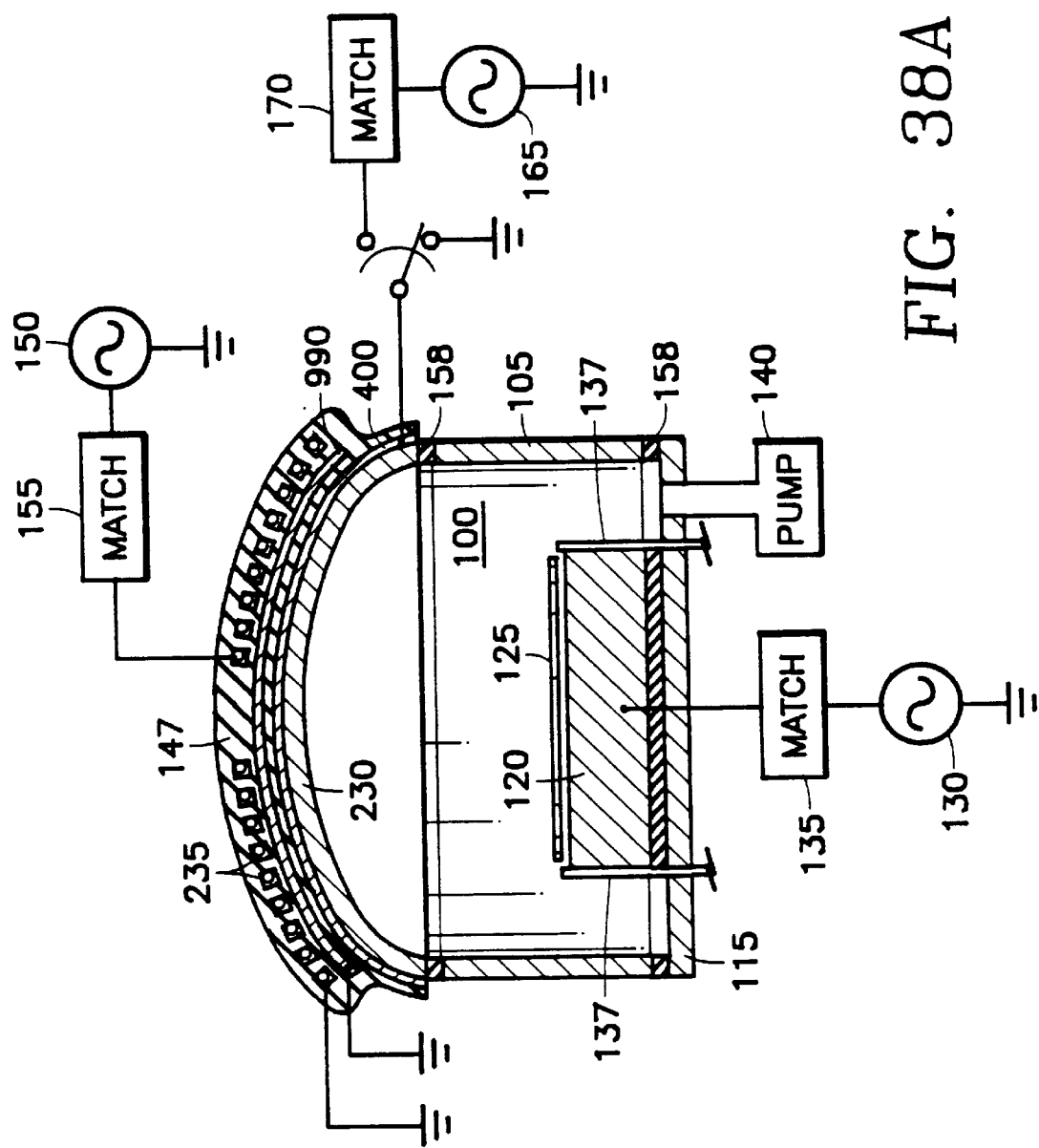
FIG. 38A illustrates how a Faraday shield may be included in the embodiment of FIG. 10 having a dome-shaped ceiling.
Figure 38B:
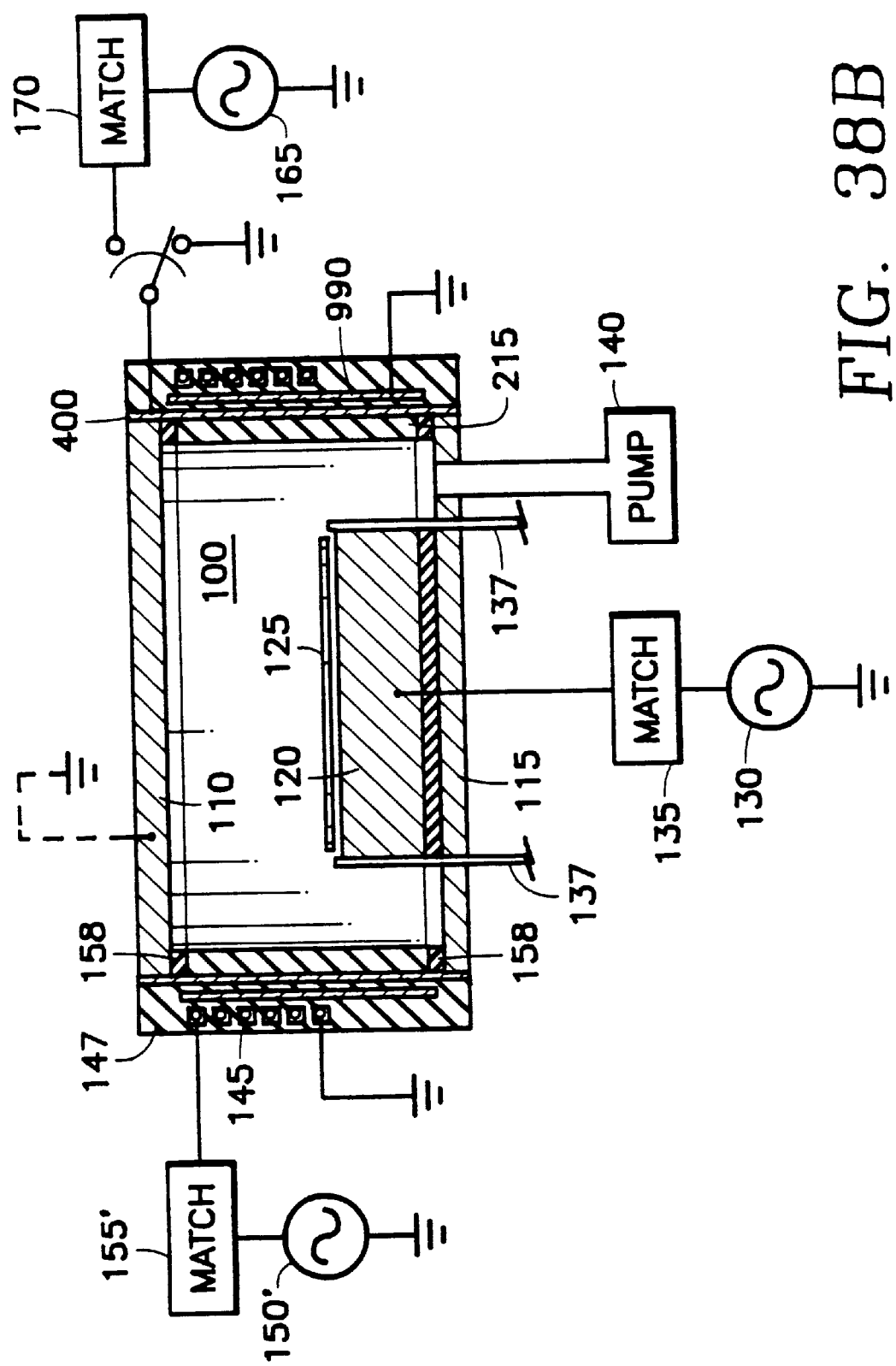
FIG. 38B illustrates how a Faraday shield may be included in the embodiments of FIGS. 7–9 having a cylindrical semiconductor window electrode and inductive antenna.
Figure 40:
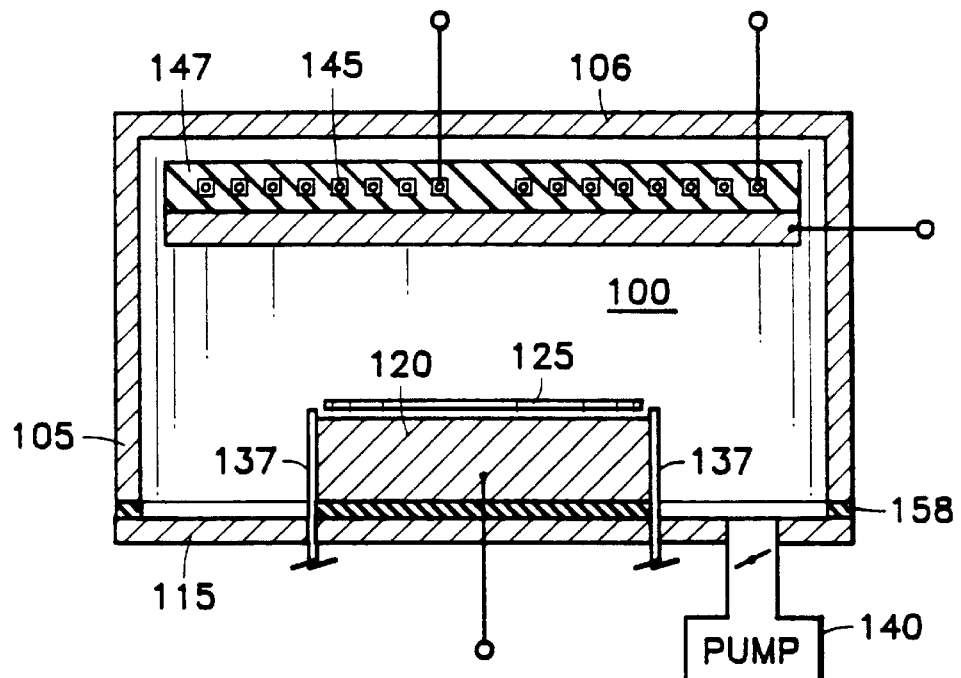
FIG. 40 illustrates an alternative embodiment in which the semiconductor window and inductive antenna are inside the reactor chamber.
Figure 41A:
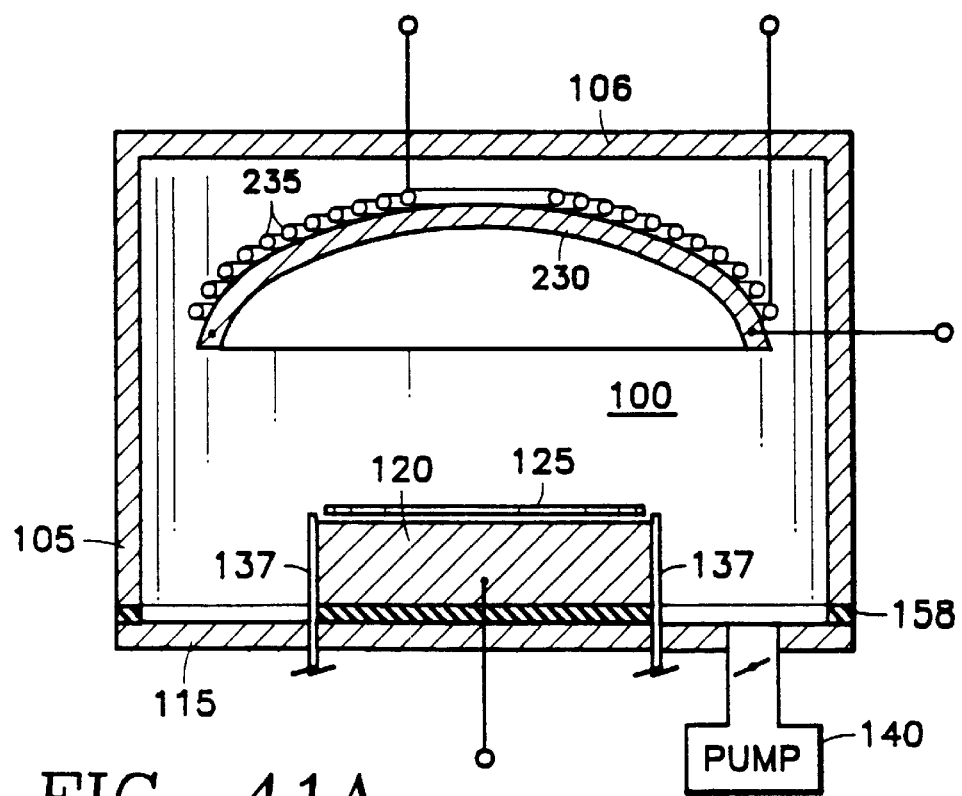
FIG. 41A illustrates an embodiment corresponding to FIG. 40 in which the semiconductor window is dome-shaped.
Figure 41B:
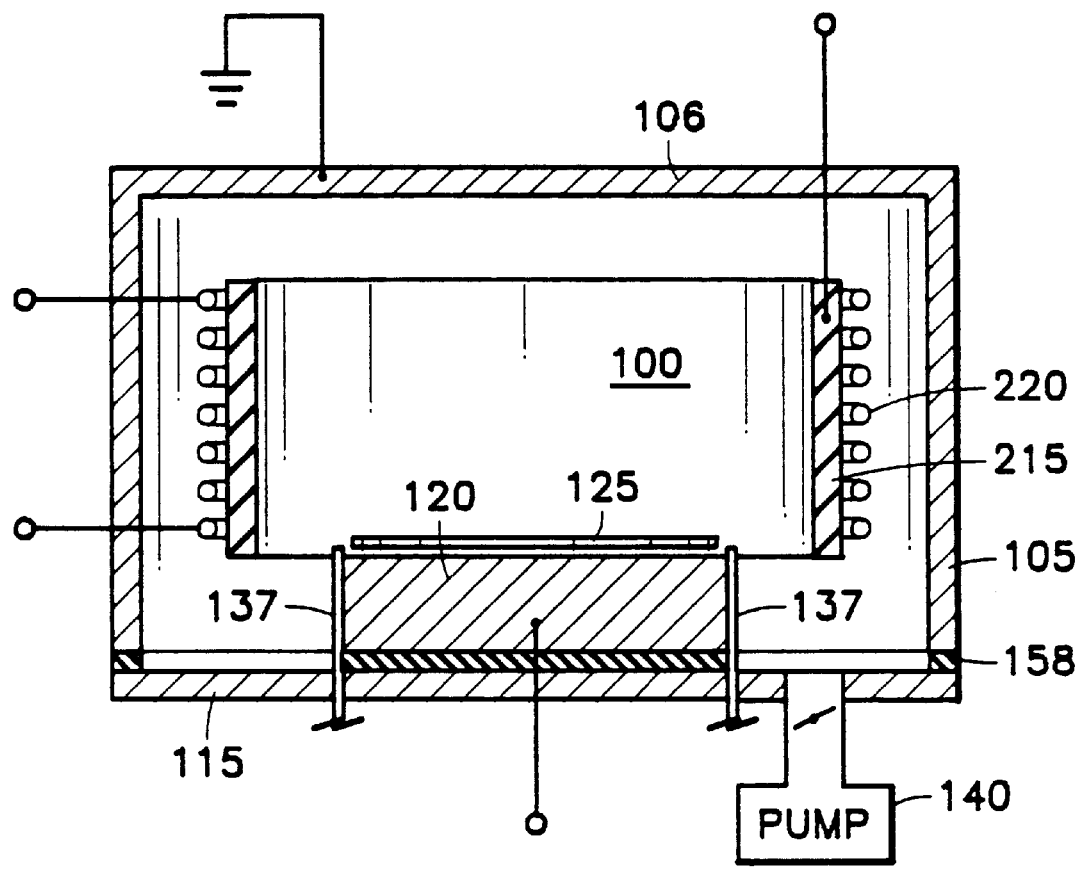
FIG. 41B illustrates an embodiments corresponding to FIG. 40 in which the semiconductor window is cylindrical and the inductive coil is cylindrical.

FIG. 37A illustrates a modification applicable to any of the embodiments employing a flat silicon ceiling 110, such as, for example, the embodiment of FIG. 1, in which an insulated grounded Faraday shield 990 is interposed between the overhead inductive antenna 145 and the silicon ceiling 110. The Faraday shield is of the conventional type whose shape is best shown in the top view of FIG. 37B and is used to reduce capacitive coupling from the inductive antenna 145 to the plasma. FIG. 38A illustrates a modification applicable to any of the embodiments employing a dome-shaped silicon ceiling 230, such as, for example, the embodiment of FIG. 13A, in which an insulated grounded Faraday shield 990 is interposed between the overhead inductive antenna 145 and the silicon ceiling 230. FIG. 38B illustrates an embodiment corresponding to the embodiments of FIGS. 7–9 having a cylindrical side semiconductor window electrode 215 and a cylindrical side inductive antenna 220, with the additional feature of a cylindrical Faraday shield 990' interposed between the inductive antenna 220 and the cylindrical semiconductor window electrode 215.

FIG. 39A is a proportional drawing illustrating a preferred arrangement of the elements described previously herein in a plasma etch reactor. FIG. 39B is a cross-section of a tube-shaped conductor employed in implementing the overhead inductive antenna, the interior volume of the tube being used to pump a coolant such as water.

Each of the foregoing embodiments has been described as employing an electrical connection of the semiconductor window to an electrical potential such as an RF power source or ground, thereby employing the semiconductor window as an electrode. However, such an electrical connection and the use of the semiconductor window as an electrode is not necessary. In fact, the semiconductor window may be allowed to float electrically and left unconnected, rather than being employed as an electrode. It would nevertheless provide certain advantages even though not necessarily functioning as an electrode. One advantage is that the semiconductor material (e.g., silicon) of the semiconductor window is less liable to be a source of contamination, in comparison with other materials (e.g., quartz or aluminum) typically employed in or near the ceiling of a typical plasma reactor. Another advantage is that the semiconductor window is a scavenger for fluorine. Thus, the semiconductor window can function simultaneously both as a shield for the inductive antenna and as a scavenger for fluorine.

Any of the embodiments described above may be modified by placing both the semiconductor window electrode and its overlying coil inductor inside the chamber. In this modification, the semiconductor window electrode is not part of the chamber enclosure but rather rests under the ceiling of the enclosure. For a planar semiconductor window electrode of the type employed in the embodiments of FIGS. 1, 4–12, 16, 18–20, 23 and 37A, FIG. 40 illustrates the planar semiconductor window electrode 110 and the planar inductive antenna 145 inside the chamber 100 under and separate from a chamber ceiling 106. For a curved or dome-shaped semiconductor window electrode of the type employed in the embodiments of FIGS. 13A–15, 17A, 17B, 21, 22, 24 and 38, FIG. 41 illustrates the dome-shaped semiconductor window electrode 230 and the conformal inductive antenna 235 inside the chamber 100 under the chamber ceiling 106. For a cylindrical semiconductor window as employed in the embodiments of FIGS. 7–9, FIG. 41B illustrates a cylindrical semiconductor window 230' and cylindrical inductive antenna 235' inside the chamber 100.

Figure 42:
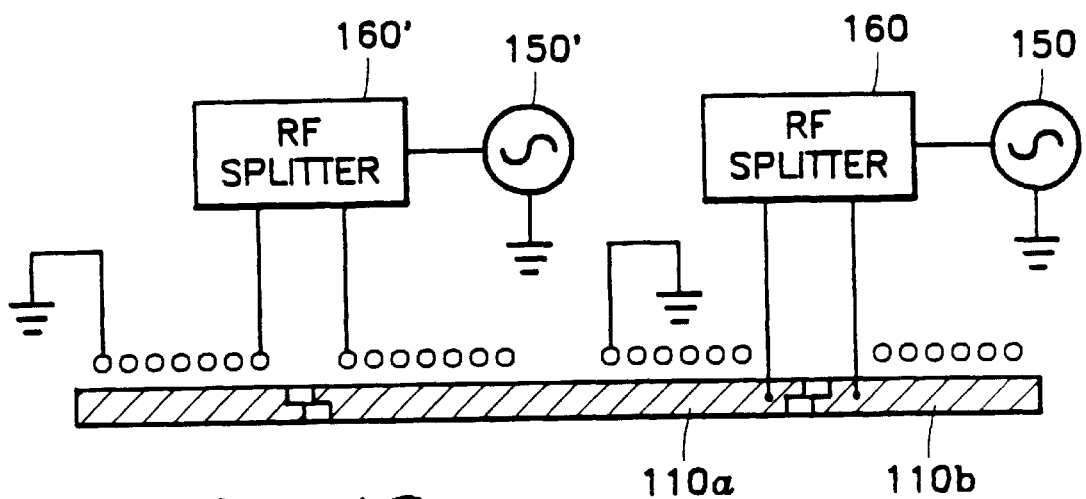
FIGS. 42 and 43 illustrate, respectively, side and top views of a segmented version of the semiconductor window electrode.
Figure 43:
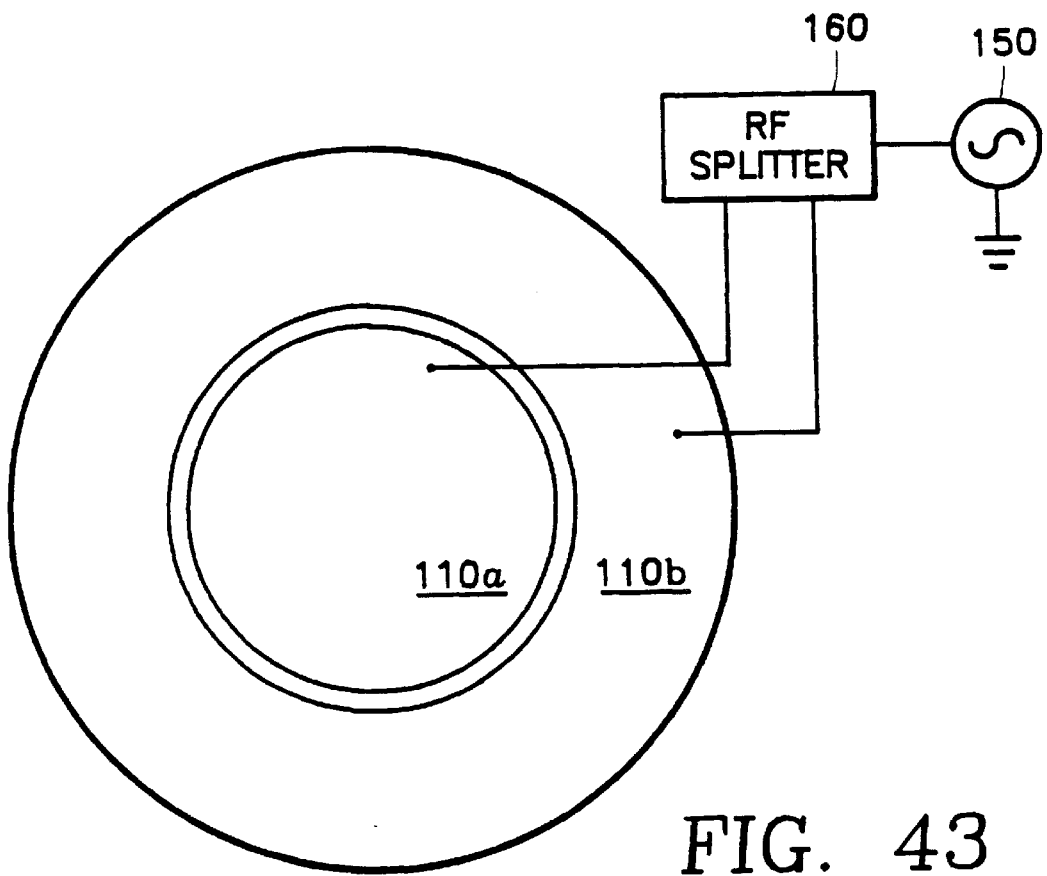

While the semiconductor window of each of the foregoing embodiments has been illustrated as a monolithic structure, in accordance with one modification the semiconductor window may be segmented into plural members. Specifically, in FIGS. 42 and 43 the planar semiconductor window 110' (corresponding to the planar semiconductor window electrode 110 of FIG. 1 or 40, for example) is comprised of a center disk 110a and a peripheral annulus 110b surrounding and concentric with the disk 110a. Preferably, the disk 110a and annulus 110b are of the same semiconductor material such as silicon or any one of the other exemplary semiconductor materials suggested above. In one embodiment, the relative center-to-edge etch performance is adjusted by applying different levels of RF power to the annulus 110a and disk 110b as desired. This is best accomplished by employing a single RF source 150 feeding an RF power splitter 160 having respective RF power outputs applied to the disk 110a and annulus 110b. This requires a third terminal (e.g., a grounded electrode) such as conductive side wall connected to RF ground (not shown in FIG. 42). If, for example, the etch rate near the center of the wafer were greater than at that near wafer periphery, the RF power splitter 160 could be adjusted to apply more RF power to the center disk 110a and relatively less to the peripheral annulus 110b of the semiconductor window. Moreover, for even greater control over the center-to-edge etch performance, the split inner and outer inductive antenna sections of FIGS. 6, 13D, 16 or 17B may be combined with the split semiconductor window electrodes 110a, 110b. Specifically, FIG. 42 illustrates the inner and outer inductive antennas 175, 180 of FIG. 16 combined with the inner disk 110a and outer annulus 110b of the semiconductor window electrode. As in FIG. 16, the power splitter 250 has separate RF power outputs connected to respective ones of the inner and outer inductive antennas 175, 180.

Figure 44:
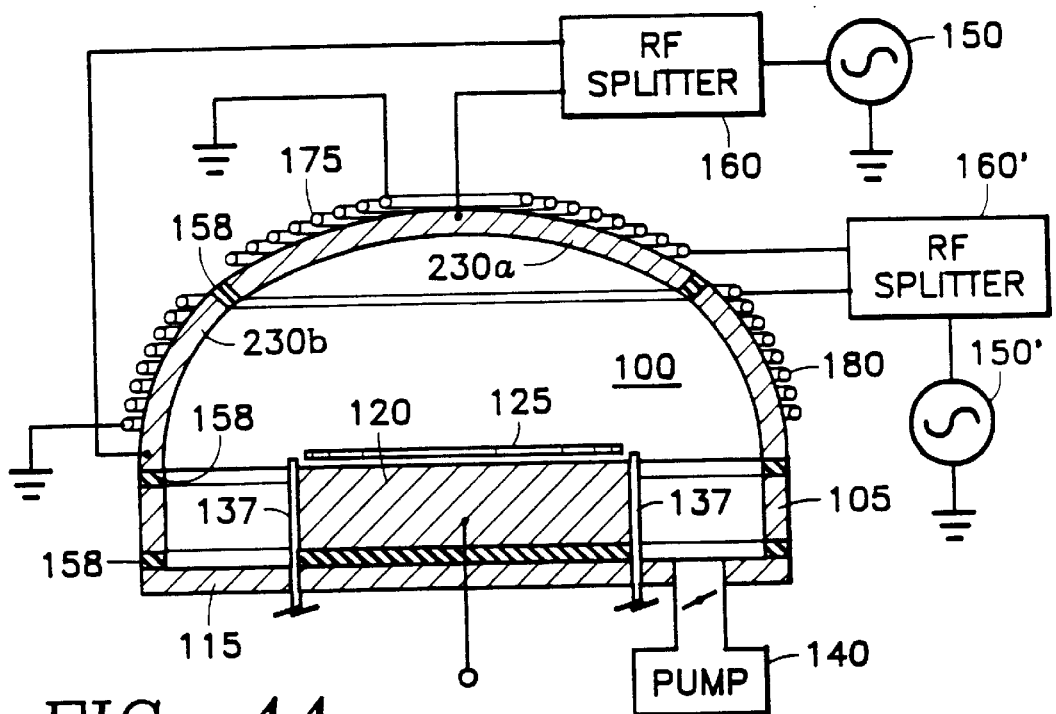
FIG. 44 illustrates an embodiment corresponding to that of FIG. 42 in which the semiconductor window is dome-shaped.
Figure 45:
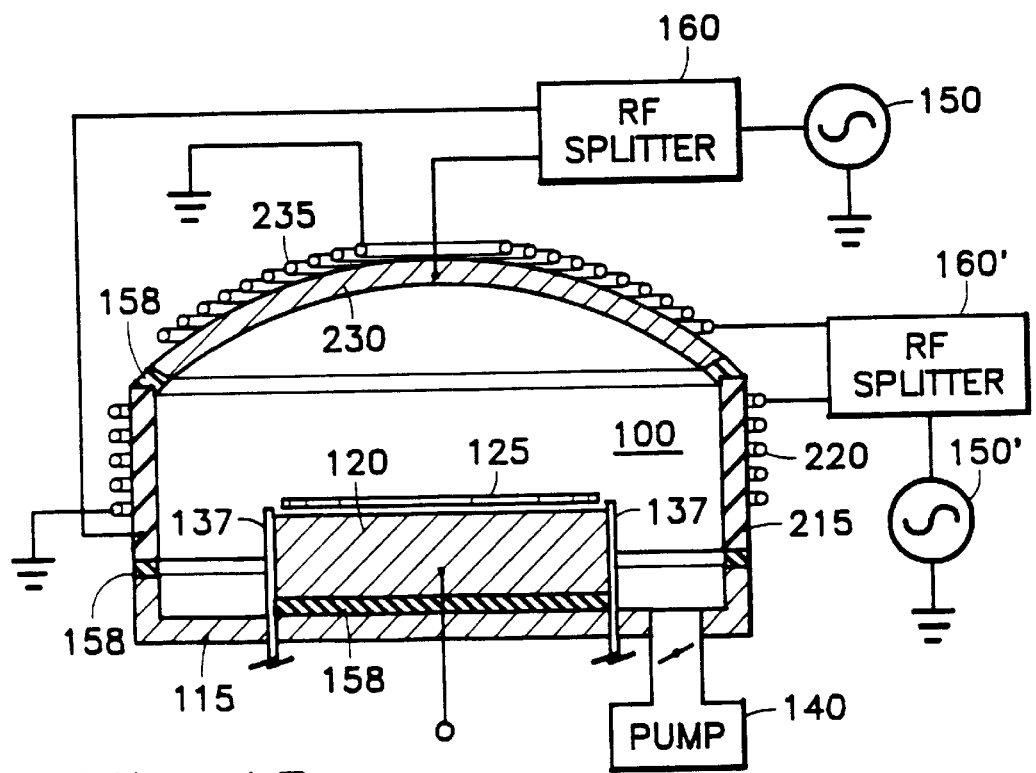
FIG. 45 illustrates an embodiment in which RF power, is split between the semiconductor window electrode and a sidewall electrode, which itself may be a segmented portion of the semiconductor window electrode.

FIG. 44 illustrates an embodiment corresponding to FIG. 42 in which the split semiconductor window electrode is arcuate or dome-shaped. In FIG. 44, the semiconductor window electrode center disk 110a corresponds to the center portion of a dome while the semiconductor window electrode peripheral annulus 110b corresponds to the outer portion of a dome and a contiguous cylinder at the circumferential base of the dome. FIG. 45 illustrates a modification of the embodiment of FIG. 44 in which the curvature of the dome nearly disappears so that the center disk 110a is virtually planar while the annulus 110b is virtually a cylindrical side wall.

Figure 46:
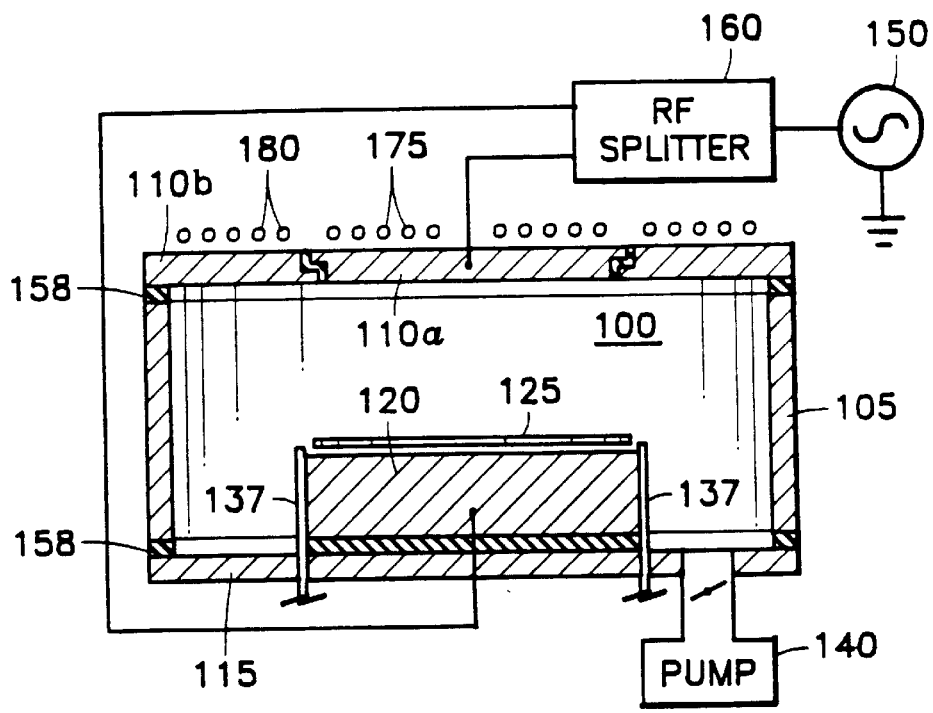
FIGS. 46 and 47 illustrate modifications of the embodiments of FIGS. 42 and 44 in which the outer segment of the semiconductor window electrode is grounded and RF power is split between the center segment of the semiconductor window electrode and the wafer pedestal.
Figure 47:
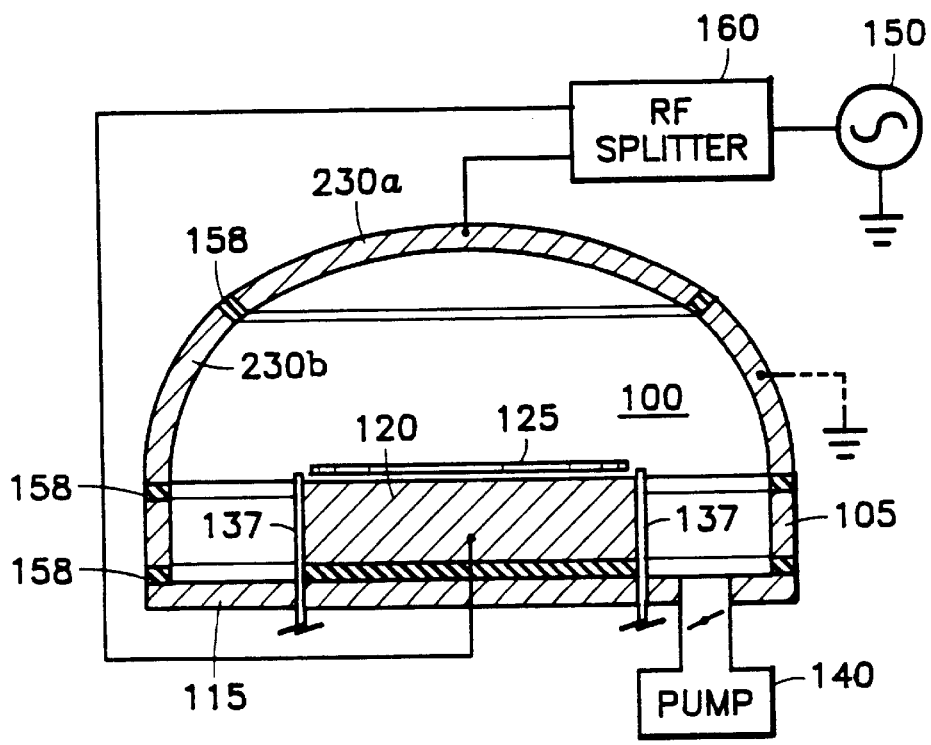

While the third terminal requisite for the RF power splitting of FIGS. 42–45 has been described as a grounded side wall, in accordance with another modification the third terminal may be the semiconductor window peripheral annulus 110b while the RF power is split between the semiconductor window center disk 110a and some other entity such as the wafer pedestal 120. FIGS. 46 and 47 illustrate how this latter modification changes the embodiments of FIGS. 42 and 44, respectively. Such a modification carried out on the embodiment of FIG. 45 results in an embodiment corresponding to that of FIG. 13B. In the embodiments of FIGS. 46 and 47, the RF power splitter 250 has one of its RF power outputs connected to the semiconductor window center disk 110a and its other output connected to the wafer pedestal 120, while the semiconductor window peripheral annulus 110b is grounded.

The effective plasma interaction area of the semiconductor window may be changed to change the ratio of the effective plasma interaction areas of the semiconductor window and the wafer/wafer pedestal. There are three regimes for this area ratio:

(1) Symmetrical: the effective plasma interaction areas are about the same (the area ratio being about 1), so that both the wafer and the semiconductor window electrode have the same plasma RF current density and the same RF and DC sheath voltage magnitudes;

(2) Not fully assymetrical: the area ratio lies in a range from 1 to a factor between 2 and 4, so that the current density and RF and DC sheath voltage magnitudes at the smaller area electrode are greater than at the larger area electrode and change significantly with further increases in the area ratio;

(3) Fully assymetrical: the area ratio exceeds a factor between 2 and 4 and the current density and RF and DC sheath voltage magnitudes do not change significantly with further increases in the area ratio, a saturation condition having been reached.

In the last case (i.e., case 3), the greater sheath voltage drop and RF current density appears at either the semiconductor window electrode or the wafer/wafer pedestal, whichever one has the smaller effective plasma interaction area. Raising the RF current density and sheath voltage drop in this manner has the same effect as raising the RF bias applied to one element (semiconductor window or wafer/pedestal) whose interaction area was reduced. As for the semiconductor window, such an change affects the rate of sputtering of scavenger material into the plasma and affects the rate of polymerization on the surface of the semiconductor electrode. As for the wafer/pedestal, such a change affects processing parameters normally affected by changes in applied bias RF power such as etch rate, etch profile and etch selectivity, for example.

The same principles apply when adjusting the ratio of effective plasma interaction areas in reactors having more than two electrodes. For example, in the embodiment of FIGS. 23 and 24, there are, in effect, four electrodes reduced to two by using electrodes which drive at one frequency and ground at another. Each pair of drive/ground electrodes is analyzed separately, with the change area ratio having the same effects as outlined in the previous paragraph. As another example, in embodiments such as FIGS. 4–12 in which a third electrode such as the cylindrical side wall is connected to a potential such as ground or another RF source, the same analysis applies, except that the apportionment of the ground return current between the grounded electrode (e.g., the cylindrical side wall) and the other terminal connected to an RF power source is determined by dynamic factors such as the phase difference between the two driven terminals as well as the effective plasma interaction area ratio. In order to maintain a constant predetermined phase difference between the two RF-driven electrodes, the invention disclosed in U.S. Pat. No. 5,349,313 by Kenneth S. Collins et al. may be employed.

The ability to establish a desired phase relationship between a pair of RF-driven elements (electrodes or inductive antennas) may be employed to apportion RF power thereto. For example, in the embodiments such as FIGS. 16, 17A, 17B and 18 employing segmented inductive antenna portions, power apportionment as between the two segmented antenna portions is described above as being accomplished by varying the magnitudes of the RF voltages applied to the respective antenna portions. However, power apportionment may also be changed by changing the phase angle between the RF voltages applied to the different antenna portions. Likewise, in the embodiments such as FIGS. 42–47 employing segmented semiconductor window portions, power apportionment as between the two segmented semiconductor window portions is described above as being accomplished by varying the magnitudes of the RF voltages applied to the respective semiconductor window portions. However, power apportionment may also be changed by changing the phase angle between the RF voltages applied to the different semiconductor window portions.

Figure 48A:
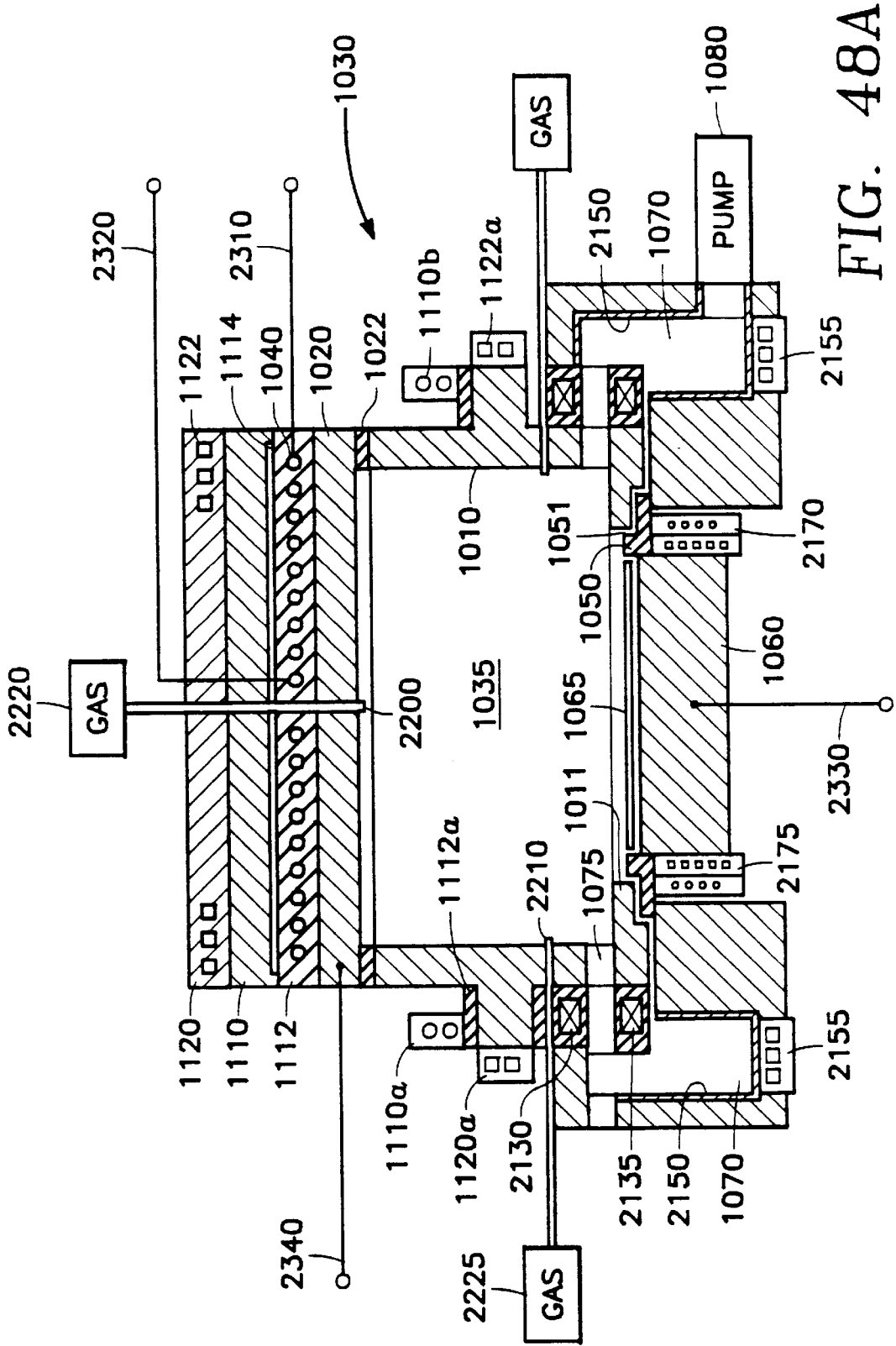
FIG. 48A is a cut-away side view of a plasma reactor of one embodiment of the invention having an all-semiconductor enclosure confining plasma within a processing region over the wafer.

FIG. 48A illustrates a plasma reactor much like the embodiment of FIG. 1 except that the concept of an overhead semiconductor window electrode is expanded to a semiconductor skirt 1010 extending vertically downward from a disk-shaped semiconductor ceiling 1020, the skirt 1010 and ceiling 1020 being insulated from one another by a dielectric insulating ring 1022 and constituting an all-semiconductor enclosure confining plasma within a processing region 1035 of the reactor chamber. Like the embodiment of FIG. 1, a coil inductor 1040 overlies the semiconductor-ceiling 1020. The skirt 1010 can be cylindrical. An optional annular semiconductor foot 1011 integrally formed with the skirt 1010 can extend radially inwardly from the bottom of the cylindrical skirt 1010. A collar 1050 extends from near the radially inward edge of the foot 1011 to near a wafer pedestal 1060 supporting a wafer 1065 being processed, leaving a meandering high aspect ratio gap 1051 therebetween. In a preferred implementation, the wafer pedestal 1060 comprises an electrostatic chuck. One purpose of the collar 1050 is to confine plasma escaping around the pedestal 1060 from the processing region 1035 to the pumping annulus 1070 to the narrow (high aspect ratio) gap or passageway 1051, so that the escaping ions recombine at the wall surfaces along the passageway before reaching the pumping annulus 1070. Another feature is that the collar 1050 provides an overlapping baffle structure so that the gap 1051 provides a meandering path and plasma ions escaping to the pumping annulus 1070 must follow the meandering path. This feature further enhances the recombination of escaping plasma ions inside the gap 1051.

A pumping annulus 1070 is coupled to the processing region 1035 through a wafer slit valve 1075 and is evacuated by a pump 1080. In order to reduce or prevent plasma leakage through the slit valve 1075, the slit valve 1075 has as high an aspect ratio as possible to provide the narrowest possible opening, in order to enhance recombination of plasma ions on the interior surface of the slit valve 1075. In the preferred embodiment of FIG. 48A, the semiconductor enclosure 1030 is the vacuum boundary of the chamber. Alternatively, such a semiconductor enclosure may be provided within a metallic vacuum enclosure so that the semiconductor enclosure itself is not the vacuum boundary. This latter alternative may be useful in embodiments of the invention implemented by retrofitting existing prior art reactor chambers.

There are several advantages provided by the all-semiconductor processing chamber enclosure of FIG. 48A. One advantage is that the all-semiconductor surfaces enclosing the processing region 1035 need not be passivated by accumulated polymer but instead may be left bare during plasma processing. This is because interaction between the plasma and the semiconductor surfaces does not produce by-products harmful to the plasma processing of the wafer. Instead, by-products produced by interaction of the plasma with the semiconductor surfaces enclosing the processing region 1035 tend to be volatile and are readily pumped away by the pump 1080. Since there is no need to passivate the surfaces enclosing the processing region 1035, there is no need to interrupt reactor operation to clean these surfaces, a significant advantage.

There are two ways to prevent accumulation of polymer on the surfaces enclosing the processing region 1035. One is to maintain these surfaces above the polymer condensation temperature. For this purpose, the ceiling 1020 and skirt 1010 are formed of a relatively highly thermally conductive material such as a semiconductor. Alternatively, the material need not be a semiconductor but may be a dielectric such as silicon nitride, aluminum nitride, quartz or alumina, for example. In the preferred embodiment employing a semiconductor material, this material is silicon, although other semiconductor materials such as silicon carbide may be employed. Silicon is preferred for plasma processes involving silicon chemistry (such as silicon dioxide etch, for example). This is because the silicon window 1030 etches very slowly in such processes relative to the etch rates on the wafer (about 3 Å silicon etched from the silicon enclosure surface for every 1µ of silicon dioxide etched from the wafer). Thus, about 35,000 wafers may be processed before a significant amount of material (e.g., 1 mm) is etched from the silicon enclosure 1030. The permissible loss due to etching of thickness of the semiconductor enclosure 1030 is limited by to factors: (a) the thickness of the enclosure 1030 required for structure integrity, and (b) the change in thickness which appreciably changes RF coupling from the coil antenna into the chamber. It is believed that a less than 10% change in thickness will not produce an appreciable change in RF coupling sufficient to affect processing of the wafer if the guidelines for semiconductor material selection given above in this specification are followed.

For aluminum or polysilicon plasma etch processes, which involve chlorine chemistry, the silicon walls may etch too fast (depending upon how the basic plasma processing parameters are controlled) and therefore silicon or semiconductor materials are not optimum for such applications. However, a semiconductor material is not necessary in carrying out the invention (unless an electrical or RF potential is to be applied thereto), and any suitable durable non-semiconductor such as silicon nitride may be employed for the process region enclosure 1030.

In order to maintain the temperature of the semiconductor ceiling 1020 at a selected temperature (e.g., for preventing polymer deposition), a temperature control system employing either direct thermal contact or indirect thermal contact may be employed. In the drawing, a temperature control system employing indirect thermal contact is illustrated and includes a heater layer 1110 on top of an insulating layer 1112 enclosing the coil inductor 1040 over the ceiling 1020 and a cold plate 1120 over the heater layer 1110 and separated therefrom by a thermal resistance air gap 1114. The heater layer 1110 contains a conventional electrical heating element (not shown in the drawing of FIG. 48A), while the cold plate 1120 has internal water cooling jackets 1122. The amount of cooling provided by the cold plate 1120 is more than sufficient to offset any plasma heating of the ceiling 1020 while the amount of heat that the heater layer 1110 is capable of providing is more than sufficient to offset the cooling from the cold plate 1120. A conventional temperature sensor/controller (not shown in the drawing of FIG. 48A) governs the amount of current flow in the resistive heating element of the heater layer 1110.

In order to maintain the temperature of the semiconductor skirt 1010 at a selected temperature (e.g., for preventing polymer deposition), a temperature control system employing either direct thermal contact or indirect thermal contact may be employed. In the drawing, a temperature control system employing direct thermal contact is illustrated and includes a heater ring 1110A surrounding and contacting the skirt 1010 through an optional insulating layer 1112A which is not necessarily required. A cold ring 1120 acontacts the skirt 1010. An optional insulating layer may be placed between the cold ring 1120a and the skirt 1010. The heater ring 1110A contains a conventional electrical heating element 1110B, while the cold ring 1120A has internal water cooling jackets 1122A. The amount of cooling provided by the cold ring 1120A is more than sufficient to offset any plasma heating of the skirt 1010 while the amount of heat that the heater ring 1110A is capable of providing is more than sufficient to offset the cooling from the cold ring 1120A. A conventional temperature sensor/controller (not shown in the drawing of FIG. 48A) governs the amount of current flow in the resistive heating element of the heater ring 1110A.

The second way of preventing polymer deposition on surfaces enclosing the processing region 1035 is to apply an RF potential to these surfaces of sufficient strength to enhance ion bombardment of these surfaces by ions from the plasma. The ion bombardment power must be sufficient to remove polymer from the surfaces faster than it is deposited. For this purpose, the disk-shaped ceiling 1020 and the cylindrical skirt 1010 must be sufficiently conductive to act as electrodes for the applied RF power. The ceiling 1020 and the skirt 1010 are preferably semiconductors. However, they preferably should not be metallic because metal exposed to the plasma in the processing region 1035 furnishes by-products which contaminate the chamber and wafer. Another reason that semiconductor material is preferred over conductive (metallic) material for the ceiling 1020 and skirt 1010 is that conductive material in the ceiling 1020 would prevent transmission through the ceiling 1020 of RF plasma source power from the coil inductor 1040.

In a preferred embodiment, the two ways of preventing polymer deposition (temperature control and a sputter-promoting applied RF potential on the window electrode) are combined. Application of an RF potential to the. semiconductor enclosure 1030 which promotes ion bombardment or sputtering of the surface advantageously reduces the surface temperature necessary to prevent polymer accumulation on the surface. For example, the temperature may be reduced from about 265° C. typically required in the prior art to prevent polymer accumulation to about 100° C. at a sufficiently high bias voltage, so that the invention allows the reactor to run cooler while still preventing polymer accumulation on surfaces within the processing region 1035. Conversely, raising of the surface temperature of the semiconductor enclosure 1030 advantageously reduces the ion bombardment power or sputtering necessary to prevent polymer accumulation on the surface. In one example, the RF power applied to the semiconductor ceiling 1020 was 500 Watts at 0.1 MHz, bias power applied to the wafer pedestal 1060 was 1400 Watts at 1.8 MHz, source power applied to the coil antenna 1040 was 3000 Watts at 2.0 MHz while the temperature of the semiconductor enclosure 1030 was held at 200° C. While an inductive antenna in the form of a coil antenna 1040 was employed in carrying out this exemplary embodiment of the invention, other antenna types may be employed, and the invention is not confined to the use of coil antennas.

As described above, plasma leakage at the wafer pedestal 1060 is prevented by providing, with the collar 1050, a high aspect-ratio opening and/or a meandering passage. Also, as noted above, the slit valve 1075 is a high aspect-ratio opening for the same purpose. Such high aspect ratio openings include not only the side wall-pedestal gap overlaid by the collar 1050 but other types of passages as well such as process gas injection orifices, which naturally block leakage of plasma ions. However, the slit valve 1075 is necessarily large enough to accommodate the semiconductor wafer 1065 and therefore is more susceptible to plasma ion leakage therethrough. In order to prevent leakage of the plasma from the processing region 1035 through large apertures such as the slit valve 1075, an optional feature of the invention includes plasma confinement magnets such as the magnet rings 2130, 2135 on opposite boundaries of the slit valve 1075 to establish magnetic flux lines across the slit valve opening. Plasma ions, electrons or charged particles, upon approaching the slit valve 1075, experience an acceleration normal to the magnetic flux lines and normal to their velocity so that they are diverted from a path through the slit valve 1075 and instead impact the side wall of the slit valve so as to be eliminated by recombination before reaching the pumping annulus 1070. This reduces the probability of ion passage through the slit valve 1075, depending upon the magnetic flux density of the magnets 2130, 2135, the charge on the ions and particles, their mass and velocity. Using plural magnets has the advantage of maximizing magnetic flux across the aperture while minimizing magnetic flux penetration into the chamber toward the wafer 1065. Preferably, the magnets 2130, 2135 are sufficiently strong to affect the heavier ions of the plasma. For example, the magnets should produce a magnetic flux density across the aperture on the order of about 50 Gauss or more, depending upon electron energy in the plasma, plasma ion energy, plasma reactor chamber pressure and other plasma processing parameters. For example, a magnetic flux density between 100 Gauss and 200 Gauss across the aperture reduced ion saturation current at a location 2 cm beyond the magnets by about 75% over a reactor chamber pressure range between 5 mT and 100 mT, an electron density range between 1 and $5 \times 10^{11}$ electrons per cubic centimeter. The magnets are preferably cooled to 100° C., or at least well-below their Curie temperature and are shielded from the plasma ions by, for example, encapsulation in a durable material (such as silicon nitride). Alternative arrangements of the magnets 2130, 2135 will be described below in this specification.

The magnets 2130, 2135 do not prevent charge-neutral radicals and particles, including charge-neutral polymer-forming particles, from passing through the slit valve 1075. Thus, polymer may accumulate in the pumping annulus 1070. In order to capture and control such polymers in the pumping annulus 1070, the interior surfaces of the pumping annulus 1070 are maintained at a temperature well-below the polymer condensation temperature in order to deposit onto the interior surfaces of the pumping annulus 1070 the polymer precursor material escaping through the slit valve 1075. Preferably, the pumping annulus 1070 is covered with a removable cold liner 2150 such as aluminum, anodized aluminum or plasma-sprayed silicon on aluminum, thermally coupled to a cold sink 2155. The advantage of this feature is that polymer accumulated on the cold liner 2150 of the pumping annulus 1070 remains undisturbed by plasma ions, is not subject to plasma heating and is not liable to be sputtered off to become a diffuse contaminant in the chamber 1030. Therefore, the polymer may be allowed to accumulate to a great thickness on the cold liner 2150 before creating any risk of contamination of the chamber. As a result, the cold liner 2150 need not be periodically cleaned or replaced except at the most remote intervals, a significant advantage. The cold liner 2150 may not be required since the polymer deposition rate is so low that polymer accumulated in the pumping annulus surfaces may not need to be removed more often than 30,000 to 40,000 wafers processed in the chamber.

In order to prevent accumulation of polymer on the surfaces of the collar 1050, the temperature of collar 1050 is held at a selected temperature well above the polymer condensation temperature by a conventional temperature control system including a heat sink 2170 and cold sink 2175 thermally coupled to the collar 1050.

In accordance with another feature of the invention, center and edge gas injection ports 2200, 2210 in the center and edge portions of the ceiling 1020, respectively, receive plasma precursor gases from independent gas supplies 2220, 2225. With this feature, the gas flow rates and gas mixtures at the wafer center and wafer periphery may be adjusted independently to precisely compensate for wafer center-to-edge processing non-uniformities. Thus, for example, the gas supply 2220 may furnish one plasma precursor gas mixture at one flow rate over the wafer center while the gas supply 2225 may furnish another plasma precursor gas mixture at another flow rate over the wafer periphery. While the drawing shows the gas supply 2220 coupled to a single gas inlet 2200 over the wafer center, multiple gas inlets overlying the wafer center or a showerhead configuration may be employed to control the gas flow over the wafer center. While the drawing shows the gas supply 2225 coupled to multiple gas inlets 2210 extending radially through the side wall or skirt 1010 toward, the wafer edge, the gas supply 2225 may be coupled instead to gas inlets extending toward the wafer edge either downwardly through the ceiling 1020 or upwardly through the collar 1050 to control gas flow over the wafer edge.

Plasma source RF power is applied to the coil inductor 1040 across the coil terminals 2310, 2320. Bias RF power is applied to the wafer pedestal 1060 through the pedestal terminal 2330. RF power or a ground potential is applied to the semiconductor enclosure electrode 1030 (including the disk ceiling 1020 and cylindrical skirt 1010) through the terminal 2340. Various ways are disclosed above in this specification for providing separate RF power supplies to the semiconductor window enclosure 1030, the induction coil 1040 and wafer pedestal 1060 (as shown, for example, in FIG. 1, 5, 19 or 23), or splitting RF power thereto from common RF power supplies (as shown, for example, in FIG. 4, 18, 19 or 20), any one of which may be applied to the embodiment of FIG. 48A. Moreover, various induction coil geometries are disclosed above in this specification (as shown, for example, in FIG. 30A, 30B, 30C, 31A, 31B, 31C, 32, 33 or 34), any one of which may be employed in carrying out the embodiment of FIG. 48A.

Thus, the embodiment of FIG. 48A has three independent electrodes, namely (a) the wafer pedestal 160, (b) the semiconductor ceiling 1020 and (c) the semiconductor skirt

1010. Each one of these three "electrodes" can be larger or smaller in effective area than the other two, depending upon the desired interaction between the particular "electrode" and the plasma. By such an increase or decrease in effective area of one the three "electrodes" relative to the other two, plasma ion flux and energy at the one electrode may be apportioned relative to the other electrodes. Specifically, a decrease in an electrode's effective area relative to the other electrodes increases the plasma ion flux and energy at the one electrode. This provides another way to control the interaction between the one electrode and the plasma and can be used, for example, to alleviate RF bias power requirements or temperature requirements in achieving a desired electrode-plasma interaction. As one example of a desired electrode-plasma interaction, in one mode of the present invention it is preferable to prevent deposition of materials onto the semiconductor enclosure interior surfaces, including the two semiconductor electrodes (i.e., the skirt 1010 and the ceiling 1020). By thus maintaining the semiconductor electrode free of deposited contaminants (e.g., polymer precursors), wafer contamination due to flaking off of deposited materials from the electrode is prevented while at the same time the electrode is left uncovered to enable it to continue participating favorably in the plasma process chemistry. For example, the electrode may be a silicon-containing material and the plasma process may be a silicon oxide etch process employing a fluorine-containing process gas, in which case the electrode provides sputtered silicon material into the plasma to scavenge fluorine. In any case, alleviation RF bias power requirements or electrode temperature requirements may be accomplished by adjusting any one, or some, or all of the following three parameters at the one "electrode": (a) RF bias power applied to the one electrode, (b) temperature of the one electrode, and (c) effective area of the one electrode relative to the other electrodes, effective areas. Thus, if it is desired to minimize the temperature of one of the electrodes and to minimize the RF bias power applied to the one electrode while nevertheless preventing deposition of materials (such as polymer precursors) on the one electrode, then the electrode's effective area may be decreased to increase the plasma ion flux and energy at the one electrode so as to compensate for a reduced electrode temperature and electrode RF bias power. In this manner, the selection of effective electrode area can alleviate RF bias power and temperature requirements in attaining a desired interaction between the electrode and the plasma.

Figure 52:
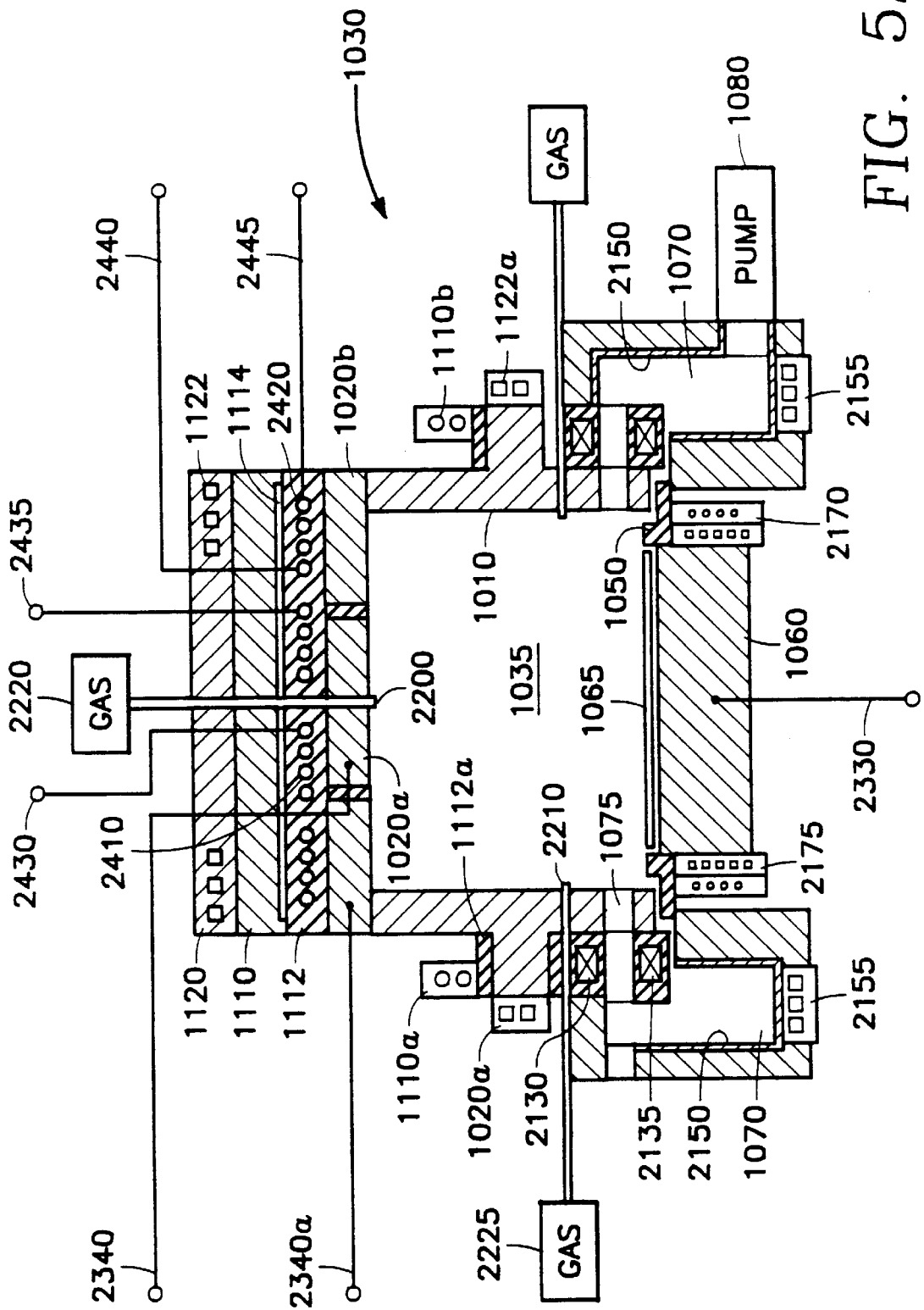
FIG. 52 illustrates the plasma reactor of FIG. 50 with separate inner and outer induction coils.

In the embodiment of FIG. 48A, the coil inductor 1040 may be divided into electrically separate inner and outer coil inductors. For example, such inner and outer coil inductors are illustrated in FIG. 52 as inner and outer coil inductors 2410 and 2420. Various ways of separately driving such inner and outer coil inductors in combination with a semiconductor window enclosure are disclosed above in this specification (as shown, for example, in FIGS. 6, 16), any one of which may be employed in carrying out the embodiment of FIG. 48A. In a special case in which the wafer-to-ceiling distance is small, one advantage of separately controlling the outer antenna coil 2420 is that the plasma density over the wafer center, which is lower than that at the wafer periphery due to the small wafer-to-ceiling distance, may be enhanced relative to that at the wafer periphery by decreasing the RF plasma source power applied to the outer coil inductor 2420 relative to that applied to the inner coil inductor 2410.

Figure 48B:
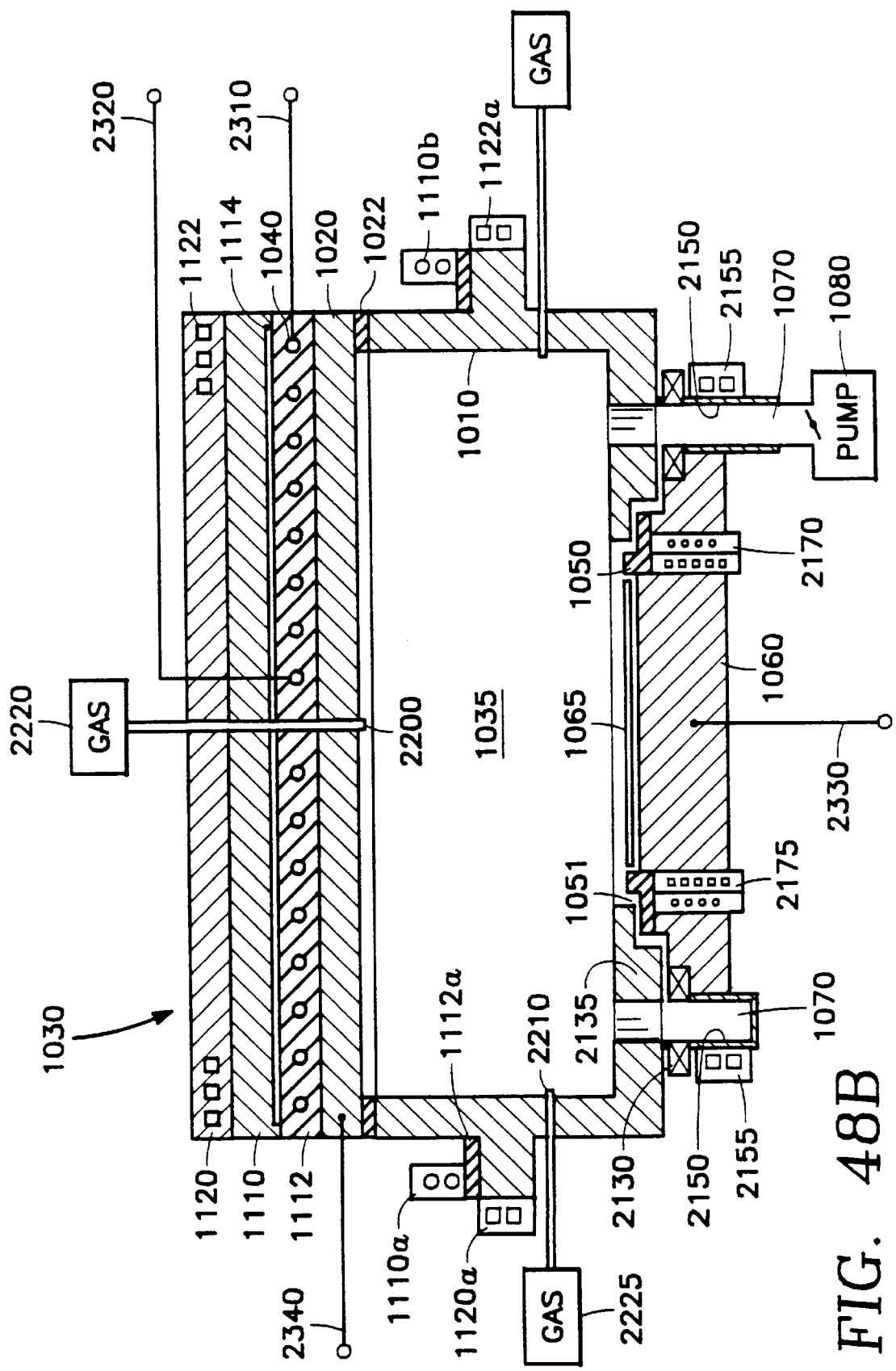
FIG. 48B is a cut-away side view of a plasma reactor corresponding to that of FIG. 48A with the exception that the plasma is isolated axially rather than laterally relative to the wafer pedestal.

While the embodiment of FIG. 48A exhausts the processing region 1035 laterally to the pumping annulus 1070, the embodiment of FIG. 48B exhausts downwardly parallel to the axis of the cylindrical skirt 1010 to the pump 1080. Optional magnet rings 2130a, 2135a block downward leakage of plasma from the processing region 1035 to the pumping annulus. In the embodiment of FIG. 48A, in order to further block plasma leakage the aperture 1075 has a relatively high aspect ratio, so that leaking plasma ions or electrons tend to collide and be absorbed on the interior surfaces of the aperture 1075 before completing their passage therethrough. Another feature that reduces plasma leakage is the meandering path through the opening 1051 between the collar 1050 and the bottom of the skirt 1010. As shown in the drawing, the collar 1050 and the bottom of the skirt 1010 have conforming overlapping step shapes—in the manner of overlapping baffles—which constrain any plasma passing therebetween to follow a meandering path through the gap 1051, thereby increasing the incidence of plasma collision with the surfaces thereof.

In FIG. 48A, the cylindrical skirt 1010 is electrically separated from the disk ceiling 1020 that each may be connected to independent RF power sources through terminals 2340 and 2340a respectively. This permits the plasma conditions near the wafer periphery to be controlled by the separate RF potential applied to the terminal 2340a on the cylindrical skirt 1010 independently of the RF potential applied to the terminal 2340 of the disk ceiling 1020 which tends to affect plasma conditions near the wafer center. Various ways of controlling the RF potential on two electrical separate sections of the semiconductor window enclosure are disclosed above in this specification (as shown, for example, in FIG. 42, 46, 10, 11 or 12), any one of which may be employed in carrying out the embodiment of FIG. 48A.

Figure 48C:
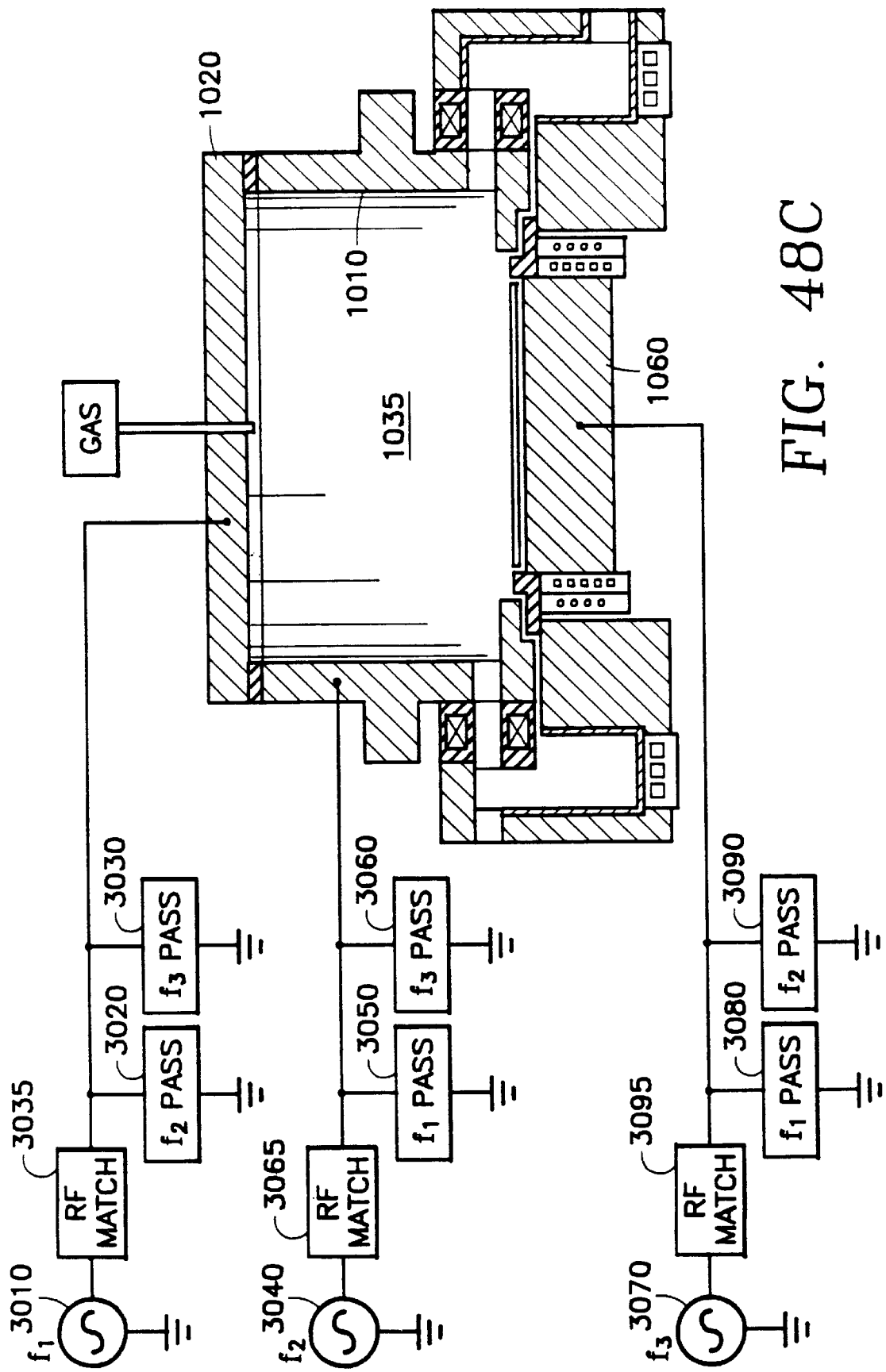
FIG. 48C illustrates an embodiment corresponding to FIG. 48A in which different sections of the ceiling are driven at different RF frequencies.

Since the skirt 1010, the ceiling 1020 and the wafer pedestal 1060 are susceptible of being used as independent electrodes, any one of them may be electrically grounded relative to the others, while the ungrounded ones may be driven with the same or different power sources. For example, as illustrated in FIG. 48C, a first RF power source 3010 of frequency $F_1$ is coupled to the semiconductor ceiling electrode 1020, while filters 3020 and 3030 prevent coupling of RF power at frequencies $f_2$ and $f_3$ back to an RF impedance match circuit 3035. A second RF power source 3040 of frequency $f_2$ is coupled to the semiconductor ceiling skirt 1010, while filters 3050 and 3060 prevent coupling of RF power at frequencies $f_1$ and $f_3$ back to an RF impedance match circuit 3065. A third RF power source 3070 of frequency $f_3$ is coupled to the wafer pedestal 1060, while filters 3080 and 3090 prevent coupling of RF power at frequencies $f_1$ and $f_2$ back to an impedance match circuit 3095. The embodiment of FIG. 48C may be modified as desired by grounding any one of the three elements 1020, 1010 or 1060.

Forming the semiconductor enclosure 1030 as two separate silicon pieces 1010, 1020 provides an additional advantage of ease of fabrication, and is therefore preferable.

Figure 49:
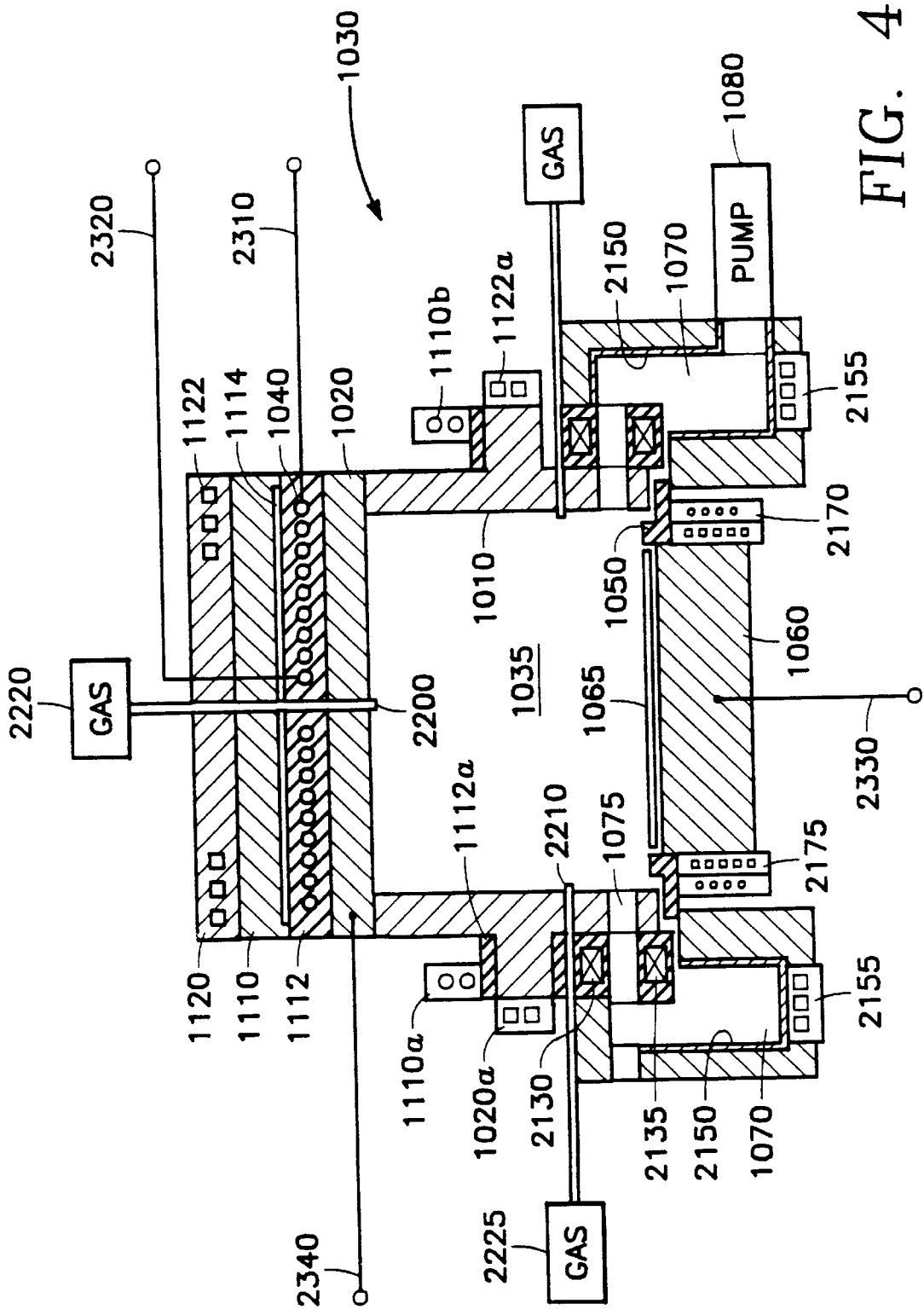
FIG. 49 is a cut-away side view of a plasma reactor corresponding to that of FIG. 48A with the exception that the all-semiconductor enclosure is monolithic.

FIG. 49 illustrates an embodiment corresponding to that of FIG. 48A except that the skirt 1010 and ceiling 1020 are not electrically insulated from one another and may even be formed as a single integral monolithic silicon piece.

Figure 50:
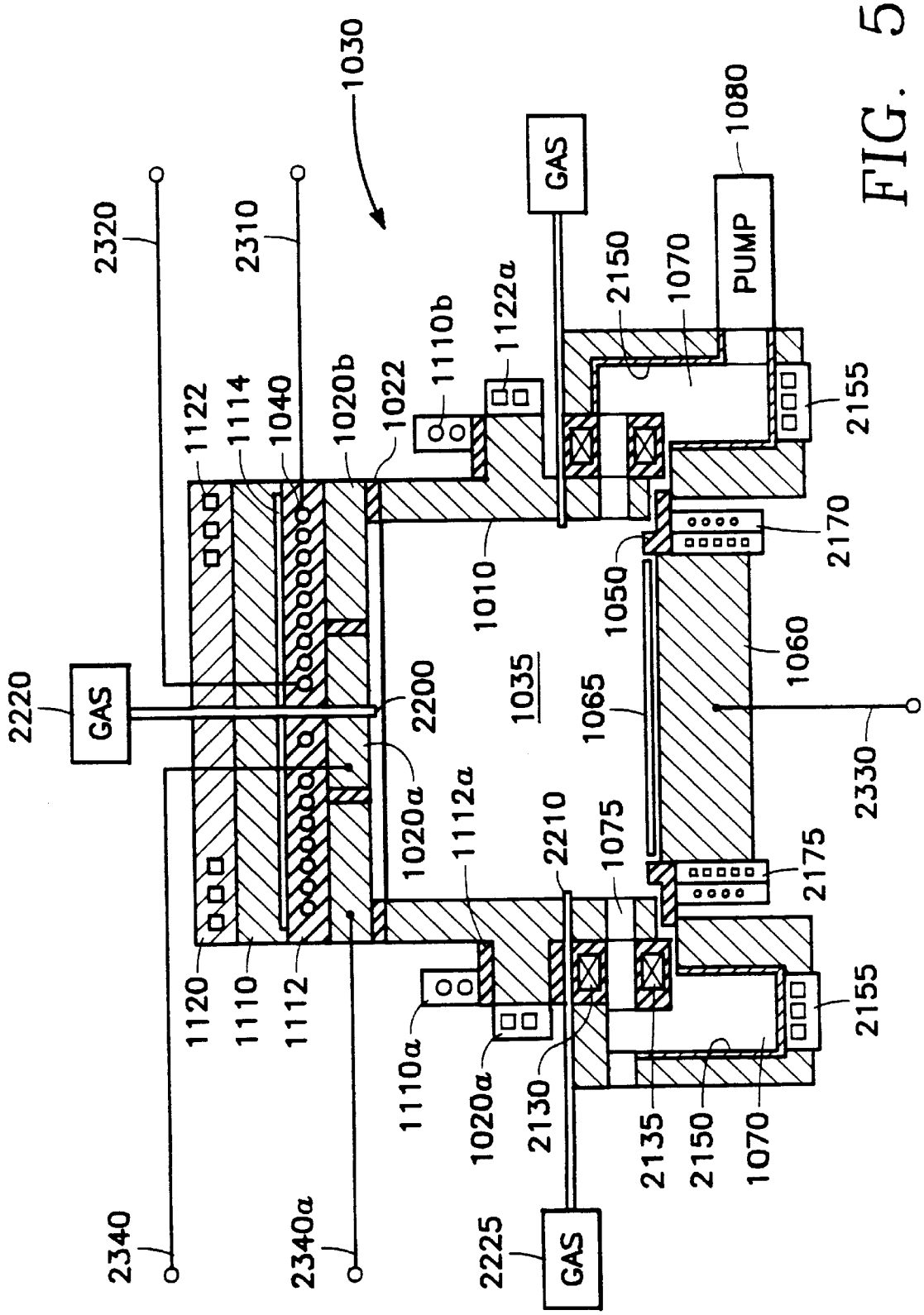
FIG. 50 is a cut-away side view of a plasma reactor corresponding to that of FIG. 48A with the exception that the semiconductor enclosure is divided into a disk center section and an annular section having cylindrical skirt.

FIG. 50 illustrates how the disk-shaped semiconductor ceiling 1020 may be divided into an inner center disk portion 1020a and a peripheral annular portion 1020b from which the cylindrical skirt 1010 extends downwardly. As in the embodiment of FIG. 49, the plasma conditions at the wafer center and wafer edge may be controlled independently by separate RF bias signals applied to the separate terminals 2340 and 2340a, respectively. Any one of the various ways disclosed above for controlling separate sections of the semiconductor window enclosure 1030 referred to above with reference to the embodiment of FIG. 48A may be employed in carrying out the embodiment of FIG. 50.

Figure 51:
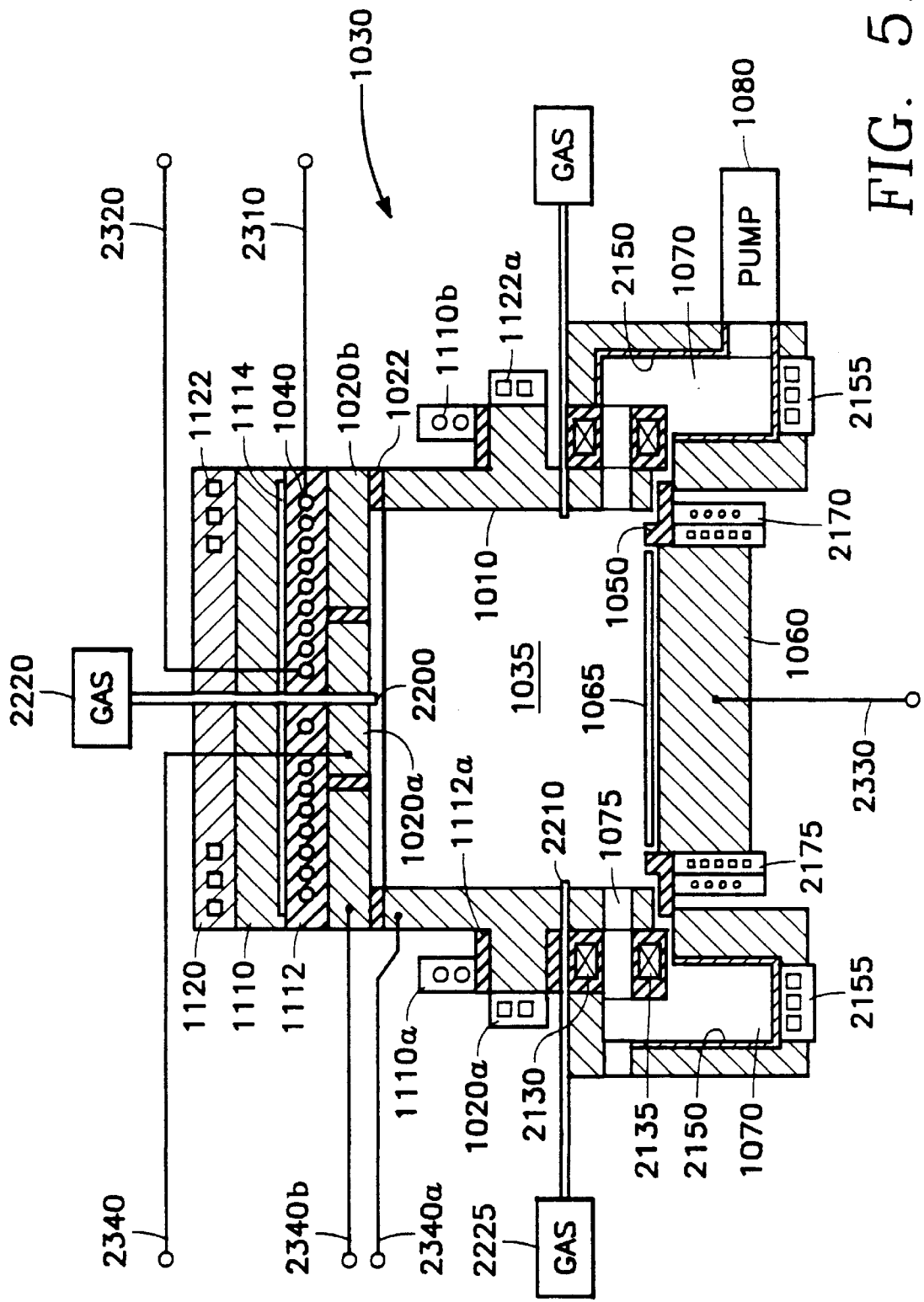
FIG. 51 is a cut-away side view of a plasma reactor corresponding to that of FIG. 48A with the exception that the semiconductor enclosure is divided into a disk center section, an annular side section and a separate cylindrical skirt.

FIG. 51 illustrates how the semiconductor window enclosure 1030 may be divided into three electrically separate portions, including (1) an inner disk portion 1020a of the ceiling 1020, (2) an outer annular portion 1020b of the ceiling 1020 and (3) the skirt 1010 separated from the annular portion 1020b. Three separate RF signals may be applied to the three portions through the terminal 2340 to the inner disk portion 1020a, through the terminal 2340a to the skirt 1010 and through the terminal 2340b to the outer annular portion 1020b.

FIG. 52 illustrates how the embodiment of FIG. 50 can be combined with independent inner and outer induction coils 2410, 2420 for independent control of plasma conditions at over the wafer center and the wafer edge. Terminals 2430, 2435 and 2440, 2445 to the inner and outer induction coils 2410, 2420, respectively may be driven by separate RF power supplies or by splitting RF power from a common supply. Various ways of powering such inner and outer induction coils 2410, 2420 in combination with separately driven portions of the semiconductor window enclosure 1030 are disclosed above in this specification (as shown, for example, in FIG. 42, 43 or 46), any one of which may be employed in carrying out the embodiment of FIG. 52.

Figure 53:
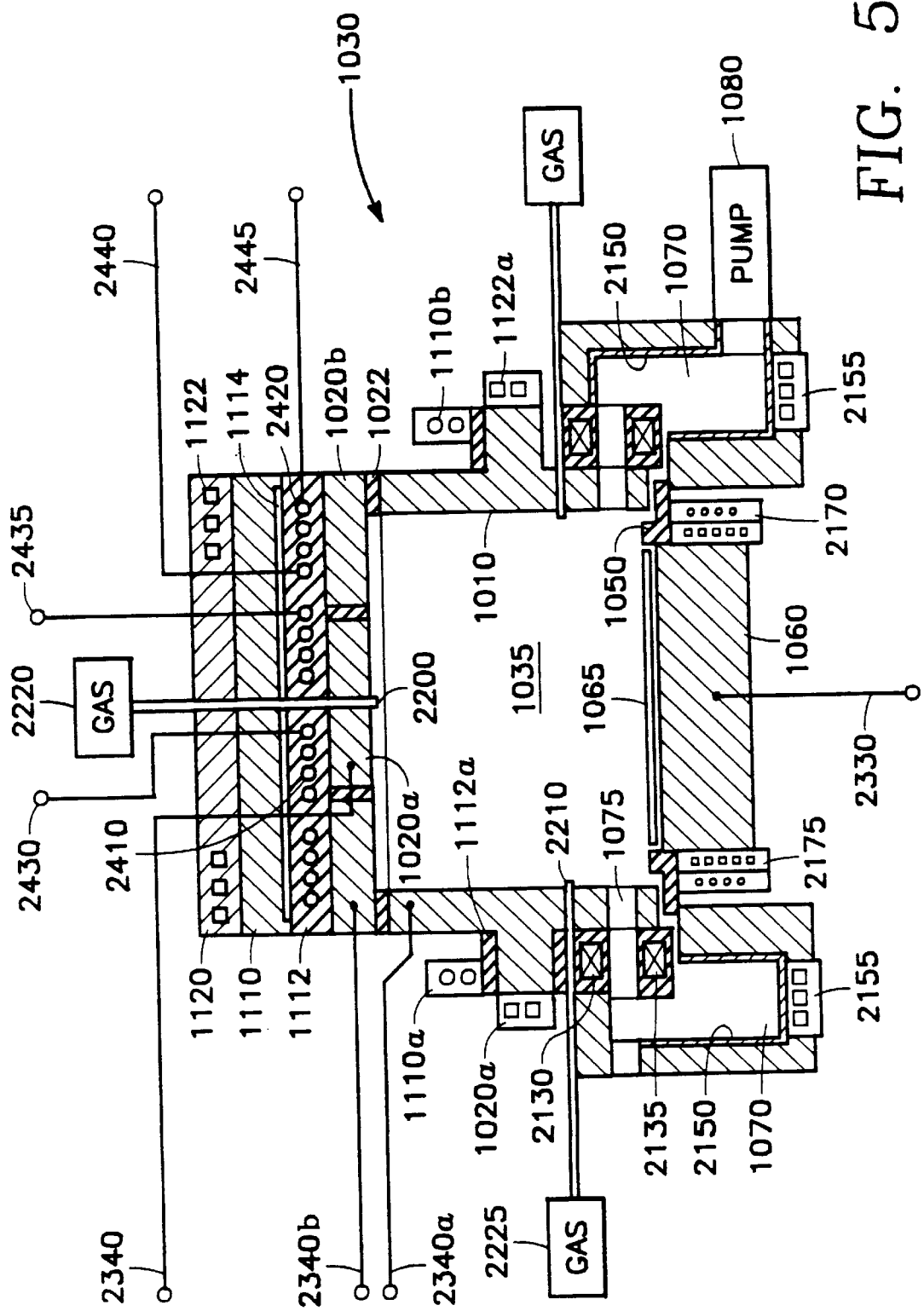
FIG. 53 illustrates the plasma reactor of FIG. 51 with separate inner and outer induction coils.

FIG. 53 illustrates how the embodiment of FIG. 51 may be combined with the separate inner and outer coil inductors 2410, 2420.

Figure 54:
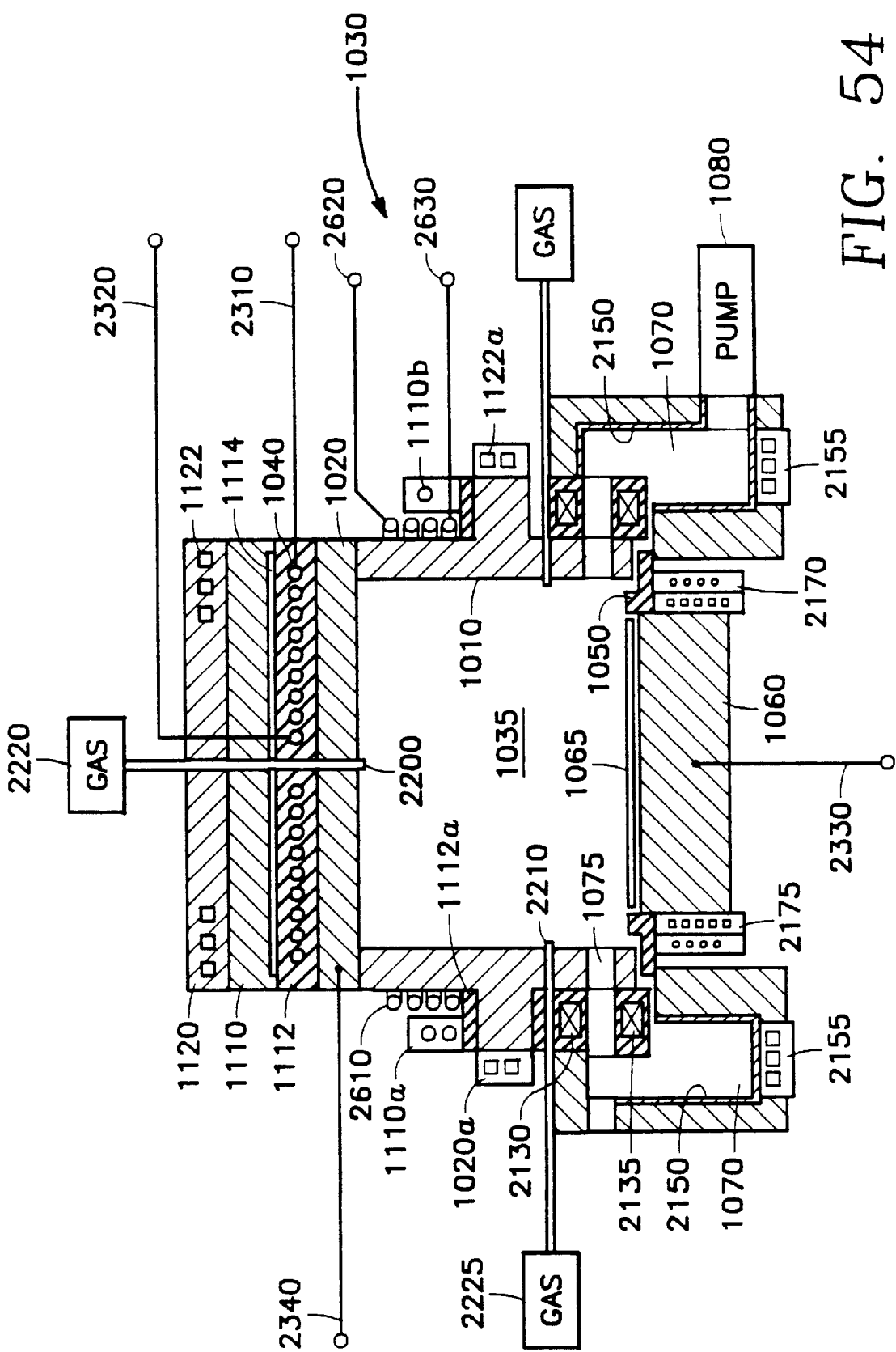
FIG. 54 illustrates the plasma reactor of FIG. 48A with a cylindrical induction coil wound around the cylindrical skirt of the semiconductor enclosure.

FIG. 54 illustrates how the embodiment of FIG. 48A may be combined with a cylindrical side coil 2610 wound around the semiconductor skirt 1010, in a manner analogous to that of the embodiment of FIG. 10. Plasma RF source power is applied to the side coil 2610 through terminals 2620, 2630. Preferably, the top coil 1040 and the side coil 2610 are separated by a distance equal to at least about twice the skin depth of the RF field in the plasma.

Optionally, the coil inductor 1040 overlying the ceiling 1020 may be eliminated in favor of the side coil 2610, in analogy with the embodiments of FIGS. 7, 8 and 9. In such a case only the skirt 1010 is required to be a semiconductor material providing a cylindrical semiconductor window enclosure 1030, while the ceiling 1020 may be an insulator (such as silicon nitride, for example). Any one of the techniques of FIG. 7, 8 or 9 for separately applying RF power to the cylindrical semiconductor window enclosure, the side coil and the wafer pedestal may be employed in carrying out the embodiment of FIG. 54.

Figure 55:
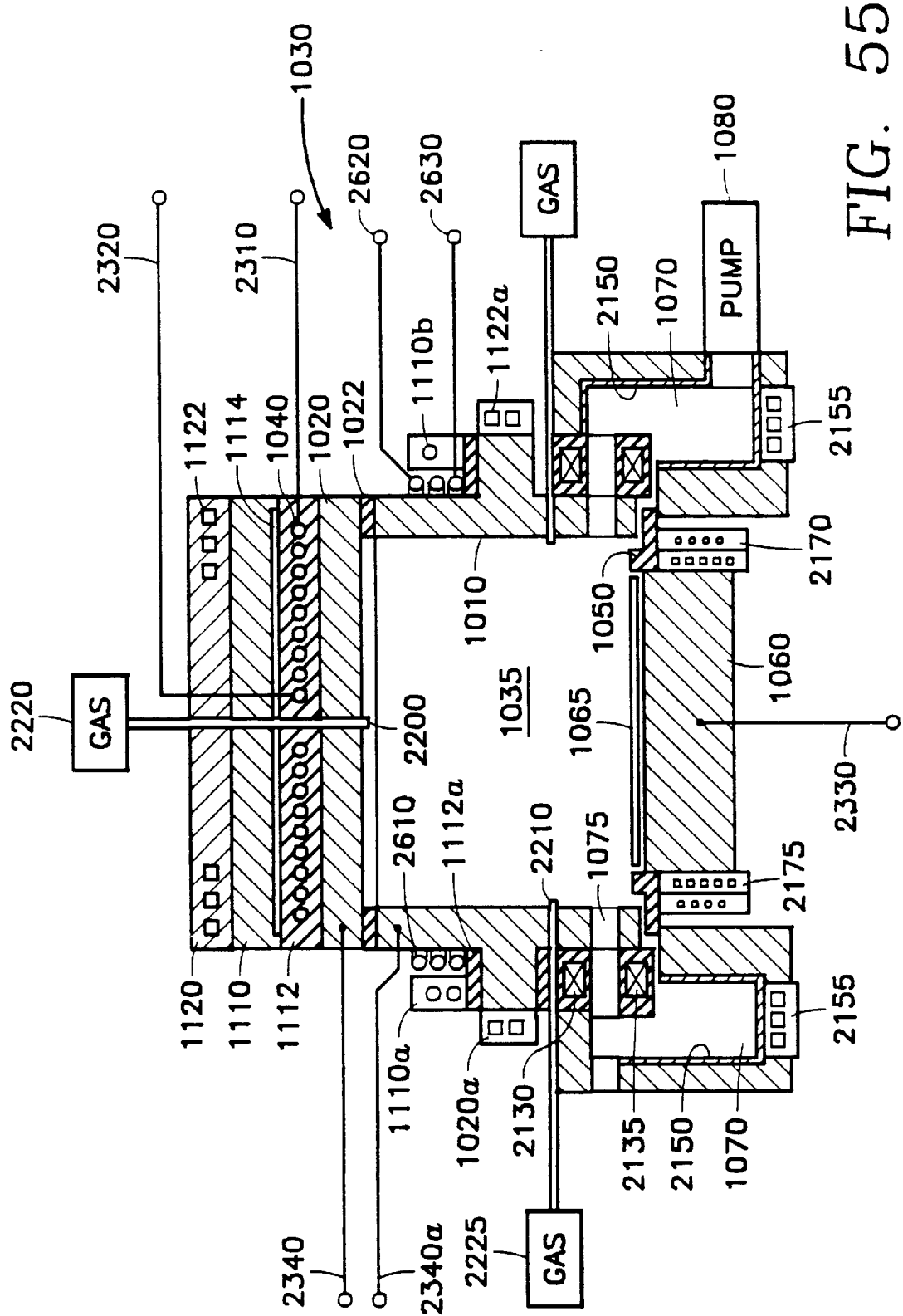
FIG. 55 illustrates the plasma reactor of FIG. 49 with a cylindrical induction coil wound around the cylindrical skirt of the semiconductor enclosure.

FIG. 55 illustrates how the embodiment of FIG. 48A whose semiconductor window enclosure 1030 is divided into a ceiling 1020 and a skirt 1010, may be combined with the cylindrical side coil 2610 wound around the skirt 1010. Any one of the ways illustrated in FIGS. 10, 11 and 12 of applying RF power to the separate ceiling sections and top and side coil inductors may be employed in carrying out the embodiment of FIG. 55.

Figure 56:
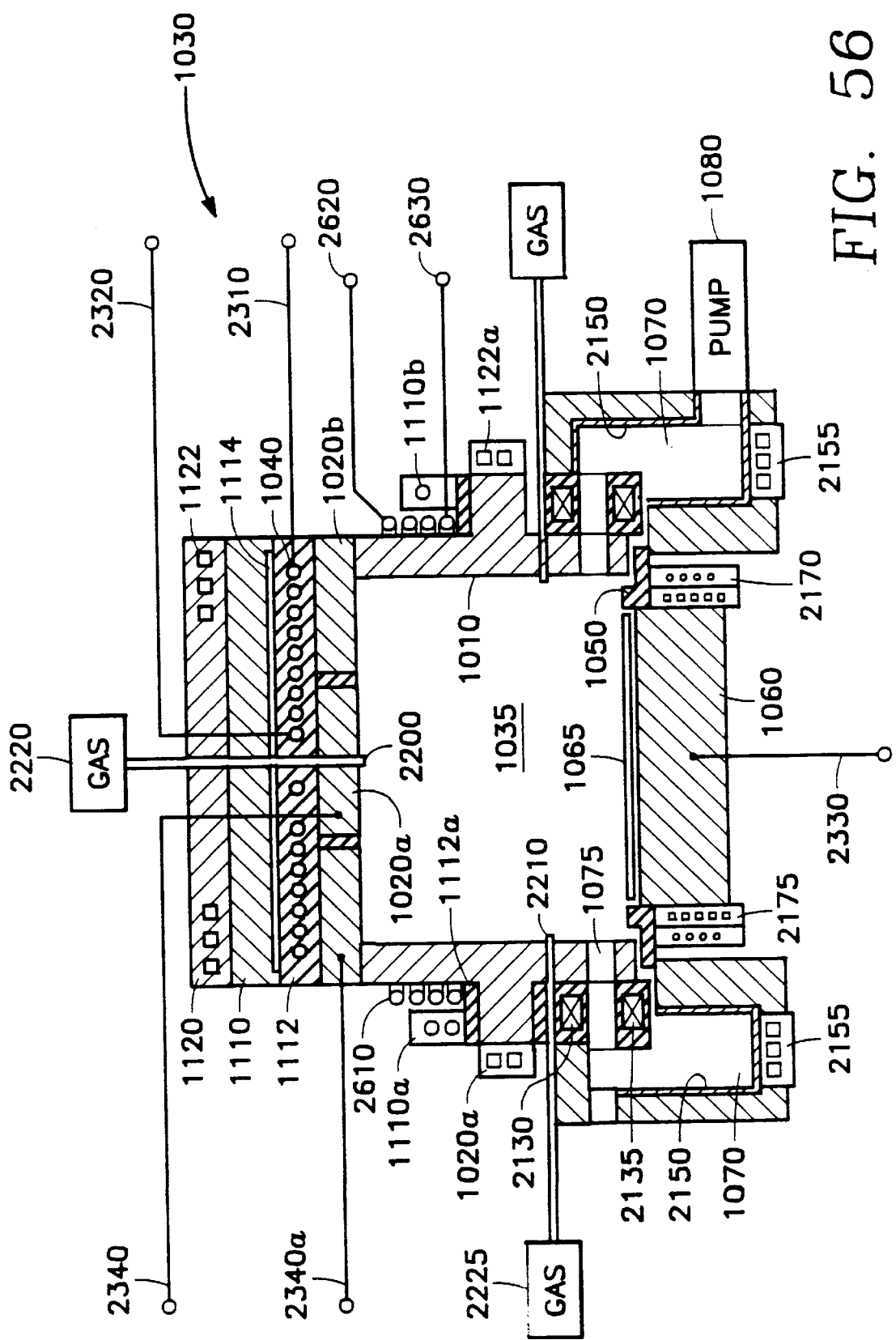
FIG. 56 illustrates the plasma reactor of FIG. 50 with-a cylindrical induction coil wound around the cylindrical skirt of the semiconductor enclosure.

FIG. 56 illustrates how the embodiment of FIG. 50, whose semiconductor window enclosure 1030 is divided into an inner disk portion 1020a and an outer annulus portion 1020b with the skirt 1010 may be combined with the side coil 2610 wound around the skirt 1010. Any one of the ways illustrated in FIGS. 10, 11 and 12 of applying RF power to the separate ceiling sections and top and side coil inductors may be employed in carrying out the embodiment of FIG. 56.

Figure 57:
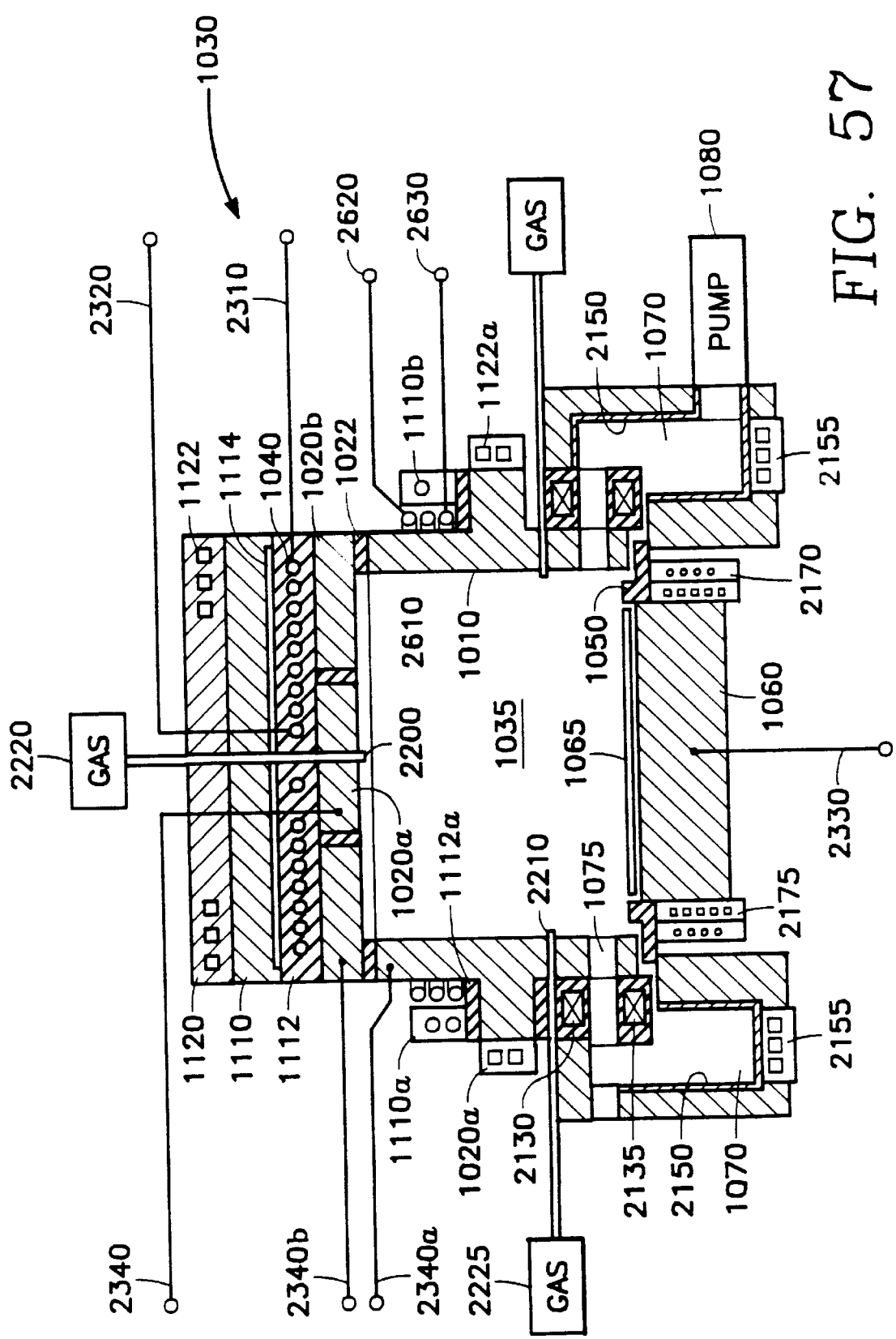
FIG. 57 illustrates the plasma reactor of FIG. 51 with a cylindrical induction coil wound around the cylindrical skirt of the semiconductor enclosure.

FIG. 57 illustrates how the embodiment of FIG. 51, whose semiconductor window enclosure 1030 is divided into an inner disk portion 1020a, an outer annulus portion 1020b and the skirt 1010, may be combined with the side coil 2610 wound around the skirt 1010.

Figure 58:
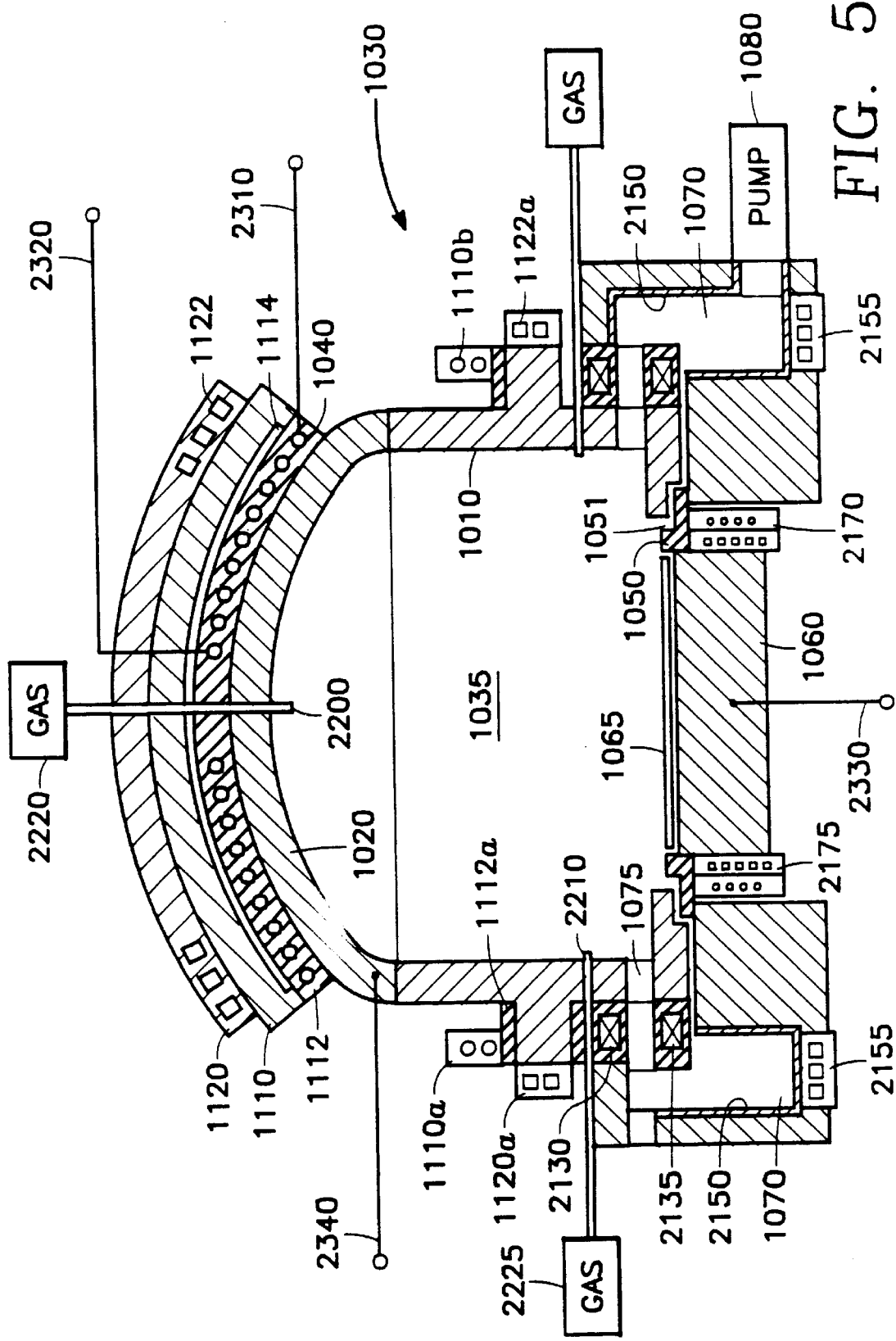
FIG. 58 is a cut-away side view of a plasma reactor corresponding to that of FIG. 48A with the exception that the ceiling portion of the semiconductor enclosure is dome-shaped.
Figure 59:
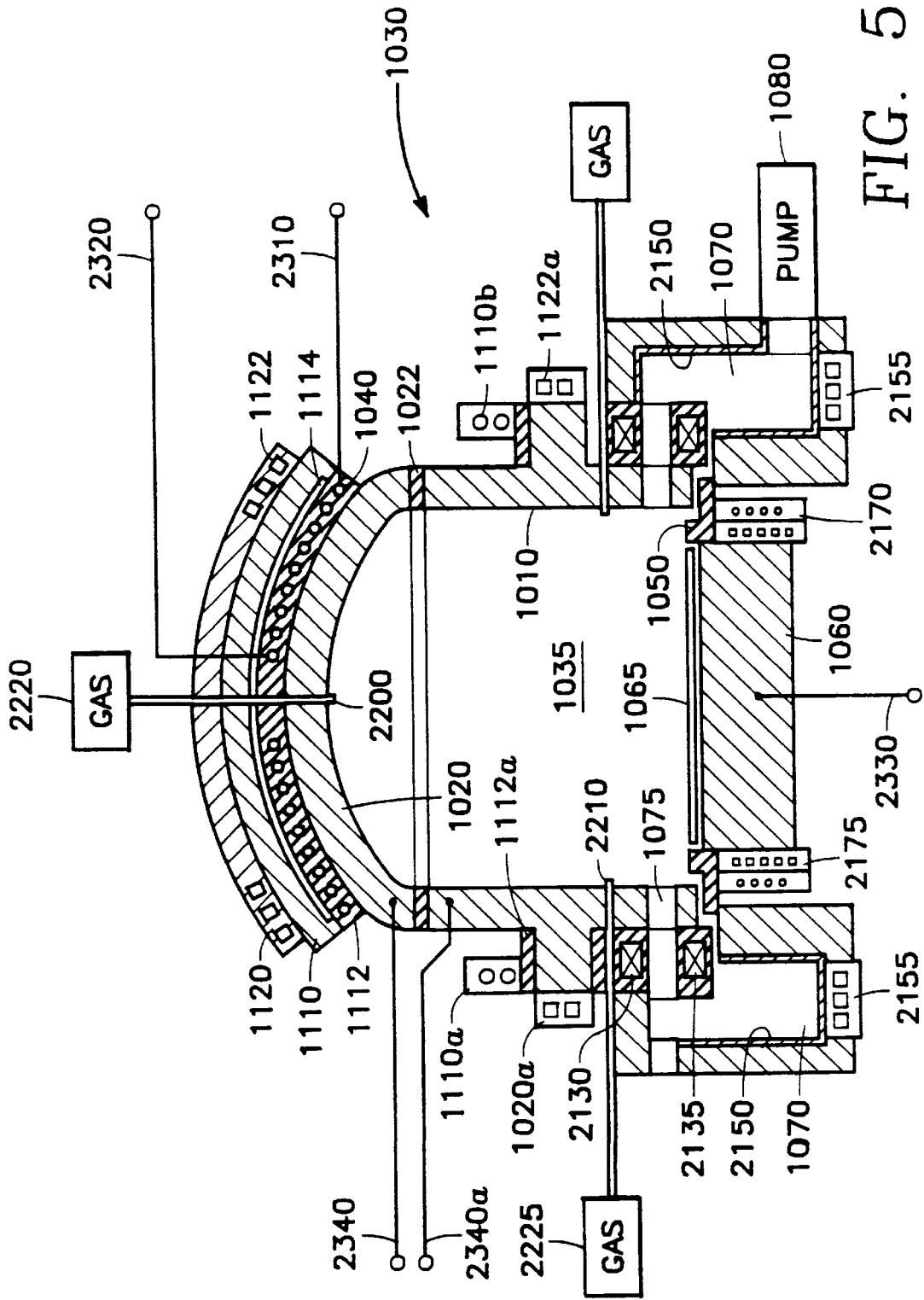
FIG. 59 is a cut-away side view of a plasma reactor corresponding to that of FIG. 49 with the exception that the ceiling portion of the semiconductor enclosure is dome-shaped.
Figure 60:
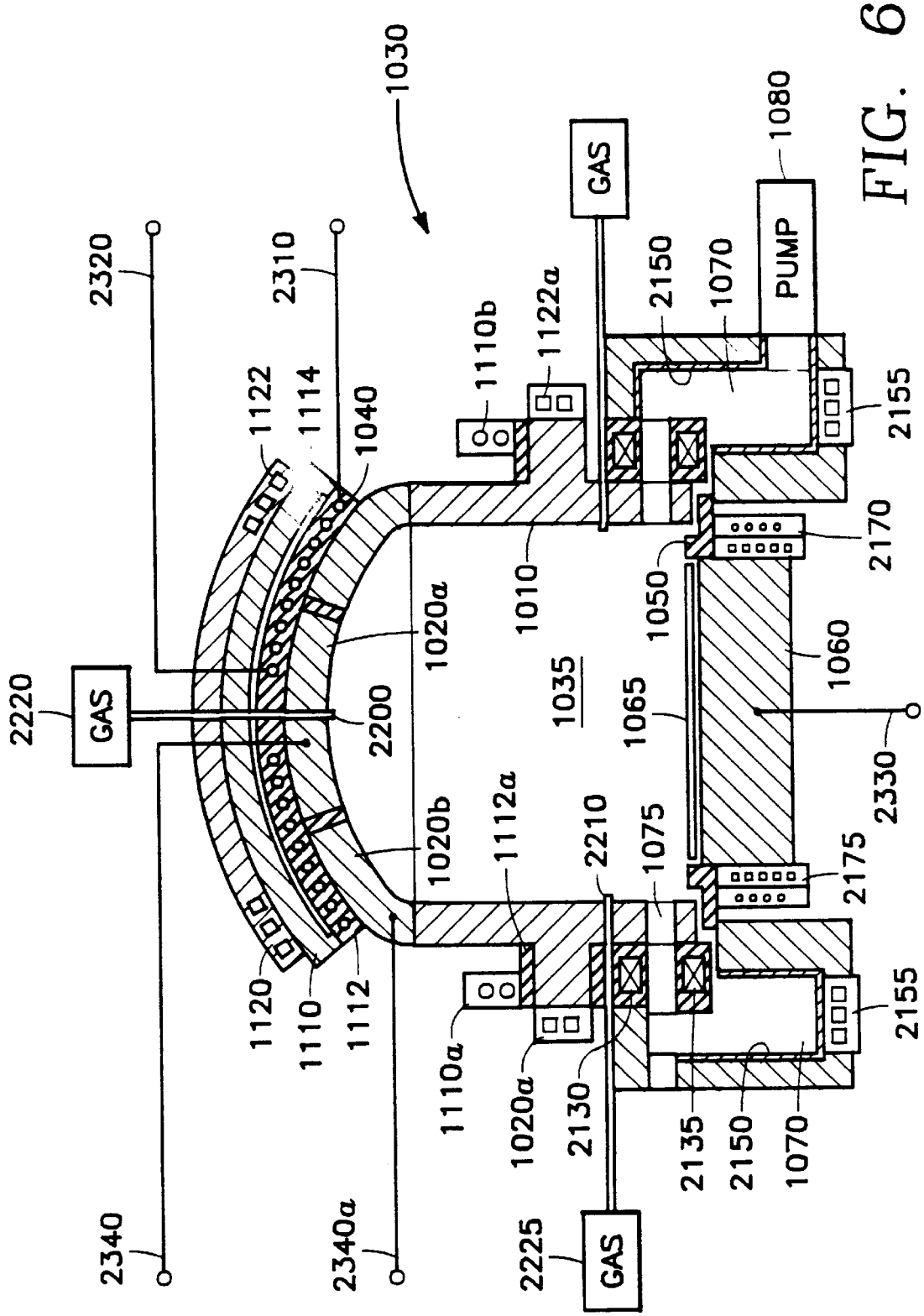
FIG. 60 is a cut-away side view of a plasma reactor corresponding to that of FIG. 50 with the exception that the ceiling portion of the semiconductor enclosure is dome-shaped.
Figure 61:
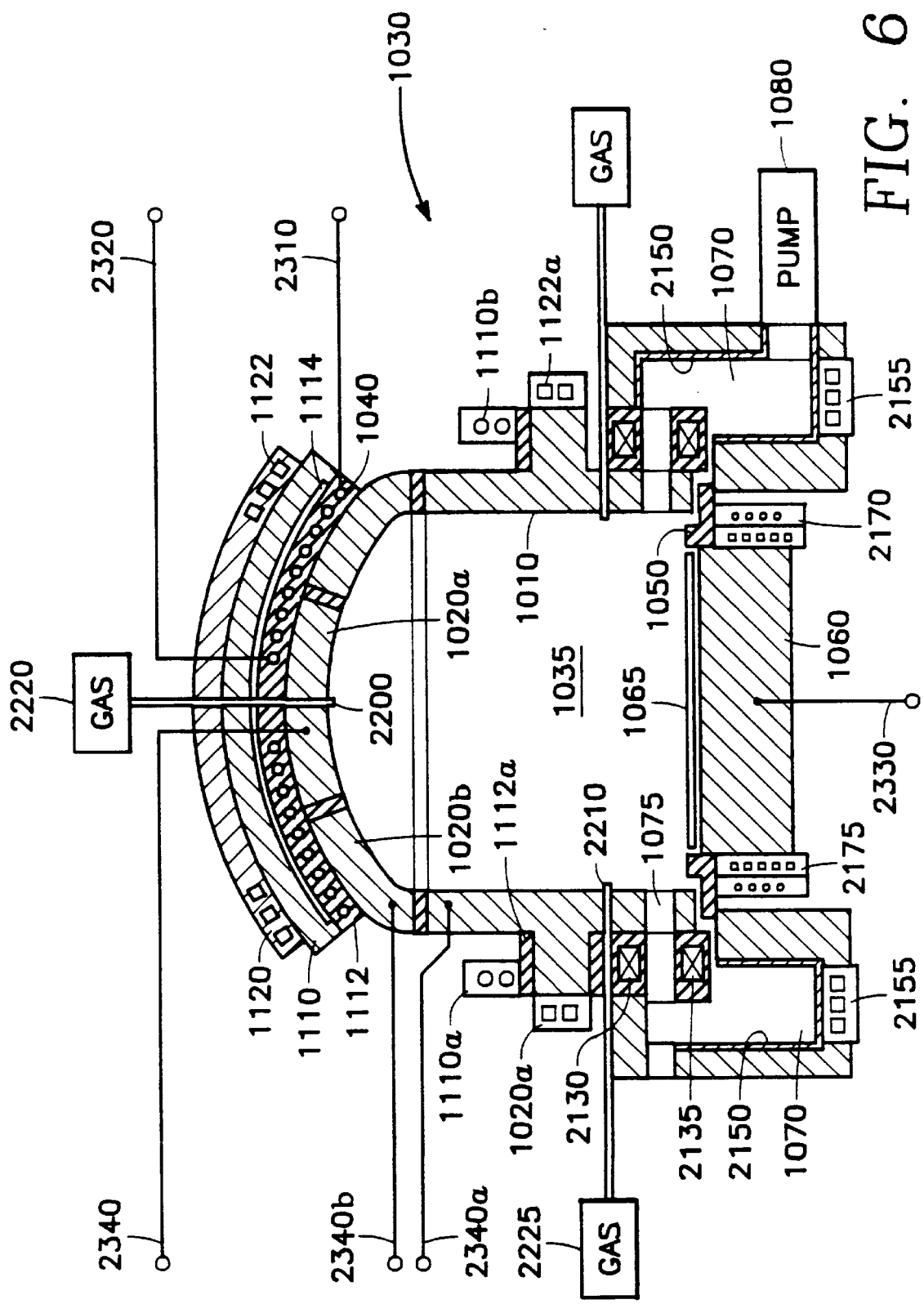
FIG. 61 is a cut-away side view of a plasma reactor corresponding to that of FIG. 51 with the exception that the ceiling portion of the semiconductor enclosure is dome-shaped.
Figure 62:
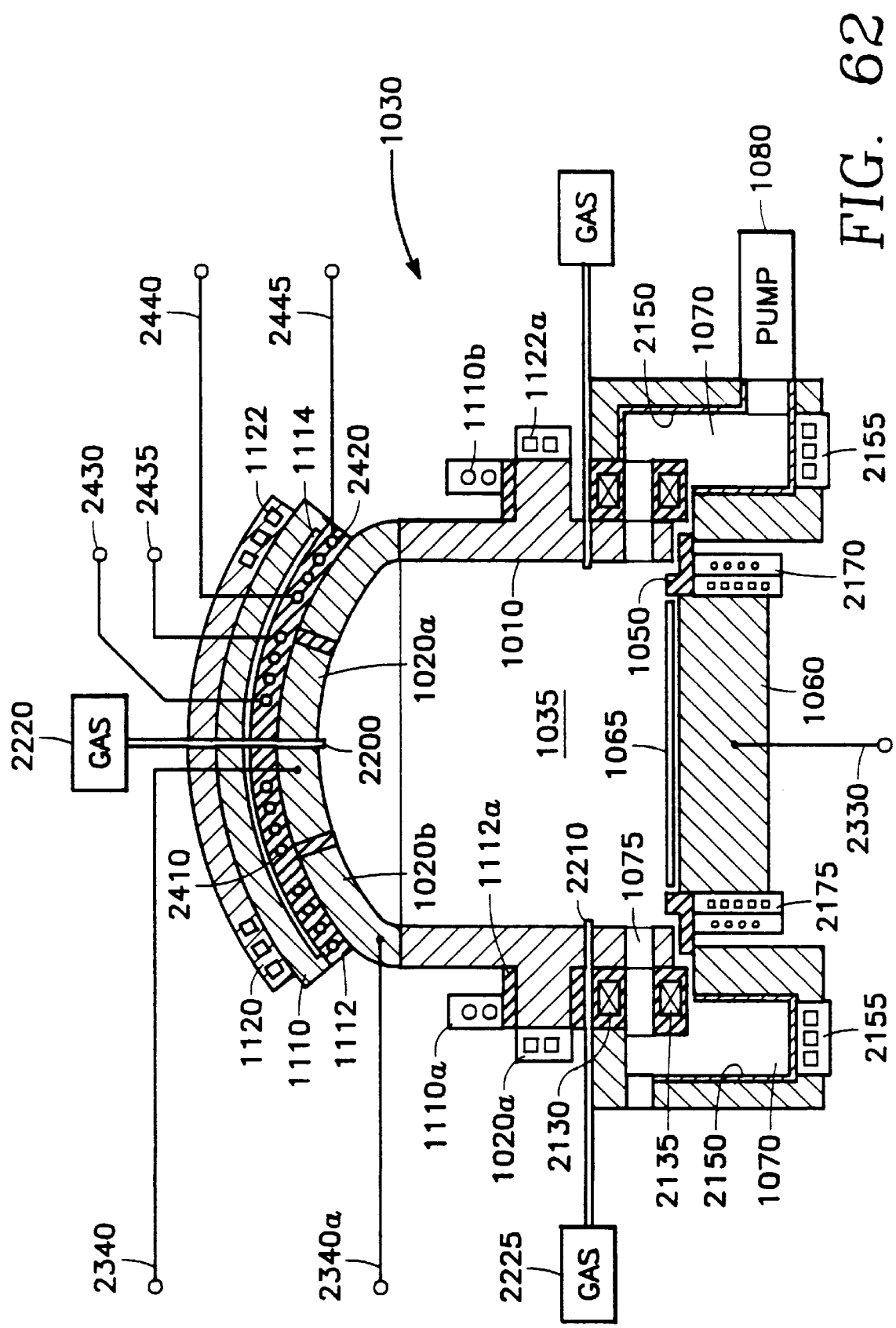
FIG. 62 is a cut-away side view of a plasma reactor corresponding to that of FIG. 52 with the exception that the ceiling portion of the semiconductor enclosure is dome-shaped.
Figure 63:
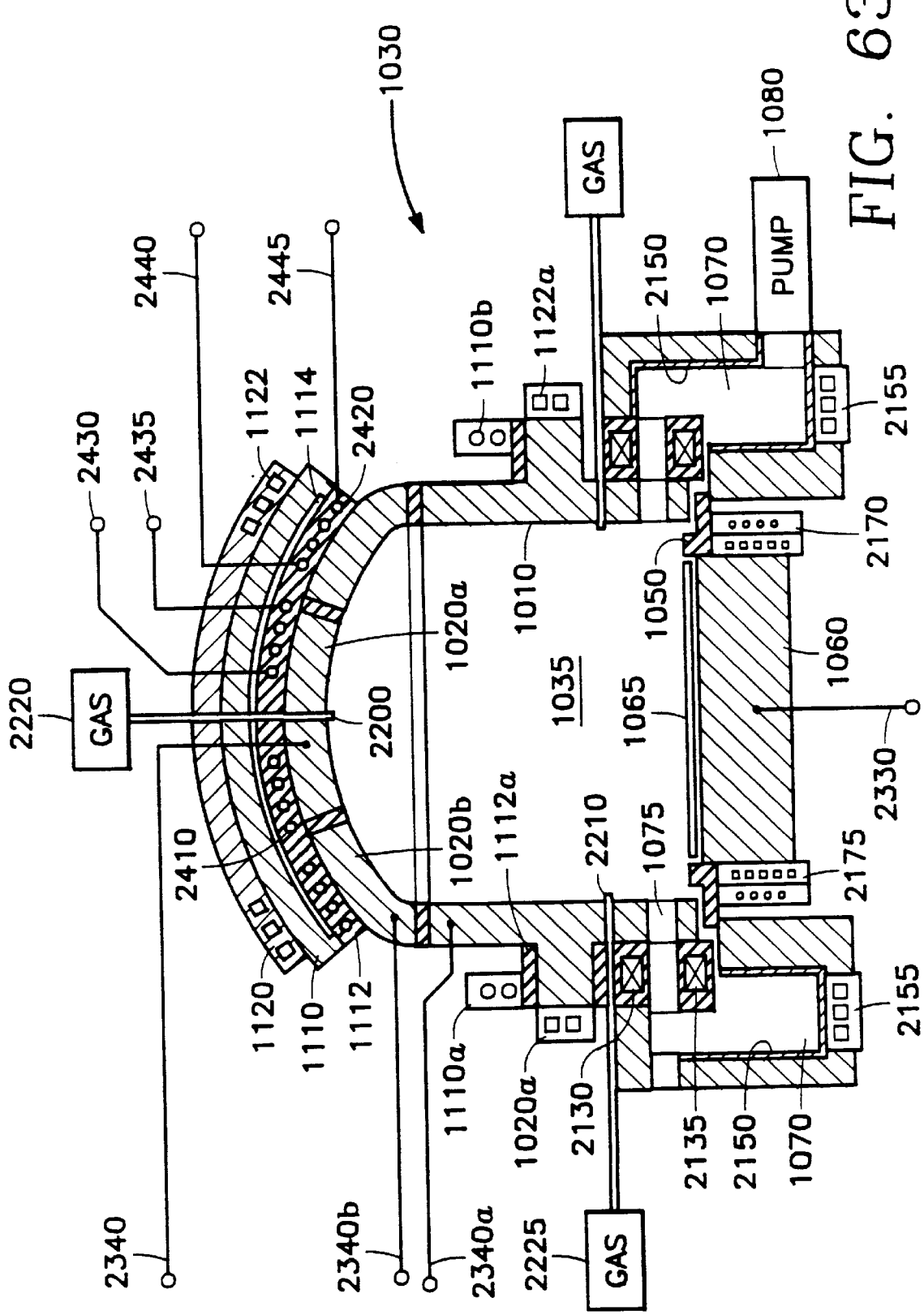
FIG. 63 is a cut-away side view of a plasma reactor corresponding to that of FIG. 53 with the exception that the ceiling portion of the semiconductor enclosure is dome-shaped.
Figure 64:
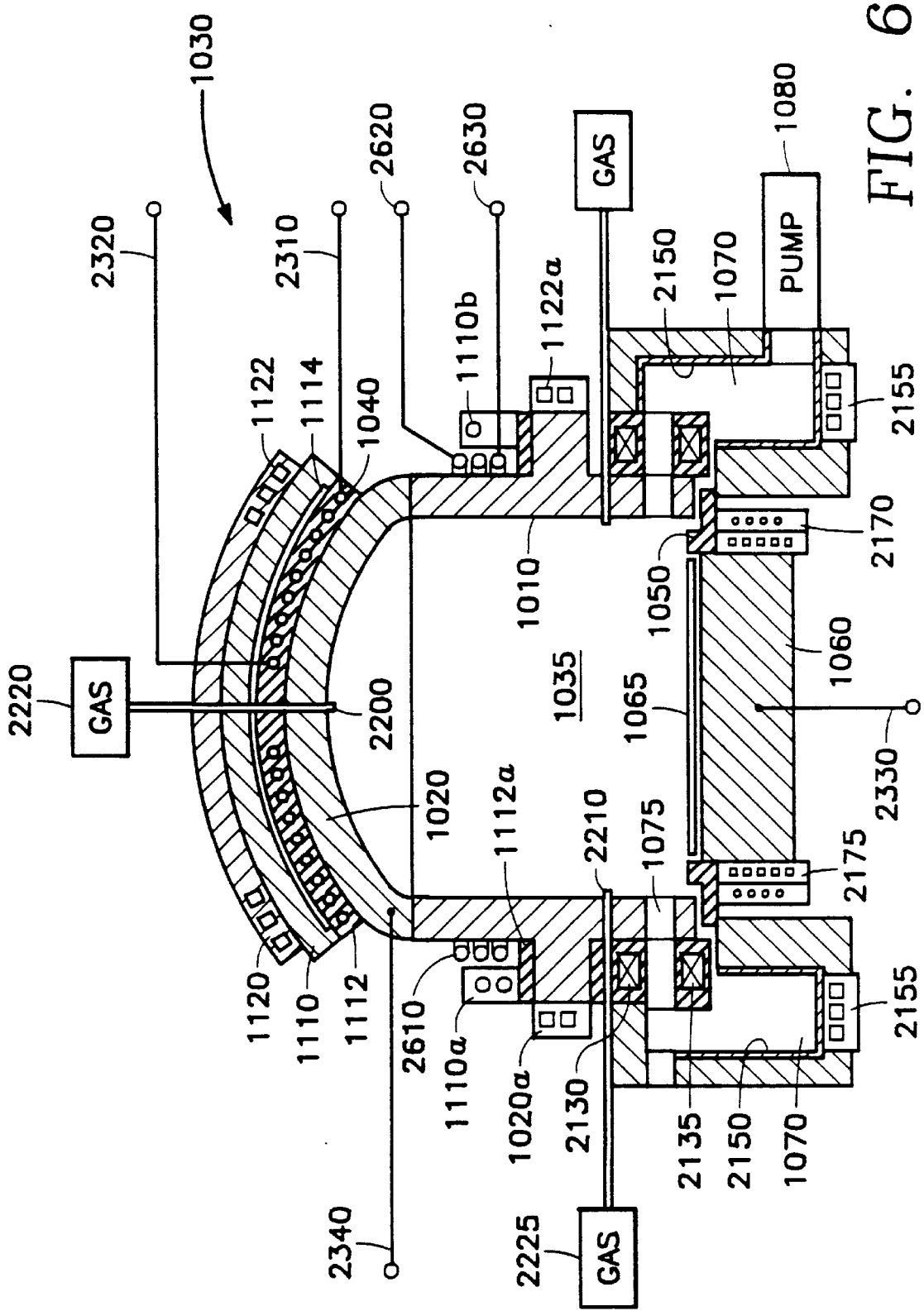
FIG. 64 is a cut-away side view of a plasma reactor corresponding to that of FIG. 54 with the exception that the ceiling portion of the semiconductor enclosure is dome-shaped.
Figure 65:
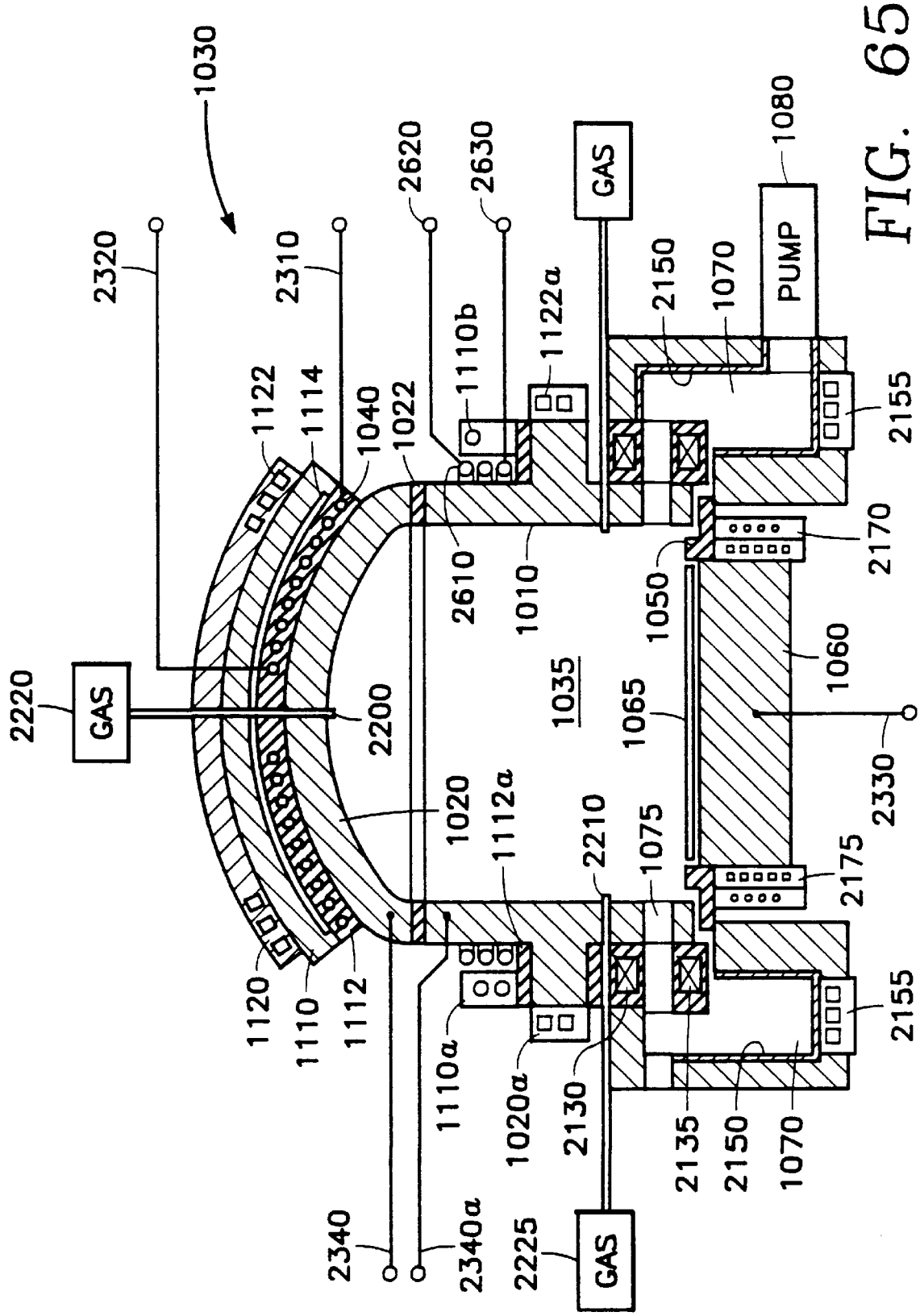
FIG. 65 is a cut-away side view of a plasma reactor corresponding to that of FIG. 55 with the exception that the ceiling portion of the semiconductor enclosure is dome-shaped.
Figure 66:
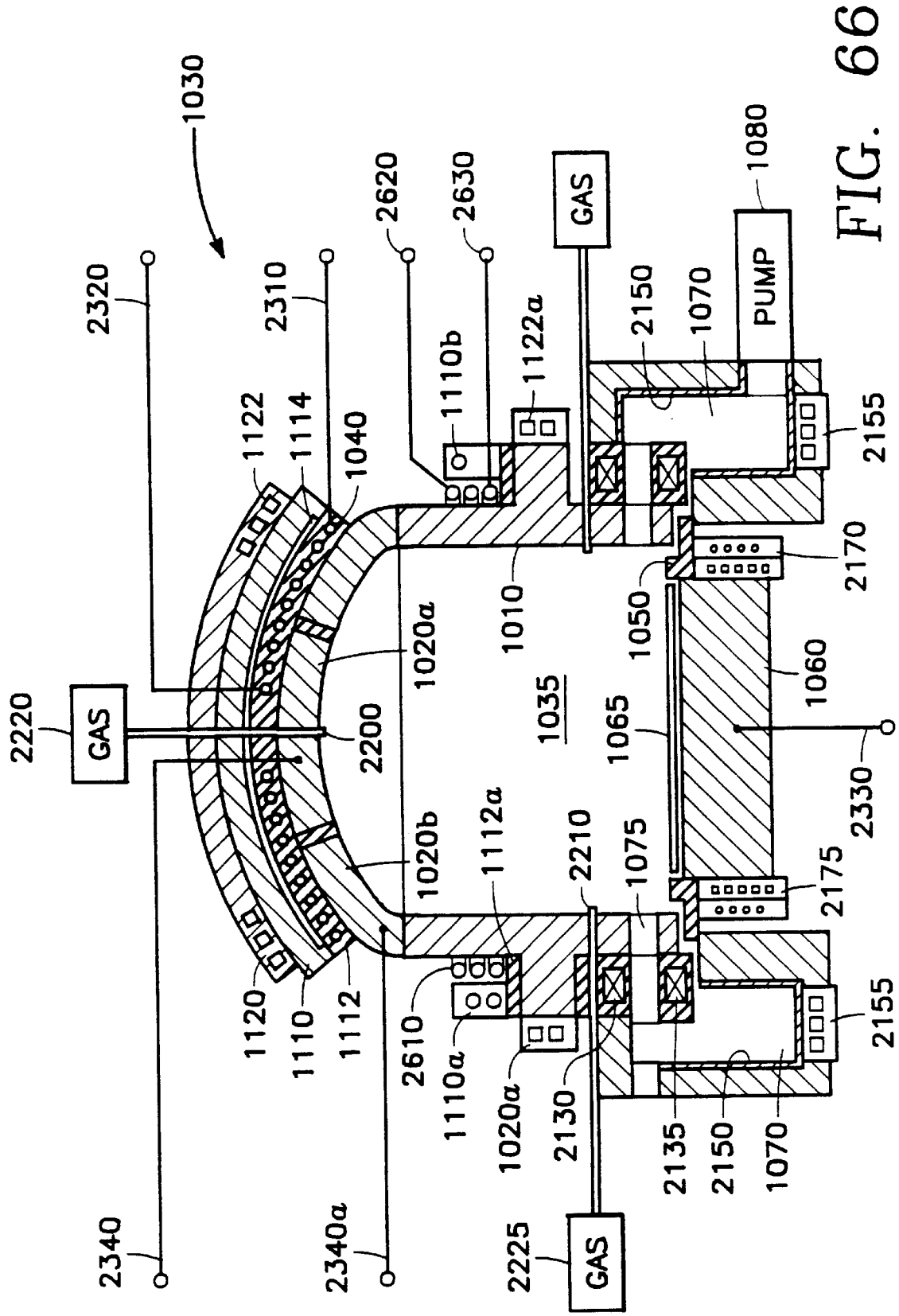
FIG. 66 is a cut-away side view of a plasma reactor corresponding to that of FIG. 56 with the exception that the ceiling portion of the semiconductor enclosure is dome-shaped.
Figure 67:
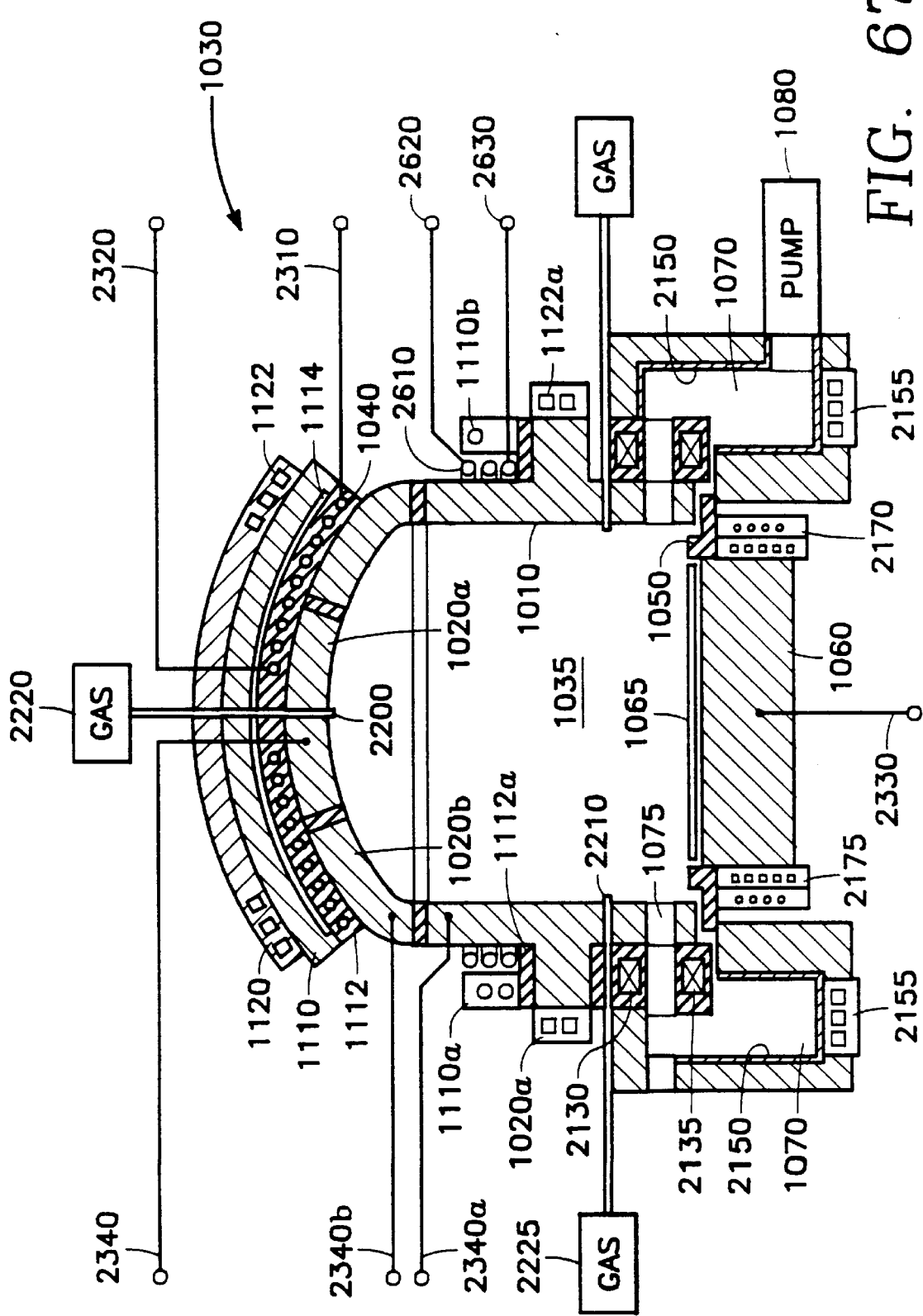
FIG. 67 is a cut-away side view of a plasma reactor corresponding to that of FIG. 57 with the exception that the ceiling portion of the semiconductor enclosure is dome-shaped.
Figure 68A:
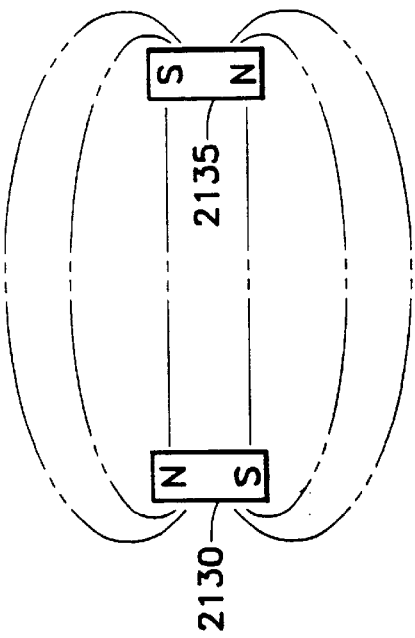
FIG. 68A is a diagram of a first version of the plasma confinement magnets optionally employed in the embodiments of FIGS. 48–67.
Figure 68B:
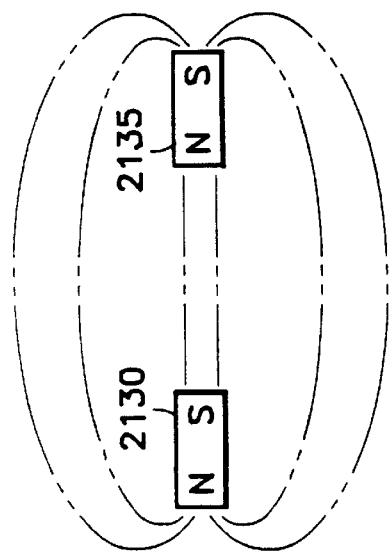
FIG. 68B is a diagram of a second version of the plasma confinement magnets optionally employed in the embodiments of FIGS. 48–67.
Figure 68D:
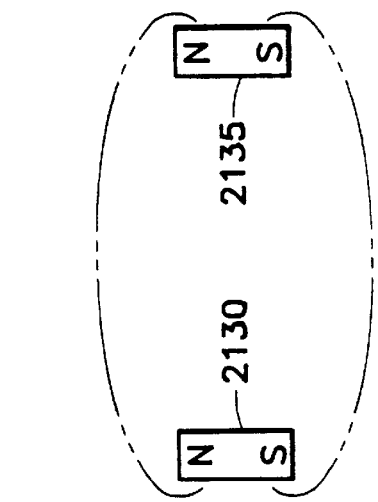
FIG. 68D is a diagram of a third version of the plasma confinement magnets optionally employed in the embodiments of FIGS. 48–67.
Figure 68C:
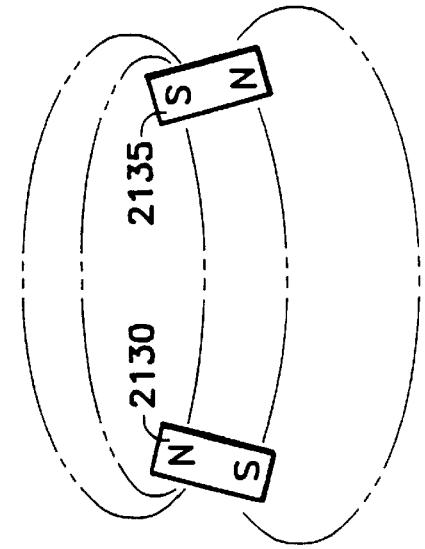
FIG. 68C is a diagram of a third version of the plasma confinement magnets optionally employed in the embodiments of FIGS. 48–67.
Figure 68E:
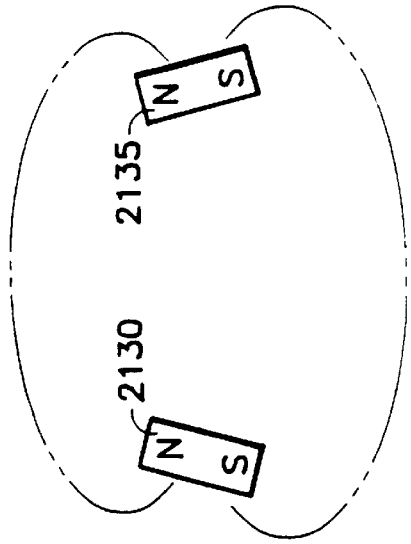
FIG. 68E is a diagram of a fourth version of the plasma confinement magnets optionally employed in the embodiments of FIGS. 48–67.

FIG. 58 illustrates how the ceiling 1020 of the embodiment of FIG. 48A may be modified to have a dome shape. Preferably, the dome shape is a multi-radius dome shape in which the radius of the dome increases from edge to center. Preferably, but not necessarily, the ceiling coil inductor 1040 is congruent with the dome shape of the ceiling 1020. Similarly, FIG. 59 illustrates how the ceiling 1020 of the embodiment of FIG. 49 may be modified to have a dome shape. Likewise, FIG. 60 illustrates how the ceiling 1020 of the embodiment of FIG. 50 may be modified to have a dome shape, FIG. 61 illustrates how the ceiling 1020 of the embodiment of FIG. 51 may be modified to have a dome shape, FIG. 62 illustrates how the ceiling 1020 of the embodiment of FIG. 52 may be modified to have a dome shape, FIG. 63 illustrates how the ceiling 1020 of the embodiment of FIG. 53 may be modified to have a dome shape, FIG. 64 illustrates how the ceiling 1020 of the embodiment of FIG. 54 may be modified to have a dome shape, FIG. 65 illustrates how the ceiling 1020 of the embodiment of FIG. 55 may be modified to have a dome shape, FIG. 66 illustrates how the ceiling 1020 of the embodiment of FIG. 56 may be modified to have a dome shape, and FIG. 67 illustrates how the ceiling 1020 of the embodiment of FIG. 57 may be modified to have a dome shape. FIG. 68A illustrates a cross-sectional view of a first embodiment of the magnetic confinement feature referred to previously in connection with the opposing magnet rings 2130, 2135 of FIG. 48A. In FIG. 68A, the magnet rings have poles which are oriented end-to-end with opposing poles facing one another. In FIG. 68B, the opposing magnet poles are oriented side-to-side in opposing directions so that opposite pair of poles are in juxtaposed alignment. In FIG. 68C, the opposing magnet poles are oriented along diagonal acute angles relative to the direction of displacement between the two magnet rings 2030, 2035. FIGS. 68D and 68E correspond to FIGS. 68B and 68C, respectively, except that like magnetic poles are juxtaposed rather than opposing magnetic poles. Other arrangements which provide the requisite diversion of ions from a straight path through the slit valve 1075 or other large opening may be provided in carrying out the invention.

While the embodiments of FIGS. 48A–68C have been described with reference to a ceiling and skirt of different shapes (i.e., either disk and cylinder or disk and dome, respectively), they may be of the same shape or different shapes formed by rotation of curves, including hemispherical, multi-radius dome, cylindrical, conical, truncated conical or the like.

Figure 69:
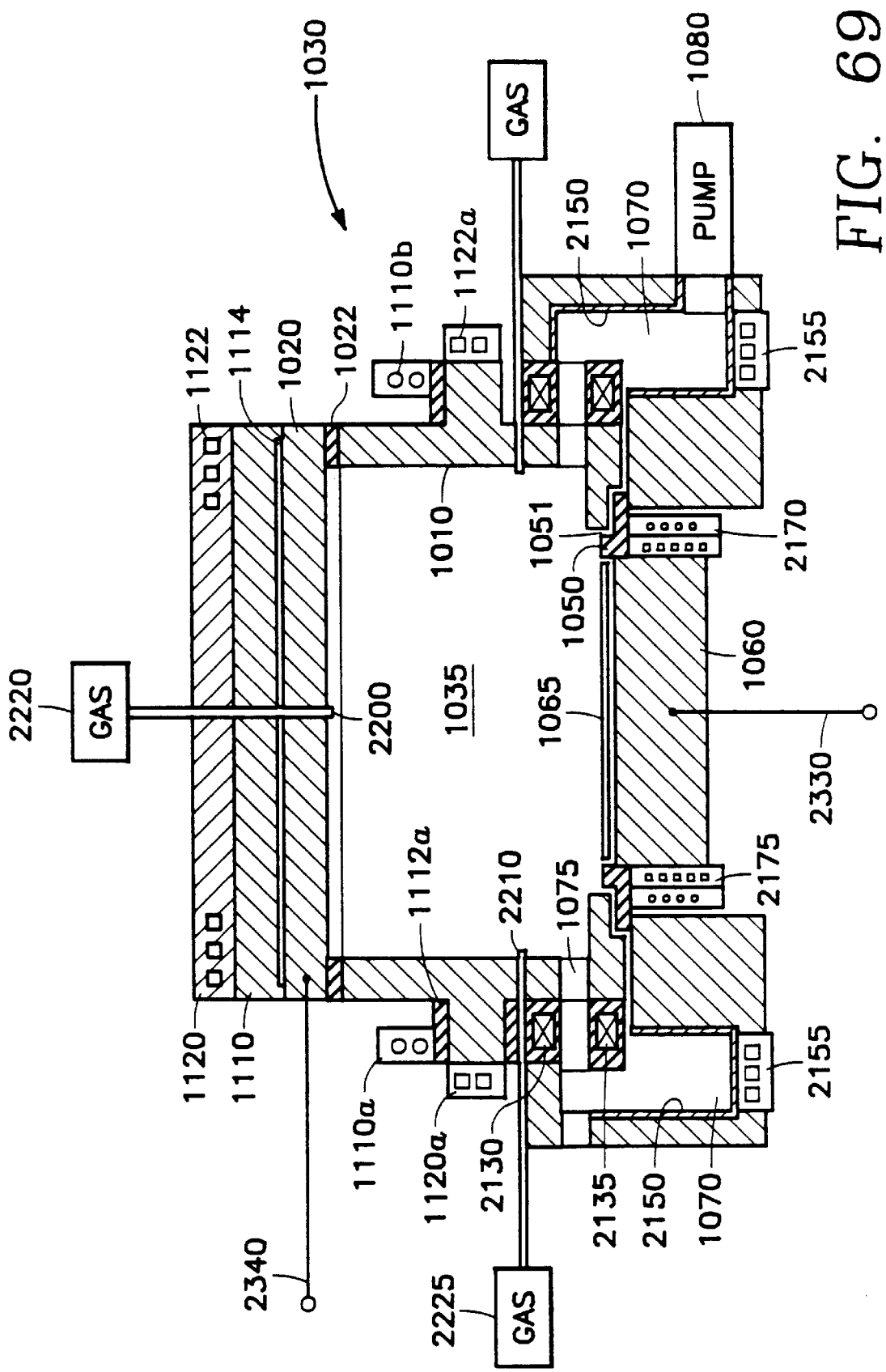
FIG. 69 is a cut-away side view of a plasma reactor of an alternative embodiment of the invention corresponding to that of FIG. 48A but employing capacitive coupling.

While the foregoing description has made reference to a rotationally symmetric inductive antenna, such an antenna is not required in carrying out the invention, and the antenna may be of any other form capable of inductively coupling RF power into the chamber. Thus, the inductive antenna, as this term is employed in this specification and in the claims appended hereto, is any current-carrying element adjacent the plasma that at least inductively couples RF power to the plasma, and therefore need not be a coil and moreover need not be located adjacent the reactor chamber ceiling, but could be adjacent any other suitable location, such as the chamber side wall. In fact, an inductive antenna can be dispensed with entirely, as in the embodiment of FIG. 69. FIG. 69 corresponds to the embodiment of FIG. 48A in which the inductive antenna 1040 has been eliminated. Instead, RF power is capacitively coupled to the plasma from, for example, the pair of electrodes comprising the semiconductor ceiling 1020 and the wafer pedestal 1060.

Figure 70:
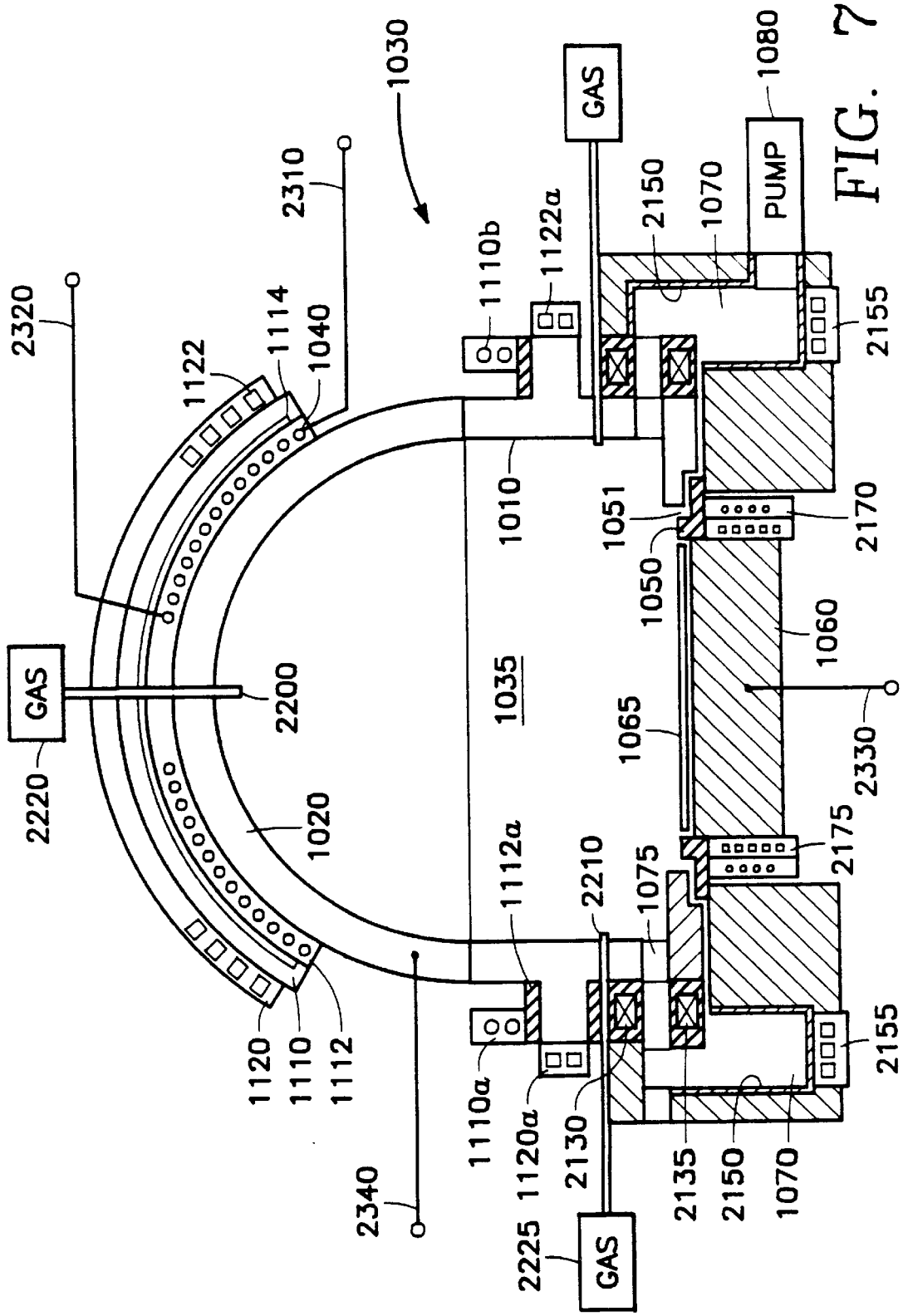
FIG. 70 is a cut-away side view of a plasma reactor corresponding to that of FIG. 48A with the exception that the ceiling portion of the semiconductor enclosure is hemispherical.
Figure 71:
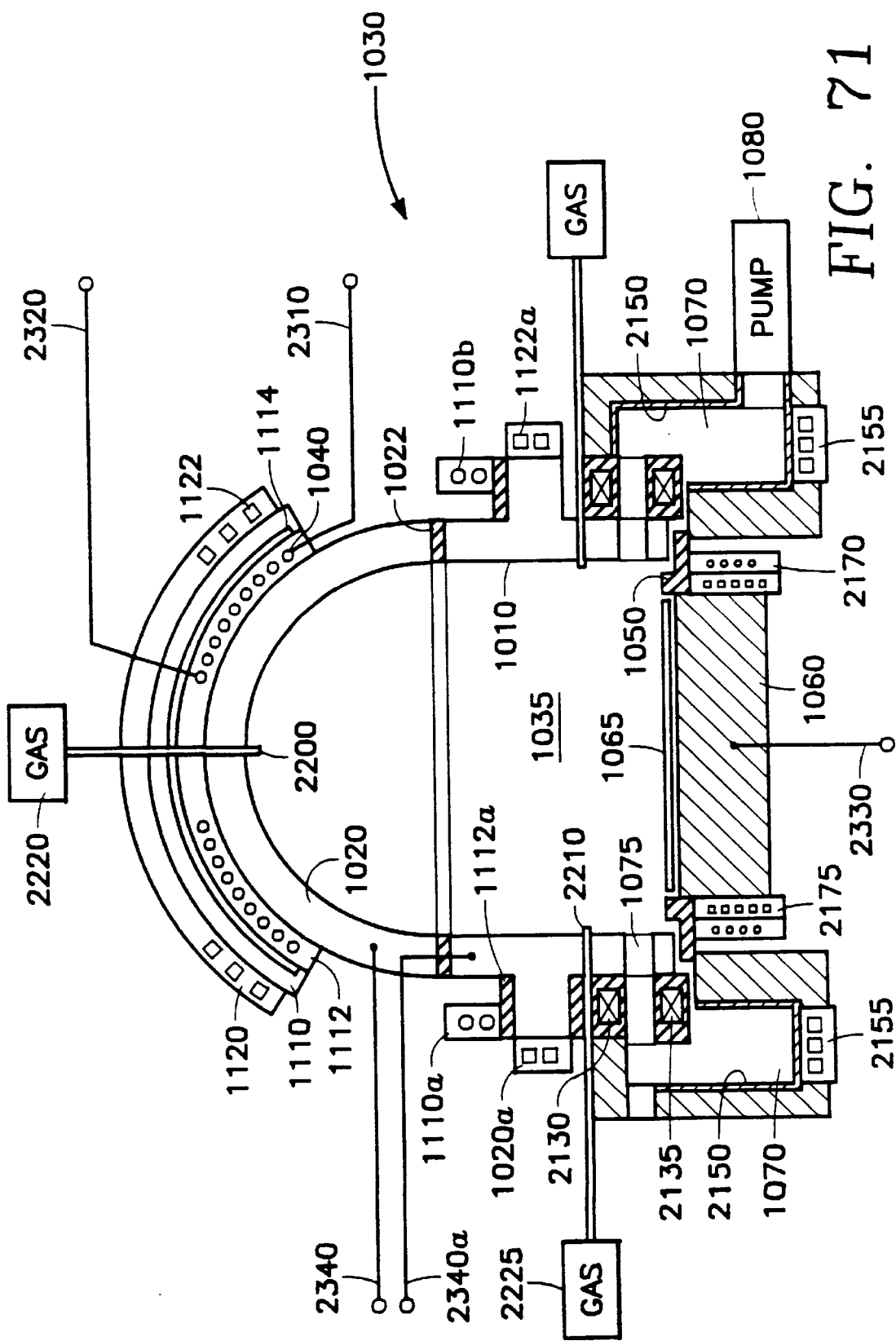
FIG. 71 is a cut-away side view of a plasma reactor corresponding to that of FIG. 49 with the exception that the ceiling portion of the semiconductor enclosure is hemispherical.
Figure 72:
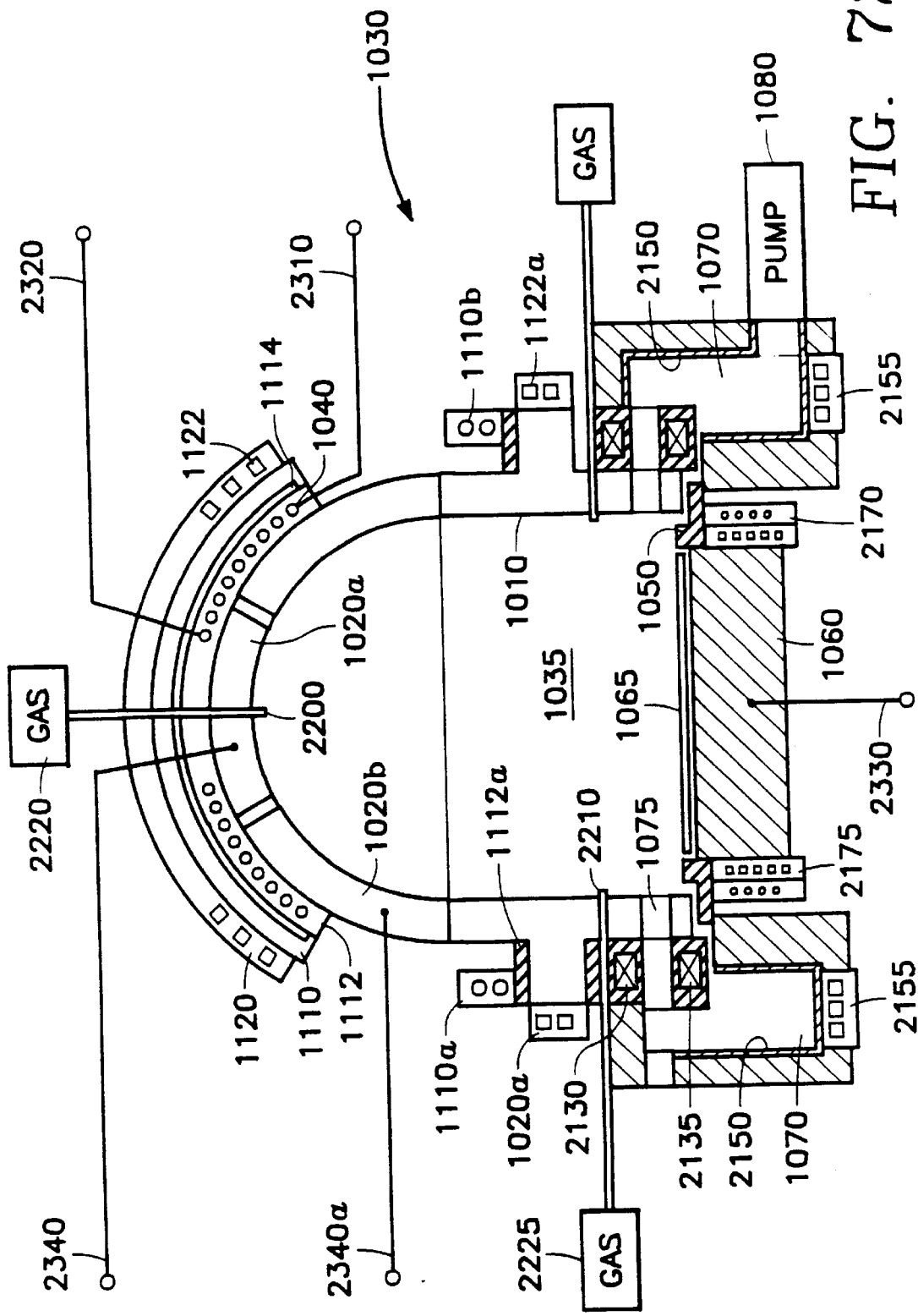
FIG. 72 is a cut-away side view of a plasma reactor corresponding to that of FIG. 50 with the exception that the ceiling portion of the semiconductor enclosure is hemispherical.
Figure 73:
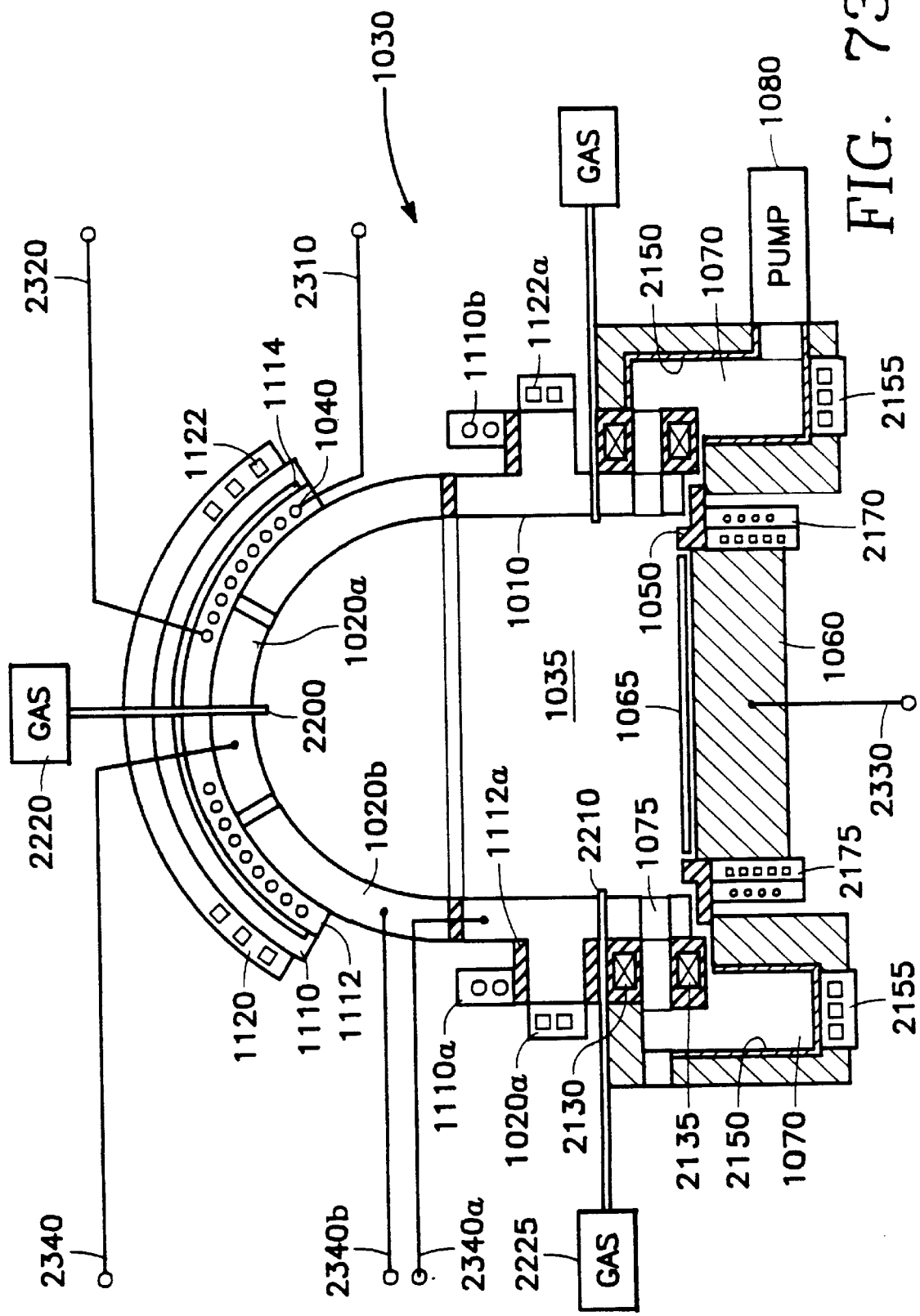
FIG. 73 is a cut-away side view of a plasma reactor corresponding to that of FIG. 51 with the exception that the ceiling portion of the semiconductor enclosure is hemispherical.
Figure 74:
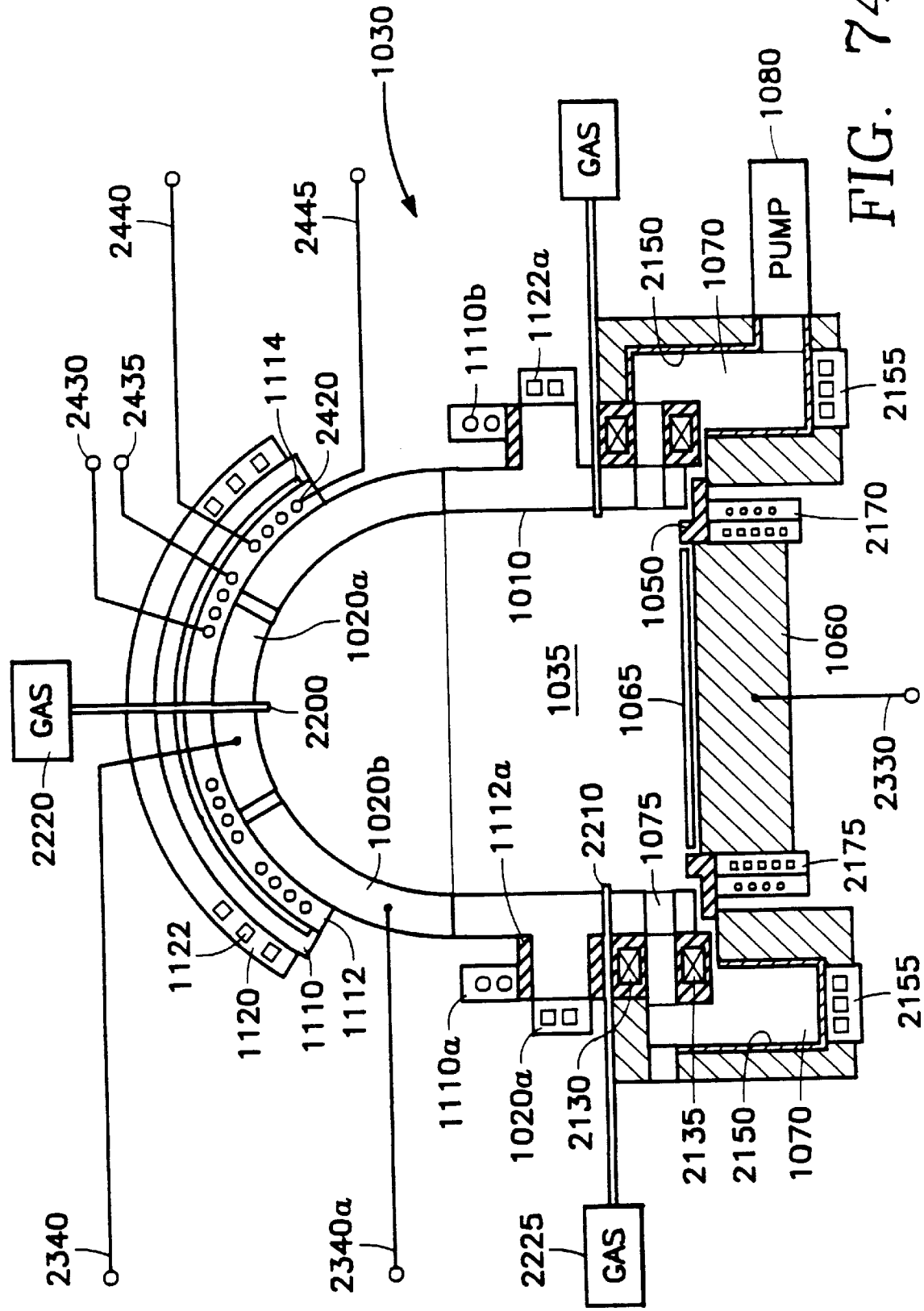
FIG. 74 is a cut-away side view of a plasma reactor corresponding to that of FIG. 52 with the exception that the ceiling portion of the semiconductor enclosure is hemispherical.
Figure 75:
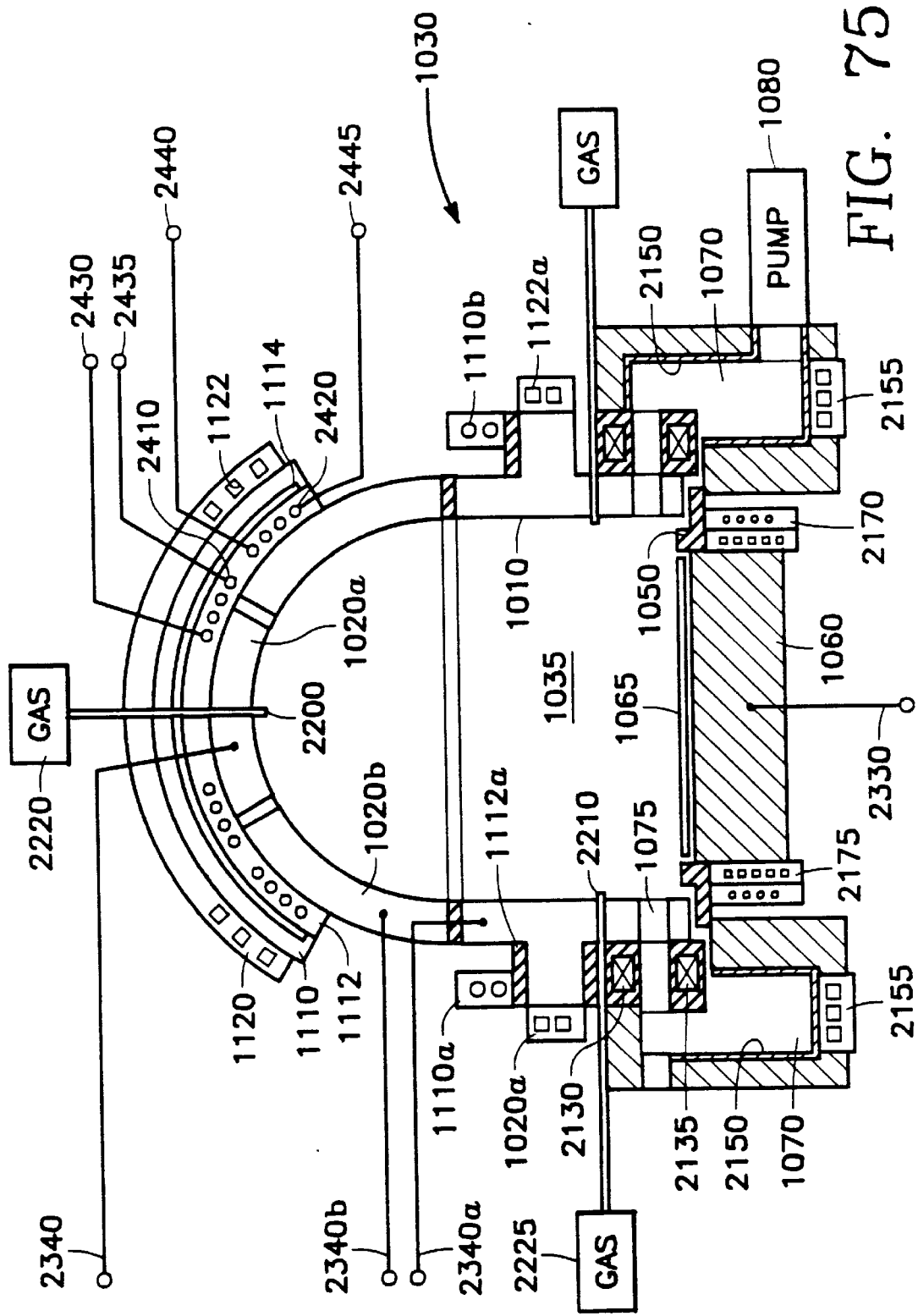
FIG. 75 is a cut-away side view of a plasma reactor corresponding to that of FIG. 53 with the exception that the ceiling portion of the semiconductor enclosure is hemispherical.
Figure 76:
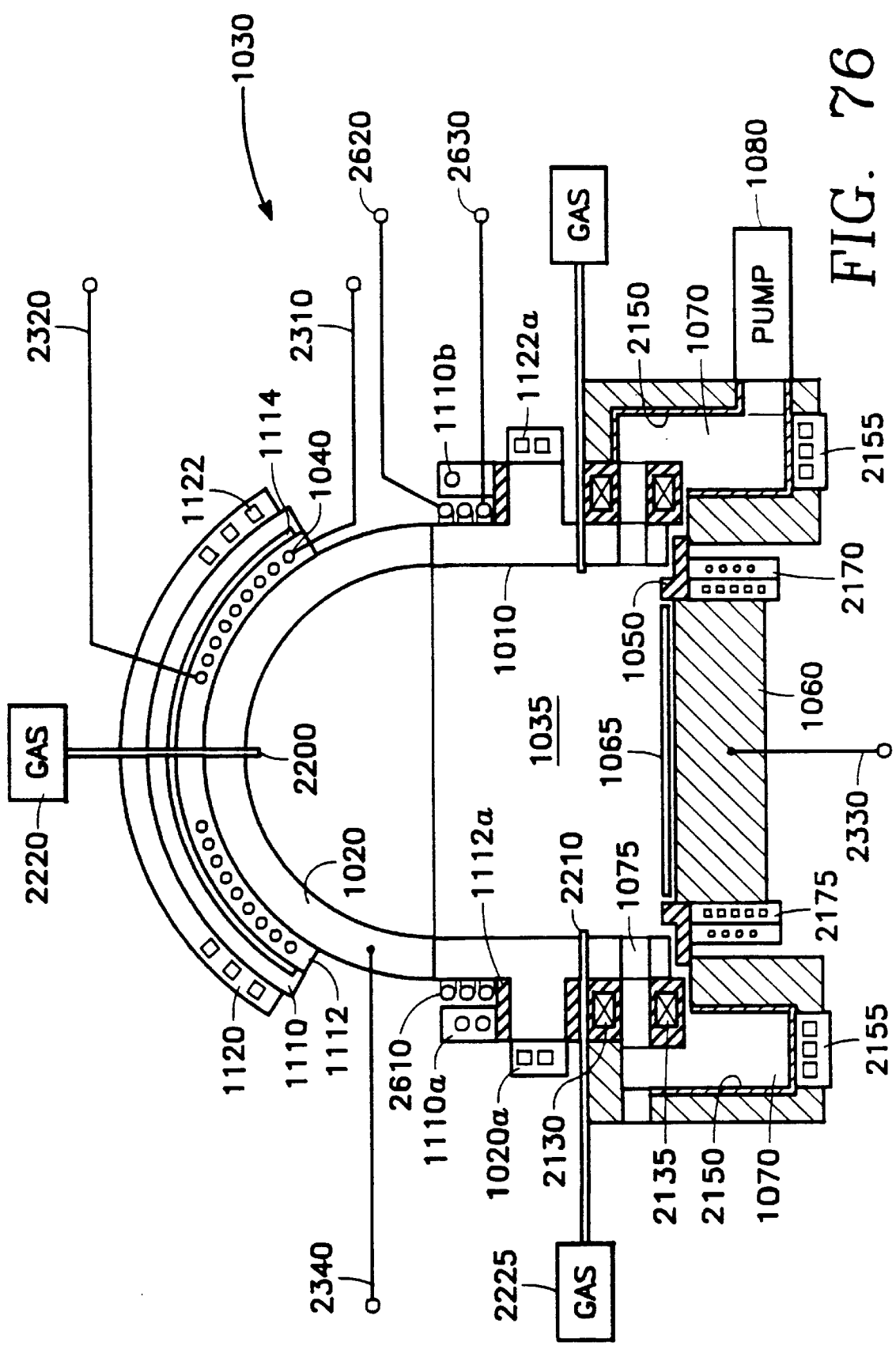
FIG. 76 is a cut-away side view of a plasma reactor corresponding to that of FIG. 54 with the exception that the ceiling portion of the semiconductor enclosure is hemispherical.
Figure 77:
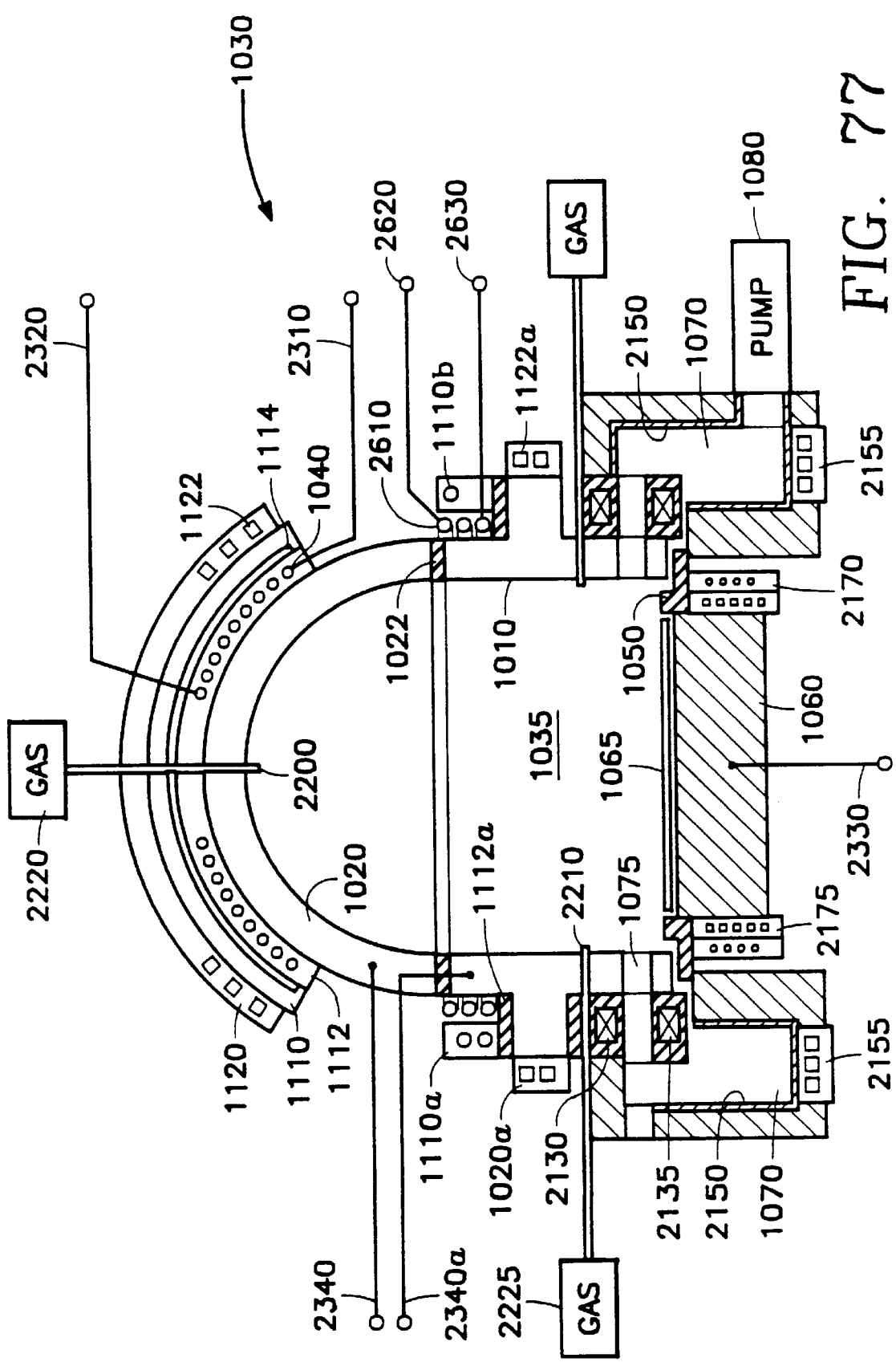
FIG. 77 is a cut-away side view of a plasma reactor corresponding to that of FIG. 55 with the exception that the ceiling portion of the semiconductor enclosure is hemispherical.
Figure 78:
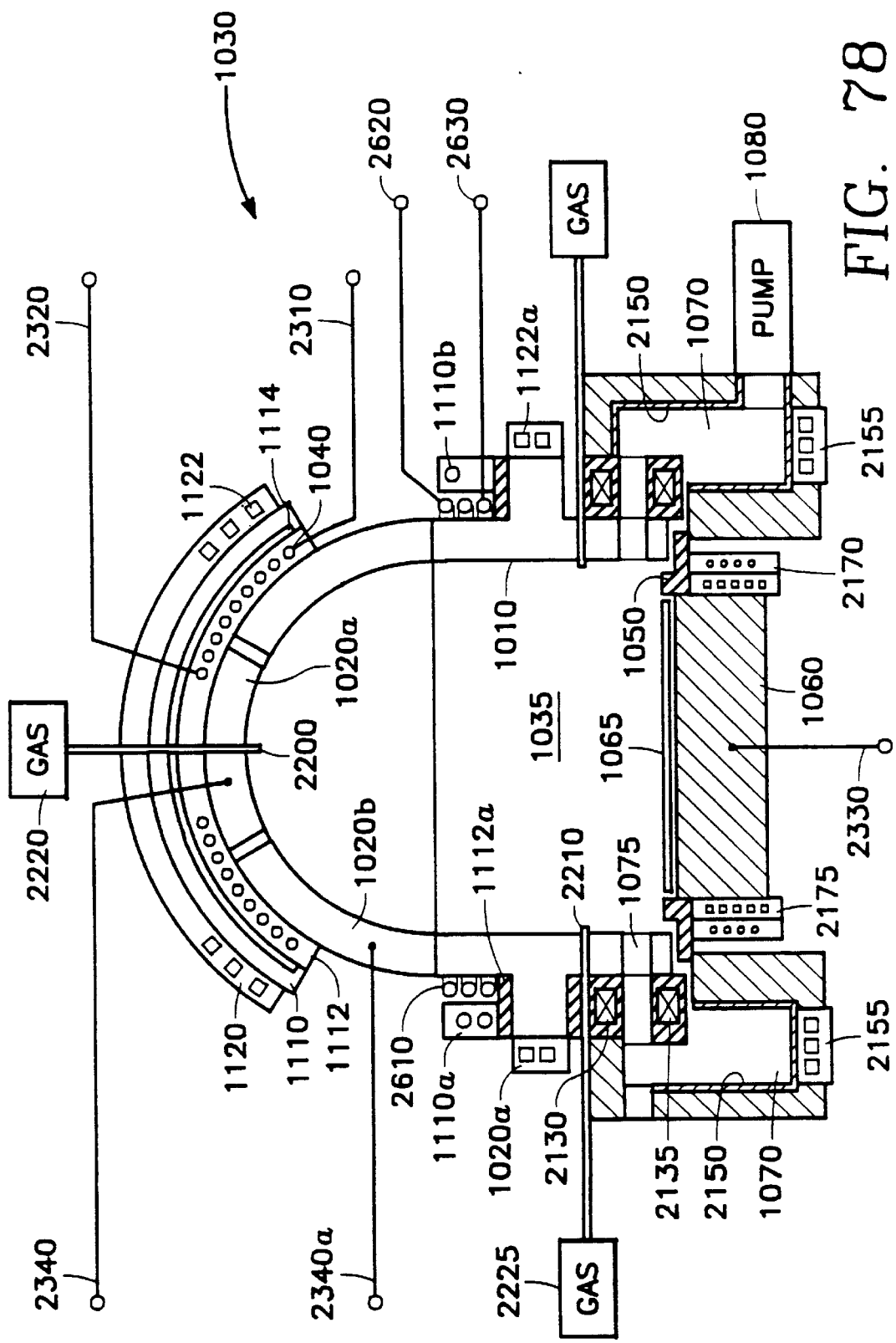
FIG. 78 is a cut-away side view of a plasma reactor corresponding to that of FIG. 56 with the exception that the ceiling portion of the semiconductor enclosure is hemispherical.
Figure 79:
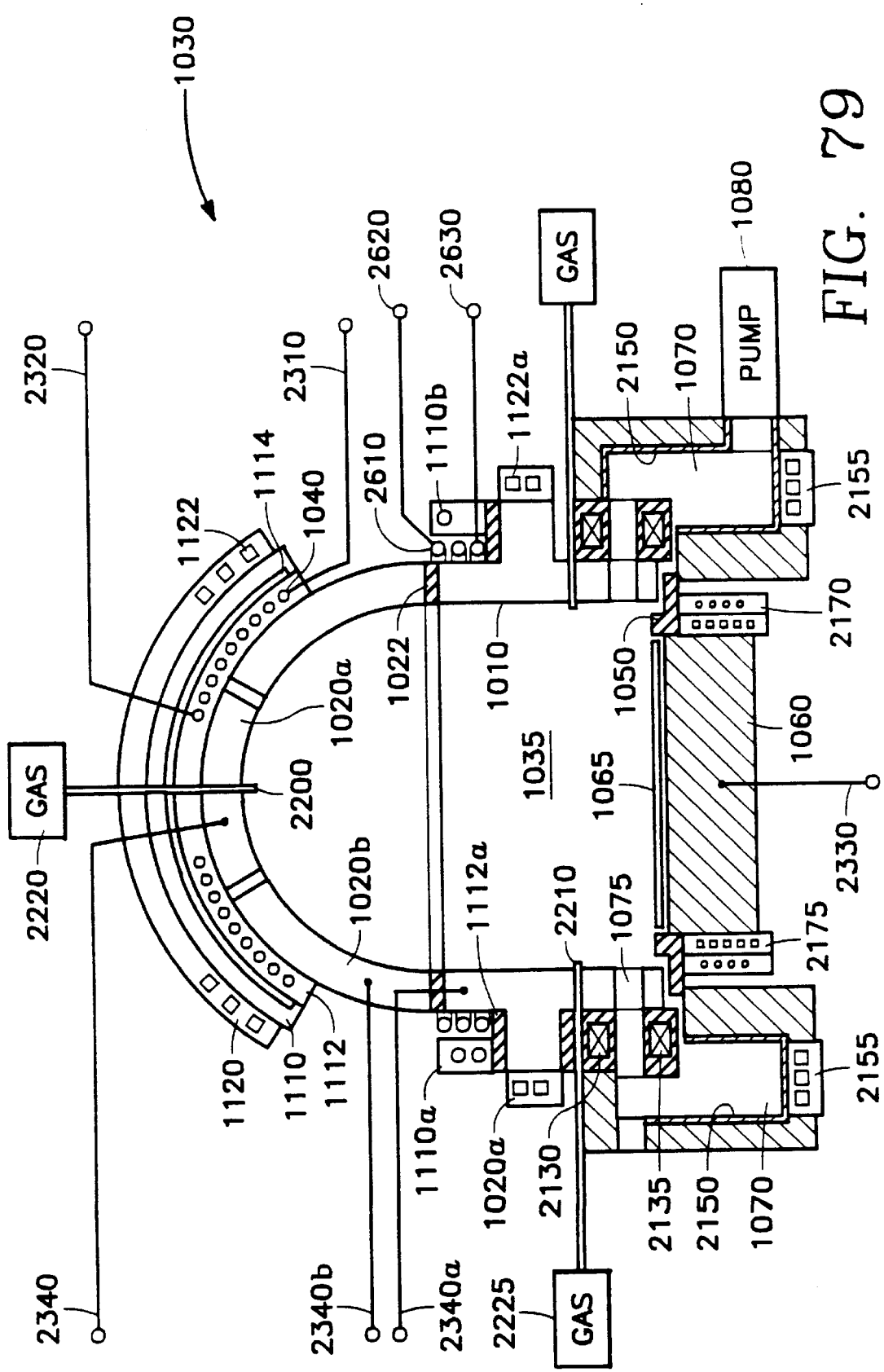
FIG. 79 is a cut-away side view of a plasma reactor corresponding to that of FIG. 57 with the exception that the ceiling portion of the semiconductor enclosure is hemispherical.

FIG. 70 illustrates how the ceiling 1020 of the embodiment of FIG. 48A may be modified to have a hemispherical shape. The hemispherical shape is a single radius dome shape in which the radius of the dome is the same from edge to center. Preferably, but not necessarily, the ceiling coil inductor 1040 is conformal with the hemispherical shape of the ceiling 1020. Similarly, FIG. 71 illustrates how the ceiling 1020 of the embodiment of FIG. 49 may be modified to have a hemispherical shape. Likewise, FIG. 72 illustrates how the ceiling 1020 of the embodiment of FIG. 50 may be modified to have a hemispherical shape, FIG. 73 illustrates how the ceiling 1020 of the embodiment of FIG. 51 may be modified to have a hemispherical shape, FIG. 74 illustrates how the ceiling 1020 of the embodiment of FIG. 52 may be modified to have a hemispherical shape, FIG. 75 illustrates how the ceiling 1020 of the embodiment of FIG. 53 may be modified to have a hemispherical shape, FIG. 76 illustrates how the ceiling 1020 of the embodiment of FIG. 54 may be modified to have a hemispherical shape, FIG. 77 illustrates how the ceiling 1020 of the embodiment of FIG. 55 may be modified to have a hemispherical shape, FIG. 78 illustrates how the ceiling 1020 of the embodiment of FIG. 56 may be modified to have a hemispherical shape, and FIG. 79 illustrates how the ceiling 1020 of the embodiment of FIG. 57 may be modified to have a hemispherical shape.

While the description has made reference to plasma confinement magnets which are permanent magnets, electromagnets may be employed as the plasma confinement magnets.

While the embodiments of FIGS. 48A–79 have been described with reference to a plasma etch reactor, the invention may also be employed in a plasma deposition reactor, such as a chemical vapor deposition (CVD) plasma reactor. In this case, the process may be carried out in such a manner that deposition occurs not only on the wafer but also on the chamber walls. Alternatively, the walls may be biased with sufficient RF power so that no deposition accumulates on the chamber interior walls even while material is being deposited on the wafer. This provides a great advantage particularly with, for example, a silicon oxide CVD plasma reactor. This is because, without the present invention, the interior walls of such a reactor must be periodically cleaned. Such a cleaning operation is difficult because silicon dioxide etches very slowly, even in a fluorine-containing cleaning gas, unless the surface temperature is well-above the chemical etch threshold temperature.

Alternatively, the invention can function as a post-processing self-cleaning CVD reactor chamber by introducing a cleaning gas (e.g., a fluorine-containing gas) into the chamber, applying RF power to each semiconductor enclosure element and suitably adjusting the temperature thereof. In such an alternative embodiment, during CVD processing of a production wafer the reactor could be operated in the manner of a conventional CVD reactor without utilizing any features of the present invention. Thereafter, a cleaning operation is performed employed all the features of the present invention. During such a cleaning operation, the rate at which deposited contaminants of the interior surfaces of the semiconductor enclosure are etch away is enhanced, without necessarily having to raise the surface temperature, by applying RF bias power to the semiconductor enclosure, in accordance with the present invention.

The shape of the semiconductor enclosure may be varied by the skilled worker to meet unique requirements of a particular application. For example, in the embodiments of FIGS. 48A and 48B, the silicon skirt 1010 has an L-shaped cross-section (formed by the semiconductor cylindrical portion of the skirt 1010 and the semiconductor annular foot 1011) to increase the radial distance from the wafer periphery to the vertical surface of the skirt 1010, while in the embodiments of the other drawings the interior surface of the skirt 1010 is completely straight and is therefore closer to the wafer periphery. Such variations in the shape of the semiconductor skirt 1010 may be carried out in any one of the illustrated embodiments.

Figure 80:
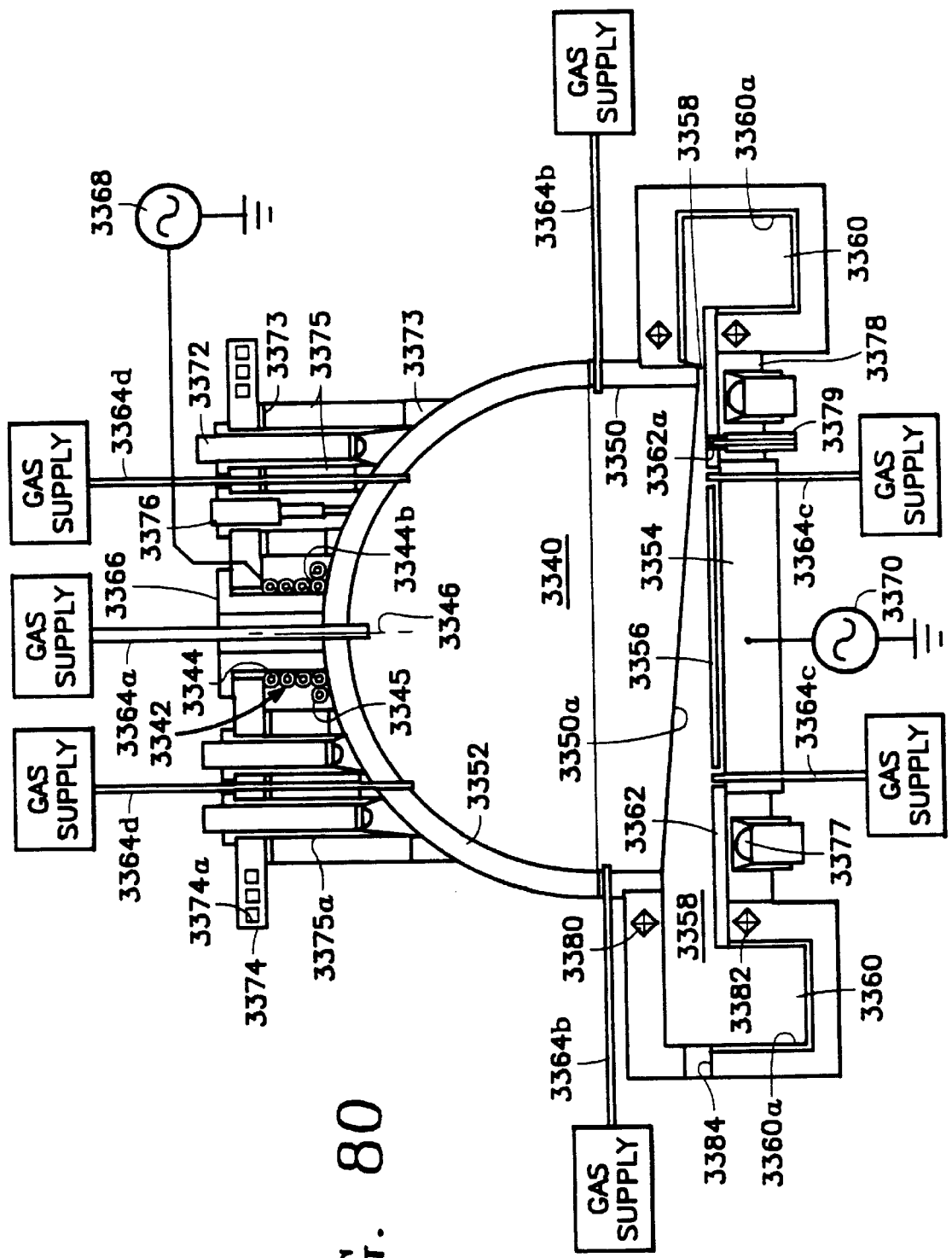
FIG. 80 illustrates a plasma reactor having a dome-shaped or hemispherical semiconductor window electrode ceiling with plural radially grouped temperature controlled zones, plural radially symmetrical inductive coils, the inductive coils being non-conformal with the ceiling shape.

Multiple Radial Temperature Zones and Non-Conformal Coil:

FIG. 80 illustrates a plasma reactor having a dome-shaped or hemispherical semiconductor window electrode ceiling with plural radially grouped temperature controlled zones, plural radially symmetrical inductive coils, the inductive coils being non-conformal with the ceiling shape. In FIG. 80, the cylindrical chamber 3340 consists of a cylindrical side wall 3350 and a dome or hemispherical ceiling 3352 integrally formed with the side wall 3350 so that the side wall 3350 and ceiling 3352 constitute a single piece of material, such as silicon. However, the invention may be carried out with the side wall 3350 and ceiling 3352 formed as separate pieces, as will be described later in this specification. Generally, the vertical pitch of the solenoid 3342 (i.e., its vertical height divided by its horizontal width) exceeds the vertical pitch of the ceiling 3352. The purpose for this, at least in the preferred embodiment, is to concentrate the induction of the antenna near the antenna symmetry axis. A solenoid having a pitch exceeding that of the ceiling is referred to herein as a non-conformal solenoid, meaning that, in general, its shape does not conform with the shape of the ceiling, and more specifically that its vertical pitch exceeds the vertical itch of the ceiling. A 2-dimensional or flat ceiling has a vertical pitch of zero, while a 3-dimensional ceiling has a non-zero vertical pitch.

A pedestal 3354 at the bottom of the chamber 3340 supports a planar workpiece 3356 in a workpiece support plane during processing. The workpiece 3356 is typically a semiconductor wafer and the workpiece support plane is generally the plane of the wafer or workpiece 3356. The chamber 3340 is evacuated by a pump (not shown in the drawing) through an annular passage 3358 to a pumping annulus 3360 surrounding the lower portion of the chamber 3340. The interior of the pumping annulus may be lined with a replaceable metal liner 3360a. The annular passage 3358 is defined by the bottom edge 3350a of the cylindrical side wall 3350 and a planar ring 3362 surrounding the pedestal 3354. Process gas is furnished into the chamber 3340 through any one or all of a variety of gas feeds. In order to control process gas flow near the workpiece center, a center gas feed 3364a can extend downwardly through the center of the ceiling 3352 toward the center of the workpiece 3356 (or the center of the workpiece support plane). In order to control gas flow near the workpiece periphery (or near the periphery of the workpiece support plane), plural radial gas feeds 3364b, which can be controlled independently of the center gas feed 3364a, extend radially inwardly from the side wall 3350 toward the workpiece periphery (or toward the workpiece support plane periphery), or base axial gas feeds 3364c extend upwardly from near the pedestal 3354 toward the workpiece periphery, or ceiling axial gas feeds 3364d can extend downwardly from the ceiling 3352 toward the workpiece periphery. Etch rates and/or polymer deposition rates at the workpiece center and periphery can be adjusted independently relative to one another to achieve a more radially uniform etch rate distribution across the workpiece by controlling the process gas flow rates toward the workpiece center and periphery through, respectively, the center gas feed 64a and any one of the outer gas feeds 3364b–d. This feature of the invention can be carried out with the center gas feed 3364a and only one of the peripheral gas feeds 3364b–d.

The solenoidal coil antenna 3342 is wound around a housing 3366 surrounding the center gas feed 3364. A plasma source RF power supply 3368 is connected across the coil antenna 3342 and a bias RF power supply 3370 is connected to the pedestal 3354.

Confinement of the overhead coil antenna 3342 to the center region of the ceiling 3352 leaves a large portion of the top surface of the ceiling 3352 unoccupied and therefore available for direct contact with temperature control apparatus including, for example, plural radiant heaters 3372 such as tungsten halogen lamps and a water-cooled cold plate 3374 which may be formed of copper or aluminum for example, with coolant passages 3374a extending therethrough. The individual heaters 3372 form plural groups, each group being circumferentially arranged along a certain radius from the center of the ceiling. The heaters can be controlled together so that the entire ceiling constitutes a single temperature control zone. However, each radial group of heaters 3372 can be controlled separately from all other such groups, so that the ceiling is divided into plural annular temperature control zones whose temperatures may be made to differ to optimize processing uniformity at the workpiece or wafer surface.

Preferably the coolant passages 3374a contain a coolant of a known variety having a high thermal conductivity but a low electrical conductivity, to avoid electrically loading down the antenna or solenoid 3342. The cold plate 3374 provides constant cooling of the ceiling 3352 while the maximum power of the radiant heaters 3372 is selected so as to be able to overwhelm, if necessary, the cooling by the cold plate 3374, facilitating responsive and stable temperature control of the ceiling 3352. The large ceiling area irradiated by the heaters 3372 provides greater uniformity and efficiency of temperature control. (It should be noted that radiant heating is not necessarily required in carrying out the invention, and the skilled worker may choose to employ an electric heating element instead, as will be described later in this specification.) If the ceiling 3352 is silicon, as disclosed in co-pending U.S. application Ser. No. 08/597,577 filed Feb. 2, 1996 by Kenneth S. Collins et al., then there is a significant advantage to be gained by thus increasing the uniformity and efficiency of the temperature control across the ceiling. Specifically, where a polymer precursor and etchant precursor process gas (e.g., a fluorocarbon gas) is employed and where the etchant (e.g., fluorine) must be scavenged, the rate of polymer deposition across the entire ceiling 3352 and/or the rate at which the ceiling 3352 furnishes a fluorine etchant scavenger material (silicon) into the plasma is better controlled by increasing the contact area of the ceiling 3352 with the temperature control heater 3372. The solenoid antenna 3342 increases the available thermal contact area on the ceiling 3352 because the solenoid windings 3344 are concentrated at the center axis of the ceiling 3352.

The increase in available area on the ceiling 3352 for thermal contact is exploited in a preferred implementation by a highly thermally conductive torus 3375 (formed of a ceramic such as aluminum nitride, aluminum oxide or silicon nitride or of a non-ceramic like silicon either lightly doped or undoped) whose bottom surface rests on the ceiling 3352 and whose top surface supports the cold plate 3374.

One feature of the torus 3375 is that it displaces the cold plate 3374 well-above the top of the solenoid 3342. This feature substantially mitigates or nearly eliminates the reduction in inductive coupling between the solenoid 3342 and the plasma which would otherwise result from a close proximity of the conductive plane of the cold plate 3374 to the solenoid 3342. In order to prevent such a reduction in inductive coupling, it is preferable that the distance between the cold plate 3374 and the top winding of the solenoid 3342 be at least a substantial fraction (e.g., one half) of the total height of the solenoid 3342. Plural axial holes 3375a extending through the torus 3375 are spaced along two concentric circles and hold the plural radiant heaters or lamps 3372 and permit them to directly irradiate the ceiling 3352. For greatest lamp efficiency, the hole interior surface may be lined with a reflective (e.g., aluminum) layer. The center gas feed 64a may be replaced by a radiant heater, depending upon the particular reactor design and process conditions. The ceiling temperature is sensed by a sensor such as a thermocouple 3376 extending through one of the holes 3375a not occupied by a lamp heater 3372. For good thermal contact, a highly thermally conductive elastomer 3373 such as silicone rubber impregnated with boron nitride is placed between the ceramic torus 3375 and the copper cold plate 3374 is between the ceramic torus 3375 and the silicon ceiling 3352.

As disclosed in the above-referenced co-pending application, the chamber 3340 may be an all-semiconductor chamber, in which case the ceiling 3352 and the side wall 3350 are both a semiconductor material such as silicon. As described in the above-referenced co-pending application, controlling the temperature of, and RF bias power applied to, either the ceiling 3352 or the wall 3350 regulates the extent to which it furnishes fluorine scavenger precursor material (silicon) into the plasma or, alternatively, the extent to which it is coated with polymer. The material of the ceiling 3352 is not limited to silicon but may be, in the alternative, silicon carbide, silicon dioxide (quartz), silicon nitride or a ceramic.

As described in the above-referenced co-pending application, the chamber wall or ceiling 3350, 3352 need not be used as the source of a fluorine scavenger material. Instead, a disposable silicon member can be placed inside the chamber 3340 and maintained at a sufficiently high temperature to prevent polymer condensation thereon and permit silicon material to be removed therefrom into the plasma as fluorine scavenging material. In this case, the wall 3350 and ceiling 3352 need not necessarily be silicon, or if they are silicon they may be maintained at a temperature (and/or RF bias) near or below the polymer condensation temperature (and/or a polymer condensation RF bias threshold) so that they are coated with polymer from the plasma so as to be protected from being consumed. While the disposable silicon member may take any appropriate form, in the illustrated embodiment the disposable silicon member is an annular ring 3362 surrounding the pedestal 3354. Preferably, the annular ring 3362 is high purity silicon and may be doped to alter its electrical or optical properties. In order to maintain the silicon ring 3362 at a sufficient temperature to ensure its favorable participation in the plasma process (e.g., its contribution of silicon material into the plasma for fluorine scavenging), plural radiant (e.g., tungsten halogen lamp) heaters 3377 arranged in a circle under the annular ring 3362 heat the silicon ring 3362 through a quartz window 3378. As described in the above-referenced co-pending application, the heaters 3377 are controlled in accordance with the measured temperature of the silicon ring 3362 sensed by a temperature sensor 3379 which may be a remote sensor such as an optical pyrometer or a fluoro-optical probe. The sensor 3379 may extend partially into a very deep hole 3362a in the ring 3362, the deepness and narrowness of the hole tending at least partially to mask temperature-dependent variations in thermal emissivity of the silicon ring 3362, so that it behaves more like a gray-body radiator for more reliable temperature measurement. If the heaters at different radial locations are controlled independently as mentioned previously herein, then plural sensors at different radial locations may be provided.

As described in U.S. application Ser. No. 08/597,577 referred to above, an advantage of an all-semiconductor chamber is that the plasma is free of contact with contaminant producing materials such as metal, for example. For this purpose, plasma confinement magnets 3380, 3382 adjacent the annular opening 3358 prevent or reduce plasma flow into the pumping annulus 3360. To the extent any polymer precursor and/or active species succeeds in entering the pumping annulus 3360, any resulting polymer or contaminant deposits on the replaceable interior liner 3360a may be prevented from re-entering the plasma chamber 3340 by maintaining the liner 3360a at a temperature significantly below the polymer condensation temperature, for example, as disclosed in the referenced co-pending application.

A wafer slit valve 3384 through the exterior wall of the pumping annulus 3360 accommodates wafer ingress and egress. The annular opening 3358 between the chamber 3340 and pumping annulus 3360 is larger adjacent the wafer slit valve 3384 and smallest on the opposite side by virtue of a slant of the bottom edge of the cylindrical side wall 3350 so as to make the chamber pressure distribution more symmetrical with a non-symmetrical pump port location.

Maximum inductance near the chamber center axis 3346 is achieved by the vertically stacked solenoidal windings 3344. In the illustrated, another winding 3345 outside of the vertical stack of windings 3344 but in the horizontal plane of the bottom solenoidal winding 3344a may be added, provided the additional winding 3345 is close to the bottom solenoidal winding 3344a.

One feature of the invention is the adjustment of the radial density distribution of etchant precursors and polymer deposition precursors in the plasma near the wafer surface. Such adjustment can make the radial distribution of the etchant and polymer deposition precursors more nearly uniform across the wafer, a significant advantage. The adjustment is carried out by differentially adjusting the flow rates through the inner and outer gas flow inlets (e.g., the inner and outer gas flow inlets 3364a, 3363d, respectively, of FIG. 80), differentially adjusting the power to the inner and outer groups of ceiling heaters (e.g., the inner and outer heater lamps 3376, 3372, respectively, of FIG. 80), differentially adjusting the RF power applied to the inner and outer overhead antenna coils (e.g., the inner and outer antenna coils 175, 180, respectively, of FIGS. 42–47) and/or differentially adjusting the RF power applied to the inner and outer sections of the ceiling (e.g., the inner and outer ceiling sections 230a, 230b, respectively, of FIGS. 42–47). For optimum adjustability, all of these adjustable features may be combined into the reactor of FIG. 80 by substituting the inner and outer ceiling sections 230a, 230b and inner and outer antenna coils 175, 180 of FIG. 47 for the ceiling 3352 and antenna 3342 of FIG. 80.

THE PRESENT INVENTION
Problems Addressed by the Present Invention:

The etch process becomes more difficult to carry out as new device geometries are introduced requiring greater versatility of the etch process. The apparatus described in this specification has successfully performed at relatively high plasma ion densities on the order of $10^{11}$ ions/cm$^3$ and greater. However, some semiconductor structures need to be etched at lesser plasma densities, e.g., on the order of $5 \cdot 10^{10}$ ions/cm$^3$. The following are some examples of such structures.

(1) Self-Aligned Contact (SAC): A self-aligned contact in a multi-level conductor structure is one in which a portion of the opening to be etched near a lower-level bit line or conductor near the bottom of the opening, for example. Normally, the contact opening location must be carefully controlled during photolithographic definition to avoid exposing the bit line to the metal deposited into the etched opening. However, depending upon the dimensions involved, the photolithographic definition process may not be sufficiently reliable guarantee accurate placement of the contact opening to avoid exposing the lower-level bit line. In order to ensure insulate the lower-level bit line from the metal deposited inside the contact opening even in the presence of significant placement errors in the photolithographic definition step, a silicon nitride film is formed around the lower level bit line before formation of the overlying layers through which the contact opening is to be etched. The challenge is to avoid etching through the silicon nitride cover layer without etch-stopping above the desired depth of the contact opening. This challenge is particularly difficult for two reasons: (a) First, if the contact opening partially overlies the lower-level bit line, it is constricted by the lower-level bit line, thereby increasing the likelihood of etch-stopping. (b) Second, the silicon nitride insulating film covering the lower-level bit line tends to have an outer corner facing the contact opening, which is highly susceptible to sputtering, thereby increasing the likelihood of damaging or etching through the silicon nitride insulating film.

(2) Self-Aligned Local Interconnect (SALI): In a self-aligned local interconnect structure, contact openings are etched at the same time large-area openings are etched, whose width may be an order of magnitude or more greater than the width of a typical contact opening. It is very difficult to maintain adequate etch selectivity in the large-area openings without etch-stopping in the contact (narrow) openings.

(3) Dual Damascene: A narrow contact opening is formed at the bottom of a large-area trench, both the trench and the contact being etched in the same etch step. In this structure, it is especially difficult to avoid exceeding the critical opening dimensions of the overhead trench without etch-stopping in the underlying contact opening, for the following reasons:

(a) the disparity in opening sizes between the trench and contact;

(b) the use of special low-dielectric constant material in the silicon oxide insulating layers renders these layers less susceptible to attack by the enchant, and therefore reduces etch selectivity;

(c) the underlying stop layer (e.g., polysilicon or silicon) contains oxide additives which renders this layer more susceptible to attack by the enchant, and therefore reduces etch selectivity.

As already mentioned, carrying out these latter applications using the reactor described in this specification has been difficult for the reasons outlined immediately above. One approach has been to simply decrease the plasma source power from its typical level corresponding to a plasma density of over $3 \cdot 10^{11}$ ions/cm$^3$ to reduce the plasma density. However, the problem with this approach is that, as the plasma source power is reduced, the skin depth of the inductive field in the plasma expands until, at or below $3 \cdot 10^{11}$ ions/cm$^3$, the skin depth reaches the lower limit (i.e., the level of the wafer or workpiece), at which point inductive coupling ceases and the plasma abruptly switches over to a purely capacitively coupled mode and a much lower plasma ion density of about $1 \cdot 10^{10}$ ions/cm$^3$. In the capacitively coupled mode it is not possible to achieve a higher plasma density, so that it would appear that it is not possible to operate the above-described reactor at an intermediate plasma density (e.g., $5 \cdot 10^{10}$ ions/cm$^3$, which would be more desireable. In addition, in the capacitively coupled mode there is no independent control of plasma ion density and plasma ion energy at the wafer surface, resulting in inadequate plasma density and excessive ion energy. Such excessive ion energy increases the risk of punching through the silicon nitride insulating layer exposed during contact etching, for example. The inadequate plasma ion density reduces process throughput or productivity. Thus, one problem is how to obtain an intermediate plasma ion density in the disclosed reactor while maintaining inductive coupling of the RF source power.

Figure 81A:
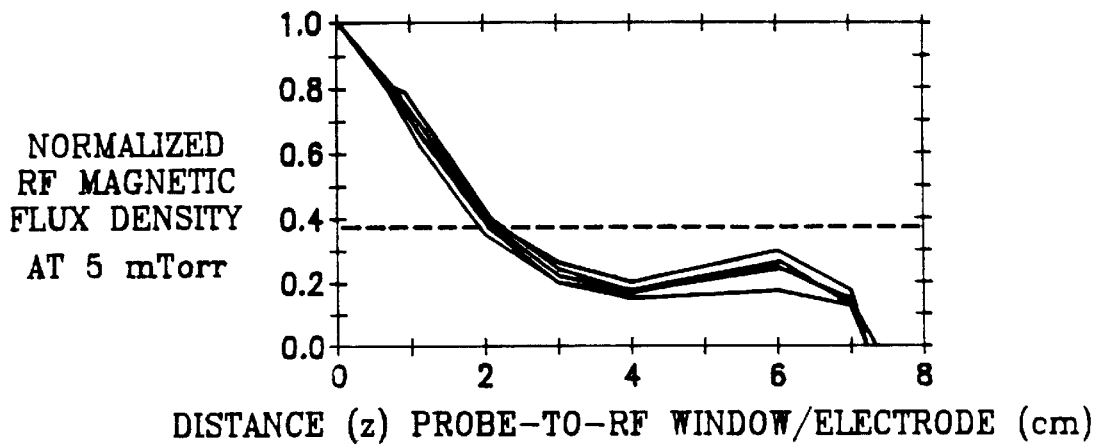
FIGS. 81A–81C are graphs, each graph including curves for different gas mixtures of the RF magnetic flux density (vertical axis) as a function of depth below the window electrode (horizontal axis) normalized to the magnetic flux density at the interior surface of the window electrode (depth zero), at chamber pressures of 5, 50 and 100 mT, respectively, at a lower source power range.
Figure 81B:
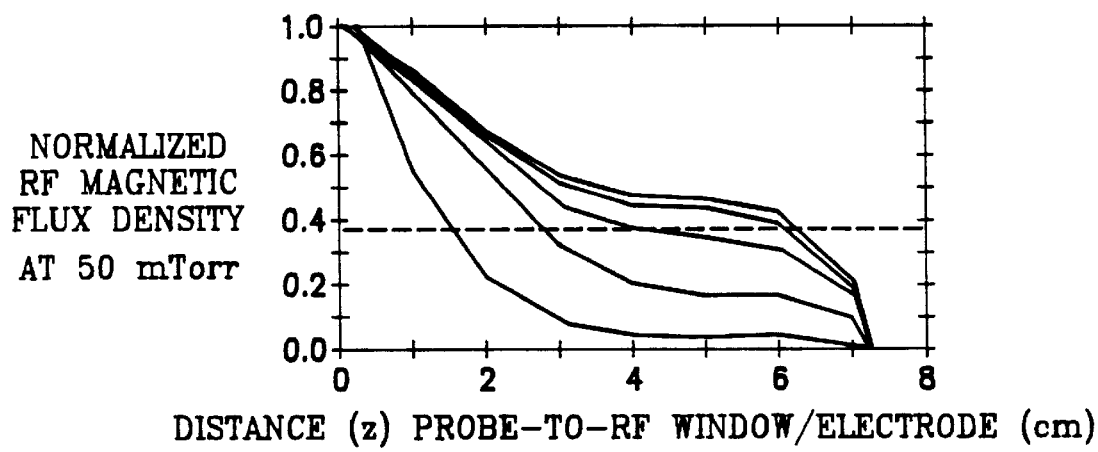
Figure 81C:
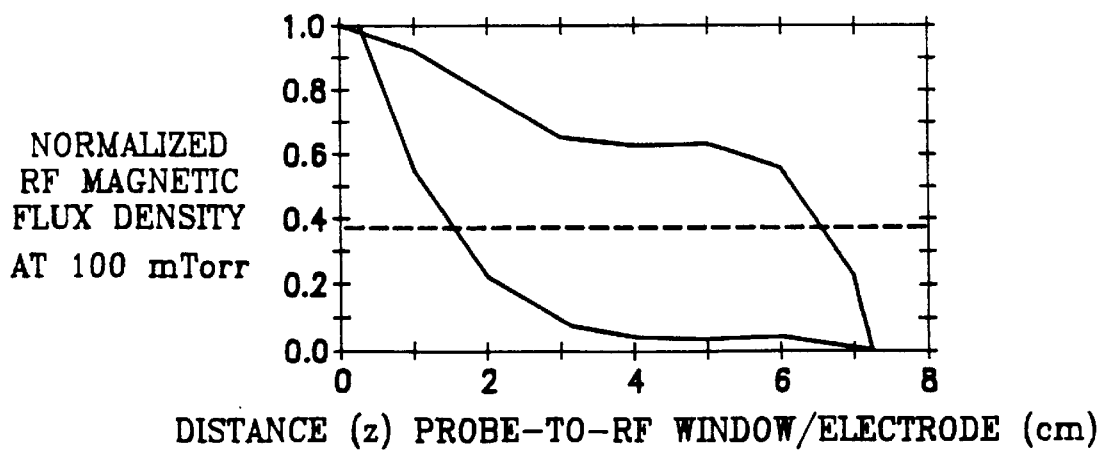
Figure 82A:
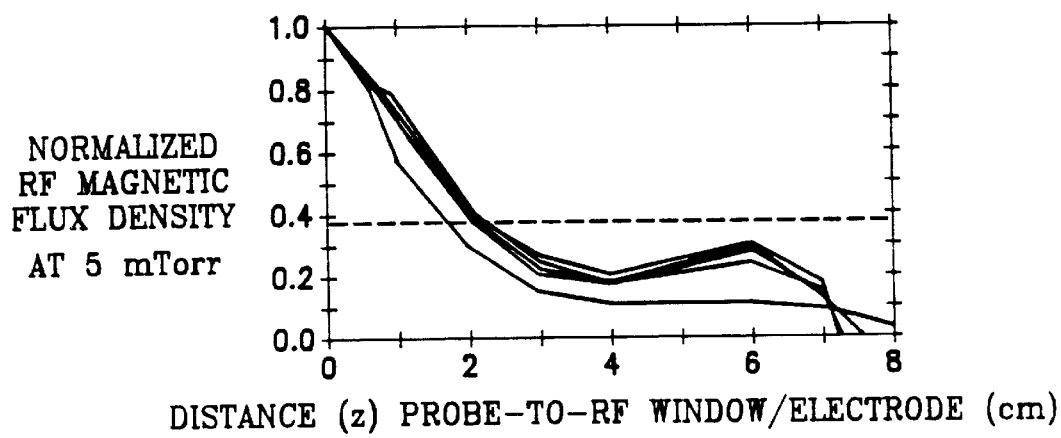
FIGS. 82A–82C are graphs, each graph including curves for different gas mixtures of the RF magnetic flux density (vertical axis) as a function of depth below the window electrode (horizontal axis) normalized to the magnetic flux density at the interior surface of the window electrode (depth zero), at chamber pressures of 5, 50 and 100 mT, respectively, at an intermediate source power range.
Figure 82B:
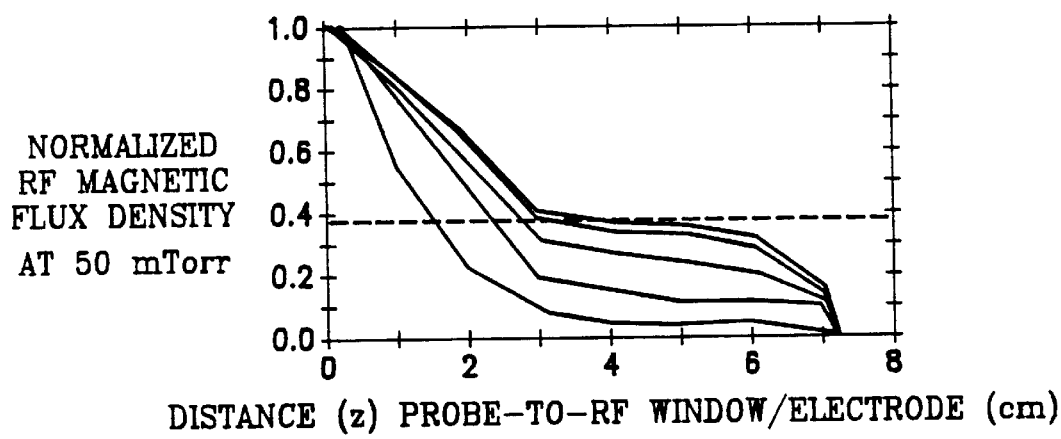
Figure 82C:
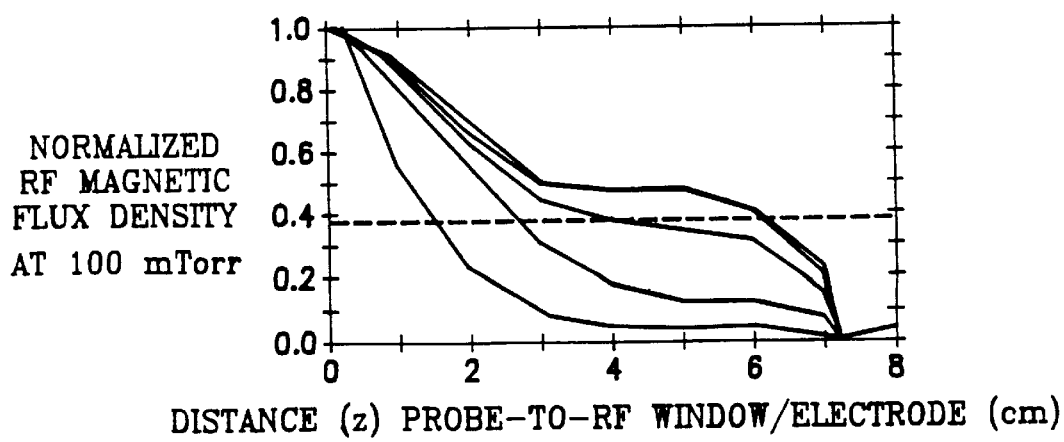
Figure 83A:
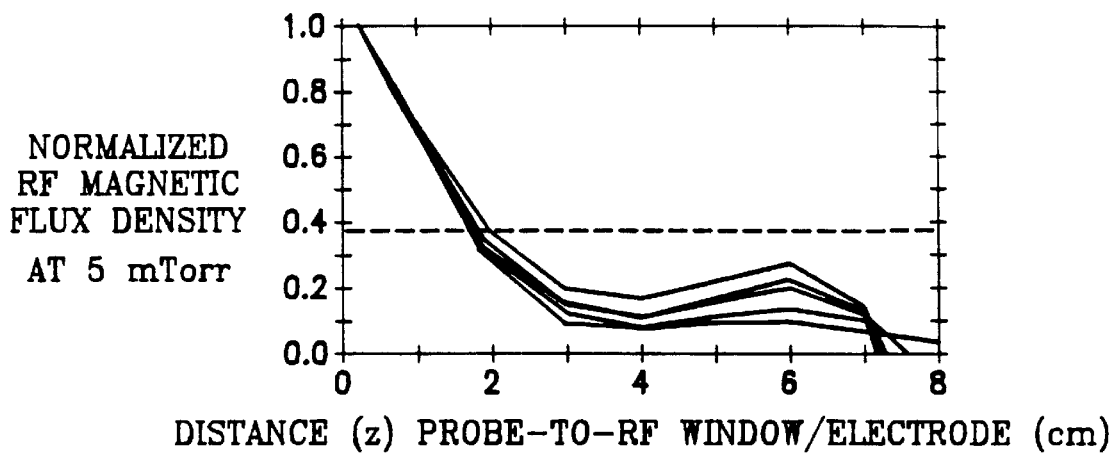
FIGS. 83A–83D are graphs, each graph including curves for different gas mixtures of the RF magnetic flux density (vertical axis) as a function of depth below the window electrode (horizontal axis) normalized to the magnetic flux density at the interior surface of the window electrode (depth zero), at chamber pressures of 5, 50, 100 and 200 mT, respectively, at a high source power range.
Figure 83B:
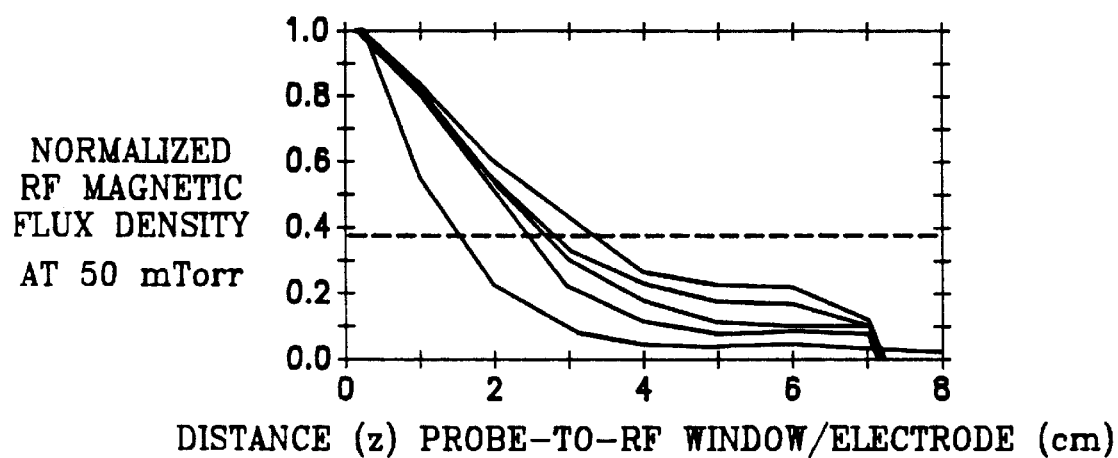
Figure 83C:
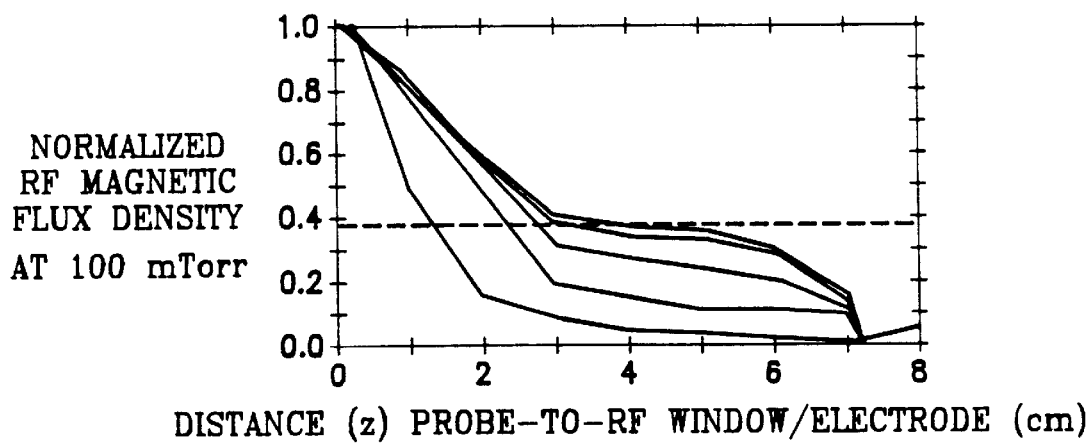
Figure 83D:
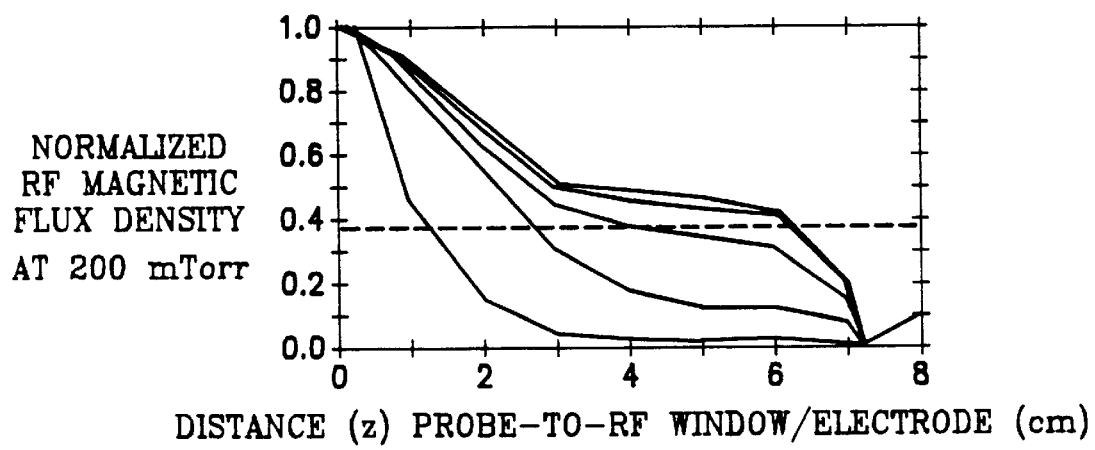

FIGS. 81–83 illustrate the difficulties discussed above in constraining the inductive field skin depth to less than the window electrode-to-wafer distance in order to avoid extinguishing the plasma inductive coupling mode. The skin depth is defined as the depth below the electrode at which 1/e of the RF power has been absorbed. As discussed above, if this skin depth is at the level of the wafer, the inductive coupling mode is extinguished in favor a the capacitive coupling mode and the plasma density drops dramatically. FIGS. 81A–81C are graphs, each graph including curves for different gas mixtures of the RF magnetic flux density (vertical axis) as a function of depth below the window electrode (horizontal axis) normalized to the magnetic flux density at the interior surface of the window electrode (depth zero). The wafer surface is about 7.2 cm below the window electrode. The horizontal red line is the normalized magnetic flux density at 1/e of the density at zero depth, i.e., about 0.37, whose intersection with each curve defines the corresponding skin depth on the horizontal axis. The curves plotted in the graphs of FIGS. 81A, 81B and 81C correspond to measurements taken at a total source power level of 1800 Watts at chamber pressures of 5, 50 and 100 mTorr, respectively. At 5 mTorr (FIG. 81A), very little behavior difference is observed between any of the different gas mixtures. However, as the chamber pressure is increased to 50 mTorr (FIG. 81B), the behaviors of the different gas mixtures begin to observably differ, with those gas mixtures having a higher electro-negative gas content (i.e., higher oxygen content) exhibiting greater skin depth approaching the electrode-to-wafer spacing. At 50 mTorr (FIG. 81B), the gas mixture containing 100% oxygen nearly is quite close to the wafer surface. At 100 mTorr (FIG. 81C), the skin depth of the gas mixture containing only about 25% oxygen is quite close to the wafer surface. Thus, as the chamber pressure increases, the skin depth for a given gas mixture approaches the electrode-to-wafer spacing at which the inductive coupling mode is extinguished. Therefore, it would appear that the process window is restricted to exclude gas mixtures rich electronegative gases and/or high chamber pressures. Such a narrowing of the process window is a significant disadvantage. One might attempt to overcome this problem by a large increase in plasma source power. However, when the total plasma source power is increased 50% to 2700 watts, similar behavior is observed at 5 mTorr (FIG. 82A), 50 mTorr (FIG. 82B) and 100 mTorr (FIG. 82C) as was observed at 1800 Watts (FIGS. 81A, 81B, 81C, respectively). Even a 100% increase in plasma source power (to between about 2600 and 3600 Watts on the outer coil) leads to similar behavior at 5, 50 and 100 mTorr (FIGS. 83A, 83B, 83C, respectively) with some slight improvement allowing operation almost up to 200 mTorr (FIG. 83D).

A different type of plasma reactor that does operate at the desired plasma density range around $5 \cdot 10^{10}$ ions/cm$^3$ is a magnetically enhanced reactive ion etch (MERIE) reactor. An MERIE reactor has a set of magnets that "stir" the plasma azimuthally across the surface of the wafer to enhance performance. However, there are a number of disadvantages of MERIE reactors as applied to processing SAC, SALI or dual Damascene structures:

(a) in certain older designs of MERIE reactors, there can be a risk of charge damage in the microelectronic structures on the wafer, due to the ExB drift attributable to the MERIE magnets;

(b) there is no radial plasma uniformity tuning of the type disclosed in the above-described reactor (e.g., using independently powered inner and outer overhead coil inductors) in an MERIE reactor;

(c) there is no chamber wall temperature control of the type disclosed in the above-described reactor for tuning polymer content in the chamber in an MERIE reactor.

(d) an MERIE reactor requires a higher chamber pressure in order to sustain a plasma and cannot exceed a lower source power level without arcing. (Such arcing would be caused by the high voltages in a capacitively coupled plasma at the low pressures referred to herein.)

Thus, the process window using an MERIE reactor would be relatively narrow, lower chamber pressure ranges being excluded and higher source power ranges being excluded from the process window. Therefore, it would be desireable to find a way in which the above-described inductively coupled plasma reactor can be operated in the inductively coupled mode in the desired intermediate range of plasma densities centered near $5 \cdot 10^{10}$ ions/cm$^3$.

Figure 84:
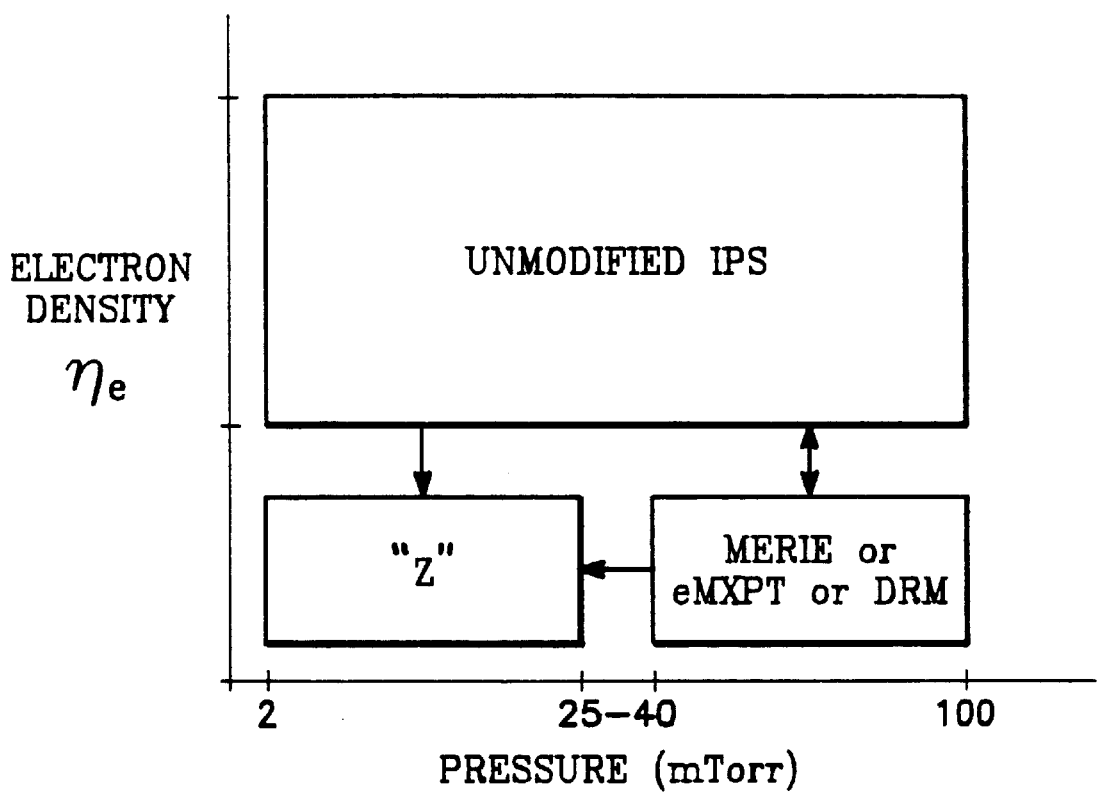
FIG. 84 is a graph illustrating the process windows of an inductively coupled plasma etch reactor of the type described in the above-referenced parent application, and of a magnetically enhanced reactive ion etch reactor.

Interestingly, while the MERIE reactor has a limited pressure range which excludes chamber pressures below about 25–40 mTorr, the inductively coupled reactor described above has no such limitations, its lowest operable chamber pressure being limited only by the size of the vacuum pump. Typically, the above-described inductively coupled reactor may be operated at chamber pressures as low as 2 mTorr. Thus, the above-described inductively coupled reactor would more likely provide the widest possible process window of chamber pressures. In this regard, a comparison of plasma density and chamber pressure process windows of the above described inductively coupled reactor and a typical MERIE reactor is given in the graph of FIG. 84. The above-described inductively coupled reactor operates in a window bounded between plasma densities of $10^{11}$ and $10^{12}$ ions/cm$^3$ (vertical axis) and 2 mTorr and 100 mTorr (horizontal axis). A typical MERIE reactor operates in a smaller window bounded between plasma densities of $10^{10}$ and $10^{11}$ ions/cm$^3$ and chamber pressures of 25 and 100 mTorr. This leaves open a process window (labelled "Z" in FIG. 84) thus far unrealized by either type of reactor bounded by plasma ion densities of $10^{10}$ and $10^{11}$ ions/cm$^3$ and chamber pressures of 2 and 25 mTorr. A goal of the present invention is to enable operation of the above-described inductively coupled reactor in the process window "Z" of FIG. 84.

Preferred Mode of the Present Invention:

The method of the present invention is to operate the above-described inductively coupled plasma reactor having the semiconductor window electrode with the plasma density reduced to the desired intermediate level by increasing the frequency of the RF source power applied to the inductive coils overlying the semiconductor window electrode. Preferably, the source power frequency is sufficiently increased to constrain the RF field skin depth to be less than the electrode-to-wafer spacing while the plasma density is in the desired intermediate (lesser) range. The electrode-to-wafer spacing is typically a fraction of the wafer diameter. In the examples given above, the desired range includes or is centered near $5 \cdot 10^{10}$ ions/cm$^3$, although this may be scaled to a different level depending upon the reactor design and application. This method realizes a reduced plasma density while maintaining the inductively coupled mode of the plasma, a significant advantage.

A second preferred but optional feature of the invention is to reduce ion energy at the wafer surface without necessarily reducing the plasma bias power applied to the wafer or wafer pedestal, by simply increasing the frequency of the plasma bias power. This reduces the sputtering of critical structural features such as the exposed corner of the silicon nitride insulating layer covering the lower-level bit line, thereby increasing the available process window over which such critical structural features are preserved during etching.

How to calculate the skin depth of the inductive field induced by the overhead coils has already been discussed earlier in this specification, for the purpose of illustrating how to design the semiconductor window electrode. Now, with reference to the principal feature of the method of the present invention in which the plasma source power frequency is increased to permit operation at a low plasma ion density, it is desired to calculate skin depth to show how to select an optimum reduction in source power frequency to permit operation at a desired intermediate plasma ion density. The source power frequency is reduced to avoid extinguishment of the inductive coupling mode due to the reduction in plasma ion density. To accomplish this, the source power frequency is increased sufficiently to constrain the skin depth to be substantially less than the electrode-to-wafer spacing, so that the skin depth is above the wafer surface. The calculation of the skin depth for this purpose is set forth in Lieberman and Lichtenberg, *Principles of Plasma Discharge and Materials Processing*, John Wiley & Sons, New York, 1994, in Chapter 12 "Inductive Discharges".

Figure 85:
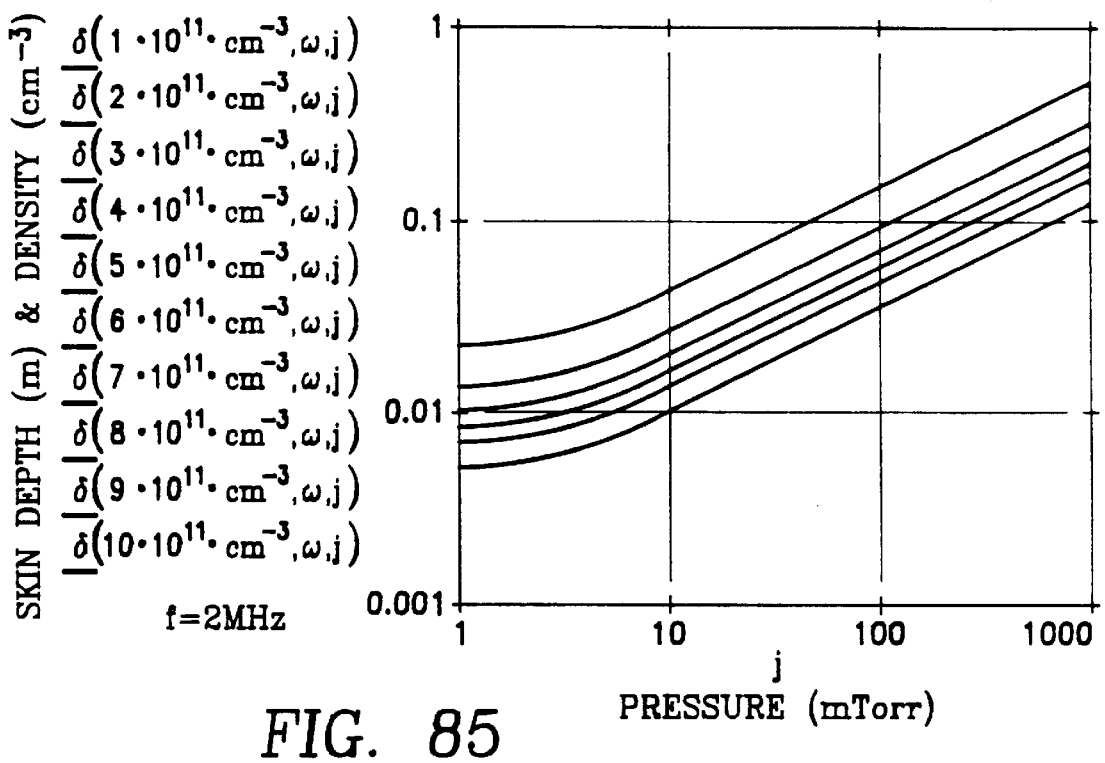
FIG. 85 is a graph illustrating for various high range plasma electron densities the skin depth as a function of chamber pressure at a low source power frequency.
Figure 86:
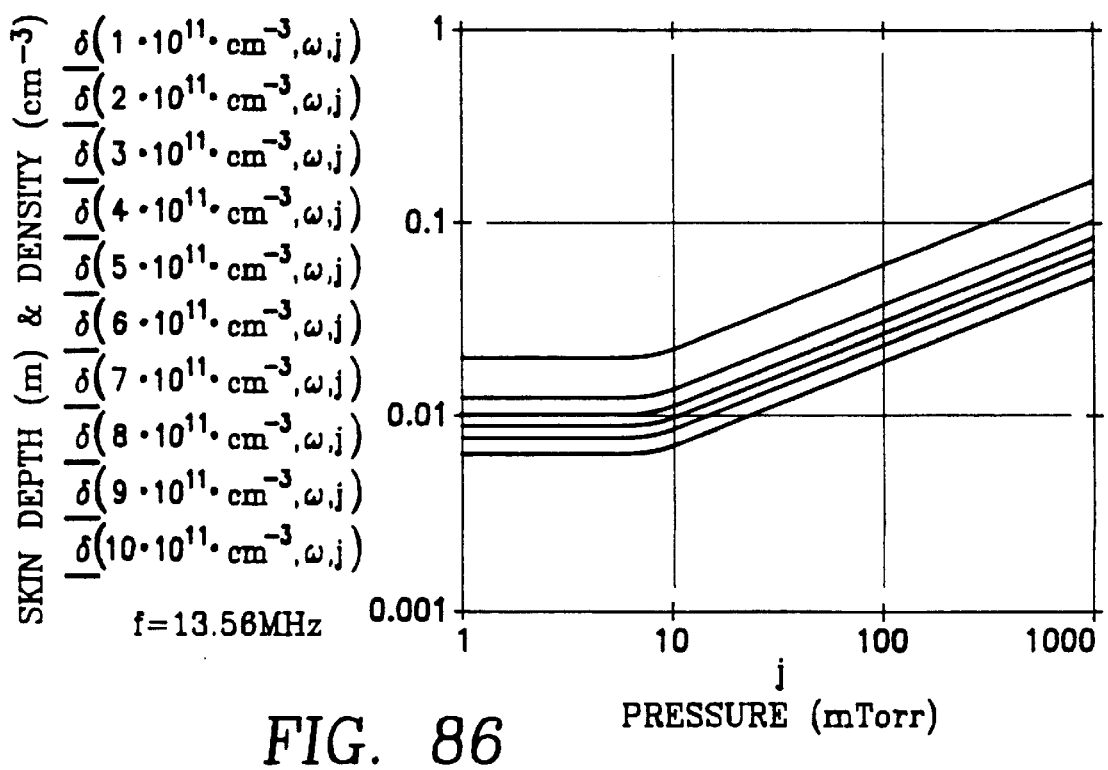
FIG. 86 is a graph illustrating for various high range plasma electron densities the skin depth as a function of chamber pressure at an intermediate source power frequency.
Figure 87:
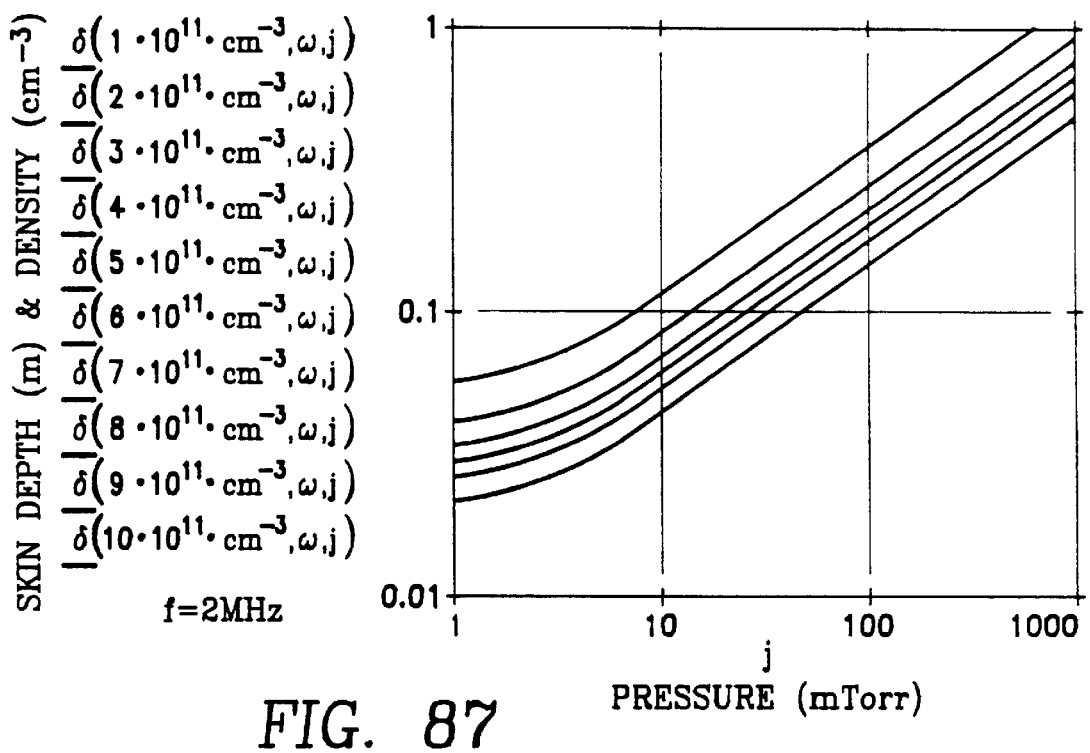
FIG. 87 is a graph illustrating for various low range plasma electron densities the skin depth as a function of chamber pressure at a low source power frequency.
Figure 88:
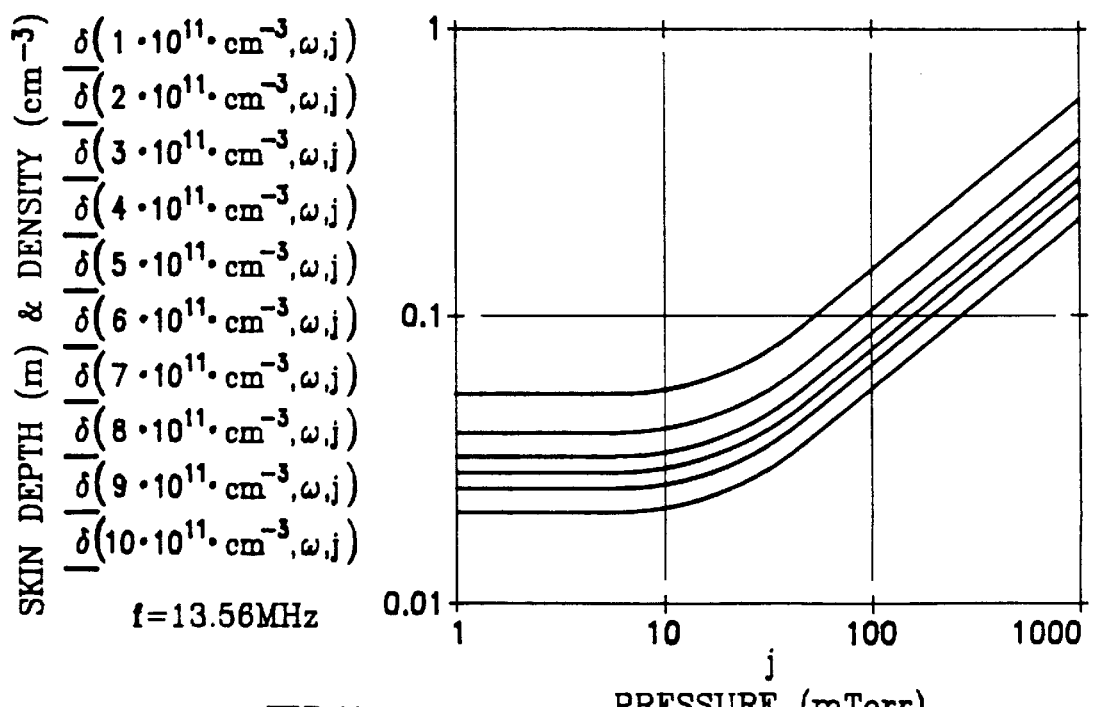
FIG. 88 is a graph illustrating for various low range plasma electron densities the skin depth as a function of chamber pressure at an intermediate source power frequency.
Figure 89:
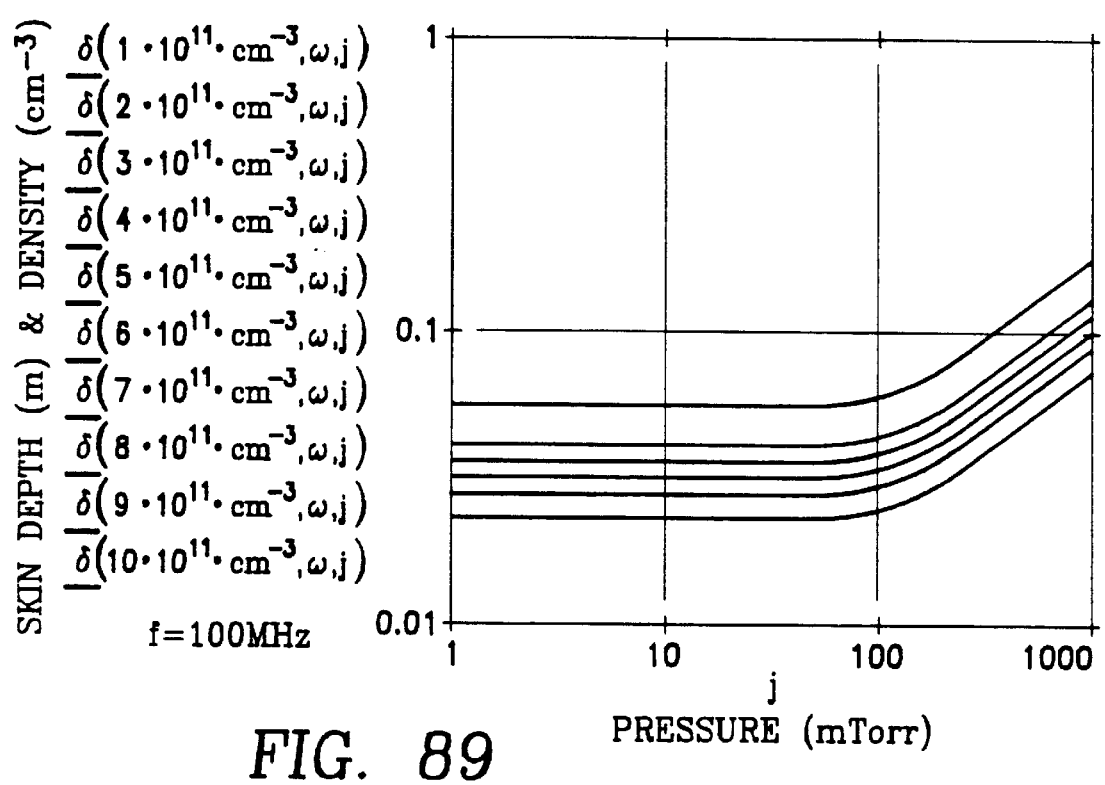
FIG. 89 is a graph illustrating for various low range plasma electron densities the skin depth as a function of chamber pressure at a high source power frequency.

Using such a calculation, the skin depths for various combinations of source power frequencies, plasma densities and chamber pressures were calculated. The results are plotted in FIGS. 85–89. Referring to FIG. 85, at a source power frequency of 2 MHz, skin depths (vertical axis) for various plasma densities lying in a high range from $1 \cdot 10^{11}$ electrons/cm$^3$ to $10 \cdot 10^{11}$ electrons/cm$^3$ are plotted as a function of chamber pressure (horizontal axis). The various plasma densities were achieved by varying the process parameters, principally the plasma source power, to provide the selected plasma density. The electrode-to-wafer spacing is 7.2 cm, as before. As can be seen from FIG. 85, at a given chamber pressure the skin depth increases as plasma density is reduced. For example, near a chamber pressure of 100 mTorr, most of the skin depths in this range of plasma densities are at or near the wafer level, so that the inductive coupling mode is weak or suppressed at these plasma densities. FIG. 86 shows that by simply increasing the plasma source power frequency to over 13 MHz, the situation is dramatically improved, in that at 100 mTorr, for example, none of the skin depths for plasma densities in the high range from $1 \cdot 10^{11}$ electrons/cm$^3$ to $10 \cdot 10^{11}$ electrons/cm$^3$ are near the wafer level. This dramatic result would suggest that the plasma density may be reduced to the intermediate range centered around $5 \cdot 10^{10}$ electrons/cm$^3$. The result of such a reduction without a concomitant increase in plasma source frequency is plotted in FIG. 87 for various intermediate plasma densities. As expected, without a concomitant increase in plasma source frequency the skin depths tend to fall near the wafer surface across most of the pressure range plotted in the figure (i.e., from 1 to 1000 mTorr), so that the inductive mode is extinguished. However, in accordance with the present invention, increasing the plasma source frequency significantly (e.g., by a factor between 6 and 7, or from 2 MHz to 13 MHz) so that below 50 mTorr (for example) virtually none of the plasma densities in the intermediate range have skin depths at or near the wafer surface, as illustrated in FIG. 88. In fact, the problem is almost completely eliminated at a very high source power frequency of 100 MHz, at which almost all of the plasma densities in the intermediate range (i.e., from $1 \cdot 10^{10}$ electrons/cm$^3$ to $10 \cdot 10^{10}$ electrons/cm$^3$ have skin depths above the wafer level for pressures from 1 to nearly 1000 mTorr. This situation is illustrated in the graph of FIG. 89. Thus, the factor by which the source power frequency is increased may lie in a range between 4 and 100, for example.

Operating the plasma source power at high frequency (e.g., 13 MHz), while reducing skin depth, does not reduce skin depth to less than the desired minimum depth of 5 times the thickness of the silicon window electrode (which is typically about 2.5 cm), where the silicon window electrode has a resistivity of 0.85 Ohm-meters. Therefore, such a high source power frequency is feasible. One consequence of selecting the window electrode resistivity to be 0.85 Ohm-meters is that the electrical potential drop across the electrode (in the radial direction) is only about 2% while the bias power loss is only about 4.8%, so that radial or edge electrical contact with the window electrode suffices. Therefore, use of the back spider contact on the window electrode described above is not preferable.

In accordance with the second (optional) feature of the present invention, the bias power frequency is increased from the nominal frequency of about 1.8 MHz to about 13 MHz. This decreases the plasma ion energy near the wafer surface and thereby reduced the damage to critical features such as the corner on a silicon nitride insulating cover around a lower level bit line of the type discussed above in this specification.

While the invention has been described with reference to maintaining inductive coupling by constraining skin depth of the RF field in the plasma to be less than the electrode-to-wafer spacing, it is well-known in the art the the term "skin depth" as employed herein behaves as described above under the assumption of a uniform charge distribution. In practical application, however, the charge distribution is not uniform in a plasma, so that the skin depth is termed an "anomalous skin depth", in which case extinguishment of the inductive coupling mode may occur at a skin depth less than or equal to the electrode-to-wafer spacing. The present invention does not depend upon the precise definition of skin depth but only upon the maintaining of the inductive coupling mode, and this determines the choice of the (higher) source power frequency.

While the invention has been described with reference to a window electrode made of a semiconductor material having an appropriate resistivity given the desired frequency of operation, another type of window electrode consisting of a very thin conductive layer within a dielectric layer has recently been disclosed in U.S. patent application Ser. No. 08/937,348 filed Sep. 20, 1997 by Horioka et al., entitled "Inductive RF Plasma Reactor with Overhead Coil and Conductive Laminated RF Window Beneath the Overhead Coil". The method of the present invention can be carried out with either the semiconductor window electrode disclosed in this specification or with the laminated thin conductor window electrode of Horioka et al. When carried out with the semiconductor window electrode, the present invention preferably chooses, in combination, an appropriate resistivity for the semiconductor window electrode and a sufficient source power frequency to permit operation at low plasma densities without extinguishing the inductive coupling mode.

While the invention has been described by specific reference to preferred embodiments, it is understood that variations and modifications thereof may be made without departing from the true spirit and scope of the invention.

What is claimed is:

1. In an inductively coupled plasma reactor capable of processing a semiconductor wafer within a chamber by inductive coupling of an RF field through a semiconductor window electrode having a finite electrode-to-wafer spacing, a method for permitting operation at a constrained plasma density inside said chamber without extinguishing said inductive coupling of said RF field, said method comprising:

operating said reactor at a selected process gas flow rate, a selected chamber pressure and a selected plasma source power level corresponding to said constrained plasma density; and maintaining the frequency of said RF field at least at a frequency sufficient to limit said skin depth to a depth less than the electrode-to-wafer spacing of said reactor, whereby to maintain said inductive coupling of said RF field.

2. The method of claim 1 wherein said electrode-to-wafer spacing in on the order of about 7 cm.

3. The method of claim 1 wherein said plasma density is between about $1 \cdot 10^{10}$ electrons/cm$^3$ to $10 \cdot 10^{10}$ electrons/cm$^3$.

4. The method of claim 1 wherein said increasing of said frequency is by a factor of between 4 and 100.

5. The method of claim 1 wherein said frequency is on the order of about 13 MHz.

6. The method of claim 1 wherein said frequency is within a range between about 13 and 100 MHz.

7. The method of claim 1 said chamber pressure lies in a range between on the order of about 2 mTorr and 100 mTorr.

8. The method of claim 1 wherein said chamber pressure lies in a range between on the order of about 2 mTorr and 200 mTorr.

9. The method of claim 1 wherein said process gas comprises etchant and polymer precursor gases.

10. The method of claim 4 wherein said factor is on the order of between about 6 and 7.

11. The method of claim 3 wherein said chamber pressure is in a range of between about 25 to 100 mTorr.

12. The method of claim 3 wherein said chamber pressure is in a range of between about 40 and 100 mTorr.

13. The method of claim 3 wherein said chamber pressure is in a range of between about 2 and 25 mTorr.

14. The method of claim 3 wherein said chamber pressure is in a range of between about 2 and 40 mTorr.

15. The method of claim 1 wherein said electrode-to-wafer spacing is a fraction of the diameter of said wafer.

16. The method of claim 1 wherein said reactor further comprises an RF bias power generator for applying plasma bias power to said wafer, said method further comprising:

maintaining the frequency of said RF bias power generator at least at a level sufficient to limit ion energies near said wafer below a desired threshold.

17. The method of claim 16 wherein said bias power frequency is maintained above 10 MHz.

18. In an inductively coupled plasma reactor capable of processing a semiconductor wafer, within a chamber by inductive coupling of an RF field through a semiconductor window electrode having a finite electrode-to-wafer spacing, a method for permitting limitation of plasma density inside said chamber without extinguishing said inductive coupling of said RF field, said method comprising:

operating said reactor at a selected process gas flow rate, a selected chamber pressure and a selected plasma source power level corresponding to said limitation of plasma density; and maintaining the frequency of said RF field at least at a frequency sufficient to limit penetration depth of said RF field relative to the electrode-to-wafer spacing of said reactor sufficiently to maintain said inductive coupling of said RF field.

19. In an inductively coupled plasma reactor capable of processing a semiconductor wafer with a plasma generated using inductive coupling of an RF field, a method for permitting limitation of plasma density inside said chamber without extinguishing said inductive coupling of said RF field, said method comprising:

providing a window electrode with a finite electrode-to-wafer spacing having sufficient transparency to said RF field to permit inductive coupling thereof into said chamber and sufficient conductivity to function as an electrode;

operating said reactor at a selected process gas flow rate, a selected chamber pressure and a selected plasma source power level corresponding to said limitation of plasma density; and maintaining the frequency of said RF field at least at a frequency sufficient to limit penetration depth of said RF field relative to the electrode-to-wafer spacing of said reactor sufficiently to maintain said inductive coupling of said RF field.

20. The method of claim 19 wherein said window electrode comprises a semiconductor window electrode.

21. The method of claim 20 further comprising selecting a resistivity of said semiconductor window electrode at which said frequency of said RF field is sufficient to limit penetration depth of said RF field relative to the electrode-to-wafer spacing of said reactor sufficiently to maintain said inductive coupling of said RF field.

22. The method of claim 21 wherein said frequency of said RF field is sufficient, given the resistivity of said semiconductor window electrode, to limit the skin depth of said RF field to not exceed said electrode-to-wafer spacing.

23. The method of claim 19 wherein said window electrode consists of a conductive layer.

* * * * *